(12) United States Patent
Shirota et al.

(10) Patent No.: US 6,618,648 B1
(45) Date of Patent: Sep. 9, 2003

(54) CONTROL SYSTEM METHOD OF PROTECTIVELY CONTROLLING ELECTRIC POWER SYSTEM AND STORAGE MEDIUM STORING PROGRAM CODE

(75) Inventors: Yoshihiro Shirota, Takasaki (JP); Katsuhiko Sekiguchi, Tama (JP); Tetsuya Miyoshi, Fuchu (JP); Yutaka Fuwa, Sagamihara (JP); Yoshiyuki Shimokawa, Fuchu (JP); Hideki Sasaki, Fuchu (JP); Masao Hori, Ageo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/262,288

(22) Filed: Mar. 4, 1999

(30) Foreign Application Priority Data

Mar. 5, 1998 (JP) .......................................... P10-053868
Nov. 24, 1998 (JP) .......................................... P10-349404

(51) Int. Cl.[7] ................................................ G05D 3/12
(52) U.S. Cl. ..................... 700/291; 700/286; 700/292; 700/299
(58) Field of Search .............................. 700/286, 291, 700/292, 299

(56) References Cited

U.S. PATENT DOCUMENTS 4,513,382 A * 4/1985 Faulkner, Jr. ............... 700/286
5,517,422 A * 5/1996 Ilic et al. .................... 700/286
5,696,695 A * 12/1997 Ehlers et al. ................ 700/286
6,246,928 B1 * 6/2001 Louis et al. ................. 700/292
6,289,267 B1 * 9/2001 Alexander et al. .......... 700/286

FOREIGN PATENT DOCUMENTS

| JP | 6-242158 | 9/1994 |
| JP | 10-222785 | 8/1998 |
| JP | 10-257661 | 9/1998 |
| WO | WO 93/12566 | 6/1993 |

* cited by examiner

Primary Examiner—Leo Picard
Assistant Examiner—Sheela S. Rao
(74) Attorney, Agent, or Firm—Oblon, Spivak, McClelland, Maier & Neustadt, P.C.

(57) ABSTRACT

The control system for a plant comprises a rectifier connected to a network. The rectifier has a unit for acquiring precise time, a unit for sampling the state quantity on the precise time to convert the state quantity into digital data and a unit for adding the precise time at each sampling timing to the digital data to transmit the digital data each having the precise time to the network. A breaker is connected to the network. The breaker has a unit for receiving, through the network, a control command thereto and a unit for transmitting an operating state thereof to the network. A control apparatus is connected to the network. The control apparatus has a unit for performing an operation process on the digital data transmitted through the communication network and the operating state of the breaker transmitted therethrough and a unit for transmitting the control command through the communication network to the breaker in response to a result of the control operation process of the performing unit.

74 Claims, 64 Drawing Sheets

FIG. 7

| | NAME OF DEVICE | PHASE | INSTANTANEOUS VALUE OF ELECTRIC QUANTITY | ABSOLUTE TIME |
|---|---|---|---|---|
| Di(t) | CURRENT TRANSFORMER 35A | Ia | 1.5A | 45.0000000 SECOND, 14:35, JULY 11, 1997 |
| | NAME OF DEVICE | PHASE | INSTANTANEOUS VALUE OF ELECTRIC QUANTITY | ABSOLUTE TIME |
| Dv(t) | TRANSFORMER 35B | Va | 63.5A | 45.0000000 SECOND, 14:35, JULY 11, 1997 |

FIG.8

| | NAME OF DEVICE | PHASE | INSTANTANEOUS VALUE OF ELECTRIC QUANTITY | ABSOLUTE TIME |
|---|---|---|---|---|
| Di(t) | CURRENT TRANSFORMER 35A | Ia | 1.5A | 44.9999997 SECOND, 14:35, JULY 11, 1997 |
| Dv(t) | TRANSFORMER 35B | Va | 50.0A | 44.9999998 SECOND, 14:35, JULY 11, 1997 |
| Di(t) | CURRENT TRANSFORMER 35A | Ia | 1.4A | 44.9999998 SECOND, 14:35, JULY 11, 1997 |
| Dv(t) | TRANSFORMER 35B | Va | 52.5A | 44.9999997 SECOND, 14:35, JULY 11, 1997 |

FIG.10

| | ABSOLUTE TIME | NAME OF DEVICE | INSTANTANEOUS VALUE | NAME OF DEVICE | INSTANTANEOUS VALUE |
|---|---|---|---|---|---|
| Di(t−m),Dv(t−m) | 44.9999997 SECOND, 14:35, JULY 11, 1997 | CURRENT TRANSFORMER 35A | Ia(t−m)1.5A | TRANSFORMER 35B | Va(t−m)52.5V |
| Di(t−m+1),Dv(t−m+1) | 44.9999998 SECOND, 14:35, JULY 11, 1997 | CURRENT TRANSFORMER 35A | Ia(t−m+1)1.4A | TRANSFORMER 35B | Va(t−m+1)53.5V |
| | . . . . | | | | |
| Di(t),Dv(t) | 45.(X)SECOND, 14:35, JULY 11, 1997 | CURRENT TRANSFORMER 35A | Ia(t)yA | TRANSFORMER 35B | Va(t)ZV |

FIG.12

| SELF-DIAGNOSIS ITEM | CONTENTS | METHOD |
|---|---|---|
| A/D ACCURACY | CHECK MPX CHANNEL SWITCHING FUNCTION AND ACCURACY OF A/D CONVERSION | INPUT PREDETERMINED DC SIGNAL TO PREDETERMINED CHANNEL OF MPX TO DETECT AND CHECK A/D-CONVERTED VALUE AND CHECK POSITIVE AND NEGATIVE DATA WHICH CAUSES + V AND − V 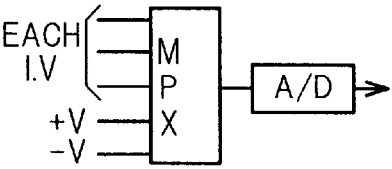 |
| RAM | CHECK READING AND WRITING FUNCTIONS OF DATA MEMORY | R1 (X 'AAAA') (X '5555') R2 (X 'AAAA') (X '5555')  R1=R2(DEFECTIVE WHEN NOT SATISFIED) CHECK EACH WORD IN MEMORY (1)−(N) |
| ROM | CHECK DATA IN PROGRAM MEMORY | COMPARE TOTAL SUM OF DATA READ FROM ROM AND KNOWN DATA WITH EACH OTHER 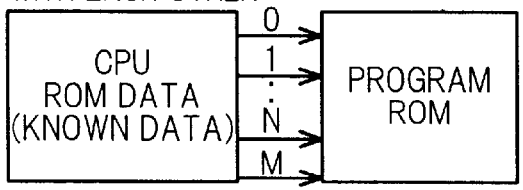 $\sum_{n=0}^{N}$ ROM DATA=M (DEFECTIVE WHEN NOT SATISFIED) |

FIG.20

| | NAME OF APPARATUS | PHASE | ELECTRIC QUANTITY | TIME |
|---|---|---|---|---|
| Dva1(t1) | APPARATUS 111A | Va | 20V | 45.2500000 SECOND, 14:30, JULY 11, 1997 |
| Dva2(t1) | APPARATUS 111B | Va | 20V | 45.2500000 SECOND, 14:30, JULY 11, 1997 |
| Dvb1(t1) | APPARATUS 111A | Vb | 10V | 45.2500000 SECOND, 14:30, JULY 11, 1997 |
| Dvc1(t1) | APPARATUS 111A | Vc | 20V | 45.2500000 SECOND, 14:30, JULY 11, 1997 |
| Dva1(t2) | APPARATUS 111A | Va | 21V | 45.2516666 SECOND, 14:30, JULY 11, 1997 |
| Dvb1(t2) | APPARATUS 111A | Vb | 9V | 45.2516666 SECOND, 14:30, JULY 11, 1997 |
| Dvb2(t1) | APPARATUS 111B | Vb | 10V | 45.2500000 SECOND, 14:30, JULY 11, 1997 |
| Dvc2(t1) | APPARATUS 111B | Vc | 20V | 45.2500000 SECOND, 14:30, JULY 11, 1997 |
| Dvc1(t2) | APPARATUS 111A | Vc | 19V | 45.2516666 SECOND, 14:30, JULY 11, 1997 |
| Dva2(t2) | APPARATUS 111B | Va | 21V | 45.2516666 SECOND, 14:30, JULY 11, 1997 |
| Dva1(t3) | APPARATUS 111A | Va | 22V | 45.2533333 SECOND, 14:30, JULY 11, 1997 |
| Dvb1(t3) | APPARATUS 111A | Vb | 8V | 45.2533333 SECOND, 14:30, JULY 11, 1997 |
| Dvc1(t3) | APPARATUS 111A | Vc | 18V | 45.2533333 SECOND, 14:30, JULY 11, 1997 |
| Dvb2(t2) | APPARATUS 111B | Vb | 9V | 45.2516666 SECOND, 14:30, JULY 11, 1997 |
| Dvc2(t2) | APPARATUS 111B | Vc | 19V | 45.2516666 SECOND, 14:30, JULY 11, 1997 |
| Dva2(t3) | APPARATUS 111B | Va | 22V | 45.2533333 SECOND, 14:30, JULY 11, 1997 |
| Dvb2(t3) | APPARATUS 111B | Vb | 8V | 45.2533333 SECOND, 14:30, JULY 11, 1997 |
| Dvc2(t3) | APPARATUS 111B | Vc | 18V | 45.2533333 SECOND, 14:30, JULY 11, 1997 |

FIG.21

| | TIME | APPARATUS 111A | | | APPARATUS 111B | | |
|---|---|---|---|---|---|---|---|
| | | Va | Vb | Vc | Va | Vb | Vc |
| Dv(t1) | t1 : 45.2500000 SECOND, 14:30, JULY 11, 1997 | 20V | 10V | 20V | 20V | 10V | 20V |
| Dv(t2) | t2 : 45.2516666 SECOND, 14:30, JULY 11, 1997 | 21V | 9V | 19V | 21V | 9V | 19V |
| Dv(t3) | t3 : 45.2533333 SECOND, 14:30, JULY 11, 1997 | 22V | 8V | 18V | 22V | 8V | 18V |

FIG.24
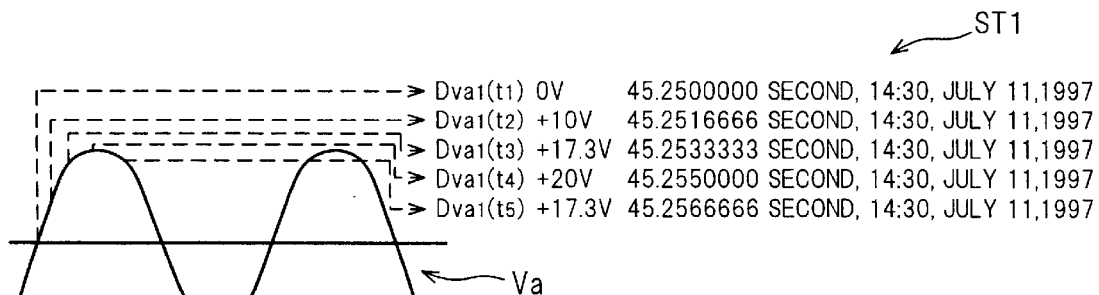
| | NAME OF APPARATUS | PHASE | ELECTRIC QUANTITY | TIME |
|---|---|---|---|---|
| Dva1(t1) Dvb1(t1) Dva2(t1) | APPARATUS 111A | Va | 0V | 45.2500000 SECOND, 14:30, JULY 11,1997 |
| | APPARATUS 111A | Vb | 17.3V | 45.2500000 SECOND, 14:30, JULY 11,1997 |
| | APPARATUS 111B | Va | 0V | 45.2500000 SECOND, 14:30, JULY 11,1997 |
ST2
ST3
| | | APPARATUS 111A | | | APPARATUS 111B | | |
|---|---|---|---|---|---|---|---|
| TIME | | Va | Vb | Vc | Va | Vb | Vc |
| t1 : 45.2500000 SECOND, 14:30, JULY 11, 1997 | | 0V | 17.3V | −17.3V | 0V | 17.3V | −17.3V |
| t2 : 45.2516666 SECOND, 14:30, JULY 11, 1997 | | 10V | 10V | −20V | 10V | 10V | −20V |
| t3 : 45.2533333 SECOND, 14:30, JULY 11, 1997 | | 17.3V | 0V | −17.3V | 17.3V | 0V | −17.3V |
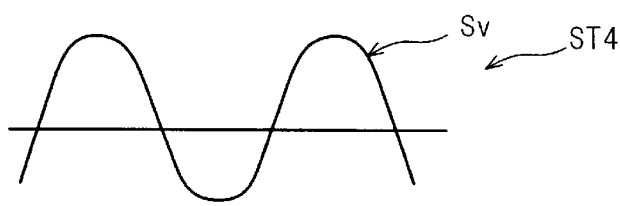

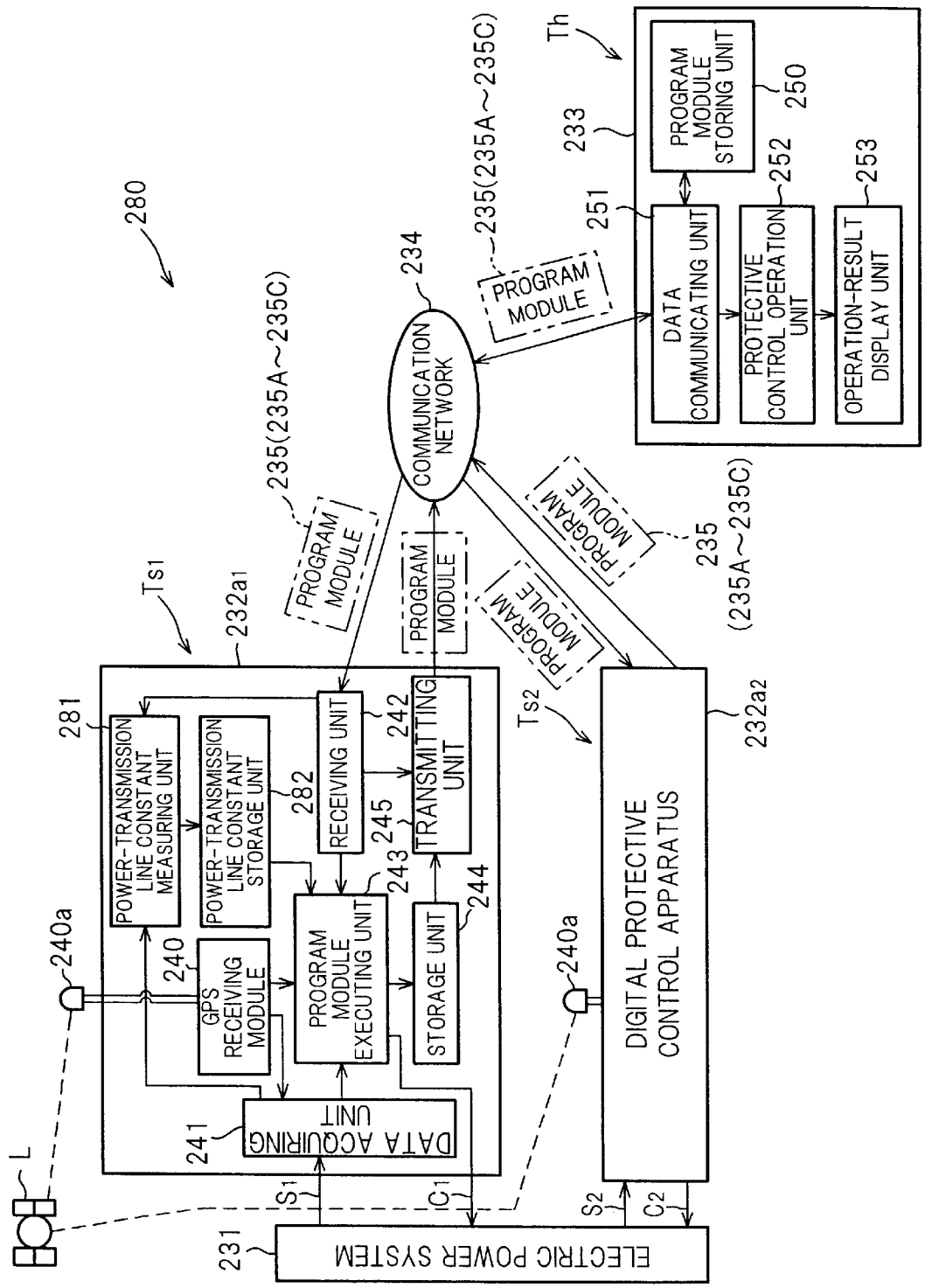

FIG.62 PRIOR ART

| TYPE OF TESTS OF DIGITAL RELAY | |
|---|---|
| ·MODEL TEST | PRECISE TESTS AND INSPECTIONS OF FUNCTIONS OF APPARATUS ARE PERFORMED WHEN APPARATUS HAS BEEN DEVELOPED TO RELIABLY DETECT ESTIMATED ACCIDENT PHENOMENON TO CONFIRM FACT THAT APPROPRIATE OPERATION CAN BE PERFORMED. USUALLY MANUFACTURER PERFORMS TEST AT PLANT. |
| ·ACCEPTANCE TEST | CONFIRM THAT APPARATUS WHICH HAS BEEN SUBJECTED TO MODEL TEST AND HAS PERFORMANCE REALIZED IN THE MODEL TEST. USUALLY MANUFACTURER PERFORMS TEST AT PLANT |
| ·COMPLETION TEST | PRIOR TO USE OF APPARATUS, CONFIRMATION OF EXPECTED OPERATION OF APPARATUS COMBINED WITH RELATIVE DEVICES IS PERFORMED UNDER ACTUAL SETTING AND OPERATION CONDITIONS. USUALLY OPERATOR PERFORMS TEST. |
| ·PERIODIC TEST | FACT THAT APPARATUS IN USE IS FREE FROM DETERIORATION AND CHANGE IN CHARACTERISTIC AND PROTECTIVE FUNCTION IS NORMALLY MAINTAINED IS CONFIRMED. |

FIG.63 PRIOR ART

| ITEMS OF ACCEPTANCE TEST | |
|---|---|
| · STRUCTURE TEST | FACT THAT STRUCTURE, SHAPE AND ASSEMBLY OF RELAY ARE REALIZED AS DESIGNED IS CONFORMED. |
| · RELAY CHARACTERISTIC TEST | APPLY TEST ELECTRICITY TO RELAY TO CONFIRM CHARACTERISTICS OF RELAY. |
| · DC SEQUENCE TEST | OPERATE MAIN RELAY AND SUB-RELAY TO CONFIRM FUNCTIONS OF DC CONTROL CIRCUIT AND DISPLAY AND ALARM CIRCUITS. |
| · AC SEQUENCE TEST | APPLY TEST AC TO CONFIRM PHASE ORDER AND POLARITY OF RELAY. |
| · AUTOMATIC MONITORING TEST | SIMULATE FAULTS OF ELEMENTS IN APPARATUS TO CONFIRM FUNCTIONS OF DISPLAY AND ALARM CIRCUITS FOR PERFORMING AUTOMATIC MONITORING. |
| · TOTAL OPERATION TEST | TEST ELECTRICITY IS RAPIDLY CHANGED FROM STEADY STATE TO STATE SIMILAR TO ACTUAL ACCIDENT OF SYSTEM TO CHECK TOTAL FUNCTION. |
| · LOAD MEASUREMENT | APPLY TEST ELECTRICITY (RATED VOLTAGE AND CURRENT) UNDER NORMAL STATE OF USE TO MEASURE LOAD. |
| · INSULATION RESISTANCE TEST | MEASURE INSULATION RESISTANCE. |
| · AC-VOLTAGE RESISTANCE TEST | APPLY VOLTAGE HAVING COMMERCIAL FREQUENCY CORRESPONDING TO VOLTAGE OF CIRCUIT TO CONFIRM RESISTANCE OF APPARATUS. |
| · ELECTRIC WAVE NOISE TEST | APPLY WAVE NOISE FROM FRONT, REVERSE AND SIDE SURFACES OF APPARATUS TO CONFIRM NO INCORRECT OUTPUT. |

CONTROL SYSTEM METHOD OF PROTECTIVELY CONTROLLING ELECTRIC POWER SYSTEM AND STORAGE MEDIUM STORING PROGRAM CODE

BACKGROUND OF THE INVENTION

1. Field of the Invention

The present invention relates to a control system for controlling a plant, such as an electric power system, a general industrial plant, a public plant and so on, in accordance with state quantities inputted from a plurality of equipment devices of the plant, which include a state quantity input device (input/output device), such as a transformer for instruments and an opening/closing device.

Moreover, the present invention relates to an electric power system protective control system for protectively controlling the electric power system.

Furthermore, the present invention relates to a method of protectively controlling the electric power system.

Still furthermore, the present invention relates to a storage medium storing a program code.

2. Description of the Prior Art

In a plant, such as an electric power system, for controlling state quantities, such as the electric quantities, which are changed as time elapses, a control system having a plurality of digital control apparatuses has widely been operated. The digital control apparatus recognizes a change state of each of a plurality of equipment devices constituting the plant and an abnormal state, such as an accident occurring in any one of the equipment devices, so that stabilizing control and system protective control are performed. In recent years, a high-performance electronic circuit including a high speed microprocessor or a large-capacity memory has been mounted on each digital control apparatus to improve the performance thereof.

As the digital control apparatus for constituting the control system, a variety of apparatuses have been developed to mainly correspond to the contents of the protective control of the electric power system. The control apparatuses are disposed at required locations in the electric power system. Specifically, as an example of the control apparatus, there is a digital relay for detecting an accident (a system accident) occurring in each of equipment devices (power-transmission lines, transformers and the like) of the electric power system so as to separate the accident portion therefrom thereby protecting the electric power system. Moreover, as another example of the control apparatus, there is a fault locator for accurately locating a location of an accident point (a faulty point) on, for example, a power-transmission line. Furthermore, as another example of the control apparatus, there is a system stabilizing relay for performing stabilizing control of the electric power system.

The structure and operation of a digital protective control apparatus (a digital relay) will now be described, which is an example of the digital control apparatus and which performs a protective relay operation for the electric power system.

FIG. 60 is a diagram showing the basic structure of a conventional multi-input digital relay. Referring to FIG. 60, a digital relay 1 is provided with an analog-digital converting unit 2 for taking a multiplicity of analog state quantities (electric quantities), such as electric currents and voltages, from an electric power system to be protectively controlled so as to convert the state quantities into digital state data.

Moreover, the digital relay 1 is provided with a digital processing unit 3 for processing protective control operations in response to the digital state data digitized by the analog/digital converting unit 2. The digital relay 1 also has an input/output interface (I/O) 4 for performing an interface process related to a data inputting/outputting operation with respect to the electric power system protective control devices (hereinafter simply called protective control devices, or external devices), such as breakers. The components (the analog-digital converting unit 2, the digital processing unit 3 and the input/output interface 4) of the digital relay 1 are mutually connected to one another through a bus 5 such that data communication is permitted.

The analog-digital converting unit 2 is provided with n analog filters 6-1 to 6-n corresponding to the number of supplied electric quantities (A-1 to A-n) for removing needless frequency components. Moreover, sample hold circuits 7-1 to 7-n corresponding to the analog filters 6-1 to 6-n are provided in the analog-digital converting unit 2 for performing sampling operation. In addition, a multiplexer 8 for selectively outputting and an A/D (analog/digital) converter 9 for performing A/D conversion are provided in the analog-digital converting unit 2.

The digital processing unit 3 is provided with a computer circuit, that is, a CPU (central processing unit) 10 for processing protective control operations; a random access memory (RAM) 11 for temporarily storing electric quantity data and data processed by the CPU 10; a read only memory (ROM) 12 for storing processing procedures (program codes) of the protective control including sequence software constituted by relay software modules; and a nonvolatile memory (EEPROM) 13 for rewritably storing setting values to operate respective relay software modules.

The digital relay 1 is provided with a display device 14, such as an LED, connected to the bus 5 for displaying electric quantity data stored in the RAM 11 by the process of the CPU 10 and the operations of the protective control devices, such as the breakers.

In the thus-structured digital relay 1, n electric quantities A-1 to A-n in parallel taken from the electric power system are passed through the analog filters 6-1 to 6-n so that unnecessary frequency components (a harmonic component except for the fundamental wave, DC component and so on) are removed. Then, the electric quantities are supplied to the sample hold circuits 7-1 to 7-n so as to be sampled in predetermined time intervals (periods) as state values (instantaneous values).

The instantaneous values sampled by the sample hold circuits 7-1 to 7-n are passed through the multiplexer 8 so as to sequentially and selectively be outputted from a single output terminal to the A/D converter 9. The instantaneous values transmitted to the A/D converter 9 are converted thereby into digitized electric quantity data, so that the electric quantity data are sequentially outputted through the bus 5 to the digital processing unit 3.

Electric quantity data sequentially outputting to the digital processing unit 3 are sequentially transmitted to the RAM 11 by a reading process of the CPU 10 in accordance with the protective control program (program code) stored in the ROM 12 so as to temporarily be stored in the RAM 11. On the basis of the electric quantity data stored in the RAM 11, the setting values of the protective relay software modules stored in the EEPROM 13 and contact information of the external devices, such as the breakers, taken through the input/output interface 4, the CPU 10 performs the protective control operation processes (for example, a digital filtering process, an amplitude calculating process, an effective value calculating process, a phase difference calculating process and a process for judging the relay operation of the relay software modules according to the setting value and the like) in accordance with the protective control program stored in the ROM 12.

Results of the protective control operation processes performed by the CPU 10 are outputted by a process of the CPU 10 to the protective control devices (external devices), such as the breakers, through the input/output interface 4 as a protective control operation command, such as a breaking command (a trip command) and a reset command. Thus, the operation for protecting the electric power system {a tripping operation or a reset operation (a contact opening/ closing operation) and so on } is performed.

Electric quantity data stored in the RAM 11 are displayed by the display unit 14 by the displaying process of the CPU 10.

Therefore, in the control system having the above-mentioned digital protective control apparatuses, an operator for monitoring the electric power system compares the values displayed on the display units 14 of the respective digital protective control apparatuses with each other. Thus, the operator is able to judge whether or not each of the digital protective control apparatus has a correct state quantity and is normally operated. Incidentally, digital protective control apparatuses except for the digital relay having another protective control function have a structure similar to that of the digital relay 1 in spite of the difference in the contents of the protective control operation processes and the protective control. Thus, a similar operation can be performed.

In recent years, the plants, such as the electric power systems, have been widened and distributed as requirement of the electric power is raised. Therefore, the numbers of the control stations, such as electric stations, for controlling the widely distributed plants and the control apparatuses, such as the digital protective control apparatuses (hereinafter simply called "protective control apparatuses") provided for the control stations have been enlarged.

To save the monitoring, the operation and the maintenance work of each of the plural control apparatuses, such as the protective control apparatuses, a remote monitoring and controlling system (hereinafter also called a "remote operational monitoring system") has been invented.

The remote operational monitoring system includes the plural control apparatuses and a display/operation apparatus disposed in a human control station (a human electric station) arranged remote from the control apparatuses. The plural control apparatuses and the display/operation apparatus are connected to each other through a communication network so as to monitor and control the operation of each control apparatus and an operational state thereof from the display/operation apparatus.

In the remote operational monitoring system adapted to, for example, the electric power system, the remote display/ operation apparatus transmits, through the communication network, processing demands related to the operation and the operational state of each of the protective control apparatuses. Moreover, the remote display/operation apparatus also transmits a display demand of the state quantity (the electric quantity) supplied from the electric power system. Thus, each of the protective control apparatuses performs processes in response to the demands so as to transmit results of the processes and electric quantity data (digital data converted from electric quantities including electric currents and voltages) to the display/operation apparatus through the communication network. Therefore, the results of the processes and the electric quantity can be displayed on the display/operation apparatus.

As a sophisticated example of the above-mentioned remote operational monitoring system, a system is known, which is disclosed in Japanese Unexamined Patent Publication No. 10-222785 (hereinafter called an "agent protective control system").

According to the agent protective control system, the display/operation apparatus transmits, to the communication network, a program module including data and procedures for remote monitoring and controlling each of the protective control apparatuses (for example, for setting the setting values of each of the protective control apparatuses, for acquiring and displaying the electric quantity and for performing the protective control operation processes), said data and procedures in the program module being integrated with each other.

The program module moves among the protective control apparatuses through the communication network. Then, each of the protective control apparatuses receives the moving program module so as to perform predetermined control operation processes in accordance with the program module. Next, each of the protective control apparatuses adds an obtained result (a result of the control) and data to the program module so as to transmit the program module to another protective control apparatus.

As described above, the program module moves to, for example, all of the protective control apparatuses through predetermined mobile routes (patterns), after that, the program module moves to the display/operation apparatus. As a result of that, the display/operation unit performs control operation processes including the display process and a fault detection process in accordance with results of the control performed by each protective control apparatus.

Therefore, the agent protective control system is able to eliminate a necessity of individually supplying the process demands and display demands to the multiplicity of the digital protective control apparatuses distributed widely. Thus, it is possible to more efficiently operate and monitor each of the digital protective control apparatus.

On the other hand, FIG. 61 shows a single-line connection employed when the digital protective control apparatuses (digital relays) having the structure and the operation described above are arranged to equipment devices, such as a power-transmission line of the electric power system, a bus line, and so on.

Referring to FIG. 61, power-transmission lines 16A and 16B of an electric power system 15 are provided with power-transmission line protective relays 1A and 1B. The relays 1A and 1B are operative to input state quantities (electric quantities, for example, electric currents and voltages) which flow in the power-transmission lines 16A, 16B and a bus line 17 from a current transformer 18A and a transformer 18B (hereinafter collectively called "electric quantity transformers"). In accordance with the inputted state quantities, the relays 1A and 1B performs the above protective control operation processes so as to make the breakers 19A and 19B protectively operate, thereby protecting the power-transmission lines 16A and 16B, respectively.

Similarly, a bus-line protective relay 1C is disposed for making each of the breakers 19A to 19C protectively operate so as to separate the bus line 17 of the electric power system 15 from the power-transmission lines 16A to 16C thereby protecting the bus line 17. Moreover, a transformer protective relay 1D is disposed for inputting, through current transformers 18A,18A, the state quantities which flow upstream and downstream of a transformer 21 of the electric power system 15.

According to the inputted state quantities, the relay 1D performs the above protective control operation processes so as to make the breakers 19C and 19D protectively operate, respectively, thereby protecting the transformer 20.

On the other hand, the digital protective control apparatus, such as the digital relay, constituting the control system is subjected to an operation confirmation test similarly to an analog protective control apparatus, so that the reliability of the digital protective control apparatus is improved, causing the reliability and safety of the electric power system to be improved.

FIG. 62 shows types of operation confirmation tests for the digital protective control apparatus. Among the test items, an acceptance test is taken as an example to described a conventional operation confirmation test.

The acceptance test is performed by sequentially carrying out the tests as shown in FIG. 63. Among the tests, for example, a total operation test is performed such that a test electric quantity is applied to a digital protective control apparatus to be tested so that the test electric quantity is rapidly changed from a steady state to a state similar to an actual accident caused to the electric power system, thereby evaluating the total functions of the tested apparatus. The total operation test is performed by using a system simulating apparatus having a system model produced by modeling configuration elements of the electric power system, such as a power generator or a power-transmission line.

That is, the system simulating apparatus simulates an accident phenomenon (a system fault) previously determined by using the system model so as to produce a test electric quantity data. The tested apparatus is subjected to the test electric quantity so that the operation of the tested apparatus corresponding to the test electric quantity is confirmed. As for a concrete example of the system simulating apparatus, refer to a document ("Practical Digital Relay", p. 152 to p. 154, edited by Izumi Mitani, Ohm).

In each protective control apparatus in the conventional electric power system protective control system, such as the remote operational monitoring system, in a case where the operation confirmation test is performed or actual system accident is performed, when an abnormal state, such as an excess current or an insufficient-level voltage, can be detected by plural relay software modules according to acquired electric quantity data, a trapping command is transmitted to the external device (the breaker) so that the breaker is operated. At this time, each protective control apparatus stores the electric quantity data before and after the operation timing (or trapping operation timing of the breaker) of the plural relay software modules in the RAM for, for example, several cycles.

At this time, by electrically connecting an analyzing tool constituted by a special recording unit and a personal computer to the digital protective control apparatus, a response in the digital protective control apparatus and a change of the state quantity therein are analyzed by the analyzing tool on the basis of the electric quantity data for several cycles before and after the occurrence of the system accident, that is, at which the relay software modules have been operated or the breaker has been operated, whereby a cause of the accident is detected. A result of the analysis of the accident phenomenon performed by the analyzing tool can be processed so that a tester can easily understand the result of the analysis of the accident, thereby displaying the processed result of the analysis of the accident with the monitor.

Therefore, the tester visually confirms data displayed with the analyzing tool so as to confirm the state of response in the digital protective control apparatus related to the system accident. Note that a concrete example of the analyzing tool has been disclosed in the document ("Practical Digital Relay", p. 155 and p. 156, edited by Izumi Mitani, Ohm).

In the conventional digital protective control apparatus, as shown in FIG. 61, since the state quantity of the equipment device of the electric power system to be protectively controlled is received through electric quantity converters 18A and 18B, the digital protective control apparatuses which protect different equipment devices, respectively, that is, the power-transmission line protective relays 1A and 1B, the bus-line protective relay 1C and the transformer protective relay 1D, have different inputted state quantities, respectively.

Therefore, the digital protective control apparatuses for protecting different equipment devices cannot be constituted by the same hardware configuration. Thus, a control system for protectively controlling a multiplicity of types of equipment devices requires digital protective control apparatuses having individual hardware configurations for the multiplicity of the types of the devices, respectively. As a result of that, the cost of the overall system is increased, thereby deteriorating the cost efficiency of the control system.

In the electric stations each of which is provided with the digital protective control apparatus, the equipment devices arranged in protective control regions of the respective electric stations have not the same structure because of limitation of the structure of the equipment device and that of the location of the electric section.

For example, as shown in FIG. 64, a bus line 17A of an electric station 25A and a bus line 17B of an electric station 25B are connected to a power-transmission line 16 through a breaker 19A. A leading portion for leading the power-transmission line of the bus line 17B of the electric station 25B is not provided with a breaker because of the limitation of the location of the electric station 25B.

Therefore, if an accident occurs at an accident point F1 on a power-transmission line 16, digital protective control apparatuses 26A and 26B fundamentally detect the accident in accordance with change of the state quantity flowing in the power-transmission line 16 through the electric quantity converters 18A,18A so as to supply a tripping command to the breaker whereby to quickly separate the accident region from normal regions.

However, in the above-mentioned structure shown in FIG. 64, a breaker is not provided at the leading portion for leading the power-transmission line of the bus line 17B in the electric station 25B. Therefore, the digital protective control apparatus 26A in the electric station 25A transmits a tripping command to the breaker 19A to perform the protective control operation through the breaker 19A.

On the contrary, a digital protective control apparatus 26B in the electric stations 25B forwards (transmits) a breaker tripping command (interruption command) to a digital protective control apparatus 26C in the electric station 25C for protecting a next region.

Therefore, in response to the forwarding interruption command, the digital protective control apparatus 26C outputs a tripping command to the breaker 19B so that the accident region is separated from normal regions.

That is, the digital protective control apparatus 26B must have a circuit (or a process) for outputting the forwarding interruption command to a digital protective control apparatus 26C for protectively controlling the next region. Therefore, the digital protective control apparatus 26A and the digital protective control apparatus 26B cannot be constituted by the same hardware configurations.

The digital protective control apparatus 26C must have a circuit for receiving the forwarding interruption command so as to output the tripping command to the breaker 19B. Therefore, the foregoing apparatus cannot be structured by the same hardware configuration as those of the digital protective control apparatus 26A and that of the digital protective control apparatus 26B.

If the equipment devices for constituting the electric power system in each electric station are different from each other, digital protective control apparatuses having different hardware configurations for the electric stations must be manufactured. As a result of that, the manufacturing cost of the overall control system having the multiplicity of electric stations are raised so that the cost efficiency of the control system deteriorates.

In the control system having a multiplicity of the electric stations having a multiplicity of types of equipment devices to be protectively controlled, since the hardware configurations of the digital protective control apparatuses are different from each other, software (a program) for performing the protective control operation processes, which are installed on the digital protective control apparatuses must be manufactured individually to correspond to the different hardware configurations. Therefore, the manufacturing cost of the digital protective control apparatuses are raised, causing the cost efficiency of the control system to deteriorate. Moreover, tests, operations and management of the software for the protective control operation processes, which is installed on each of the digital protective control apparatuses must be performed individually for each of the protective control apparatuses. Therefore, the cost to perform the tests, operations and the management of the software for the protective control are raised. Thus, the reliability of the software for the protective control deteriorates.

In the conventional electric power system protective control system having a plurality of the digital protective control apparatuses provided for the plural equipment devices, such as the power-transmission lines and bus lines, of the electric power system, and in the electric power system protective control system constituted by connecting the plurality of the digital protective control apparatuses through the communication network to the display/operation apparatus for the remote operational monitoring control, an operator of the remote monitoring operation of the electric power system visually confirms the electric quantity acquired by the digital protective control apparatus through the display unit of each of the digital protective control apparatuses. Therefore, the electric quantities at the same time acquired by the respective digital protective control apparatuses cannot strictly be confirmed, thereby deteriorating the reliability of the electric power system protective control system. Moreover, a multiplicity of electric quantities gained by the plural apparatuses must successively be confirmed by using a multiplicity of display units. Therefore, the burden imposed on the operator performing the visibly monitoring operation increases and the cost efficiency deteriorates due to an increase of the cost of the components of the control system.

With the conventional agent protective control system, in a case where the display/operation unit performs a fault detection process including location of an accident point in accordance with the electric quantity gained by each of the protective control apparatuses, electric quantity data {which are acquired, for example, at angular intervals of 3.75° (4.8 KHz) or 15° (1.2 KHz)} of the voltage and the electric current, which are results of the control performed by a certain protective control apparatus (a first protective control apparatus), are added to the program module so that the program module with the electric quantity data moves to a next protective control apparatus (a second protective control apparatus). The second protective control apparatus executes the transferred program module so that the electric quantity data gained by the second protective control apparatus are added to the program module. The program module with the electric quantity data moves to a next protective control apparatus (a third protective control apparatus). That is, execution of the program module, addition of the electric quantity data gained by executing the program module, and movement of the program module to a next protective control apparatus are sequentially performed for each of the protective control apparatuses. The display/operation unit performs the fault detection process in accordance with electric quantity data of each protective control apparatus added to the transferred program module.

In order to enable the display/operation unit to execute the fault detection process thereby detecting a fault of the electric power system, electric quantity data detected by the protective control apparatuses at the same timing, that is, electric quantity data precisely (for example, in $\mu s$ units or a level substantially 1 $\mu s$) synchronized with each of the protective control apparatuses must be required.

However, the conventional agent protective control system gains electric quantity data whenever the program module is moved, that is, at different timings among the protective control apparatuses. The communication network, such as a usual telephone circuit, has a possibility that transmission of communication data is delayed by tens of milliseconds to several seconds owning to a state of load on the network or noise. Therefore, it is impossible to transmit synchronizing signals to the protective control apparatuses through the communication network for the purpose of precisely synchronizing the apparatuses each other.

Therefore, in the conventional agent protective control system having the communication network through which the program module is transferred, it is hard to synchronize the electric quantity data acquired by the protective control apparatuses and difficult to accurately detect the fault of the electric power system.

From this viewpoint, in the electric station unit, by laying a signal line to individually from the communication network so as to connect the plural protective control apparatuses in the electric station to each other, it is possible to synchronize the plural protective control apparatuses in the electric station by communicating the synchronizing signals among the plural protective control apparatuses therein.

However, in the above-mentioned remote operational monitoring system, it is very hard, from a viewpoint of cost efficiency and large quantity of operation, to lay the synchronizing signal lines among the protective control apparatuses provided for the plural electric stations distributed widely. What is worse, there is apprehension that the practicality of the remote operational monitoring system excessively deteriorates.

In the conventional electric power system protective control system, such as the remote operational monitoring system, power-transmission line constants (ranging impedances) required in a case of performing, as the fault detection process, the accident determination (detection) process at which an earth fault occurs between, for example, power-transmission lines and a fault locating process for locating the accident point, are set to predetermined values calculated as a mere theory in accordance with design data of the power-transmission lines. Therefore, the electric quantity (the electric current of the power-transmission line encountered the accident) of the actual electric power system cannot be employed. Thus, there is apprehension that the set power-transmission line constants have errors so that there is a possibility that the accurate accident point cannot be located. Furthermore, the power-transmission line constants are fixed to the values which are calculated by using the mere theory. However, since the parameter, such as the electric current in the power-transmission line, for obtaining the power-transmission line constants which always vary because of an influence of variation in the weather conditions, even if the fixed power-transmission line constants are used to locate the accident point, the accuracy in locating the accident point cannot be improved.

In viewpoint of this, in a conventional electric power system protective control system, a measurement device comprised of an operating unit and an memory, which is an individual from the protective control apparatus, has been operated to measure the parameter required to calculate the power-transmission line constants from the electric power system (the power-transmission line). In accordance with the measured value, the power-transmission line constants have been operated by the measurement device.

However, the conventional method of obtaining the power-transmission line constants using the measurement apparatus requires the measurement apparatus provided individually from the protective control apparatus. Therefore, cost efficiency of obtaining the power-transmission line constant deteriorates. To obtain the power-transmission line constants, the measurement apparatus must always be provided for the electric power system (the power-transmission line or the like) to measure parameters required for the power-transmission line constants. Therefore, the power-transmission line constants cannot easily be obtained periodically or as necessary.

The conventional electric power system protective control system, such as the remote operational monitoring system, has the protective control apparatuses each having a single processing unit which performs an input/output process of data which are supplied from the display/operation unit through the communication network, a control demand analyzing process and a process for acquiring the electric quantity. However, a great processing load is required for making the input/output process of data and the control demand analyzing process, and, the process for acquiring the electric quantity from the electric power system at predetermined periods must be performed simultaneously with the input/output process and the control demand analyzing process.

That is, it is very difficult for the single processing unit to simultaneously perform all of the data input/output process through the communication network, the control requirement analyzing process and the electric quantity acquiring process. Therefore, there is apprehension that at least one of the processes is delayed and that the protective control operation for the electric power system protective control system is obstructed.

In the conventional electric power system protective control system, such as the remote operational monitoring system, input/output of data between the digital protective control apparatuses and that between each of the digital protective control apparatuses and the display/operation unit are performed through the communication network.

However, each of electric quantity acquiring devices, such as sensors in the electric power system, and each of the digital protective control apparatuses (its analog input/output interface) are connected to each other through dedicated lines. The equipment devices for operating the breakers (the external devices), such as switches, of the electric power system and each digital protective control apparatus (an I/O interface for outputting the external operation command signals with regard to the external devices) are connected to each other through dedicated lines.

Since large numbers of the electric quantity acquiring devices and the equipment devices for operating the external devices must be provided for the electric power system, the dedicated lines are increased so that the cost for providing the electric power system protective control system cannot be reduced and that a great amount of works for connecting the dedicated lines is required.

In the foregoing electric power system protective control system, the interface is established between the electric power system and the digital protective control apparatuses by the dedicated lines.

In a case where the electric quantity of an equipment device which must be protected by another digital protective control apparatus is sometimes required to be used by a certain digital protective control apparatus among a plurality of the digital protective control apparatuses, the foregoing digital protective control apparatus (a digital protective control apparatus of the root of the requirement) must acquire, through the communication network, the electric quantity fetched through the sensor and the dedicated line from the predetermined equipment device to be protectively controlled by the another digital protective control apparatus.

In this case, the demand-receiving digital protective control apparatus is continuously acquiring the electric quantity from the predetermined equipment device through the sensor and the dedicated line at predetermined periods. That is, the electric quantity (electric quantity data) which has continuously been collected must be communicated to the digital protective control apparatus of the root of the requirement through the communication network. As a result, the communication load must be subjected to a heavy communication load.

When a demand for using the electric quantity is transmitted from the digital protective control apparatus of the root of the requirement, the another digital protective control apparatus must perform a process for successively communicating, to the communication network, the electric quantity (electric quantity data) continuously collected from the electric power system through the sensor. Thus, the processing efficiency of the another digital protective control apparatus deteriorates.

The conventional digital protective control apparatus such as the digital relay, performs the tripping test having the items shown in FIG. 63. The total operation test of the tripping test is a very important test in which a system simulating apparatus is used to simulate the system fault. That is, an obtained test electric quantity produced by the simulation of the system simulating apparatus is applied to the digital protective control apparatus to confirm the total operation thereof.

Among the total operation test to which the conventional digital protective control apparatus is subjected, the system simulating apparatus simulates only the system accident (fault) which has been previously set to the system simulating apparatus. Moreover, the system model cannot accurately model the whole of the electric power system. Therefore, actual and complicated system accidents cannot completely be simulated. For example, electromagnetic induction between the two adjacent and parallel power-transmission lines cannot completely be modeled, which includes a variety of electric fields and magnetic fields acting on the power-transmission lines. Therefore, the foregoing electromagnetic induction cannot be simulated.

In recent years, an actual electric power system has been complicated, and a superimposed power flow (load flow) has been caused from enlargement of the supply and demand of the electric power. Therefore, various and complicated system accidents are expected in the actual electric power system.

However, in the conventional digital protective control apparatus, since the test electric quantity is produced from the simulations of the system accidents by the system model, the total operation test cannot be performed by using a test electric quantity similar to that based on a system accident occurring in an actual electric power system which has been complicated and has the superimposed power flow. Therefore, the reliability of the tested apparatus (the digital protective control apparatus) is reduced.

In the conventional electric power system protective control system, such as the remote operational monitoring system having the plural digital protective control apparatuses, each of the digital protective control apparatuses has the memory. The state quantity (electric quantity data) for several cycles before and after the operation timing are stored in the memory in response to the operations of the plural relay software modules or the operation of the external equipment device, such as the breaker, when the system accident has occurred (or the system accident has been simulated).

In the conventional electric power system protective control system, the protective control apparatus, which has detected an accident, acquires the electric quantity data. However, the other protective control apparatuses around (for example, adjacent) the protective control apparatus detecting the accident do not usually perform the tripping operations of the breakers, though the apparatuses detect the changes in the state quantities caused from the accident (for example, in a case where only a single relay software module has been operated). Therefore, the electric quantity data are not stored in the other protective control apparatuses. As a result, only electric quantity data stored by the protective control apparatus detecting the accident is used to perform the analyzing process for detecting the cause of the accident. Thus, a detailed cause of the accident cannot be analyzed.

As described above, the conventional electric power system protective control system cannot analyze the reaction of the digital protective control apparatus, which is not operated. Therefore, whether or not the operation of the digital protective control apparatus encounters a problem cannot be determined. As a result, if the operation of the digital protective control apparatus is erroneously not operated, the erroneous non-operation of the protective control apparatus cannot be detected. Therefore, there is apprehension that the reliability of the digital protective control apparatus, that is, the reliability of the overall control system deteriorates.

As described above, the conventional electric power system protective control system having the plurality of the digital protective control apparatuses is provided with the memory disposed in each of the digital protective control apparatuses. In response to the timing of the operations of the plural relay software modules or the operations of the breakers when the system accident has occurred, the electric quantity data indicating a state of the reaction in the apparatus and change in the state quantity are stored in the memory. Therefore, when the system accident has occurred, the electric quantity data indicating the reaction in the apparatus and the change in the state quantity are not stored in the digital protective control apparatus having the relay software modules, which are correctly not operated. Total analysis using the electric quantity (the state quantity) of the overall electric power system obtained from all of the digital protective control apparatuses when the system accident has occurred cannot be performed. Therefore, there is apprehension that the reliability of the overall control system deteriorates.

The various problems experienced with the electric power system protective control system for protectively controlling the electric power system apply to control systems for controlling plants in addition to the electric power systems, such as general industrial plants and public plants.

SUMMARY OF THE INVENTION

In view of the foregoing problems, a first object of the present invention is to provide a control system and an electric power system protective control system for using digital data (electric quantity data) on the basis of state quantities taken from a plurality of equipment devices constituting a plant, such as an electric power system, so as to control each of the equipment devices, wherein control functions are divided among the equipment devices and processing units for performing the divided functions are connected to each other through a communication network thereby improving the cost efficiency and reliability of the control system and the electric power system protective control system.

In view of the foregoing problems, a second object of the present invention is to provide a control system having a plurality of digital protective control apparatuses for controlling each of equipment devices by using digital data on the basis of state quantities taken from the equipment devices constituting a plant, such as an electric power system, which is capable of subjecting state quantities acquired by the digital protective control apparatuses to comparisons at the same time so as to improve the reliability of the control system and reduce a load which must be applied to an operator for monitoring the plant and part cost of the control system.

In view of the foregoing problems, a third object of the present invention is to provide a remote operational monitoring system, which is capable of precisely synchronizing state quantity data, such as electric quantity data, acquired by a plurality of control apparatuses with each other, without using any signal line for establishing synchronization laid among the control apparatuses (among control stations and among electric stations), thereby performing, for example, an accurate fault detection process.

In view of the foregoing problems, a fourth object of the present invention is to provide an electric power system protective control system which is capable of periodically or occasionally obtaining power-transmission line constants on the basis of an actual electric power system without using a fixed power-transmission line constant and a measurement device which is provided individually from the protective control apparatus.

In consideration of the foregoing problems, a fifth object of the present invention is to provide an electric power system protective control system which is capable of simultaneously and quickly performing a data input/output process through a communication network, a control demand analyzing process and an electric quantity acquiring process.

In consideration of the foregoing problems, a sixth object of the present invention, by establishing interface required to communicate electric quantities and operation command signals between an electric power system and a plurality of the digital protective control apparatus without using a plurality of dedicated lines, is to reduce processing loads of the communication interface for communicating data among the digital protective control apparatuses and among the digital protective control apparatus and a display/operation apparatus, and to reduce an equipment cost of the electric power system protective control system and an amount of operation works required to connect the dedicated lines.

In consideration of the foregoing problems, a seventh object of the present invention is to enable a total operation test to be performed by using the same test state quantity as that caused when a system accident occurs in an equipment device provided for an actual electric power system or the like so as to improve the reliability of each digital protective control apparatus and the reliability of the overall electric power system protective control system.

In consideration of the foregoing problems, an eighth object of the present invention is to provide an electric power system protective control system, in a case where a system accident occurs, when a relay software module or a breaker with regard to a digital protective control apparatus except for the protective control apparatus which is related to the system accident is not operated, said electric power system protective control system performing analysis of a reaction of the non-operated digital protective control apparatus so as to enable a detailed cause of a fault to be detected and a total analysis, thereby improving the reliability of the digital protective control apparatuses and that of the electric power system protective control system.

To achieve such objects, according to one aspect of the present invention, there is provided A control system for controlling a plant according to a state quantity related to the plant and inputted therefrom, said system comprising: a communication network; an input device connected to the communication network so that data communication is permitted, said input device having: means for acquiring precise time, inputting means for inputting the state quantity related to the plant therefrom, converting means for sampling the inputted state quantity according to the acquired precise time so as to convert the state quantity into digital data and first transmitting means for adding the precise time at each sampling timing to the digital data so as to transmit the digital data each having the precise time to the communication network; an opening/closing device connected to the communication network so that data communication is permitted and adapted to opening and closing a part of the plant., said opening/closing device having: means for receiving, through the communication network, a control command with respect to the opening/closing device and second transmitting means for transmitting an operating state of the opening/closing device to the communication network; and a control apparatus connected to the communication network so that data communication is permitted, said control apparatus having: means for performing a control operation process according to the digital data transmitted through the communication network and the operating state of the opening/closing device transmitted therethrough and third transmitting means for transmitting the control command through the communication network to the opening/closing device in response to a result of the control operation process of the performing means.

To achieve such objects, according to another aspect of the present invention, there is provided An electric power system protective control system for controlling an electric power system according to a state quantity related to the electric power system and inputted therefrom, said protective control system comprising: a communication network; an input device connected to the communication network so that data communication is permitted, said input device having: means for acquiring precise time, inputting means for inputting the state quantity related to the electric power system therefrom, converting means for sampling the inputted state quantity according to the acquired precise time so as to convert the state quantity into digital data and first transmitting means for adding the precise time at each sampling timing to the digital data so as to transmit the digital data each having the precise time to the communication network; an opening/closing device connected to the communication network so that data communication is permitted and adapted to opening and closing a part of the electric power system, said opening/closing device having: means for receiving, through the communication network, a control command with respect to the opening/closing device and second transmitting means for transmitting an operating sate of the opening/closing device to the communication network; and a protective control apparatus connected to the communication network so that data communication is permitted, said control apparatus having: means for performing a protective control operation process according to the digital data transmitted through the communication network and the operating state of the opening/closing device transmitted therethrough and third transmitting means for transmitting the control command through the communication network to the opening/closing device in response to a result of the protective control operation process of the performing means.

In preferred embodiment of this another aspect, said acquiring means, said converting means and said first transmitting means are constituted by a computer circuit having hardware elements including a CPU and a memory unit, said computer circuit being provided with means for self-diagnosing an operating state of the computer circuit and means for transmitting a result of the self-diagnosis performed by the self-diagnosing means to the communication network, and wherein said opening/closing device is provided with means for receiving the result of the self-diagnosis transmitted through the communication network and means for locking control of the operation of the opening/closing device in response to the result of the self-diagnosis received by the result receiving means.

This another aspect of the present invention has an arrangement that said input device and said opening/closing device are provided for plurality of electric stations, respectively, said electric stations being distributed, said acquiring means, said converting means and said first transmitting means are provided for the respective input devices of the respective electric stations, said control command receiving means and said second transmitting means are provided for the respective opening/closing devices of the respective electric stations, said control operation performing means and said third transmitting means are provided for at least one of the dispersively disposed electric stations, said communication network is composed of a first communication network in a local area constituted in each of the electric stations and a second communication network for widely connecting the dispersively disposed electric stations to each other, said converting means of each of the input devices in the electric station is adapted to sample the state quantity of its own input device at predetermined periods in accordance with the precise time acquired by the acquiring means while synchronizing the state quantities of the respective input devices with each other, and to convert the sampled state quantities into digital data, said first transmitting means of each of the input devices is adapted to add the precise time at each sampling time to each converted digital data and to transmit the digital data each having the precise time through the first communication network to the second communication network, and wherein said control operation performing means of the at least one of the electric stations has means for receiving the digital data each having the precise time of each of the input devices and the operating state of the opening/closing device transmitted through the first and second communication networks, means for time-sequentially arranging the received digital data in accordance with the precise time of each received digital data for each of the input devices and means for performing the protective control operation process in accordance with the time-sequentially arranged digital data by the arranging means.

In order to achieve such objects, according to further aspect of the present invention, there is provided an electric power system protective control system for performing an operation process in accordance with a state quantity inputted from an electric power system so as to protectively control the electric power system, said protective control system comprising: a communication network; a digital protective control apparatus connected to the communication network so that data communication is permitted, said digital protective control apparatus comprising: means for acquiring precise time, converting means for sampling the state quantity inputted from the electric power system according to the acquired precise time so as to convert the state quantity into digital data and transmitting means for adding the precise time to the converted digital data at each sampling timing so as to transmit the digital data each having the precise time to the communication network; means for receiving the digital data transmitted through the communication network, each of said digital data having the precise time and means for time-sequentially arranging the received digital data each having the precise time in accordance with the precise time of each of the received digital data.

In preferred embodiment, this further aspect further comprises display means for displaying a digital data group time-sequentially arranged by the arranging means.

In preferred embodiment, this further aspect further comprises means for generating a state quantity of a test for a digital protective control apparatus to be tested in accordance with the digital data group time-sequentially arranged by the arranging means.

For achieving such objects, according to further aspect of the present invention, there is provided an electric power system protective control system comprising: a plurality of digital protective control apparatuses for protectively controlling an electric power system; a communication network for connecting the digital protective control apparatuses to each other so that data communication is permitted, each of said digital protective control apparatuses having: means for acquiring precise time, converting means for sampling a state quantity related to a first equipment device of the electric power system at predetermined periods in accordance with the precise time acquired by the acquiring means so as to convert the sampled state quantities into digital data, said first equipment device being an object for protectively control of the corresponding digital protective control apparatus, first judgement means for judging whether or not the first equipment device is faulty based on the converted digital data so as to perform a protective control operation process according to a result of the judgement of the first judgement means, second judgement means for judging whether or not the first equipment device and a second equipment device of the electric power system are faulty based on the converted digital data, said second equipment device being not object for protective control of the corresponding digital protective control apparatus; recording means for, when the judgement of the second judgement means is made that at least one of the first and second equipment devices is fault, adding the precise time to the converted digital data at each sampling timing so as to record the digital data each having the sampled precise time, and means for transmitting the digital data recorded by the record means to the communication network, said transmitted digital data having the sampled precise time; receiving means connected to the communication network for receiving the digital data transmitted through the communication network from each of the digital protective control apparatuses, each of said received digital data having the precise time; and arranging means for time-sequentially arranging the received digital data according to the sampled precise time thereof for each of the digital protective control apparatuses.

In order to achieve such objects, according to still further aspect of the present invention, there is provided an electric power system protective control system comprising: a plurality of digital protective control apparatuses for protectively controlling an electric power system; and a communication network for connecting the digital protective control apparatuses to each other so that data communication is permitted, each of said digital protective control apparatuses having: means for acquiring precise time; converting means for sampling a state quantity related to an equipment device of the electric power system at predetermined periods in accordance with the precise time acquired by the acquiring means so as to convert the sampled state quantities into first digital data, said equipment device being an object for protective control of the corresponding digital protective control apparatus; transmitting means for adding the precise time at each sampling timing to each first converted digital data so as to transmit the first digital data each having the precise time to the communication network; means for receiving second digital data having the precise time transmitted from the transmitting means of at least one of other digital protective control apparatuses through the communication network; arranging means for time-sequentially arranging the received second digital data in accordance with the precise time of each second received digital data; and means for performing a protective control operation process by using one of the first digital data converted by the converting means and the second digital data time-sequentially arranged by the arranging means.

For achieving such objects, according to still further aspect of the present invention, there is provide an electric power system protective control system comprising: a plurality of protective control apparatuses adapted to perform a protective control operation process according to a state quantity related to an electric control system for protectively controlling the electric power system, respectively, said control apparatuses being distributed; and a communication network by which the protective control apparatuses are connected to each other so that data communication is permitted, each of said protective control apparatuses comprising: means for acquiring signals at substantially constant periods; collecting means for sequentially sampling the state quantity related to the electric power system at a same timing as a timing of another protective control apparatus in accordance with the periodic signals acquired by the acquiring means so as to collect digital data; and storage means for adding time at each sampling timing based on the periodic signals to the collected digital data so as to sequentially store the digital data each having the time.

This still further aspect of the present invention has an arrangement that said acquiring means is composed of means for acquiring precise time and the time at each sampling timing is precise time at each sampling timing.

This still further aspect of the present invention has an arrangement that further comprises a monitor/control unit connected to the communication network and adapted to remotely monitor and control an operation state of the protective control apparatuses, wherein each of said protective control apparatuses is provided with means for performing a protective control operation process based on the digital data so as to determine whether or not abnormal data is detected and means for, when the abnormal data is detected as a result of the protective control operation process, transmitting an abnormal data generation information including detection time to the display/operation unit, said abnormal-data being detected at the detection time, and wherein said monitor/control unit is provided with means for transmitting, when the abnormal data generation information including the detection time is transmitted from a predetermined protective control apparatus in the protective control apparatuses, a first program module for collecting digital data before and after the detection time to the protective control apparatuses through the communication network along a predetermined route, said first program module previously being provided in the monitor/control unit; each of said protective control apparatuses being provided with means for receiving the first program module transmitted through the communication network so as to execute the first program module and means for transmitting the digital data having the precise time before and after the detection time to the monitor/control unit in accordance with the first executed program module, said monitor/control unit being provided with means for locating a fault point related to the abnormal data according to the digital data, said digital data having the precise time before and after the detection time and being transmitted from each of the protective control apparatuses.

In preferred embodiment of this still further aspect, each of said protective control apparatuses is provided with: means for reading out predetermined precise time of precise time stored in the storing means of its own protective control apparatus together with the digital data in accordance with a second program module for measuring a power-transmission line constant, said second program module previously being provided in the monitor/control unit and being transmitted through the communication network therefrom, means for measuring the power-line transmission constant by using the digital data of the own protective control apparatus and digital data of at least one of other another protective control apparatuses, said digital data of the own-protective control apparatus being added to the predetermined precise time, means for storing the measured power-transmission line constant and means for calculating a ranging impedance related to an object for the protective control of the own protective control apparatus on the basis of the measured power-transmission line constant.

In preferred embodiment of this still further aspect, said storage means is adapted to store the digital data having the precise time in a period of time from the transmission of the abnormal-data generation information to the monitor/control unit till the transmission of the digital data having the precise time before and after the detection time to the monitor/control unit.

This still further aspect of the present invention has an arrangement that said electric power system and each of said protective control apparatuses are connected to each other through a second communication network which is different from the communication network, said state quantity related to the electric power system being supplied to each of the protective control apparatuses through the second communication network.

In order to achieve such objects, according to still further aspect of the present invention, there is provided a computer-readable storage medium storing a program code for use in a protectively control of a plant, in which the plant has an input device for inputting a state quantity related to the plant therefrom and an opening/closing device for opening and closing a part of the plant, said program code comprising: a first step of causing a computer to acquire precise time; second step of causing a computer to sample the state quantity inputted from the input device according to the acquired precise time so as to convert the state quantity into digital data; a third step of causing a computer to add the precise time at each sampling timing to the digital data so as to transmit the digital data to a communication network, said digital data each having the sampled precise time; a fourth step of causing a computer to perform a control operation according to the digital data transmitted through the communication network; a fifth step of causing a computer to transmit a control command with respect to the opening/closing device through the communication network in response to a result of the control operation of the fourth step; a sixth step of causing a computer to receive, through the communication network, the control command with respect to the opening/closing device; and a seventh step of causing a computer to control an operation of the opening/closing device according to the received control command.

For achieving such objects, according to still further aspect of the present invention, there is provided a method of protectively controlling a plant, in which the plant has an input device for inputting a state quantity related to the plant therefrom and an opening/closing device for opening and closing a part of the plant, said method comprising the steps of: acquiring precise time; sampling the state quantity inputted from the input device according to the acquired precise time so as to convert the state quantity into digital data; adding the precise time at each sampling timing to the digital data so as to transmit the digital data to a communication network, said digital data each having the sampled precise time; performing a control operation according to the digital data transmitted through the communication network; transmitting a control command with respect to the opening/closing device through the communication network in response to a result of the control operation of the performing step; receiving, through the communication network, the control command with respect to the opening/closing device; and controlling an operation of the opening/closing device according to the received control command.

As described above, according to the present invention, the control functions related to the equipment devices (the inputting/outputting devices and the opening/closing device) of the plant, such as the electric power systems, which is protectively controlled are separated from the overall control functions, such as the protective control functions of the overall control system. The separated functions are included by each of the equipment devices so that the control system, such as the electric power system protective control system, is constituted. Therefore, a common hardware configuration realizing the unit included in the same-type equipment devices can be employed, making it possible to reduce the cost of the hardware of the overall control system, such as the electric power system protective control system, and the cost of the software for performing the control operation processes. Thus, the cost efficiency can be improved and the reliability of the software for the control process can be improved.

According to the present invention, the operations of the control apparatuses can accurately be synchronized with each other by using the periodic signals, such as the precise time, making it possible to improve the reliability of the control system. In particular, the control operation process, such as the protective control operation process, can be performed by using digital data on the basis of the state quantity sampled (synchronized) with the same precise time. Therefore, it is able to perform a very accurate control process, such as the process for determining an accident. Thus, a reliable control system can be provided.

According to the present invention, even if a fault takes place in at least a portion of the hardware configuration of the device for inputting/outputting the state quantity and thus an incorrect operation control command are transmitted to the opening/closing device, the fault can be detected thanks to the self-diagnosing means. In accordance with a result of the detection, the locking means inhibits transmission of the incorrect operation control command to the opening/closing device so that the operation control is locked. Therefore, a needless operation control of the opening/closing device caused from a fault of the hardware of the device for inputting/outputting the state quantity can be prevented. As a result, it is possible to improve the reliability of the control systems, such as the electric power system protective control system.

According to the present invention, the control operations, such as the protective control operations, can be performed by using digital data having precise time obtained by adding precise time of the sampling process. Therefore, the control operation processes can be performed by using digital data acquired at distant control stations without any influence of the transmission delay occurring among the control stations (apparatuses). As a result, the reliability of the control system, such as the electric power system protective control system, can be improved.

According to the present invention, digital data having precise time on the basis of the state quantity sampled from a plurality of equipment devices of, for example, the electric power system can time-sequentially be arranged and displayed for each control apparatus in accordance with the added precise time. Therefore, a monitor for monitoring the electric power system, is able to, from each equipment device, accurately and simultaneously (at the same time) compare the sampled state quantities through each control apparatuses. As a result, the reliability of the control system, such as the electric power system protective control system, can be improved.

Moreover, state quantities sampled by each control apparatus can collectively be confirmed from each equipment device of, for example, the electric power system. Therefore, the load and complexity of the operator which is caused from the work for making the rounds the control apparatuses can be overcome. Moreover, the display unit required for each control apparatus can be omitted. Therefore, the cost efficiency can be improved and saving in labor can be realized.

According to the present invention, the state quantity to be tested can be generated in accordance with digital data having the precise time and on the basis of the actual state quantity sampled from a plurality of equipment devices of, for example, the electric power system. The state quantity to be tested can be used in the test of the tested apparatus (the protective control apparatus). Therefore, a test state quantity corresponding to a state quantity corresponding to a complicated system accident which occurs in a complicated electric power system in the form of a superimposed power flow and test state quantity corresponding to change in the power flow of the system during the day of the operation of the system, which have been difficult to be generated for the conventional technique, can significantly easily be generated so as to be used in the test. Therefore, it is possible to improve the reliability and the cost efficiency of the test for confirming the operation of the unit to be tested and the electric power system protective control system.

According to the present invention, each protective control apparatus has a function provided individually from the function of the usual processing unit for determining a fault. The individual function determines whether or not a fault occurs in an equipment device to be protectively controlled in accordance with digital data converted by the converting unit and an equipment device which is not protectively controlled. If a determination is made that a fault occurs, precise time of the sampling operation is added to the sampled digital data so as to be recorded and transmitted to the communication network, making it possible to receive the digital data transmitted through the communication network so as to be arranged. Therefore, it is possible to display the arranged state quantities and to generate the test state quantities by using the arranged state quantities. In addition, the test state quantity can be generated.

The operations for recording, confirming and analyzing of the state quantity acquired by the protective control apparatus which is correctly not operated when an accident occurs in a device to be protectively controlled and an operation confirmation test of the apparatus to be tested can be performed by using the test state quantity corresponding to the state quantity acquired by the protective control apparatus which is correctly not operated, which have been impossible for the conventional technique. Therefore, if a system accident occurs, a total analyzing process and an operation confirmation test using the state quantity of, for example, the overall electric power system obtained from all of the protective control apparatus can be performed regardless of the object to be protectively controlled. Therefore, the reliability of the overall electric power system protective control system can significantly be improved.

According to the present invention, the operation confirmation test of the protective control apparatus to be tested and the protective control apparatus which is correctly operated actually can be performed by using digital data corresponding to the state quantity of each equipment device of, for example, the electric power system without a necessity of using a system simulating unit. Therefore, it is possible to improve the reliability and the cost efficiency of the test for confirming the operation of the electric power system protective control system.

According to the present invention, the power-transmission-line constant can be measured periodically or as necessary by performing the protective control operation process using digital data on the basis of the state quantities sampled at the same time among the plural protective control apparatuses without use of a fixed power-transmission line constant and a measuring unit provided individually from the protective control apparatus. Since the ranging impedance can be calculated by using the measured power-transmission line constant and thus an accident determining process can be performed, the accuracy to detect the accident can be improved and the reliability of the electric power system protective control system can be improved. In addition, the cost of the electric power system protective control system can be reduced.

According to the present invention, one of CPU among a plurality of CPU is caused to perform a data input/output process and a process for analyzing a control demand (the program module) through the communication network. On the other hand, the other CPU is caused to perform the process for collecting digital data and the protective control operation process. Thus, the process for inputting/outputting data through the communication network, the process for analyzing the request for performing control, the process for acquiring digital data in accordance with the state quantity and the protective control operation process can easily simultaneously be performed. Therefore, the efficiency of the protective control operation of the electric power system protective control system can be improved.

According to the present invention, the communication of the state quantity and the operation command signal among the electric power system and the plural protective control apparatuses can be performed by the second communication network provided individually from the communication network for connecting the protective control apparatuses to each other. Therefore, transmission of the state quantity through the communication network for connecting the plural protective control apparatuses is inhibited to considerably reduce the process load which must be borne by the communication network. Since a multiplicity of lines for communicating signals are omitted between the electric power system and the plural protective control apparatuses, the cost of the multiplicity of the dedicated lines and the operation works required to establish the connection of the multiplicity of the dedicated line can be omitted. Therefore, it is possible to reduce the cost of the electric power system protective control system and the amount of the operation for constituting the electric power system protective control system.

BRIEF DESCRIPTION OF THE DRAWINGS

Other objects and aspects of the present invention will become apparent from the following description of embodiments with reference to the accompanying drawings in which:

FIG. 7 is a diagram conceptually showing electric quantity data having absolute time and including a plurality of parameters;

FIG. 8 is a diagram conceptually showing electric quantity data Di (t) and Dv (t) transmitted at each sampling period and stored in a RAM according to the first embodiment;

FIG. 10 is a diagram showing conceptually a table of electric quantity data sorted in accordance with the absolute time;

FIG. 12 is a diagram showing a portion of items of diagnosis, the contents of the diagnosis and a diagnosing method of a self-diagnosing unit according to the second embodiment;

FIG. 20 is a diagram conceptually showing electric quantity data having absolute time and including a plurality of parameters;

FIG. 21 is a diagram conceptually showing electric quantity data Dv (t1 to t3) transmitted at each sampling period and stored in the RAM according to the fourth embodiment;

FIG. 24 is a diagram showing status transition of electric quantities Va in the electric power system protective control system according to the fifth embodiment;

FIG. 36 is a diagram showing functional blocks of an electric power system protective control system according to a twelfth embodiment of the present invention;

FIG. 62 is a diagram showing types of operation confirmation tests for the digital protective control apparatus;

FIG. 63 is a diagram showing items of receiving test; and

DETAILED DESCRIPTION OF THE PREFERRED EMBODIMENTS

Embodiments of a control system, an electric power system protective control system and a storage medium according to the present invention will now be described with reference to the drawings.
(First Embodiment)

An electric power system protective control system according to a first embodiment of the present invention will now be described with reference to FIGS. 1 to 10.

Figure 1:
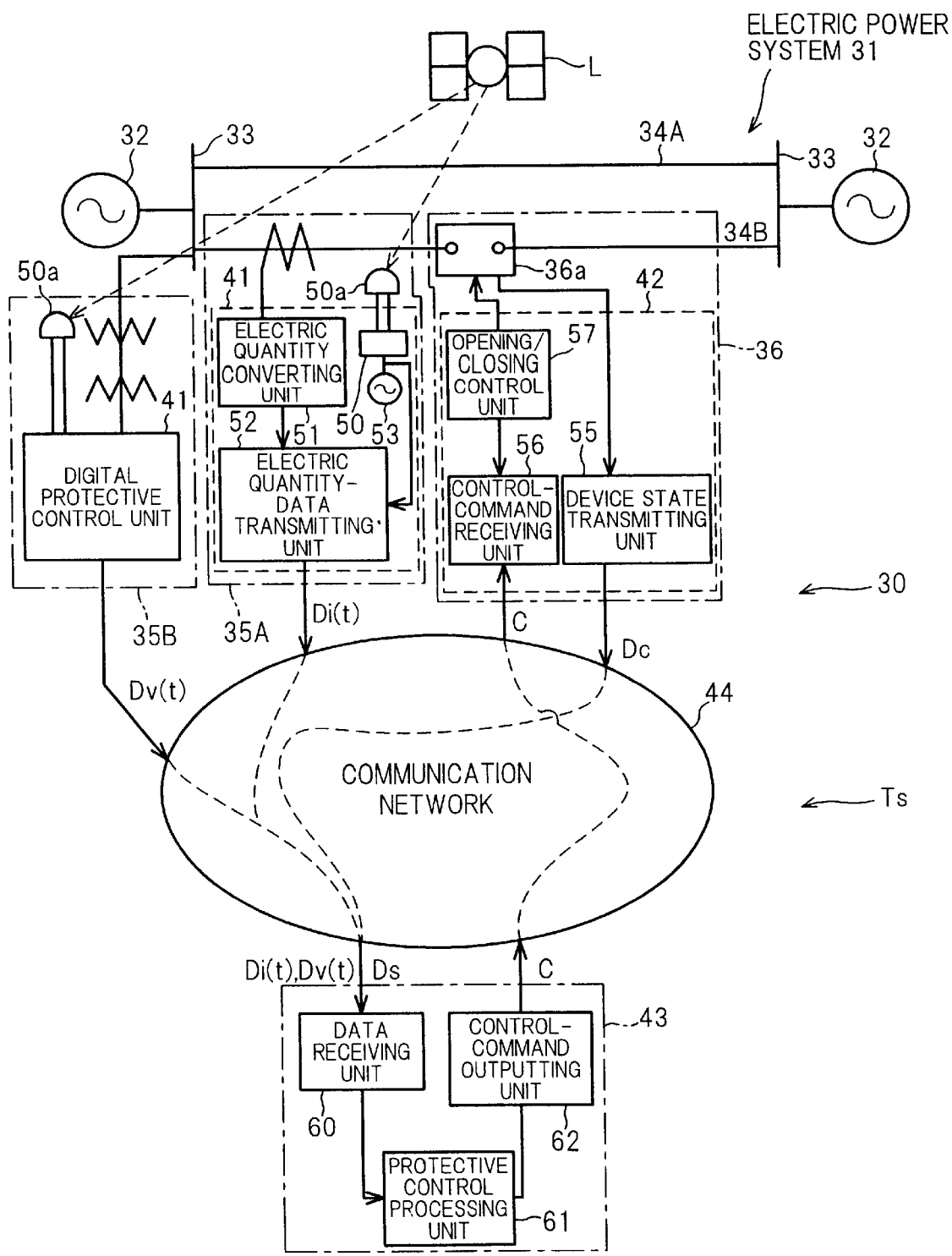
FIG. 1 is a functional block diagram showing an electric power system protective control system including a single-line connection diagram of an electric power system according to a first embodiment of the present invention.

Function blocks of the electric power system protective control system are shown in FIG. 1. The electric power system protective control system includes a single-line connection diagram of an electric power system to be protectively controlled in this embodiment.

An electric power system protective control system 30 (simply referred to "control system" hereinafter) shown in FIG. 1 has an electric power system 31 to be protectively controlled, which is provided with AC generators 32,32, bus lines 33,33 connected to the AC generators 32,32 and power-transmission lines 34A and 34B branched from the bus lines 33,33. Moreover, an electric quantity converting device 35 (a current transformer and a transformer: 35A and 35B, as electric quantity imputing/outputting device) is provided for the control system 30 which takes (inputs) electric quantities (electric currents and voltages) flowing in the bus lines 33 and the power-transmission line 34B to convert the electric quantities into electric quantity data Di and Dv. A breaker 36, as an opening/closing device, is provided for the control system 30, for protectively controlling the electric power system 31 by opening/closing the power-transmission line 34B of the electric power system 31.

The control system 30 according to this embodiment, disposed in an electric power station (transformer station) Ts for protectively controlling the electric power system 31 is constituted by separating functions of the control system 30 required for equipment devices and installing the functions in the corresponding equipment devices, respectively.

That is, the control system 30 is provided with digital protective control units 41 and 42 each of which is provided for each of the equipment devices (the electric quantity converting device 35 and the breaker 36) to perform the functions required for the equipment devices. Moreover, the control system 30 is provided with a digital protective control apparatus 43 for performing protective control operation processes in accordance with the electric quantity data Di and Dv transmitted from each of the digital protective control unit 41 so as to output data indicating control command C (control command data C, hereinafter simply called "control command C") related to protective control on the basis of a result of the processes and state data Ds transmitted from the digital protective control unit 42 of the breaker 36.

The rectifier 35A and the transformer 35B which are the electric quantity converting device 35 (transformers for instruments) having the digital protective control unit 41, the breaker 36 having the digital protective control unit 42 and the digital protective control apparatus 43 are arranged in the electric power station Ts. The digital protective control units 41–42 and apparatus 43 in the electric power station Ts are connected to each other through a communication network 44 so that data communication is permitted, whereby the electric power system protective control system 30 is constituted.

The digital protective control unit 41 provided for each of the electric quantity converters 35A and 35B (hereinafter the digital protective control unit 41 provided for the rectifier 35A will now be described) are provided, as precise time detection means for detecting and acquiring time having a predetermined accuracy {for example, a high accuracy of substantially 100 ns (0.1 $\mu$s), an accuracy about substantially several $\lambda$s and an accuracy of substantially one second}, with a GPS (Global Positioning System) receiving unit 50 for detecting the time having the high accuracy of about 100 ns (0.1 $\lambda$s). Incidentally, the expression "precise time" used herein is employed to mean "time having the predetermined accuracy" and the expression "absolute time" used herein is employed to mean "time having the high accuracy of substantially 100 ns (0.1 $\lambda$s).

The GPS receiving unit 50 has a GPS antenna 50a which receives navigation signals (navigation data which are hereinafter called "GPS signals") transmitted from a plurality of (for example, four or more) satellites L (only one satellite is shown in the drawing) on each of which an atomic clock in which oscillation periods of molecules are constant is installed. The GPS receiving unit 50 is operative to decode the GPS signals so as to obtain a three-dimensional position of the GPS antenna 50a. The GPS receiving unit 50 is also operative to, in accordance with the obtained three-dimensional position, correct a time lag so as to measure accurate absolute time t {a periodic signal indicating each timing of time and having predetermined periods (having an accuracy corresponding to the absolute time) and time data indicating time of each timing; for example, the accuracy of 100 ns}.

In the electric power system protective control system, it is preferable that the accuracy of the precise time is an accuracy of substantially 1 $\lambda$s to substantially 100 ns (0.1 $\lambda$s) which is the accuracy of the absolute time or a superior accuracy.

The digital protective control unit 41 is also provided with an electric quantity converting unit 51 for sampling an electric quantity (an electric current quantity) from the power-transmission line 34B of the electric power system 31 in accordance with the absolute time t communicated by the GPS receiving unit 50 to convert the electric quantity into digital electric quantity data (electric quantity data Di). Moreover, the digital protective control unit 41 is provided with an electric quantity-data transmitting unit 52 for adding absolute time t at which the electric quantity data Di is sampled to electric quantity data Di sampled by the electric quantity converting unit 51 so as to transmit, to the communication network 44, electric quantity data Di (t) having the absolute time. Reference numeral 53 represents an AC power source for the GPS receiving unit. The digital protective control unit 41 provided for the transformer 35B has a similar structure as that of the digital protective control unit 41 provided for the rectifier 35A except for the inputted electric quantity is the voltage and the electric quantity data Di which are indicated by electric quantity data Dv. Therefore, detailed description is omitted here.

The digital protective control unit 42 provided for the breaker 36 is provided with an device state transmitting unit 55 for transmitting a present opened/closed state of the breaker 36 (a breaking portion 36a) as state data Ds to the communication network 44; a control-command receiving unit 56 for receiving control command C outputted in accordance with a result of a protective control operation processes performed by the digital protective control apparatus 43, which will be described later; and an opening/closing control unit 57 for controlling the opening/closing operation of the breaking portion 36a of the breaker 36 in response to the control command C received by the control-command receiving unit 56.

The digital protective control apparatus 43 is provided with a data receiving unit 60 for receiving electric quantity data Di (t) and Dv (t) each having the absolute time and transmitted from the electric quantity-data transmitting unit 52 of the digital protective control unit 41 through the communication network 44. The data receiving unit 60 is also operative to receive state data Ds transmitted from the device state transmitting unit 55 of the digital protective control unit 42 through the communication network 44.

The digital protective control apparatus 43 is also provided with a protective control processing unit 61 for performing the protective control operation processes on the basis of the electric quantity data Di (t) and Dv (t) received by the data receiving unit 60 so as to judge whether or not an accident has occurred in the electric power system 31 in accordance with a result of the protective control operation processes and the state data Ds. In addition, the digital protective control apparatus 43 has a control-command outputting unit 62 for transmitting, to the communication network 44, the control command C toward the breaker 36 on the basis of the result of the protective control operation processes, that is, the result of the judgement, performed by the protective control processing unit 61.

Figure 2:
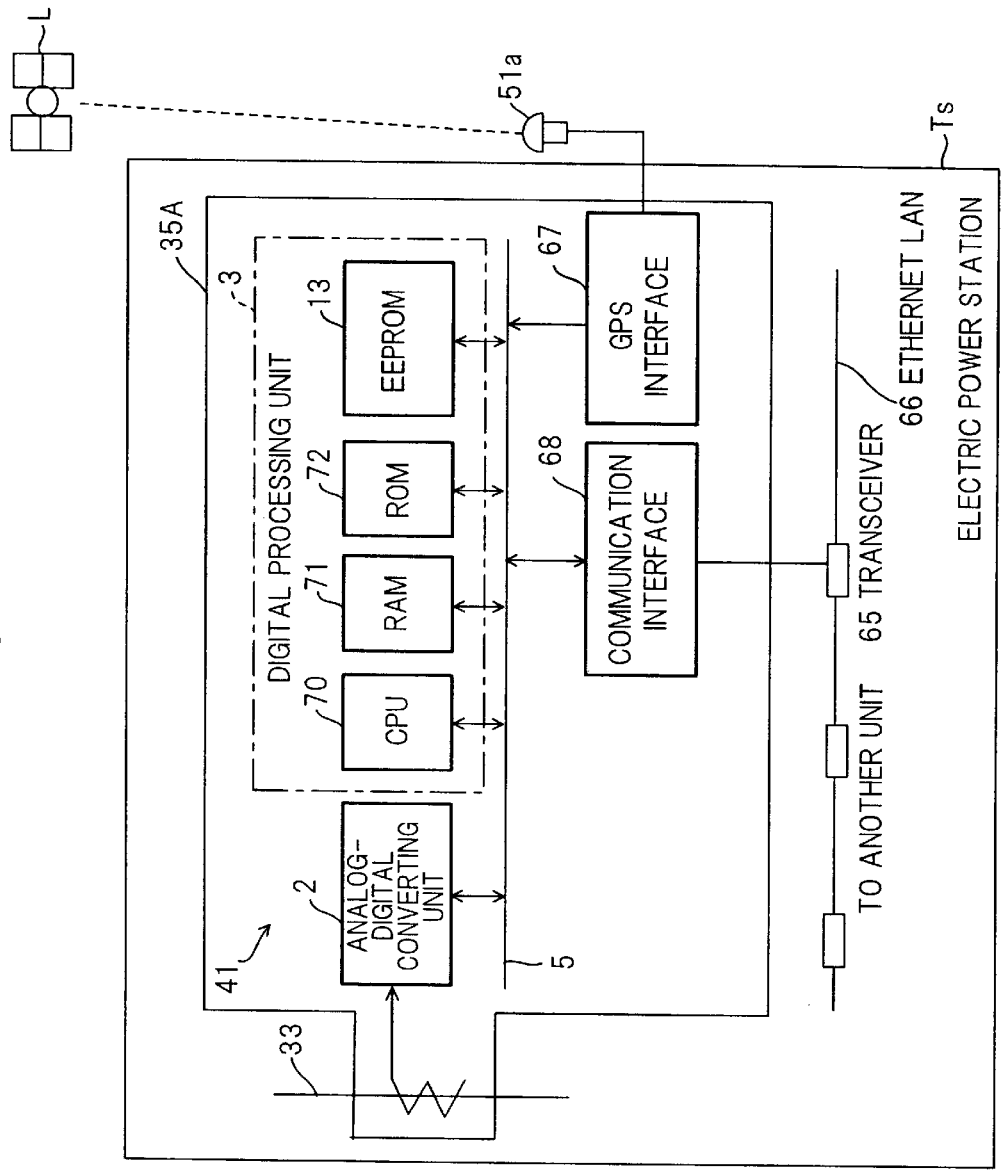
FIG. 2 is a diagram showing a hardware configuration of a digital protective control unit of a electric quantity converting device according to the first embodiment.
Figure 60:
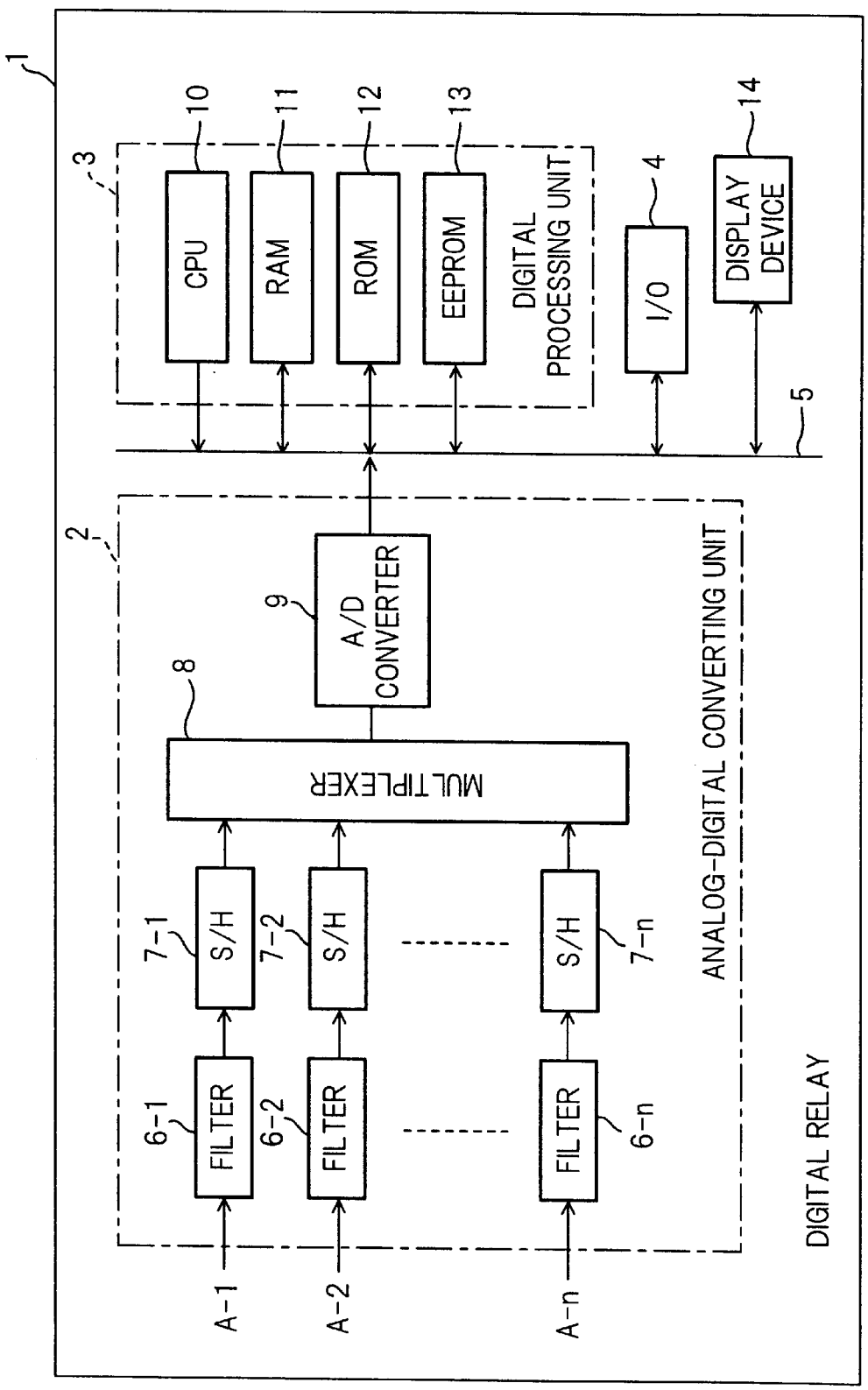
FIG. 60 is a diagram showing a basic structure of a conventional multi-input digital protective control apparatus (a digital relay)
Figure 61:
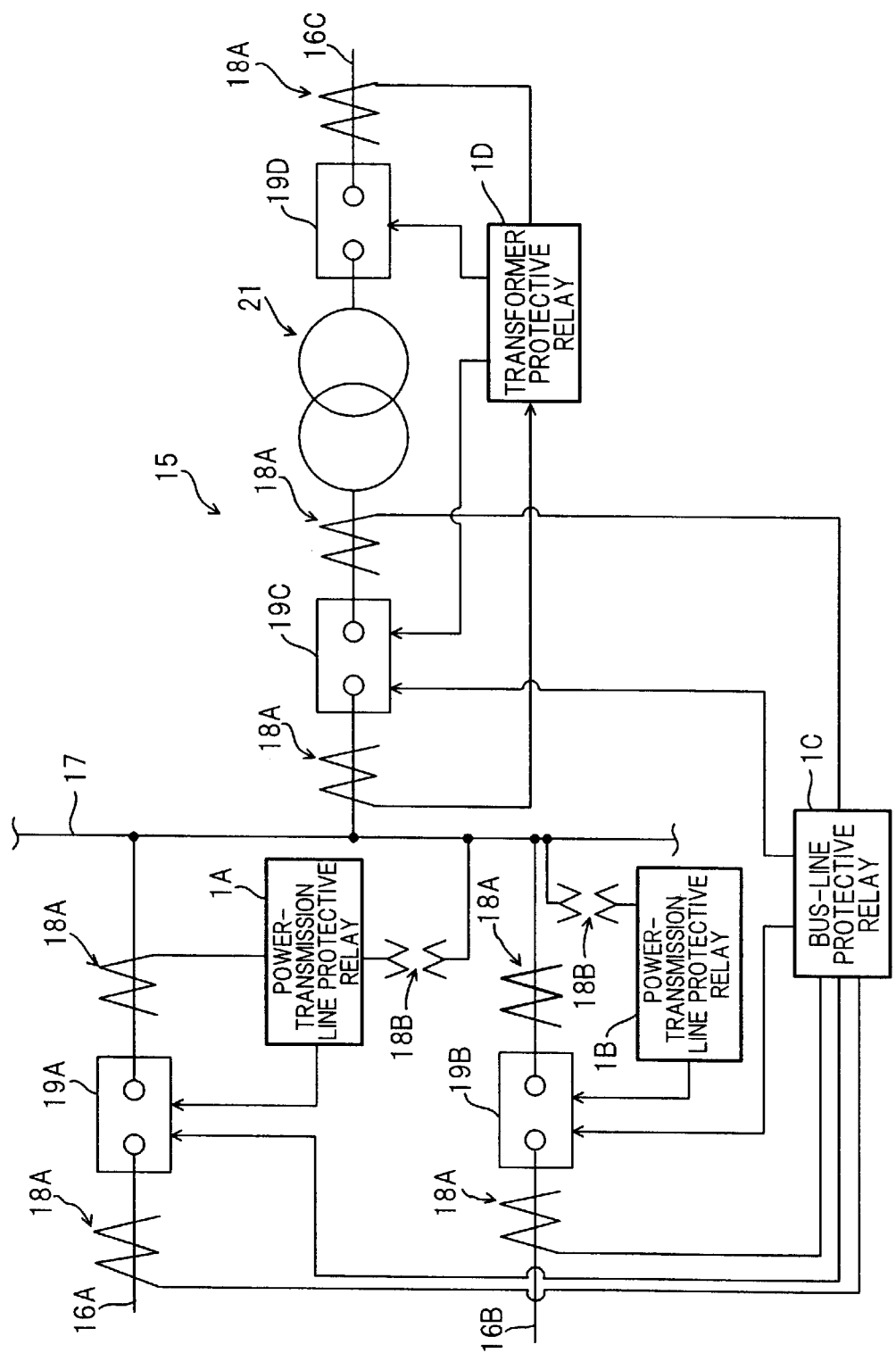
FIG. 61 is a single-line connection diagram which is used when the digital protective control apparatus (the digital relay) is disposed in a equipment device such as a power transmission line or a bus.
Figure 64:
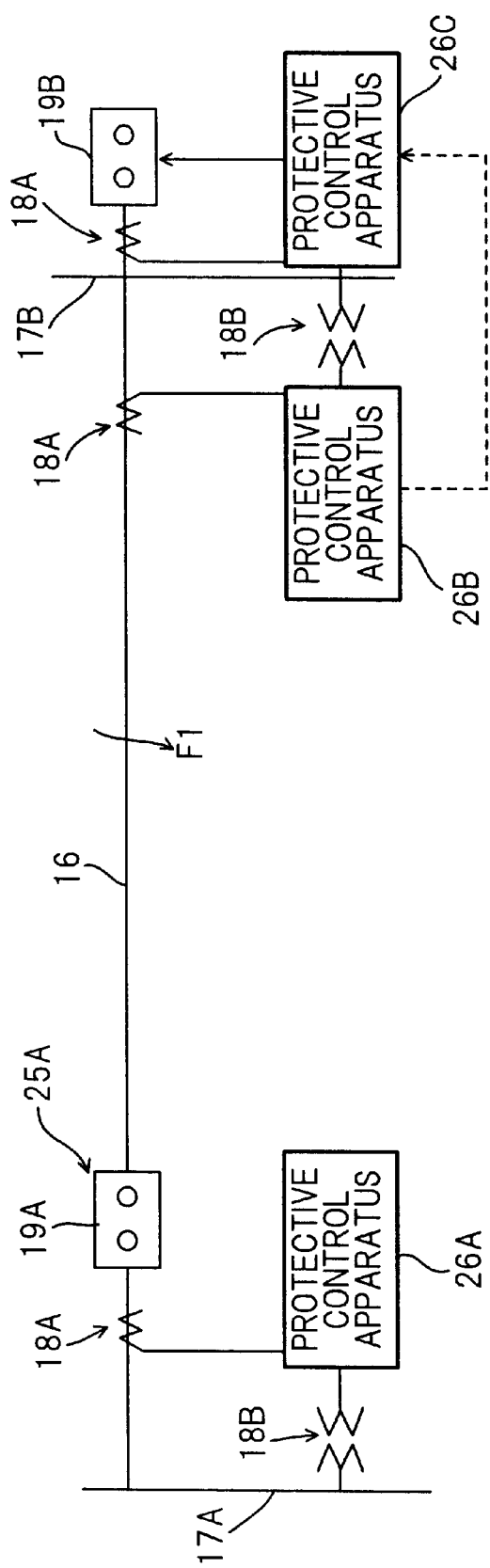
FIG. 64 is diagram showing a conventional electric power system protective control system constituted by a plurality of electric stations including an electric station in which no breaker is provided because of a limitation of location.

FIG. 2 is a diagram showing the hardware configuration for realizing the function blocks of the digital protective control unit 41 of the electric quantity converting device 35 according to this embodiment. The elements of the hardware configuration of the digital protective control unit 41 which are similar to those of the hardware of the digital protective control apparatus 1 shown in FIG. 60 are given the same reference numerals and the similar elements are omitted or simply described.

An electric quantity converter (the rectifier 35A) shown in FIG. 2 is connected to the other units (the transformer 35B, the breaker 36 and the digital protective control apparatus 43) through a transceiver 65 and an Ethernet LAN 66, which constitute the communication network 44, so that data communication is permitted with each other therethrough.

The digital protective control unit 41 of the rectifier 35A is provided with an analog-digital converting unit 2 (an analog filter, a sample hold circuit, a multiplexer and an A/D converter) for receiving the electric quantity which flows in the bus lines 33 of the electric power system 31 to convert the electric quantity into the digital electric quantity data Di; a digital processing unit 3; an I/O 4, a bus 5 for connecting the analog-digital converting unit 2 and the digital processing unit 3 so that data communication is permitted with each other through the bus 5; a GPS interface 67 for receiving the GPS signal through the GPS receiving antenna 51a to supply the received GPS signal to the digital processing unit 3 through the bus 5; and a communication interface 68 connected to the transceiver 65 of the Ethernet LAN 66 and the bus 5 and adapted to perform an interface process for permitting data input/output between the Ethernet LAN 66 and the digital processing unit 3.

The digital processing unit 3 comprises a CPU 70 for performing processes including the absolute time addition process described above, an arranging process described later and so on; a RAM 71 for temporarily storing electric quantity data and data used when the CPU 70 performs the processes; a ROM 72 for storing the procedures (program codes) of the processes including the absolute time addition process, the arranging process and the like; and an EEPROM 13. The hardware configuration of the digital protective control unit 41 in the transformer 35B is similar to that of the digital protective control unit 41 in the rectifier 35A. Therefore, the similar units are omitted from description.

The GPS receiving unit 50 shown in FIG. 1 is able to concretely be realized mainly by the GPS interface 67, the CPU 70, the RAM 71 and the ROM 72. The electric quantity-data transmitting unit 52 is able to concretely be realized by mainly the CPU 70, the RAM 71, the ROM 72, the communication interface 68, the transceiver 65 and the Ethernet LAN 66.

Figure 3:
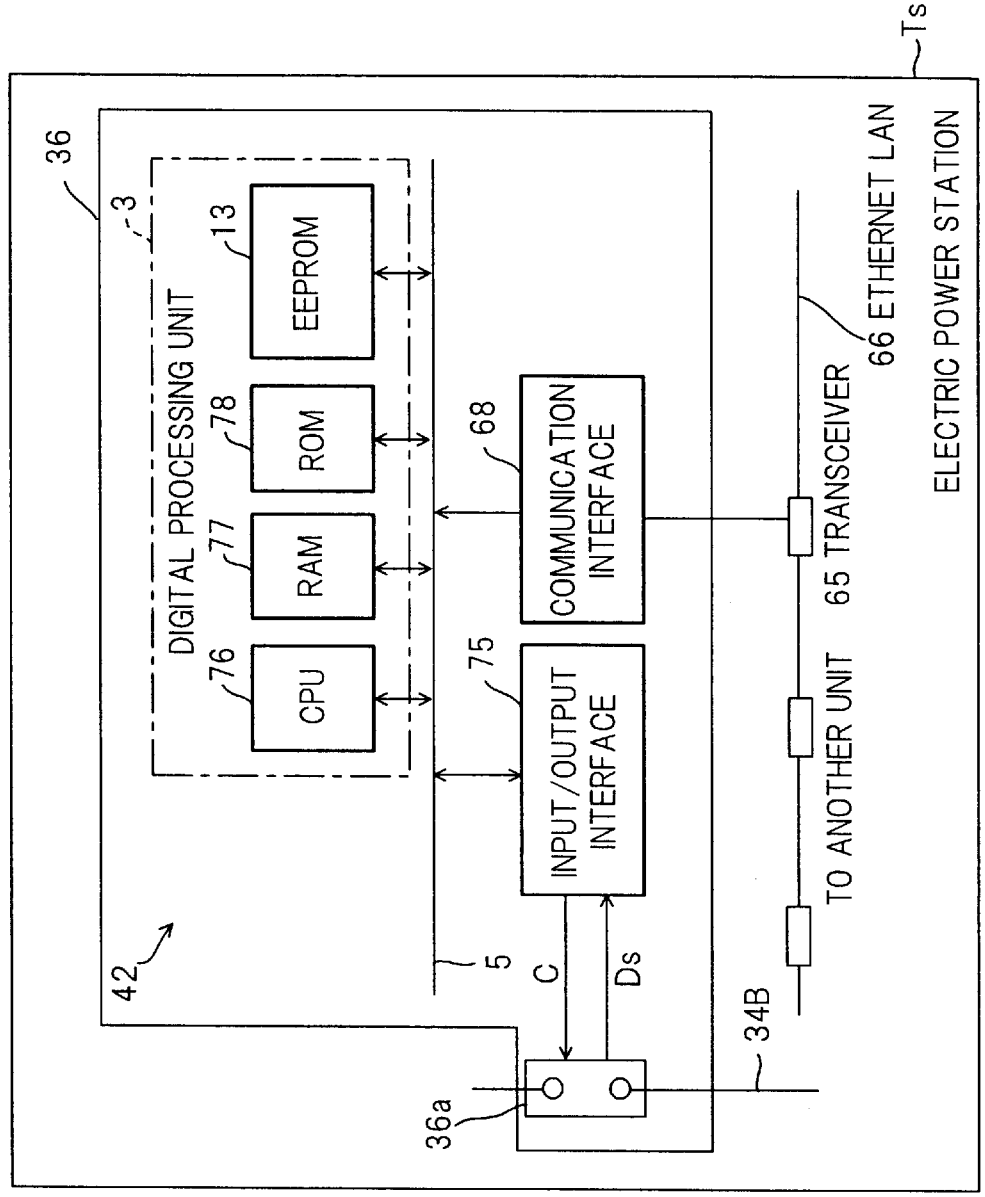
FIG. 3 is a diagram showing a hardware configuration of a digital protective control unit for a breaker according to the first embodiment.

FIG. 3 shows the hardware configuration for realizing the function blocks of the digital protective control unit 42 of the breaker 36 according to this embodiment. The elements of the hardware configuration of the digital protective control unit 42 which are similar to those of the hardware of the digital protective control unit 41 shown in FIG. 60 and those of the hardware of the digital protective control unit 41 shown in FIG. 2 are given the same reference numerals. Therefore, the similar elements are omitted from description or simply described.

The other units (the rectifier 35A, the transformer 35B and the digital protective control apparatus 43) in the electric power station Ts are connected to the breaker 36 shown in FIG. 3 through the transceiver 65 and the Ethernet LAN 66 such that data communication is permitted with each other.

In addition to the digital processing unit 3, the bus 5 and the communication interface 68, the digital protective control unit 42 of the breaker 36 is provided with an input/output interface (I/O) 75. The input/output interface (I/O) 75 transmits state data indicating a state of opening/closing of the breaking portion 36a of the breaker 36 and transmits the control command C supplied from the digital processing unit 3 to the breaking portion 36a.

The digital processing unit is provided with a CPU 76 for performing processes for reading and transmitting state data Ds and processes for receiving and transmitting the control command C; a RAM 77 for temporarily storing the state data Ds, data indicating the control command C and data for use in the processes performed by the CPU 76; a ROM 78 for storing the procedures (program codes) of the processes including the state data reading process, the state data transmitting process, the control-command receiving process and the control-command transmitting process; and the EEPROM 13.

The device state transmitting unit 55 shown in FIG. 1 is able to concretely be realized by mainly the input/output interface 75, the CPU 76, the RAM 77, the ROM 78, the communication interface 68, the transceiver 65 and the Ethernet LAN 66. The control-command receiving unit 56 is able to concretely be able to concretely be realized mainly by the communication interface 68, the CPU 76, the RAM 77 and the ROM 78. The opening/closing control unit 57 is able to concretely be realized by mainly the CPU 76, the RAM 77, the ROM 78 and the input/output interface 75.

Figure 4:
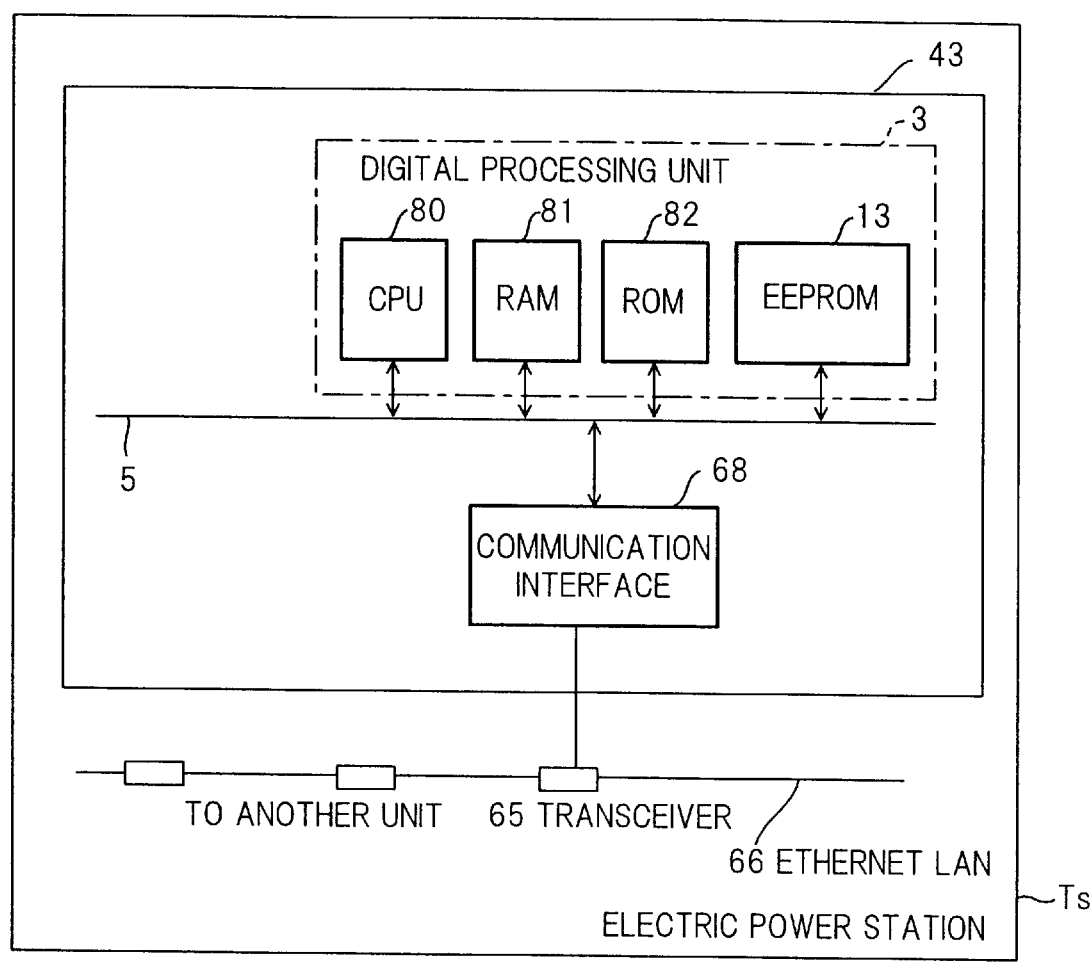
FIG. 4 is a diagram showing a hardware configuration of the digital protective control apparatus according to the first embodiment.

FIG. 4 is a diagram showing the hardware configuration for realizing the processes of the function blocks of the digital protective control apparatus 43 according to this embodiment. The elements of the hardware configuration of the digital protective control apparatus 43 which are similar to those of the digital protective control apparatus 1 shown in FIG. 60 and those of the digital protective control unit 41 shown in FIG. 2 are given the same reference numerals. The similar elements are omitted from description or described simply.

The digital protective control apparatus 43 shown in FIG. 4 is connected to the other units (the rectifier 35A, the transformer 35B and the breaker 36) in the electric power station Ts through the transceiver 65 and the Ethernet LAN 66 such that data communication is permitted with each other.

The digital protective control apparatus 43 is provided with the digital processing unit 3, the bus 5 and the communication interface 68. The digital processing unit 3 is provided with a CPU 80 for performing processes including processes for receiving electric quantity data Di (t) and Dv (t) and the state data Ds; a RAM 81 for temporarily storing electric quantity data Di (t) and Dv (t), the state data Ds, data indicating the control command C and data for use in the processes performed by the CPU 80; a ROM 82 for storing the procedures (program codes) of the processes including the processes for receiving electric quantity data and state data, the protective control operation processes (sequence software constituted by relay software modules) and the control-command transmitting process; and the EEPROM 13 in which the setting values to operate the respective relay software3 modules are stored.

The data receiving unit 60 shown in FIG. 1 is able to concretely be realized mainly by the communication interface 68, the CPU 80, the RAM 81 and the ROM 82. The protective control operation unit 61 is able to concretely be realized mainly by the CPU 80, the RAM 81 and the ROM 82. The control-command transmitting unit 62 is able to concretely be realized mainly by the CPU 80, the RAM 81, the ROM 82, the communication interface 68, the transceiver 65 and the Ethernet LAN 66.

Figure 5:
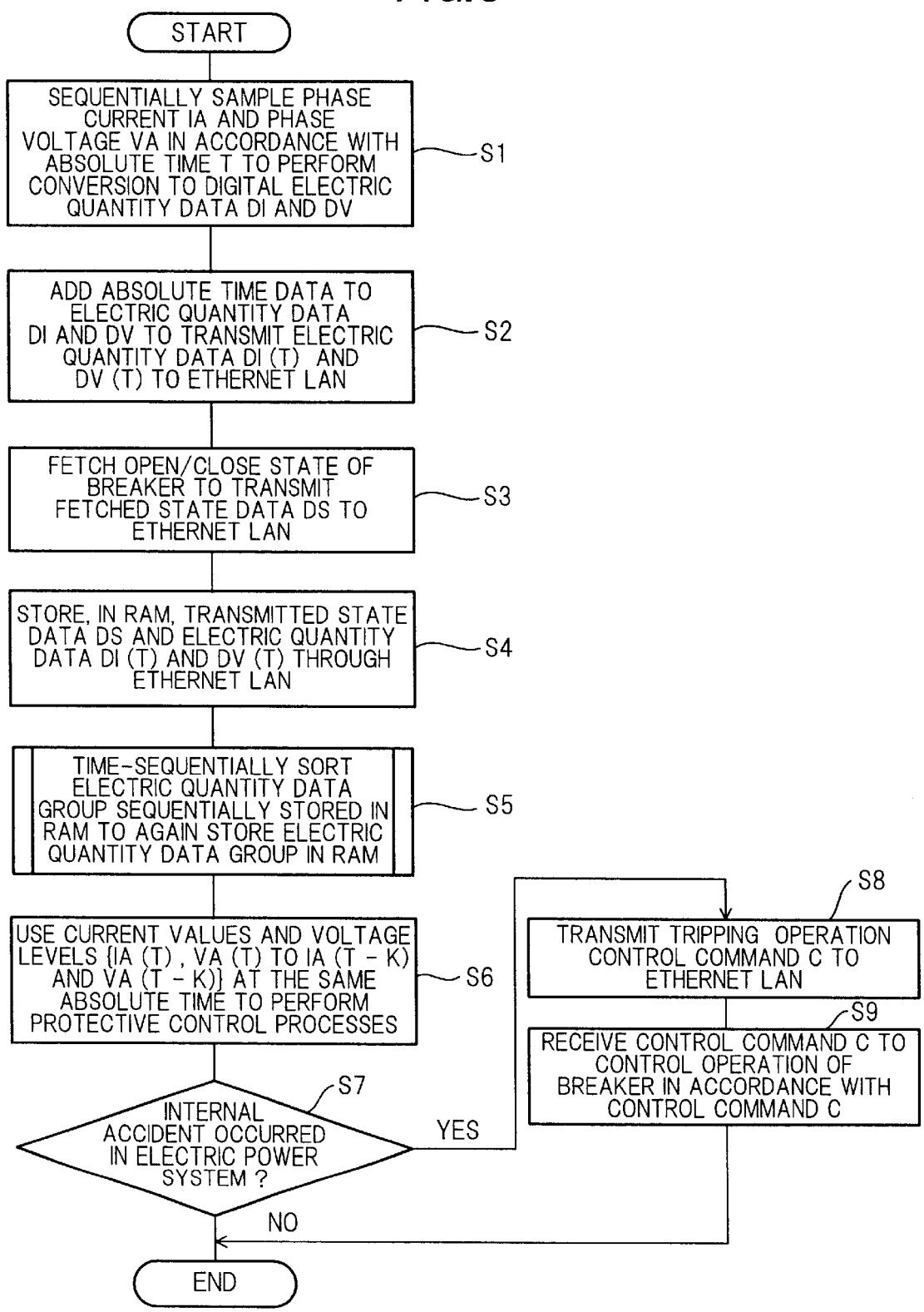
FIG. 5 is a schematic flow chart showing an example of a process of an overall operation of the electric power system protective control system according to the first embodiment.
Figure 6:
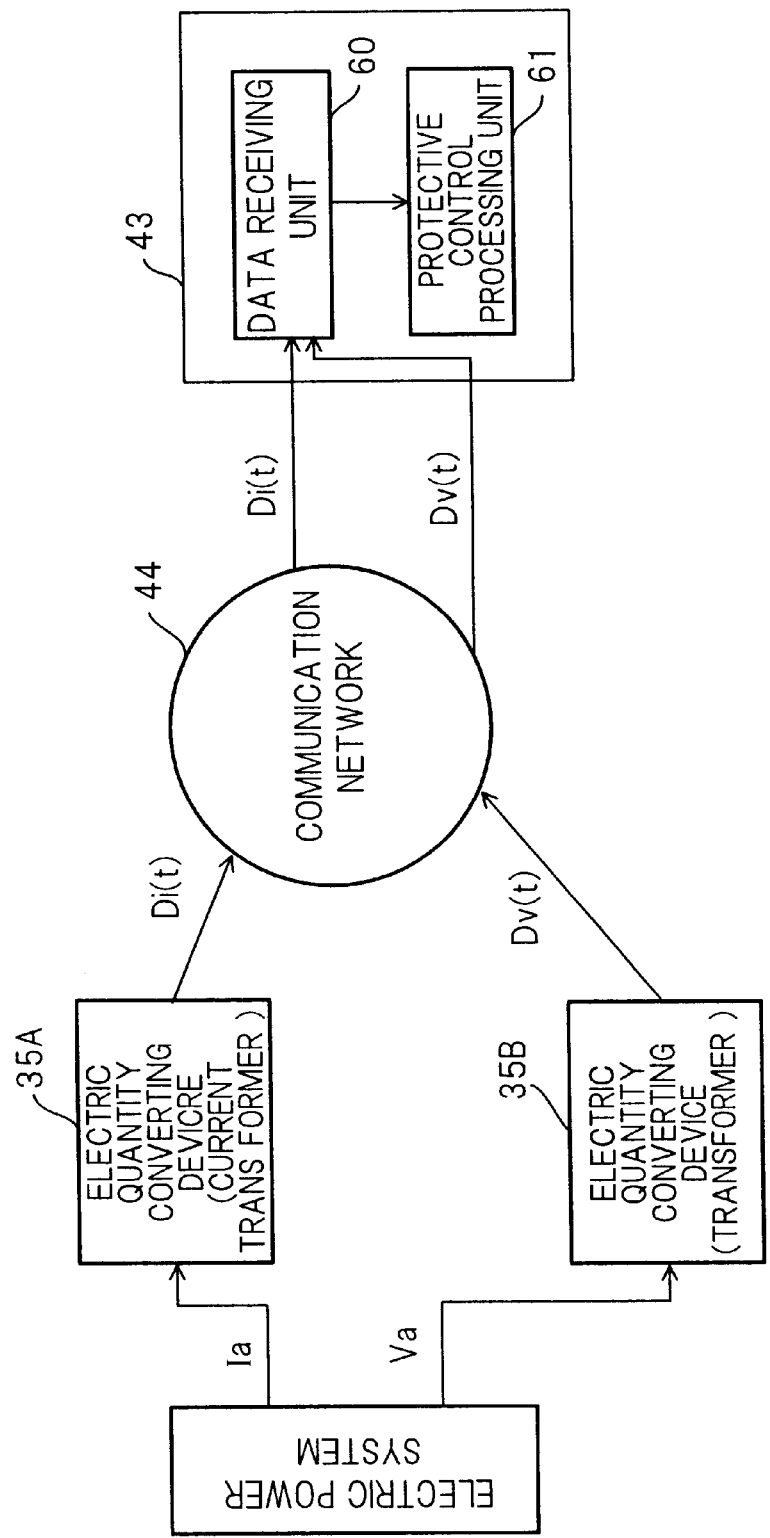
FIG. 6 is a diagram showing status transition of electric quantities (Ia, Va) in the electric power system protective control system according to the first embodiment.

With the thus-structured electric power system protective control system 30, as shown in a flow chart in FIG. 5, each CPU 70 of the digital protective control unit 41 of each of the rectifier 35A and the transformer 35B sequentially receives the GPS signals transmitted from the satellites L through the GPS receiving antenna 51a and the GPS interface 67. Thus, the CPU 70 obtains the absolute time t. In accordance with the absolute time t, the CPU 70 sets data acquiring sampling period (for example, 0.0000001 second) common to all of the devices (the rectifier 35A and the transformer 35B). As a result, the digital protective control apparatuses of the devices (the rectifier 35A and the transformer 35B) are synchronized with each other.

In accordance with the set sampling period, each CPU 70 sequentially samples phase-a current Ia (for example, 1.5 A) flowing in the power-transmission line 34B of the electric power system 31 and phase-a voltage Va (for example, 63.5 V) of the bus lines 33 through each analog-digital converting unit 2 so as to convert the sampled values into digital electric quantity data Di and Dv. Then, the CPU 70 sequentially stores, in the RAM 71, the sequentially converted electric quantity data Di and Dv (step S1 and refer to FIG. 6).

The CPU 70 of each digital protective control unit 41 adds the absolute time t of the sampling time to electric quantity data Di and Dv sampled in synchronization with the same absolute time t and stored in the RAM 71. Thus, the CPU 70 sequentially transmits electric quantity data Di (t) and Dv (t) having a data structure as schematically shown, for example, in FIG. 7 and including parameters "name of device which has acquired electric quantity", "phase of the electric quantity", "instantaneous value of the electric quantity" and "absolute time" to the Ethernet LAN 66 through the communication interface 68 and the transceiver 65 (step S2).

The CPU 76 of the digital protective control unit 42 of the breaker 36 fetches a state of opening/closing (for example, the present state is a "closed" state because of a normal state) of the breaking portion 36a through the input/output interface 75. Then, the CPU 76 transmits state data Ds indicating the "closed" state to the Ethernet LAN 66 through the communication interface 68 and the transceiver 65 (step S3).

The CPU 80 of the digital protective control apparatus 43 receives the state data Ds transmitted through the Ethernet LAN 66 through the transceiver 65 and the communication interface 68 to store the state data Ds in the RAM 81. Moreover, The CPU 80 receives the electric quantity data Di (t) and Dv (t) sequentially transmitted through the Ethernet LAN 66 through the transceiver 65 and the communication interface 68 to sequentially store the data Di (t) and Dv (t) in predetermined address ranges temporarily assigned to the RAM 81. FIG. 8 schematically shows electric quantity data Di (t) and Dv (t) transmitted at the absolute time t=44.9999997 second, 14:35, Jul. 11, 1997 at each sampling period (0.0000001 second) and stored in the RAM 81 (step S4).

Then, since the electric quantity data group sequentially stored in the RAM 81 are added to the sampling time t, the CPU 80 of the digital protective control apparatus 43 arranges (sorts) the electric quantity data group in a time sequential manner and for each protective control apparatus from, for example, former absolute time to the latest absolute time in accordance with sampling time (absolute time) t. Then, the CPU 80 again stores the electric quantity data group in addresses assigned to the RAM 81 in the form of a "table" to make a table in which electric quantity data groups are arranged in accordance with the absolute time t (step S5).

Figure 9:
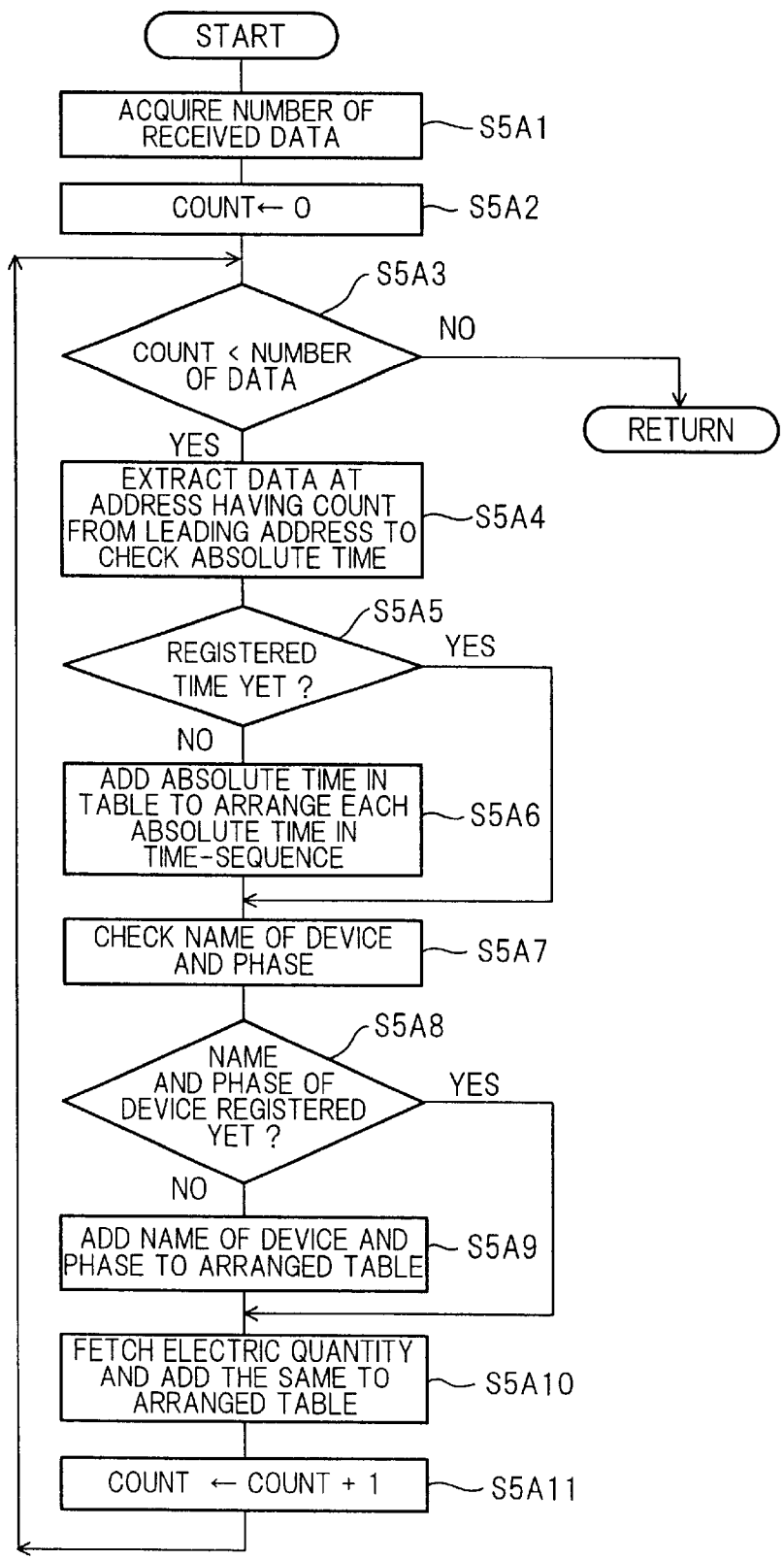
FIG. 9 is a schematic flow chart showing an example of a sub-routine process related to an arranging process included in the process of the electric power system protective control system shown in FIG. 5.

An assumption is made that electric quantity data items of the rectifier 35A and the transformer 35B having the same absolute time, that is, latest sampling data sampled at the same absolute time are (t)-th sampling data Di (t) and Dv (t). With reference to the absolute time, sampling data one time before ((t−1)-th) is sampling data Di (t−1) and Dv (t−1), (t−2)-th sampling data is Di (t−2) and Dv (t−2), . . . , (t−m+1)-th sampling data is Di (t−m+1) and Dv (t−m+1) and (t−m)-th sampling data is Di (t−m) and Dv (t−m). An assumption is made that the foregoing sampling data is randomly stored in a certain address region, the CPU 80, as shown in FIG. 9 (a sub-routine showing an arranging process) acquires the total number of data in the electric quantity data group Di (t), Dv (t) to Di (t−m) and Dv (t−m) which are sequentially stored in the RAM 81 (step S5A1). Then, a counter (a register) of the CPU 80 is initialized (the count is made to be zero)(step S5A2). Then, the CPU 80 judges whether or not the total number of data acquired in step S5A1 is larger than the initialized count (0) (the number of data>count)(step S5A3). If a negative judgement is made, that is, if the total number of data is equal to or larger than the initialized count (0), the CPU 80 completes the sub-routine process for the arranging process, and the operation is returned to a main process.

If an affirmative judgement is made in step S5A3, that is, if the total number of data is larger than the initialized count (0), the CPU 80 extracts the electric quantity data included in the electric quantity data group Di (t) and Dv (t) to Di (t−m) and Dv (t−m), wherein the extracted electric quantity data is stored at an address having the count from a leading address. At present, the electric quantity data is stored in a 0-th address, that is the leading address itself because the count is zero.

Then, the CPU 80 checks the absolute time of the extracted electric quantity data (step S5A4) so as to judge whether or not the confirmed absolute time is registered in the table (step S5A5). If an affirmative determination is made, that is, if the absolute time (t−k) of the extracted electric quantity data Di (t−k) is registered, the operation of the CPU 80 proceeds to a process in step S5A7 described later.

Since the electric quantity data stored in the leading address is first electric quantity data and thus the same is registered in the table, the CPU 80 judges that the absolute time (t−k) of electric quantity data Di (t−k) is not been registered in that table (a negative determination is made in step S5A5). The operation proceeds to a next step.

The CPU 80 makes a comparison between the absolute time (t−k) of the electric quantity data Di (t−k) and absolute time {t, t−1, . . . , t−(k−1), t−(k+1), . . . , t−m} of the electric quantity data group registered in the table. In accordance with each absolute time in the table, the CPU 80 adds the absolute time (t−k) in the table so as to arrange each absolute time in time sequence from oldest absolute time to newest absolute time. Since, at this time, the added electric quantity data is the first newest electric quantity data, the absolute time (t−k) is registered in the uppermost portion of the table (step S5A6).

The CPU 80 checks the name of the device and the phase included in the electric quantity data Di (t−k) (step S5A7) to judge whether or not the name and the phase are already registered (step S5A8). If affirmative determination is made, that is, if the name (the rectifier 35A) in the electric quantity data Di (t−k) is already registered, the operation of the CPU 80 is shifted to step S5A10 described later.

Since, at present, the electric quantity data is first electric quantity data stored in the leading address at this time, the name of the electric quantity data is not registered yet in the table. Therefore, the CPU 80 judges that the name (the rectifier 35A) of the devise in the electric quantity data Di (t−k) is not registered yet in the table (a negative judgement is made in step S5A8). Thus, the operation proceeds to a next step.

The CPU 80 adds the name (the rectifier 35A) of the device included in the electric quantity data Di (t−k) to the portion for the absolute time (t−k) (step S5A9). Then, an electric quantity (an instantaneous value) of the electric quantity data Di (t−k) is fetched to be registered to the portion for the absolute time (t−k) in correspondence with the name of the device (step S5A10).

The CPU 80 increments the count of the counter by one (one is added to the count)(step S5A11). Then, the operation is returned to the process in step S3 so that electric quantity data {for example, Dv (t−k)} stored at an address having the incremented count (a first address) from the leading address is subjected to the above-mentioned processes.

In the processes in steps S5A3 to S5A11 in which the CPU 80 processes Dv (t−k), the absolute time (t−k) is already registered in the table. Therefore, an affirmative determination is made in step S5A5. Thus, the process in step S5A6 is skipped. As a result of the processes in steps S5A7 to S5A10, the name of the device (the transformer 35B) in the electric quantity data Dv (t−k) and the electric quantity are added to the portion of the absolute time (t−k).

A case will now be considered in which electric quantity data Di (t−m) having the absolute time {for example, (t−m)<(t−k)}, which is different from the absolute time (t−k) registered in the table is fetched. In this case, a negative judgement is made in step S5A5. Thus, an arranging process (a sorting process) between the absolute time (t−m) and absolute time (t−k) is performed. Since (t−m)<(t−k) at present, the absolute time (t−m) is moved to the uppermost portion so as to be registered in the table. Thus, the absolute time (t−k) is added next to (t−m) so as to be registered in the table.

If the count of the counter is the same as the number of data in the electric quantity data group, a negative determination is made in step S5A3. Thus, the CPU 80 completes the sub-routine in the arranging process so as to return the operation to the main process.

Thus, as shown in FIG. 10, the electric quantity data groups Di (t), Dv (t) to Di (t−m) and Dv (t−m) are formed, in accordance with the absolute time, into a table in which instantaneous values including from the latest sampled electric quantity data Di (t) and Dv (t) to the electric quantity data Di (t−m) and Dv (t−m) sampled most previously every name of the device, as shown in FIG. 10. The formed table is stored in the RAM 81.

Then, the CPU 80 uses instantaneous values {ia (t), va (t) to ia (t−m) and va (t−m)} of electric quantity data Di (t) and Dv (t) to Di (t−m) and Dv (t−m) at the same absolute time stored as the table in the RAM 81 so as to perform the protective control operation processes. Thus, the CPU 80 judges whether or not an accident occurs in the electric power system 31.

If sorting is performed such that m=4, that is, until sample data four times before present sample data, the CPU 80 performs the protective control operation processes on the basis of a known equation (1) below (step S6). In accordance with a result of the processes, the CPU 80 judges whether or not an accident is occurred in the electric power system 31 (step S7).

$$(Z1+Z2)\{ia(t-1)\cdot va(t-3)-ia(t-1)\cdot va(t)\} - Z1Z2\{ia^2(t-1)+ia^2(t-4)\} - \{va^2(t)+va^2(t-3)-k0>0 \quad (1)$$

where Z1, Z2 and k0 are constants.

That is, the CPU 80 judges whether or not the Equation (1) showing a result of the protective control operation processes is held. If the Equation (1) is not satisfied (if a negative determination is made in step S7), the process is completed.

If an affirmative determination is made in step S7, that is, if a judgement is made that an accident is occurred in the electric power system 31, the CPU 80 makes a reference to the state data Ds stored in the RAM 81. On the basis of the contents (the "closed" state), the CPU 80 transmits, to the Ethernet LAN 66, a tripping operation control command (a command to cause the breaker to perform an "opening operation") C through the communication interface 68 and the transceiver 65 (step S8).

The CPU 76 of the breaker 36 receives, through the transceiver 65 and the communication interface 68, the control command C transferred through the Ethernet LAN 66. In accordance with the received control command C, the CPU 76 causes the breaking portion 36a of the breaker 36 to be operated from "close" state to "open" state. Then, the operation is completed (step S9).

As a result, the breaking portion 36a of the breaker 36 is "opened" so that the tripping operation is performed. Thus, the portion of the electric power system 31 encountered the accident is separated so that the electric power system 31 is protected.

As described above, according to the electric power system protective control system according to this embodiment, the control functions of the equipment devices (the electric quantity converting device and the breaker) constituting the electric power system 31 are separated from the electric power system protective control functions of the overall system. Moreover, the digital protective control units 41 and 42 for performing the functions are provided for each of the equipment devices (the electric quantity converting device and the breaker). Thus, the overall control function of the electric power system 31, such as the protective control operation processes, is collectively performed by one digital protective control apparatus, such as the digital protective control apparatus 43. Therefore, a common hardware configuration can be employed by the digital protective control units provided for the same devices.

That is, the hardware configuration of the digital protective control unit 41 included in the electric quantity converting device 35 can be made such that a common portion for inputting analog electric quantity is employed. Moreover, in the hardware configuration of the digital protective control unit 42 included in the breaker 36, a common portion for transmitting an operation control command to the breaker 36 can be employed.

Therefore, the cost of the overall hardware of the electric power system protective control system can be reduced and the cost efficiency thereof can be improved.

The digital protective control units having the common hardware configuration are able to use the common software (the common program codes) for the control operation processes installed on each of the digital protective control units. Therefore, the manufacturing cost of each digital protective control unit can be reduced and the overall cost efficiency thereof can be improved. In addition, the test, the operation and the administration of the software for the control operation processes, which is installed on each of the digital protective control units can collectively be performed for each of the common digital protective control units of the equipment devices. Therefore, the costs of the test, the operation and the administration of the software for the control operation processes can be reduced so that the reliability of the software therefor can be improved.

In the electric power system protective control system according to this embodiment, absolute time t of sampling is added to electric quantity data. Therefore, electric quantity data sampled at the same time can be used to perform the protective control operation processes using Equation (1) so as to perform the accident determining process. As a result, a reliable protective control system can be provided.

(Second Embodiment)

An electric power system protective control system according to a second embodiment of the present invention will now be described with reference to FIGS. 11 and 12.

Figure 11:
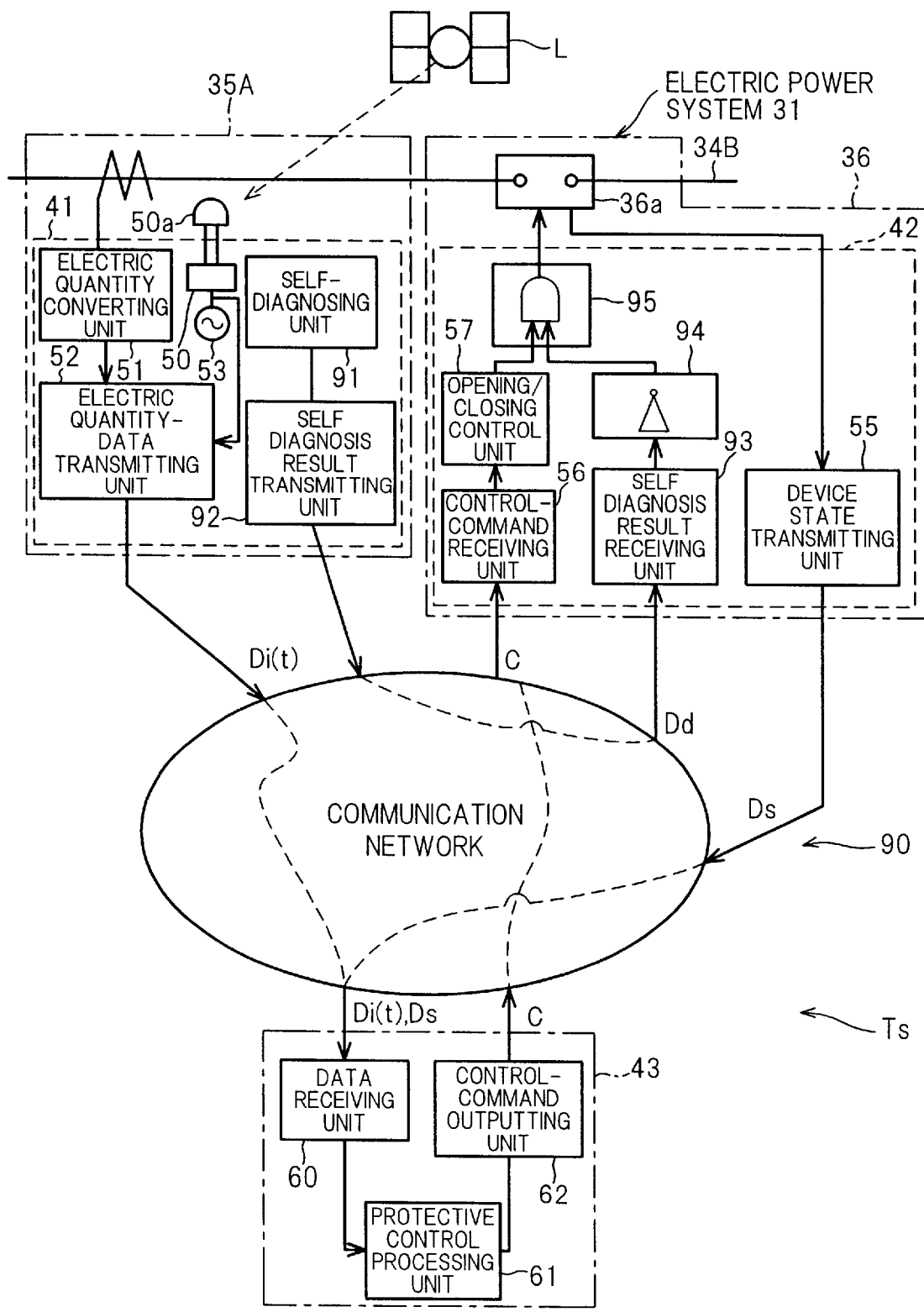
FIG. 11 is a functional block configuration diagram showing an electric power system protective control system including a single-line connection diagram of an electric power system according to a second embodiment of the present invention.

Function blocks of the electric power system protective control system is shown in FIG. 11 which includes a single-line connection diagram of an electric power system which must be protected by the structure according to this embodiment. Only a portion of the electric power system 31 (the power-transmission line 34B, the rectifier 35A and the breaker 36) is shown in FIG. 11 to simply describe the structure.

The hardware configurations of the digital protective control unit 41 and the digital protective control unit 42 included in each of the equipment devices (the rectifier 35A and the breaker 36) and the function block configuration and the hardware configuration of the digital protective control apparatus 43 are the same as those shown in FIGS. 1 and FIGS. 2 to 4. Therefore, the same structures are omitted from description.

An electric power system protective control system 90 shown in FIG. 11 is provided with the digital protective control unit 41 provided for the rectifier 35A. The digital protective control unit 41 is provided with a self-diagnosing unit 91 for checking in the hardware configuration shown in FIG. 2 the operation {the channel switching function and A/D conversion accuracy of the multiplexer (MPX)} of the analog-digital converting unit 2, checking reading and writing of data to and from the RAM 71 and checking reading of data in the program code stored in the ROM 72. As described above, the self-diagnosing unit 91 self-diagnoses whether or not a fault has occurred in the hardware elements constituting the digital protective control unit 41 by the process performed by the CPU 70. Moreover, the digital protective control unit 41 is provided with a self diagnosis result transmitting unit 92.

If a determination is made as a result of the self-diagnosis performed by the self-diagnosing unit 91 that a fault has occurred in a certain hardware element, the self diagnosis result transmitting unit 92 is adapted to transmit the result of the faulty state to the communication network 44 as self-diagnosis result data Dd. The self diagnosis result transmitting unit 92 is able to concretely be realized mainly by the processes which are performed by the CPU 70, the communication interface 68, the transceiver 65 and the Ethernet LAN 66.

FIG. 12 shows a portion of factors, contents and methods of the diagnosis which are performed by the self-diagnosing unit 91. The self-diagnosis is a known operation which has been performed by the conventional digital relay (the digital protective control apparatus).

Therefore, only one example will now be described and detailed description is omitted here.

When self-diagnosis of, for example, the RAM 71 is performed, the CPU 70 writes data R1 having a predetermined value at each address in the RAM 71.

Moreover, the CPU 70 read data R2 stored at the address to determine whether or not R1=R2 is satisfied at all of addresses. If R1=R2 is not satisfied at least one address, a determination is made that a fault has occurred in the RAM 71. The other functional block configurations of the digital protective control unit 41 provided for the rectifier 35A are similar to those of the digital protective control apparatuses 41 shown in FIG. 1. Therefore, similar structures are omitted from description.

The digital protective control unit 42 provided for the breaker 36 is provided with a self diagnosis result receiving unit 93 for receiving the self-diagnosis result data transmitted from the self diagnosis result transmitting unit 92 through the communication network 44 so as to transmit the digital data indicating logical value "1". Moreover, a NOT logical unit 94 is provided in the control unit 42 for inverting (NOT) digital data indicating the logical value "1" transmitted from the self diagnosis result receiving unit 93 to output digital indicating logical value "0". Furthermore, an AND logical unit 95 is provided in the control unit 42 for executing a logical AND of control command C transmitted from the opening/closing control unit 57 and digital data transmitted from the NOT logical unit 94 so as to output a result of the AND execution to the breaking portion 36a of the breaker 36. The other functional block configurations of the digital protective control unit 42 of the breaker 36 are similar to those of the digital protective control unit 42 shown in FIG. 1. Therefore, the similar structures are omitted from description.

Figure 13:
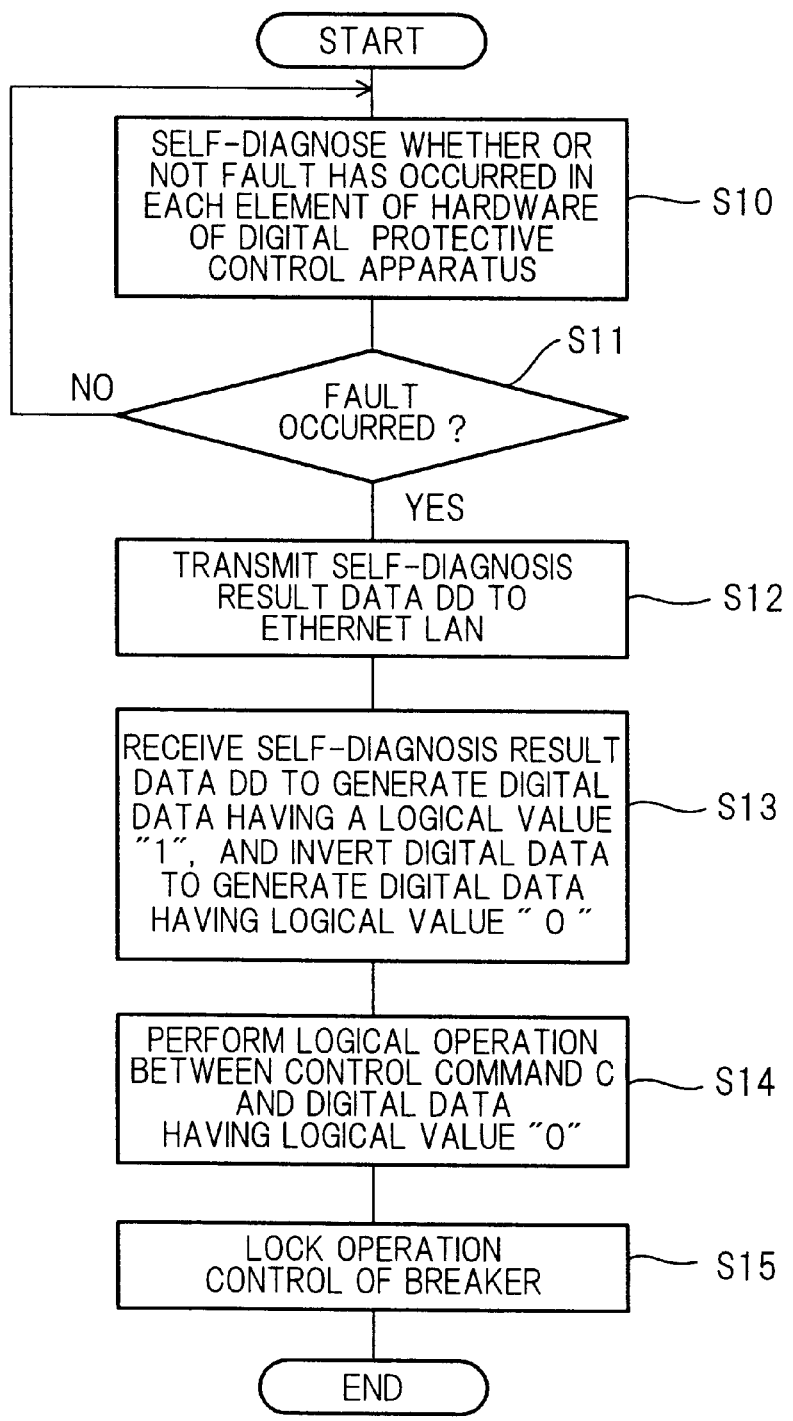
FIG. 13 is a schematic flow chart showing an example of a process of the electric power system protective control system according to the second embodiment.

That is, the CPU 70 of the digital protective control unit 41 of the electric quantity converting device 35 (the rectifier 35A) performs a self-diagnosing (self-inspecting) process simultaneously and in parallel with the absolute-time adding process performed in step S2 in FIG. 5, the self-diagnosing process being a process for checking whether or not a fault has occurred in each of the elements (the analog-digital converting unit 2 the RAM 71, the ROM 72 and the like) of the hardware of the digital protective control unit 41 (FIG. 13; step S10).

If a determination is made that any fault has not occurred in all of the hardware elements of the digital protective control unit 41 as a result of the self-diagnosis in step S10 (a negative determination is made in step S11), the CPU 70 repeats the self-diagnosing process in step S10 at predetermined periods.

If a determination is made that any fault has occurred in at least any one of the hardware elements (for example, the analog-digital converting unit 2) of the digital protective control unit 41 as a result of the self-diagnosis in step S10 (an affirmative determination is made in step S11), the CPU 70 of the digital protective control unit 41 transmits the result indicating the fault of the analog-digital converting unit 2 of the digital protective control unit 41. The result is transmitted as self-diagnosis result data Dd to the Ethernet LAN 66 through the communication interface 68 and the transceiver 65 (step S12).

Thus, the CPU 76 of the digital protective control unit 42 of the breaker 36 receives, through the RAM 77, the self-diagnosis result data Dd transmitted through the transceiver 65. In response to the receiving process, the CPU 76 produces digital data having logical value "1". Moreover, the CPU 76 inverts the digital data having logical value "1" to digital data having logical value "0" so as to store the produced digital data having logical value "0" in the RAM 77 (step S13).

In place of step S9 shown in FIG. 5, the CPU 76 receives, through the transceiver 65 and the communication interface 68, control command C transmitted from the digital protective control apparatus 43 through the Ethernet LAN 66 to store the control command C in the RAM 77. Thus, the CPU 76 performs the logical AND operation between digital data having logical value "0" and control command C stored in the RAM 77 (step S14).

A result of the AND operation is always the logical value of "0" regardless of the value of control command C. Therefore, the breaking operation command is not transmitted from the CPU 76 to the breaking portion 36a of the breaker 36. Then, the operation control of the breaker 36 is locked and thus the process is completed (step S15).

That is, in this embodiment, if an unnecessary (error) control command C is transmitted toward the digital protective control unit 42 of the breaker 36 through the digital protective control unit 41 and the digital protective control apparatus 43 as a result of a fault of at least a portion of the hardware configuration of the electric quantity converting device 35, the fault can be detected by the self-diagnosing process of the digital protective control unit 41. In accordance the detection of the fault, transmission of the control command C to the breaking portion 36a of the breaker 36 can be inhibited and the operation control of the breaker 36 can be locked. In addition to the effect obtainable from the first embodiment, unnecessary operation control of the breaker 36 owning to a fault of the hardware of the electric quantity converting device 35 can be prevented. As a result, it is possible to improve the reliability of the electric power system protective control system.

Although the foregoing structure is formed such that the NOT logical unit 94 and the AND logical unit 95 are realized by the process performed by the CPU, the present invention is not limited to this structure. The foregoing structure may be realized by hard-wired logic circuits.

(Third Embodiment)

Figure 14:
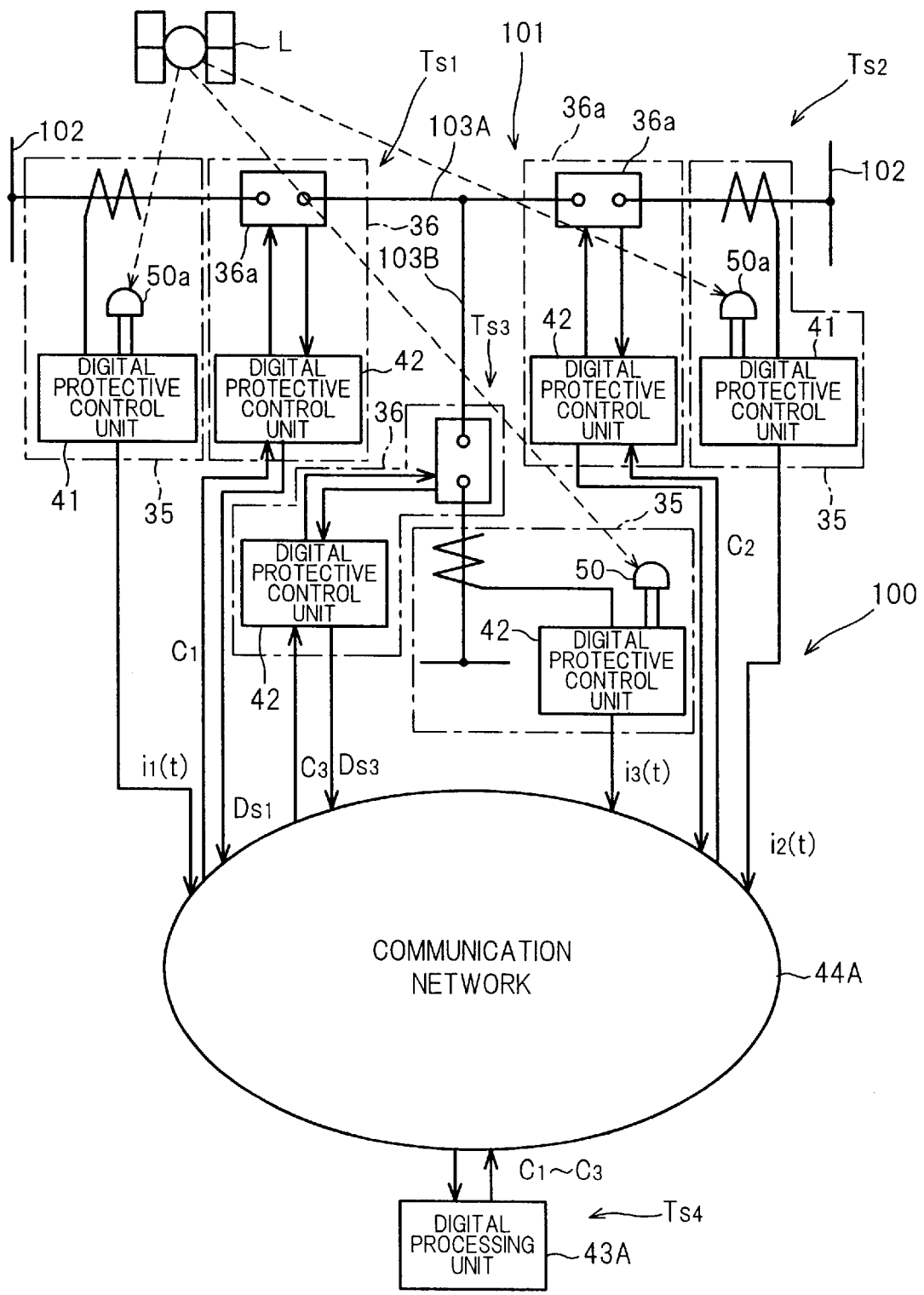
FIG. 14 is a functional block configuration diagram showing an electric power system protective control system including a single-line connection diagram of an electric power system according to a third embodiment of the present invention.

FIG. 14 shows a functional block configuration of an electric power system protective control system including a single-line connection diagram of the electric power system which must be protected by the structure according to this embodiment.

In the electric power system protective control system 100 shown in FIG. 14, an electric power system 101 is formed by a power-transmission line 103A branched from bus lines 102 and connecting two electric stations (electric power stations) Ts1 and Ts2 and a power-transmission line 103B branched from an intermediate position of the power-transmission line 103A so as to be connected to an electric power station Ts3. Each of the electric power stations Ts1, Ts2 and Ts3 has an electric quantity converting device 35 (for example, a current transformer) for fetching (inputting) the electric quantities (for example, electric current quantities) which flow in the power-transmission lines 103A and 103B to convert the electric quantities into electric quantity data. Moreover, each of the electric power stations Ts1, Ts2 and Ts3 is provided with a breaker 36 for protecting the electric power system 101 by opening/closing the power-transmission lines 103A and 103B.

The electric power system protective control system 100 according to this embodiment for protecting the electric power system 101 is constituted by separating functions of the control system 100 required for the equipment devices and installing the functions in the corresponding equipment devices of the electric power stations Ts1 to Ts3.

That is, each of the electric power stations Ts1 to Ts3 of the control system 100 is provided with digital protective control units 41 and 42 for performing the functions required for the electric quantity converting device 35 and the breaker 36 disposed in each of the equipment device (the electric quantity converter (the current transformer)35 and the breaker 36).

The control system 100 is provided with an electric power station Ts4 having a digital protective control apparatus 43A for performing protective control operation processes in accordance with electric quantity data supplied from each digital protective control unit 41 of each electric power stations Ts1 to Ts3. According to the obtained result of the processes and state data transmitted from each digital protective control unit 42 of each of the electric power stations Ts1 to Ts3, the digital protective control apparatus 43A outputs a control command for performing the protective control to each digital protective control unit 42 of each of the electric power stations Ts1 to Ts3.

The electric power stations Ts1 to Ts4 are distributed apart from each other in a wide region. The electric power stations Ts1 to Ts4 are connected to each other through a communication network 44A such that data communication is permitted with each other therethrough.

The functional block configurations of the digital protective control unit 41 and the digital protective control unit 42 of each of the electric power stations Ts1 to Ts3 are similar to those according to the first embodiment shown in FIG. 1. Therefore, the similar structures are omitted from description. The functional block configurations of the digital protective control apparatus 43A of the electric power station Ts4 are similar to those according to the first embodiment shown in FIG. 1 except for the contents of the processes performed by the protective control processing unit. Therefore, the similar structures are omitted here.

Figure 15:
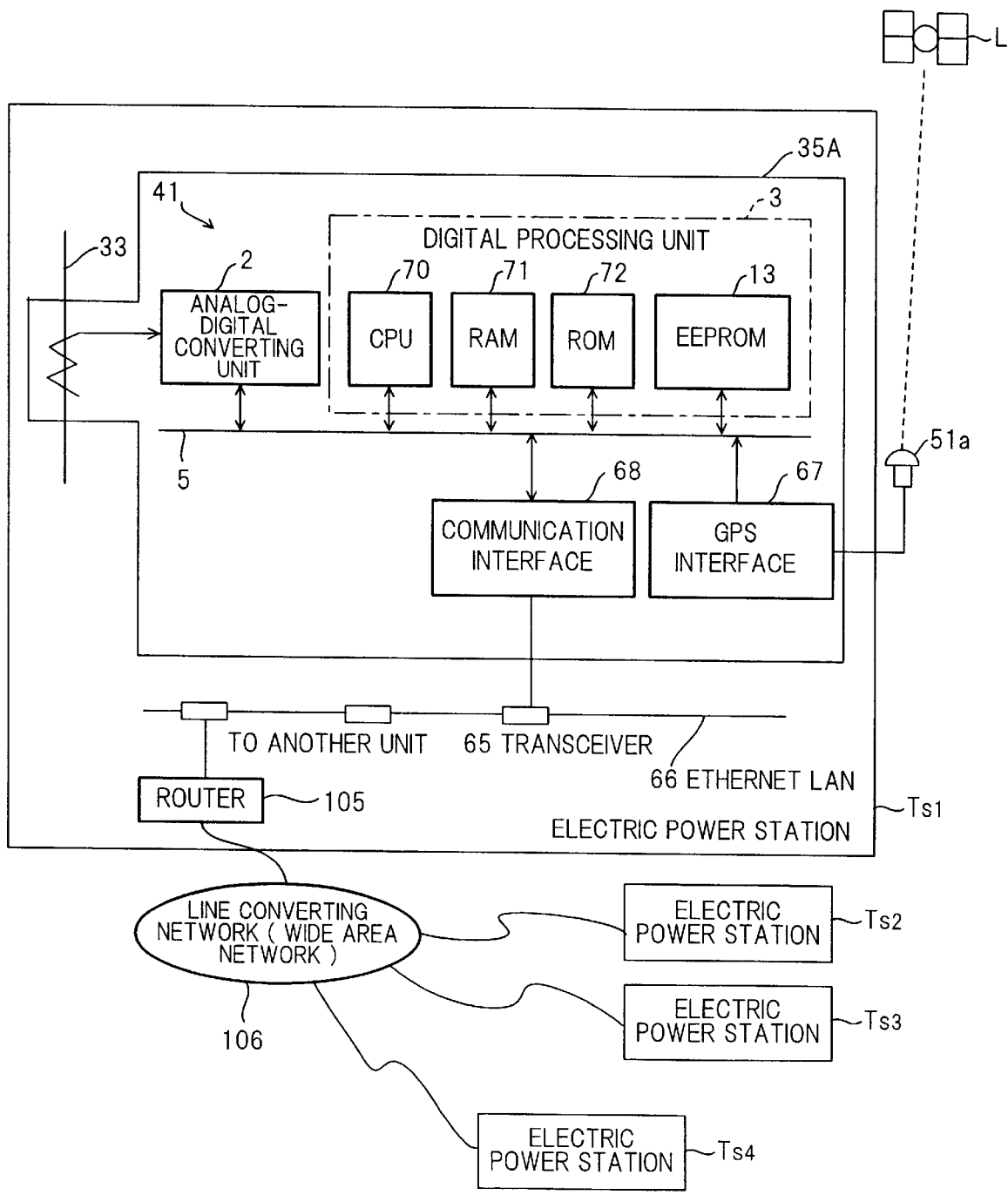
FIG. 15 is a diagram showing the hardware configuration of the electric quantity converting device in each of electric power stations Ts1 to Ts3 according to the third embodiment.

FIG. 15 is a diagram showing the hardware configuration of the electric quantity converting device 35 of each of the electric power stations Ts1 to Ts3. FIG. 15 representatively shows only the electric quantity converting device 35 of the electric power station Ts1. The electric quantity converting device 35 of each of the electric power stations Ts2 and Ts3 has a similar structure.

Referring to FIG. 15, the electric quantity converting device 35 is connected to an Ethernet LAN 66 constituted in the electric power station Ts1 through the transceiver 65. The electric quantity converting device 35 is connected to the other units (for example, the breaker 36) in the electric power station Ts1 through the Ethernet LAN 66 such that data communication is permitted.

The Ethernet LAN 66 for establishing the connection in a local area in the electric power station Ts1 is, through the transceiver 65 and a router 105, connected to a wide area network 106, such as a telephone network, which constitutes the communication network 44A. The Ethernet LAN 66 of each of the electric power stations Ts2 and Ts3 is connected to the wide area network 106 through the transceiver 65 and the router 105. Since the hardware configuration of the electric quantity converting device 35 including the digital protective control unit 41 shown in FIG. 15 is similar to that of hardware element of the digital protective control unit 41 shown in FIG. 2, the similar structures are omitted from description.

Figure 16:
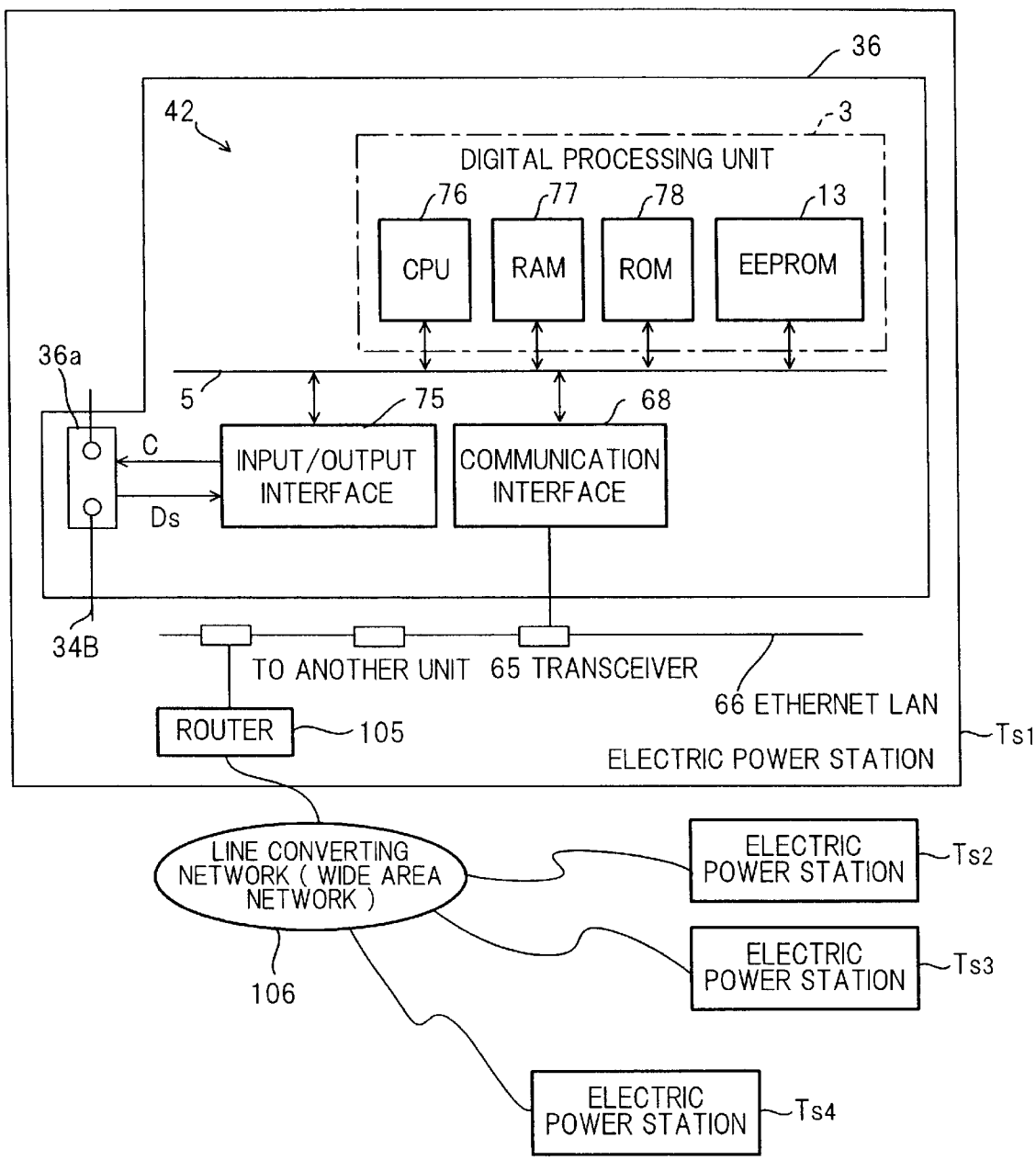
FIG. 16 is a diagram showing the hardware configuration of a breaker in each of electric power stations Ts1 to Ts3 according to the third embodiment.

Similarly, FIG. 16 is a diagram showing the hardware configuration of the breakers 36 of the electric power stations Ts1 to Ts3 (FIG. 16 representatively shows the breaker 36 of the electric power station Ts1). Although FIG. 16 representatively shows only the breaker 36 of the electric power station Ts1, the breakers 36 of the other electric power stations Ts2 to Ts3 have similar structures.

Referring to FIG. 16, the breaker 36 is connected to the Ethernet LAN 66 through the transceiver 65. The breaker 36 is connected to another unit (for example, the electric quantity converting device 35) in the electric power station Ts1 through the Ethernet LAN 66 such that data communication is permitted. The hardware configuration of the digital protective control unit 42 of the breaker 36 shown in FIG. 16 is similar to that of the element of the hardware of the digital protective control unit 42 shown in FIG. 2. Therefore, same reference numerals are given to the similar elements and the similar elements are omitted from description.

Figure 17:
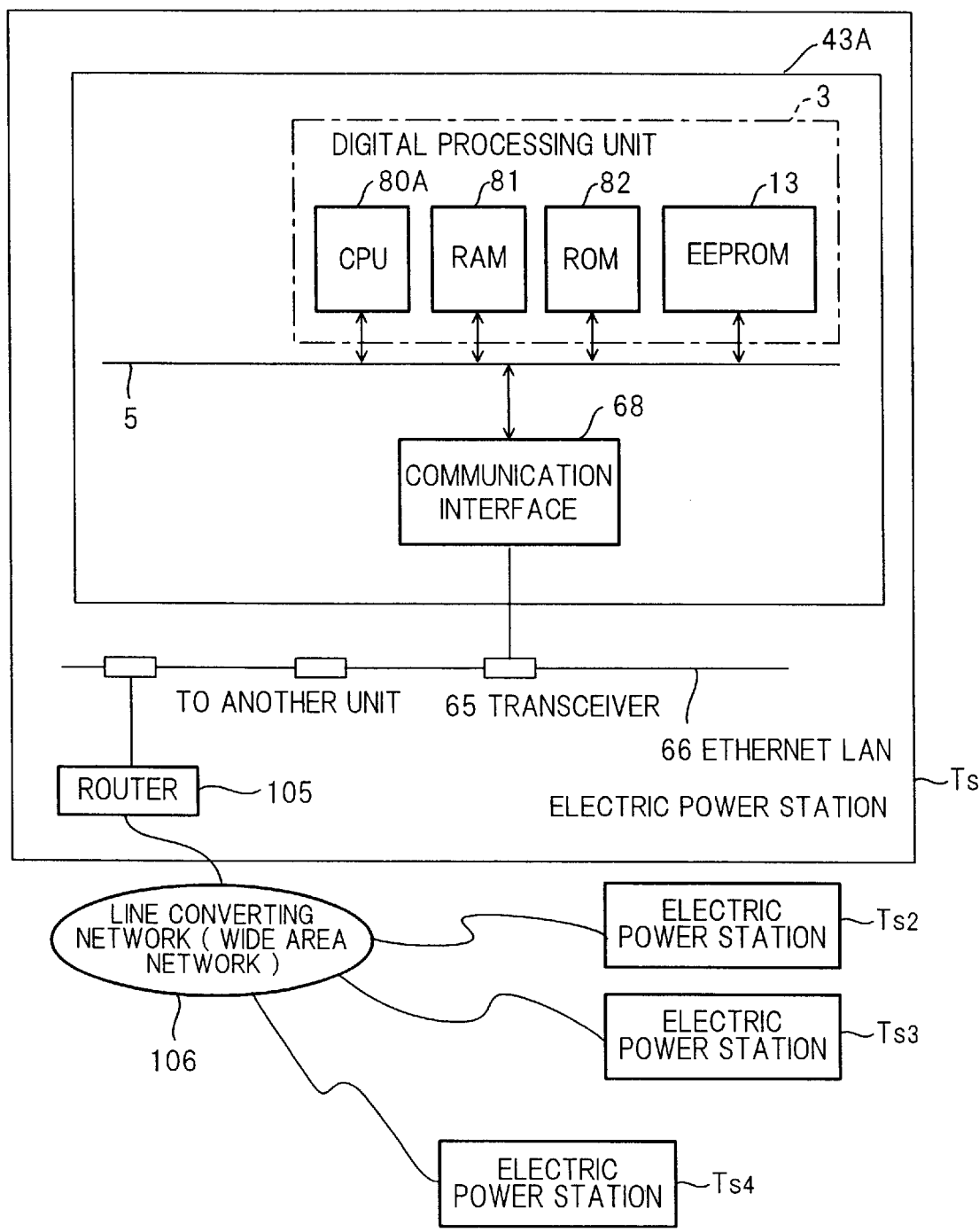
FIG. 17 is a diagram showing the hardware configuration of a digital protective control apparatus in a electric power station Ts4 according to the third embodiment.

FIG. 17 is a diagram showing the hardware configuration of the digital protective control apparatus 43A in the electric power station Ts4.

Referring to FIG. 17, the digital protective control apparatus 43A is connected to another apparatus in the electric power station Ts4 through the transceiver 65 and the Ethernet LAN 66 such that data communication is permitted.

The Ethernet LAN 66 for establishing the communication network in a local region in the electric power station Ts4 is connected to the wide area network 106 through the transceiver 65 and the router 105. The hardware configuration of the digital protective control apparatus 43A shown in FIG. 17 is similar to that of the digital protective control apparatus 43A shown in FIG. 4. Therefore, the same reference numerals are given to the similar elements and the similar elements are omitted from description.

In the electric power system protective control system 100 having the above-mentioned structure, each analog-digital converting unit 2 of each of the electric power stations Ts1 to Ts3 performs a process similar to that in step S1 shown in FIG. 5 so that current i flowing in each of the power-transmission lines 103A and 103B of the electric power system 101 is sequentially sampled at each receiving period at absolute time t so as to be converted into digital current data i1 to i3 which are sequentially stored in the RAM 71.

Electric quantity data i1 to i3 are subjected to a process similar to that in step S2 shown in FIG. 5 and performed by the CPU 70 of each digital protective control unit 41. Thus, the electric quantity data i1 (t) to i3 (t) to which absolute time t of sampling are added are sequentially transmitted to the wide area network 106 through the communication interface 68, the transceiver 65, the Ethernet LAN 66 and the router 105. Incidentally, the communication interface 68, the transceiver 65, the Ethernet LAN 66 and the router 105 are collectively referred to "the wide area network interface".

An opening/closing state (a "close" state) of the breaking portion 36a of the breaker 36 in each of the electric power stations Ts1 to Ts3 is subjected to a process similar to that in step S3 performed by the CPU 76 of each digital protective control unit 42 so as to be fetched. Thus, the fetched states of the breaking portions 31a of the electric power station Ts1 to Ts3 are transmitted as state data Ds1 to Ds3 to the wide area network 106 through the wide area network interface.

Electric quantity data i1 (t) to i3 (t) and state data Ds1 to Ds3 transmitted through the wide area network 106 are received through the wide area network interface by the process in step S4 shown in FIG. 5 performed by the CPU 80A of the digital protective control apparatus 43A so as to be stored in the RAM 81.

The process in step S5 shown in FIG. 5 is performed by the CPU 80A of the digital protective control apparatus 43A so that an electric quantity data group sequentially stored in the RAM 81 is formed into a table in which the data group is time-sequentially, for example, arranged from old absolute time to latest absolute time in accordance with the added sampling time t. The table is again stored in the RAM 81.

Electric quantity data having the latest and same absolute time transmitted from each of the electric power stations Ts1 to Ts3, that is latest sampling data sampled at the same absolute time are assumed to be (t)-th sampling data i1 (t) to i3 (t). With reference to the absolute time, sampling data one time before ((t−1)-th) are sampling data i1 (t−1) to i3 (t−1), (t−2)-th sampling data are i1 (t−2) to i3 (t−2), . . . , and (t−m)-th sampling data are i1 (t−m) to i3 (t−m). The data group is formed into the table sorted with data i1 (t) to i3 (t) most lately sampled from data i1 (t−m) to i3 (t−m) sampled most previously so as to be stored in the RAM 81.

The CPU 80A of the digital protective control apparatus 43A performs the protective control operation processes using the electric quantity data group. Thus, whether or not an accident has occurred in the electric power system 101 is determined.

An assumption is made that m=5, that is, sampling data fifth operation before to present sampling data have been arranged. The CPU 80A performs operations in accordance with the following Equations (2) to (4) to obtain |i1t|, |i2t| and |i3t|.

$$|i1t| = k \sum_{m=0}^{5} |i1(t-m)| \tag{2}$$

$$|i2t| = k \sum_{m=0}^{5} |i2(t-m)| \tag{3}$$

$$|i3| = k \sum_{m=0}^{5} |i3(t-m)| \tag{4}$$

where k is a constant.

Simultaneously, the CPU 80A performs operations on the basis of the following Equation (5) to obtain |idt|.

$$|idt| = k \sum_{m=0}^{5} |i1(t-m) + i2(t-m) + i3(t-m) + i4(t-m)| \quad (5)$$

The CPU 80A performs operations by using the obtained |i1t| to |i3t| and |idt| in accordance with the following Equation (6) so as to determine whether or not an accident has occurred in the electric power system 101.

$$|idt| \geq k1(|i1t|+|i2t|+|i3t|+|i4t|)+k0 \quad (6)$$

where k1 and k0 are constants.

As a result, the CPU 80A determines whether or not the above-mentioned Equation (6) is satisfied, which is a result of the protective control operation processes. Only when the foregoing equation is satisfied, the CPU 80A determines that an internal accident of the electric power system 101 is happened. A process similar to that in step S8 shown in FIG. 5 is performed by the CPU 80A so that separation operation control commands C1 to C3 on the basis of the contents of the state data Ds1 to Ds3 stored in the RAM 81 are transmitted to the wide area network 106 through the wide area network interface.

The separation operation control commands C1 to C3 transmitted to the wide area network 106 are received through the wide area network interface by a process similar to that in step S9 shown in FIG. 5 of the CPU 76 of the breaker 36 in each of the electric power stations Ts1 to Ts3 In accordance with the received control commands C1 to C3, a "closed state" of the breaking portion 36a of the breaker 36 in each of the electric power stations Ts1 to Ts3 is changed to an "opened state".

As a result, the breaking portion 36a of the breaker 36 in each of the electric power stations Ts1 to Ts3 is "opened" so that the tripping operation is performed. Thus, the accident portion of the electric power system 101 is separated so that the electric power system 101 is protected.

As described above, in the electric power system protective control system according to this embodiment, in each of the electric power stations Ts1 to Ts4 distributed apart from each other and connected to each other through the wide area network 106, the electric quantities are sampled at the same absolute time t from the electric power stations Ts1 to Ts3 in which the control functions for each of the equipment devices (the electric quantity converting unit and the breaker) are installed so that the electric quantity data i1 (t) to i3 (t) to which the absolute time t of sampling are added are obtained. The electric quantity data i1 (t) to i3 (t) can be transmitted to the digital protective control apparatus 43A in the electric power station Ts4 through the wide area network 106.

Therefore, in a case where the distance from, for example, the electric power station Ts1 of the electric power stations Ts1 to Ts3 to the electric power station Ts4 is different (for example, Ts1 is positioned distant as compared with Ts2 and Ts3) and where the absolute time t of sampling is not added to the electric quantity data, if electric quantity data i1 (t) to i3 (t) sampled in the electric power stations Ts1 to Ts3 at the same absolute time t are transmitted to the digital protective control apparatus 43A in the electric power station Ts4, because of occurrence of the transmission delay, the electric quantity data i1 (t) of the electric power station Ts1 is delayed when it is received by the digital protective control apparatus 43A as compared with electric quantity data i2 (t) and i3 (t) of the electric power stations Ts2 and Ts3.

Therefore, it cannot be determined whether or not the electric quantity data i1 (t) is sampled at the same sampling times as the electric quantity data i2 (t) and i3 (t). Thus, there is apprehension that the accident determination process in accordance with the same sampling data and using the foregoing Equations (2) to (6) cannot be performed.

However, the structure according to this embodiment is arranged such that the absolute time t of sampling is added to the electric quantity data. Accordingly, even if, because of the occurrence of the transmission delay, the electric quantity data i1 (t) of the electric power station Ts1 is delayed when it is received by the digital protective control apparatus 43A as compared with the other electric quantity data i2 (t) and i3 (t), the sorting (arranging) process in accordance with sampling time t enables sampling of electric quantity data i1 (t) at the same time as the other electric quantity data i2 (t) and i3 (t) to easily be recognized. Therefore, the accident determining processes using the above-mentioned Equations (2) to (6) can be performed.

Therefore, if limitation of the location or the like causes transmission delay among electric quantity data i1 (t) to i3 (t) which are transmitted from the electric power stations Ts1 to Ts3 to the electric power station Ts4, the accident determining processes using the above-mentioned Equations (2) to (6) can be performed, making it possible to improve the reliability of the electric power system protective control system.

Although the equipment device (the electric quantity converting device) for inputting electric quantity in each of the electric power stations Ts1 to Ts3 is the current transformer, it may be a transformer. As shown in FIG. 1, the electric power stations Ts1 to Ts3 may fetch the electric quantities (current and voltage) from both of the current transformer and the transformer.

Although the breaker is employed as the opening/closing device in each of the first to third embodiments, the present invention is not limited to this structure. If the accident portion in the electric power system can be separated by the opening/closing control operation and a normal state can be restored, any one of a variety of opening/closing devices, such as a disconnect switch, may be employed.

In the first to third embodiments, the functions required for the units of one or two electric quantity converting devices and the opening/closing devices are separated so as to be included in the corresponding equipment devices so that the electric power system protective control system is constituted. The present invention is not limited to the number and type of the equipment devices. The present invention may be applied to an electric power system protective control system having a multiplicity of equipment devices having other devices in addition to the electric quantity converting devices and the opening/closing devices by separating the functions required for the equipment devices and installing those therein.

In the first to third embodiments, state data and the state of the operation communicated from the digital protective control units provided for the electric quantity converting devices and the opening/closing devices constituting the electric power system are received in the digital protective control apparatus so as to perform the protective control operation processes, thereby outputting the operational control commands. That is, the digital protective control apparatus for outputting the operation control commands is individually disposed from the electric quantity converting device and the opening/closing device. However, the present invention is not limited to this structure. The digital protective control apparatus for the protective control operation processes may be installed to the electric quantity converting device and the opening/closing device constituting the electric power system.

(Fourth Embodiment)

An electric power system protective control system according to a fourth embodiment of the present invention will now be described with reference to FIGS. 18 to 21.

Figure 18:
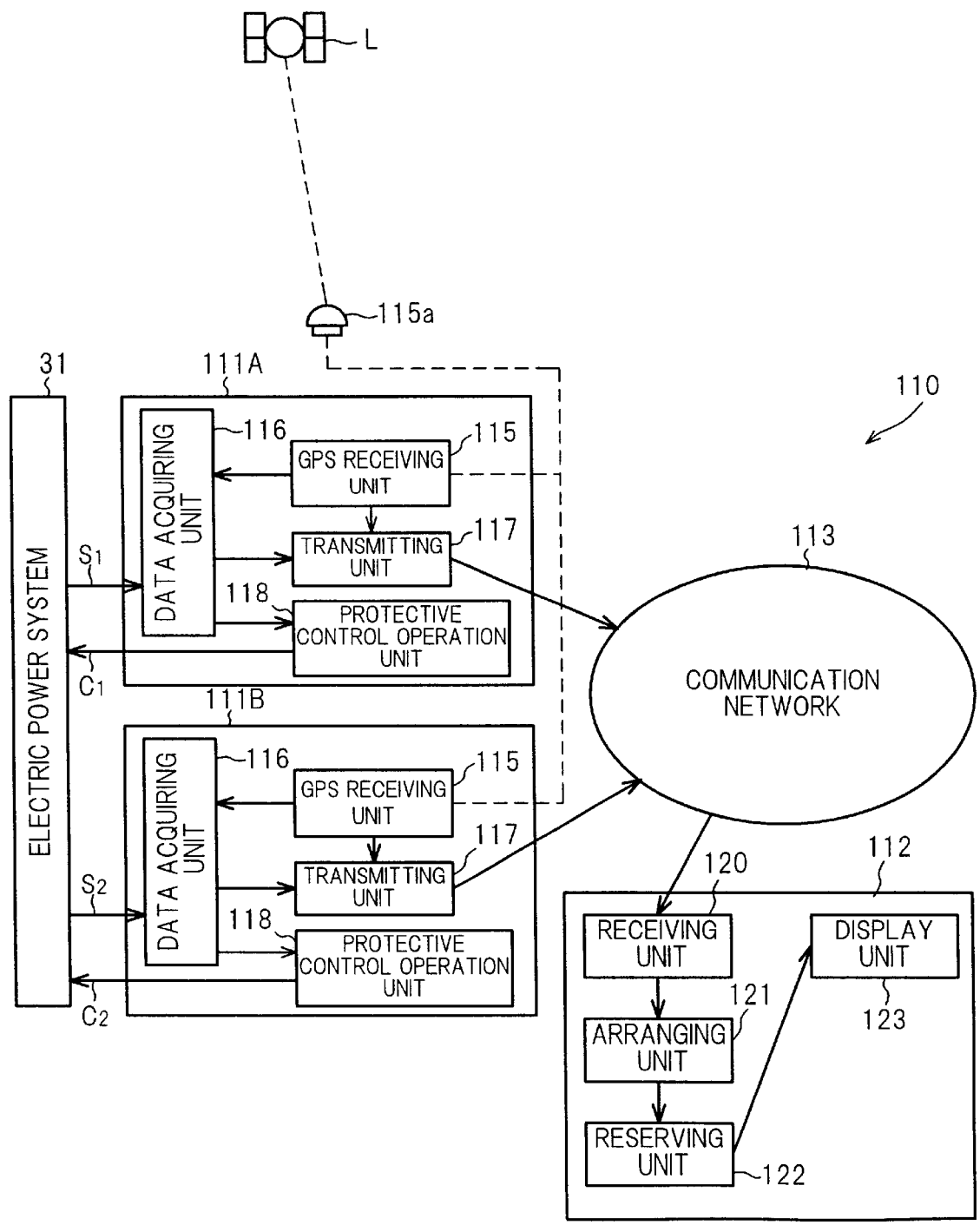
FIG. 18 is a diagram showing functional blocks of an electric power system protective control system according to a fourth embodiment of the present invention.

FIG. 18 is a diagram showing function blocks of the electric power system protective control system according to this embodiment.

Referring to FIG. 18, an electric power system protective control system 110 is provided with digital protective control apparatuses 111A and 111B provided for each equipment devices {which are hereinafter two equipment devices (equipment devices E1 and E2) to simplify the description} of the electric power system 31 to be protectively controlled. Thus, the digital protective control apparatuses 111A and 111B are operative to fetch (input) analog state quantities (the electric quantities) S1 and S2, such as electric currents and voltages, from the equipment devices E1 and E2, respectively. Moreover, the digital protective apparatuses 111A and 111B are operative to, in accordance with the inputted electric quantities S1 and S2, perform a protective control operation processes so as to output, to the corresponding equipment devices E1 and E2 of the electric power system 31, such as the breakers, protective control operation commands C1 and C2 including a tripping command and a reset command.

Furthermore, the control system 110 has a display unit 112 for displaying electric quantities S1 and S2 acquired by the digital protective control apparatuses 111A and 111B.

The control apparatuses 111A and 111B and the display unit 112 are connected to each other through a communication network 113 such that data communication is permitted, whereby the control system 110 is constituted.

Similarly to the first to third embodiments, each of the control apparatuses 111A and 111B is provided with a GPS receiving unit 115 for receiving through a GPS antenna 115a GPS signals transmitted from satellites L each having an atomic clock mounted thereon and for decoding the GPS signals. Thus, the GPS receiving unit 115 recognizes accurate absolute time t (for example, an accuracy of 100 ns.

Moreover, each of the control apparatuses 111A and 111B has a data acquiring unit 116 for acquiring (sampling) electric quantities S1 and S2 of the equipment devices E1 and E2 of the electric power system 31 in accordance with absolute time t received by the GPS receiving unit 115. Then, the data acquiring unit 116 converts the electric quantities S1 and S2 into digital electric quantity data D1 and D2 so as to output the electric quantity data D1 and D2. In addition, each of the control apparatuses 111A and 111B has a transmitting unit 117 for adding absolute time t of sampling of electric quantity data D1 and D2 to electric quantity data D1 and D2 outputted from the data acquiring unit so as to transmit electric quantity data D1 (t) and D2 (t) each having the absolute time to the communication network 113. Each of the control apparatuses 111A and 111B also has a protective control processing unit 118 for performing protective control operation processes in accordance with electric quantity data D1 and D2 outputted from the data acquiring unit 116. Thus, the protective control processing unit 118 outputs the obtained result of the processes as protective control operation commands C1 and C2 to the protective control devices, such as the breakers, provided for the equipment devices E1 and E2 of the electric power system 31. Note that the AC power source for the GPS receiving unit is omitted from illustration.

The display unit 112 is provided with a receiving unit 120 for receiving electric quantity data D1 (t) and D2 (t) each having the absolute time transmitted from the control apparatuses 111A and 111B through the communication network 113. Moreover, the display unit 112 has an arranging unit 121 for time-sequentially arranging (sorting) electric quantity data D1 (t) and D2 (t) received by the receiving unit 120 in accordance with the added absolute time. In addition, the display unit 112 has a reserving (storing) unit 122 for storing a result of arrangement performed by the arranging unit 121 and a display unit 123 for displaying a result of arrangement stored in the reserving unit 122.

Figure 19:
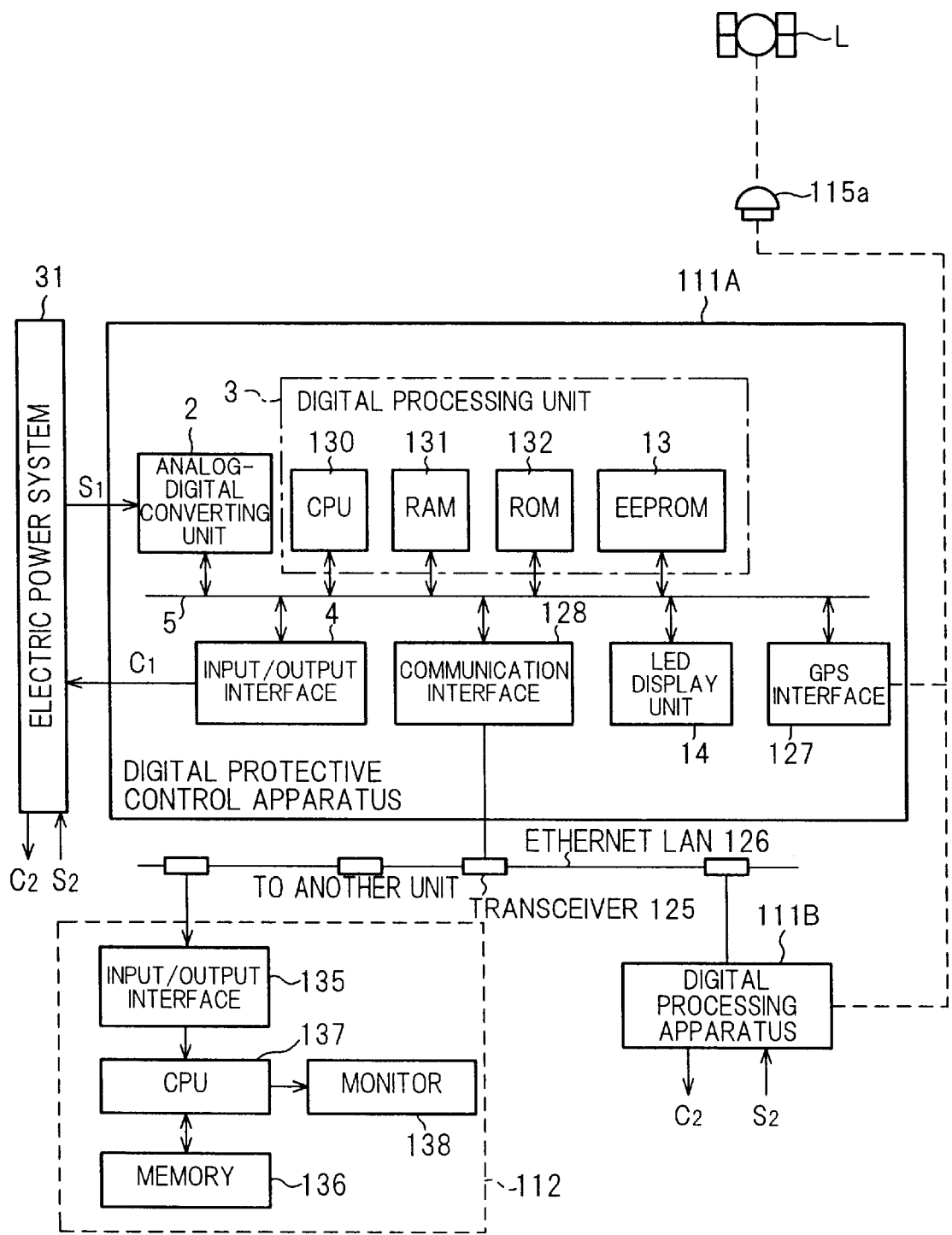
FIG. 19 is a diagram showing the hardware configurations of a digital protective control apparatus and a display unit according to the fourth embodiment.

FIG. 19 is a diagram showing the hardware configuration for realizing a process of each function block of the digital protective control apparatus 111A and the display unit 112 according to this embodiment. The display unit 112 is realized by, for example, a personal computer or other computer systems. In the hardware configuration of the digital protective control apparatus 111A, similar elements as those of the hardware of the digital protective control apparatus 1 shown in FIG. 60 are given the same reference numerals and the similar elements are omitted from described or described simply.

The control apparatus 111A shown in FIG. 19 is connected to other units (the control apparatus 111B and the display unit 112) in the control system 110 through a transceiver 125 and an Ethernet LAN 126, which constitute the communication network 113, such that data communication is permitted.

The control apparatus 111A is provided with an analog-digital converting unit 2 (an analog filter, a sampling hold circuit, a multiplexer and an A/D converter) for fetching the electric quantity S1 from the equipment device E1, which is an object for protectively control of the control apparatus 111A. Thus, the analog-digital converting unit 2 converts electric quantity S1 into electric quantity data D1. In addition, the control apparatus 111A is provided with a digital processing unit 3, an input/output interface (I/O) 4; a bus 5, an LED display unit 14, an interface (a GPS interface) 127 for inputting the GPS signals received through the GPS receiving antenna 115a to the digital processing unit 3 through the bus 5; and a communication interface 128 connected between the transceiver 125 of the Ethernet LAN 126 and the bus 5 to perform an interface process for inputting/outputting data between the Ethernet LAN 126 and the digital processing unit 3.

The digital processing unit 3 is provided with a CPU 130 for performing processes including the above-mentioned process for adding the absolute time and the protective control operation processes to transmit the protective control operation command C1 to the input/output interface 4 in accordance with a result of the processes. Moreover, the digital processing unit 3 has a RAM 131 for temporarily storing the electric quantity data and data for use in the processes performed by the CPU 130. In addition, the CPU 130 is provided with a ROM 132 for storing the procedures (program codes) of the processes including the process for adding the absolute time. The digital processing unit 3 is provided with an EEPROM 13 (in which the setting values to operate the respective relay software modules are stored). The hardware configuration of the digital protective control apparatus 11B is similar to the hardware configuration of the digital protective control apparatus 111A except for the structure that the acquired electric quantity is expressed by S2 and the electric quantity data to be converted is expressed by D2. Therefore, the hardware configuration is omitted from description.

The display unit 112 is provided with an input/output interface 135 connected to the Ethernet LAN 126 through the transceiver 125 for inputting electric quantity data transmitted from the digital protective control apparatuses 111A and 111B to the display unit 112. Moreover, the display unit 112 has a memory 136 for storing processing programs (program codes) and processed data. In addition, the display unit 112 is provided with a CPU 137 for performing a time-sequential arranging process in accordance with the absolute time in accordance with the programs previously stored in the memory 136 by using the memory 136, and a monitor 138 for displaying a result of the arranging processes performed by the CPU 137.

Incidentally, the data acquiring unit 116 shown in FIG. 18 is able to concretely be realized mainly by the processes of the analog-digital converting unit 2 and the CPU 130. The GPS receiving unit 115 is able to concretely be realized mainly by the interface 127, the CPU 130, the RAM 131 and the ROM 132. The transmitting unit 117 is able to concretely be realized mainly by the CPU 130, the RAM 131, the ROM 132, the communication interface 128, the transceiver 125 and the Ethernet LAN 126.

The receiving unit 120 shown in FIG. 18 is able to concretely be realized mainly by the input/output interface 135 of the display unit 112 and the CPU 137. The arranging unit 121 and the reserving unit 122 are able to concretely be realized mainly by the CPU 137 and the memory 136. The display unit 123 is able to concretely be realized mainly by the CPU 137 and the monitor 138.

Similarly to the first to third embodiments, in the electric power system protective control system 110 having the above-mentioned structure, each CPU 130 of the control apparatuses 111A and 111B sequentially receives GPS signals transmitted from the satellites L through the GPS receiving antenna 115a and the GPS interface 127 so as to obtain the absolute time t. In accordance with the absolute time t, a data acquiring sampling period (for example, 0.0016666 . . . second) common to all of the apparatuses (111A and 111B) is set. Thus, data acquiring timing is kept between the apparatus 111A and the apparatus 111B.

Each CPU 130 sequentially samples electric quantities S1 and S2 (for example, voltages Va, Vb and Vc in each phase) of the equipment devices E1 and E2 of the electric power system 31 through each analog-digital converting unit 2 in accordance with the set sampling period. Then, the CPU 130 converts the electric quantities S1 and S2 into digital electric quantity data Dva1 to Dvc1 and Dva2 to Dvc2. Sequentially converted electric quantity data Dva1 to Dvc1 and Dva2 to Dvc2 are sequentially stored in the RAM 131.

At this time, the CPU 130 of each of the control apparatuses 111A and 111B adds absolute time t of sampling to electric quantity data Dva1 to Dvc1 and Dva2 to Dvc2 sampled at each of the same absolute time t and stored in the RAM 71. Then, the CPU 130 forms electric quantity data Dva1 (t) to Dvc1 (t) and Dva2 (t) to Dvc2 (t) having a data structure including parameters ("name of apparatus", "the phase of the electric quantity", "electric quantity (instantaneous value)" and "absolute time (time)" schematically shown in FIG. 20. Then, the CPU 130 sequentially transmits the electric quantity data Dva1 (t) to Dvc1 (t) and Dva2 (t) to Dvc2 (t) to the Ethernet LAN 126 through the communication interface 128 and the transceiver 125.

The CPU 137 of the display unit 112 receives, through the input/output interface 135, electric quantity data Dva1 (t) to Dvc1 (t) and Dva2 (t) to Dvc2 (t) transmitted through the Ethernet LAN 126. Then, the CPU 137 sequentially stores the electric quantity data in a predetermined address range temporarily assigned to the memory 136. Electric quantity data Dva1 (t1 to t3) to Dvc1 (t1 to t3) and Dva2 (t1 to t3) to Dvc2 (t1 to t3) sampled at absolute time t=t1: 45.250000 second, 14:30, Jul. 11, 1997, t=t2: 45.2516666 second, 14:30, Jul. 11, 1997 and t=t3: 45.2533333 second, 14:30, Jul. 11, 1997 and stored in the memory 136 are schematically shown in FIG. 20.

At this time the electric quantity data group acquired by the plural control apparatuses 111A and 111B and sequentially stored in the memory 136 is added with the sampling time t (t1 to t3), and is randomly positioned regardless of the absolute time and the phase, as shown in FIG. 20.

Therefore, the CPU 137 of the display unit 112 performs an arranging process similar to that in steps S5A1 to S5A11 shown in FIG. 9 in accordance with the sampling time (the absolute time) t (t1 to t3). Thus, the CPU 137 time-sequentially arranges (sorts) the electric quantity data group for each protective control apparatus from, for example, previous absolute time to latest absolute time so as to store again the sorted electric quantity data group in the addresses assigned to the memory 136 as a "table". Therefore, the CPU 137 forms the table in which the electric quantity data are arranged in accordance with the absolute time t (t1 to t3).

That is, the CPU 137 registers, in the uppermost portion in the table, the absolute time t1 of the electric quantity data Dva1 (t1), which is at the leading address stored in the memory 136, of the electric quantity data Dva1 (t1 to t3) to Dvc1 (t1 to t3) and Dva2 (t1 to t3) to Dvc2 (t1 to t3) (refer to steps S5A1 to S5A6). The CPU 137 adds name of the apparatus (111A) and the phase (Va) included in Dva1 (t1) to the portion for the absolute time t1 so as to be registered (refer to steps S5A7 to S5A9). Then, the CPU 137 fetches the electric quantity (an instantaneous value: 20 V) of electric quantity data Dva1 (t1) to register the same in the portion of the absolute time t1 in the table so as to correspond to the apparatus name portion (refer to step S5A10).

Then, electric quantity data Dva2 (t1) at a next address in the memory 136 is subjected to the foregoing process in accordance with the increment of the counter.

Since the absolute time t1 has been registered in the table in the process of the Dva2 (t1) performed by the CPU 137, the process for additionally registering the absolute time ti is not performed (refer to steps S5A5 and S5A7). Thus, name of the apparatus (111B), name of the phase (Va) and the electric quantity of 20 V in the electric quantity data Dva2 (t1) are added to the portion of the absolute time t1 to be registered.

Similarly, in the process of Dvb1 (t2) (phase b) which is fifth data from the leading address performed by the CPU 137, the absolute time t2 is additionally registered. Thus, name of the apparatus (111B), name of the phase (Vb) and the electric quantity of 9 V in the electric quantity data Dva1 (t2) are added to the portion of the absolute time t2 to be registered.

As described above, as for the foregoing electric quantity data Dva1 (t1 to t3) to Dvc1 (t1 to t3) and Dva2 (t1 to t3) to Dvc2 (t1 to t3), the electric quantity (the instantaneous value) sampled most previously to the electric quantity (the instantaneous value) sampled most lately are sorted for each apparatus and each phase in the table so as to be stored in the memory 136, as shown in FIG. 21.

Then, the CPU 137 reads the table stored in the memory 136 to display the table on the monitor 138.

As a result, the state quantities (the electric quantities) acquired by the control apparatuses 111A and 111B provided for each of the plural equipment devices E1 and E2 are simultaneously displayed on the screen of the monitor 138 in a state that the state quantities are arranged in accordance with the added absolute time, as shown in FIG. 21.

Therefore, an operator for monitoring the electric power system 31 is able to accurately (for example, an accuracy of 100 ns which is the accuracy of the absolute time) and simultaneously (at the same time) compare the sampled electric quantities from the equipment devices E1 and E2 through the control apparatuses 111A and 111B, making it possible to improve the reliability of the control system 110.

Moreover, the operator is able to collectively confirm, on the monitor 138 of the display unit 112, the electric quantities sampled through the control apparatuses 111A and 111B from each of the equipment devices E1 and E2. Therefore, the load and complexity during the monitoring operation required for the operator can be eliminated as compared with the conventional system in which the operator makes rounds the digital protective control apparatuses so as to perform confirmation through each display unit of each control apparatus. Thus, it is possible to omit the display unit (the monitor) for confirming the electric quantity from each digital protective control apparatus, thereby improving the cost efficiency and realizing a labor saving of the monitoring operation.

(Fifth Embodiment)

An electric power system protective control system according to a fifth embodiment of the present invention will now be described with reference to FIGS. 22 to 24.

Figure 22:
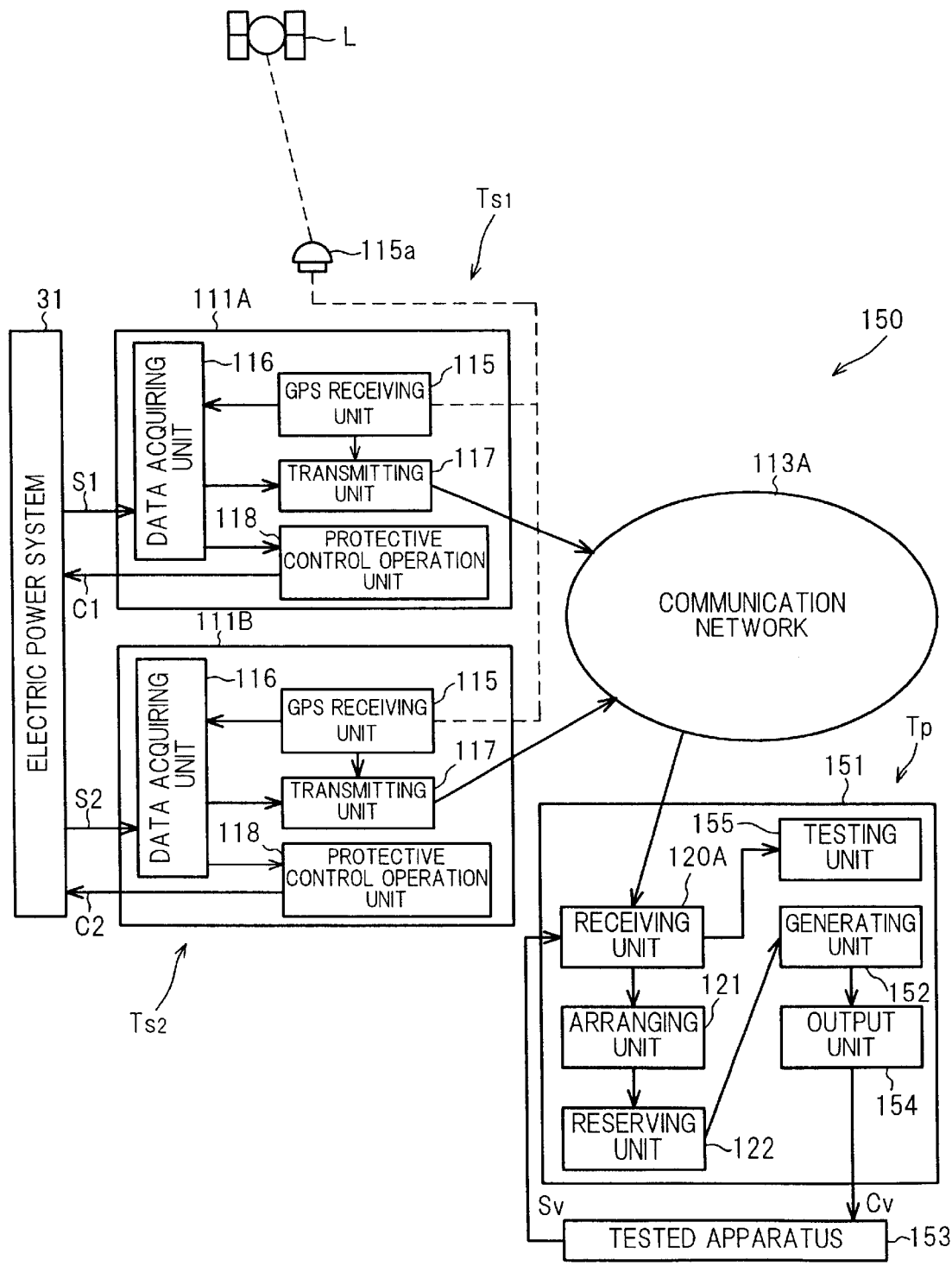
FIG. 22 is a diagram showing functional blocks of an electric power system protective control system according to a fifth embodiment of the present invention.

FIG. 22 is a diagram showing functional blocks of the electric power system protective control system according to this embodiment.

Referring to FIG. 22, an electric power system protective control system 150 is constituted by a plurality of electric power stations Ts1 and Ts2 and a manned electric station (or a plant for manufacturing a digital protective control apparatus) Tp. Incidentally, the manned electric station or the plant is hereinafter simply referred to an "electric station". Each of the electric power stations Ts1 and Ts2 of the electric power system protective control system 150 is provided with digital protective control apparatuses 111A and 111B provided for each of equipment devices E1 and E2 of the electric power system 31 to be protectively controlled.

The electric station Tp of the control system 150 is provided with a system simulating unit 151 for confirming the operation of a digital protective control apparatus manufactured by a manufacturer in the electric station Tp.

The electric power stations Ts1 and Ts2 and the electric station Tp are distributed apart from each other in a wide region. The electric power stations Ts1 and Ts2 and the electric station Tp are connected to each other through a communication network 113A such that data communication is permitted. The functional block configurations of the digital protective control apparatuses 111A and 111B are similar to those according to the fourth embodiment shown in FIG. 18. Therefore, the similar structures are given the same reference numerals and the similar structures are omitted from description or simply described.

The system simulating unit 151 has the predetermined functional blocks (the receiving unit 120A, the arranging unit 121 and the reserving unit 122) of the display unit 112 according to the fourth embodiment. Moreover, the system simulating unit 151 has a generating unit 152 for generating a test electric quantity, that is, analog data applied for the test, in accordance with electric quantity data formed and sequentially sorted as the table in the reserving unit 122 by the process of the arranging unit 121. In addition, the system simulating unit 151 has an output unit 154 for outputting, to a apparatus 153 to be tested, analog data Sv to be applied for the test generated by the generating unit 152.

A receiving unit 120A of the system simulating unit 151 has the foregoing function for receiving electric quantity data D1 (t) and D2 (t) each having the absolute time. Moreover, the receiving unit 120A has a function for receiving an operation control command Cv transmitted from the tested apparatus 153.

The system simulating unit 151 is also provided with a testing unit 155 for testing the operation of the apparatus 153 in accordance with the operation control command Cv received by the receiving unit 120A. FIG. 23 is a diagram showing the hardware configuration for realizing the processes of the functional blocks of the digital protective control apparatus 111A and the system simulating unit 151 according to this embodiment.

Figure 23:
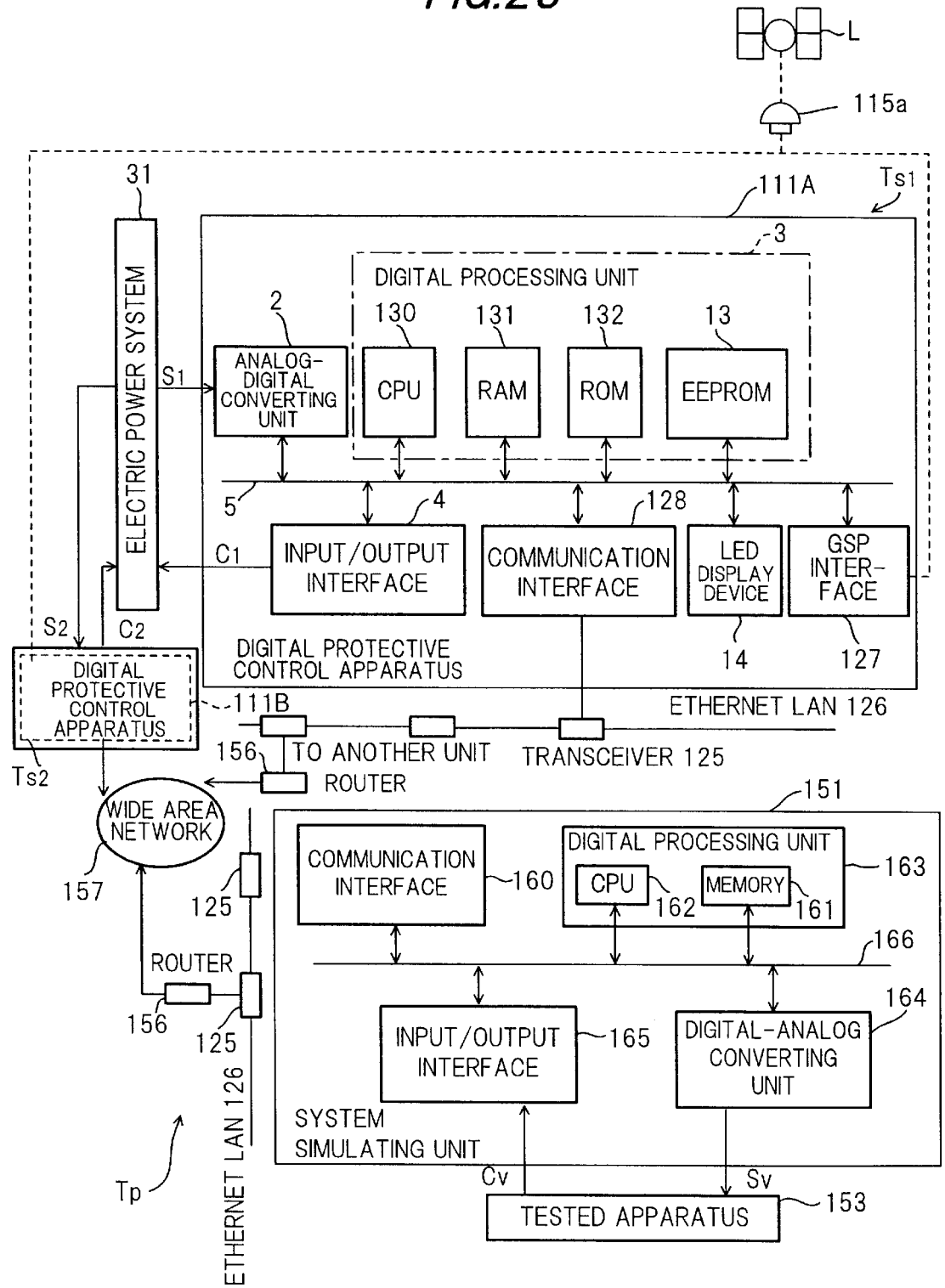
FIG. 23 is a diagram showing the hardware configuration of a digital protective control apparatus and a system simulating unit according to the fifth embodiment.

The hardware configurations of the digital protective control apparatuses 111A and 111B shown in FIG. 23 are similar to those shown in FIG. 19. Therefore, the similar structures are omitted from the description or described simply.

Referring to FIG. 23, the digital protective control apparatus 111A is, through the transceiver 125, connected to the Ethernet LAN 126 constituted in the electric power station Ts1. Thus, the digital protective control apparatus 111A is connected to other units in the electric power station Ts1 through the Ethernet LAN 126 such that data communication is permitted.

The Ethernet LAN 126 for establishing a local area in the electric power station Ts1 is, through the transceiver 125 and the router 155, connected to a wide-area network 157, such as a telephone line, which constitutes a communication network 113A. The connection with the wide-area network 157 is established in the electric power station Ts2 (the digital protective control apparatus 111B) similarly to the connection established in the electric power station Ts1 (the digital protective control apparatus 11A) shown in FIG. 23. Therefore, the structure of the connection is omitted here.

On the other hand, the system simulating unit 151 is, through the transceiver 125, connected to the Ethernet LAN 126 constituted in the electric station Tp. Thus, the system simulating unit 151 is connected to other units in the electric station Tp through the Ethernet LAN 126.

That is, the system simulating unit 151 is provided with a communication interface 160 for inputting, to the system simulating unit 151, electric quantity data D1 (t) and D2 (t) each having the absolute time and transmitted from the wide-area network 157 through the router 156, the Ethernet LAN 126 and the transceiver 125. Moreover, the system simulating unit 151 is provided with a digital processing unit 163 having a memory 161 for storing processing programs and processed data and a CPU 162 for receiving electric quantity data supplied through the communication interface 160.

The CPU 162 is also operative to perform time sequentially arranging processes based on the absolute time by using the received electric quantity data according to the programs stored in the memory 161 and operative to perform processes for generating digital data applied for the test in accordance with a result of the time sequentially arranging process.

Moreover, the system simulating unit 151 is provided with a digital-analog converting unit 164 for converting the digital data for the test generated by the digital processing unit 163 into analog data (analog data applied for the test) Sv so as to output the analog data Sv to the apparatus 153 to be tested.

In addition, the system simulating unit 151 is provided with an input/output interface 165 for inputting, to the system simulating unit 151, control output data Cv corresponding to the analog data Sv and transmitted from the apparatus 153. The CPU 162 of the digital processing unit 163 is adapted to receive the control output data Cv supplied through the input/output interface 165, so as to, in accordance with the control output data Cv, confirm the operation of the apparatus 153. Each of the elements (the communication interface 160, the CPU 162, the digital processing unit 163, the digital-analog converting unit 164 and the input/output interface 165) of the system simulating unit 151 are connected to a bus 166. Thus, data communication among the elements are performed through the bus 166.

The receiving unit 120A shown in FIG. 22 is able to concretely be realized mainly by the processes of the communication interface 160, the memory 161, the CPU 162 and the input/output interface 165. Each of the arranging unit 121, the reserving unit 122, the generating unit 152 and the testing unit 155 is able to concretely be realized mainly by the processes of the memory 161 and the CPU 162 The output unit 154 is able to concretely be realized mainly by the processes of the CPU 162 and the digital-analog converting unit 164.

Similarly to the first to fourth embodiments, the control system 150 having the above-mentioned structure is provided with the digital protective control apparatuses 111A and 111B each having the CPU 130. The CPU 130 sequentially samples the electric quantities (for example, voltages Va, Vb and Vc in the corresponding phases) of the equipment devices E1 and E2 of the electric power system 31 through each analog-digital converting unit 2 in accordance with the sampling period set in accordance with the absolute time t. Then, the CPU 130 converts the electric quantities into digital electric quantity data Dva1 to Dvc1 and Dva2 to Dvc2. Then, the CPU 130 adds absolute time t of sampling to the sequentially converted electric quantity data Dva1 to Dvc1 and Dva2 to Dvc2. Thus, the CPU 130 generates electric quantity data Dva1 (t) to Dvc1 (t) and Dva2 (t) to Dvc2 (t) having a data structure including predetermined parameters {"name of apparatus", "the phase of electric quantity", "electric quantity (instantaneous value)" and "absolute time (time)"}.

The instantaneous value of voltage Va in the phase a of the equipment device E1 of the electric power system 31 is, by the analog-digital converting unit 2, sampled at each sampling period (for example, every 0.0016666 . . . second) from absolute time t=t1:45.2500000 second, 14:30, Jul. 11, 1997. Thus, electric quantity data Dva1 (t1) and Dva1 (t2), to which the absolute time t=t1, t2, . . . , of sampling are added, are generated (refer to step ST1 shown in FIG. 24 which is a data transition diagram).

Electric quantity data Dva1 (t1, t2, . . . ,) to Dvc1 (t1, t2, . . . ,), and Dva2 (t1, t2, . . . ,) to Dvc2 (t1, t2, . . . ,) sampled by the control apparatuses 111A and 111B are sequentially transmitted to the wide-area network 157 through the communication interface 128, the transceiver 125, the Ethernet LAN 126 and the router 156.

The CPU 162 of the digital processing unit 163 of the system simulating unit 151 receives electric quantity data Dva1 (t1, t2, . . . ,) to Dvc1 (t1, t2, . . . ,), and Dva2 (t1, t2, . . . ,) to Dvc2 (t1, t2, . . . ,) transmitted through the wide-area network 157. Then, the CPU 162 sequentially stores the same in a predetermined address range temporarily assigned to the memory 161 through the communication interface 160.

The electric quantity data group Dva1 (t1, t2, . . . ,) to Dvc1 (t1, t2, . . . ,), and Dva2 (t1, t2, . . . ,) to Dvc2 (t1, t2, . . . ,) received by the system simulating unit 151 and temporarily stored in the memory 161 is in the form in which absolute time and phases mixed with each other are randomly positioned in step ST2 shown in FIG. 24. Therefore, an arranging process similar to that according to the fourth embodiment is performed by the CPU 162. Thus, the electric quantity data group is formed into a table in step ST3 shown in FIG. 24 in which the electric quantities (instantaneous values) sampled from the most previous electric quantity (the instantaneous value) to latest electric quantity for each apparatus and phase are sorted. The table is stored in the memory 161.

The CPU 162 performs a process to read electric quantities (the instantaneous values) for each apparatus and phase from the table stored in the memory 161 so as to output the electric quantities to the digital-analog converting unit 164. Then, the digital-analog converting unit 164 sequentially generates analog data (voltage data) Sv applied for the test.

The thus-generated analog data Sv applied for the test are substantially equal to the actual electric quantities of the equipment devices E1 and E2 of the electric power system 31, because no logical conversion error is included in the analog data Sv except for a conversion error occurring when analog data are converted into digital data and a conversion error occurring when digital data are converted into analog data.

Therefore, in this embodiment, it is unnecessary to use analog data applied for the test, which are obtained by a conventional system simulating apparatus in accordance with a fixed system accident of a fixed system model previously installed in the conventional system simulating apparatus.

That is, in this embodiment, it enables to generate analog data applied for the test, which are substantially equal (except for the conversion errors) to the actual electric quantities of the electric power system 31.

The analog data Sv applied for the test generated by the digital-analog converting unit 164 as described above are supplied to the apparatus 153 to be tested.

The apparatus 153 to be tested performs protective control operation processes in accordance with the transmitted analog data Sv so as to generate control output data Cv corresponding to the analog data Sv. Thus-generated control output data Cv is transmitted to the system simulating unit 151 so as to be received by the CPU 162 of the digital processing unit 163 through the input/output interface 165.

As a result, the CPU 162 of the system simulating unit 151 enables the operation of the tested apparatus 153 to be confirmed according to the analog data applied for the test.

As described above, the electric power system protective control system according to this embodiment is able to use analog data applied for the test, which are similar to the actual state quantities (the electric quantities) of the electric power system. Therefore, there in no need to use analog data applied for the test, which are obtained on the basis of a predetermined system model or a system accident. In this embodiment, it is able to use analog data applied for the test corresponding to state quantities (state change data) on the basis of a system accident occurred in an actual electric power system, thereby performing the operation confirmation test of the apparatus to be tested.

Therefore, the operation confirmation test of the apparatus to be tested can be performed by using the analog data corresponding to the state quantities related to a complicated system accident, such as electromagnetic induction between two parallel power-transmission lines. Therefore, it is possible to improve the reliability of the test for confirming the operation of the apparatus to be tested and the electric power system protective control system.

If an actual electric power system is complicated and in the form of superimposed power flow, it is possible to use analog data applied for the test corresponding to the state quantities related to the system accident which occur in the foregoing complicated electric power system having the superimposed power flow so as to perform a total operation test of the apparatus to be tested. Therefore, it is capable of improving the reliability of the test for confirming the operation of the apparatus to be tested and the electric power system protective control system.

Furthermore, when a test for causing a steady state to be continued for long time is performed, the state quantities (the electric quantities) of the actual electric power system are as it is used as analog data applied for the test. Therefore, it is able to generate the analog data applied for the test corresponding to change in the power flow during the daytime and the change of the operation of the system. Therefore, operation confirmation tests to which the change in the system power flow during the daytime and the change in the system operation, which must require considerably high cost and a complicated system model, can easily be performed without the foregoing costly and complicated system model Therefore, it is possible to improve the cost efficiency of the electric power system protective control system and the reliability of the apparatus to be tested and the electric power system protective control system.

(Sixth Embodiment)

An electric power system protective control system according to a sixth embodiment of the present invention will now be described with reference to FIGS. 25 to 27.

Figure 25:
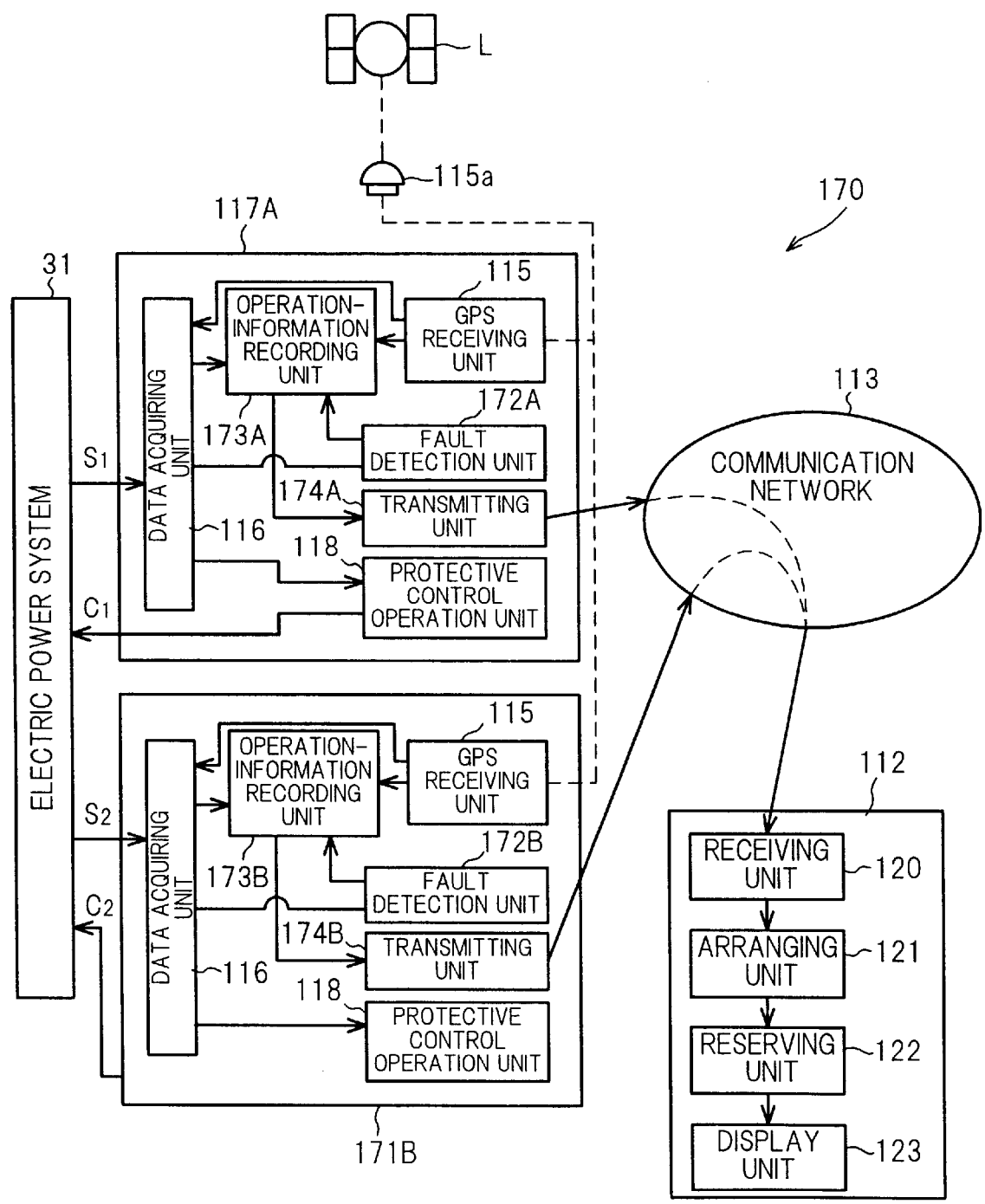
FIG. 25 is a diagram showing functional blocks of an electric power system protective control system according to a sixth embodiment of the present invention.

FIG. 25 is a diagram showing functional blocks of the electric power system protective control system according to this embodiment. Functional blocks similar to those of the electric power system protective control system according to the fourth embodiment shown in FIG. 18 are given the same reference numerals and the similar blocks are omitted from description or described simply.

Referring to FIG. 25, an electric power system protective control system 170 is provided with a plurality of digital protective control apparatuses 171A and 171B. The digital protective control apparatuses 171A and 171B are provided for each equipment device {two equipment devices (equipment devices E1 and E2) disposed adjacent to each other to simplify the description} of the electric power system 31 to be protected.

Each of the control apparatuses 171A and 171B has a protective control processing function for fetching analog state quantities (the electric quantities) S1 and S2, such as electric currents and voltages, in the equipment devices E1 and E2 so as to perform the protective control operation processes in accordance with the electric quantities S1 and S2 thereby outputting protective control operation commands C1 and C2, such as a tripping command and a reset command, toward protective control devices, such as breakers, corresponding to the equipment devices E1 and E2 of the electric power system 31.

Moreover, each of the digital protective control apparatuses 171A and 171B has a fault detecting function, which is independently of the protective control processing function, for detecting whether or not a fault (an accident) has occurred in each of the equipment devices E1 and E2 in accordance with the electric quantities S1 and S2.

Furthermore, the control system 170 is provided with the display unit 112 for displaying the electric quantities S1 and S2 acquired by the control apparatuses 171A and 171B. The foregoing elements (the control apparatuses 171A, 171B and the display unit 112) in the control system 170 are connected to each other through the communication network 113 such that data communication is permitted.

In addition to the GPS receiving unit 115, the data acquiring unit 116 and the protective control processing unit 118, the digital protective control apparatus 171A is provided with a fault detection unit 172A for detecting a fault occurring in the equipment device E1 which is an object of protectively control of the apparatus 171A and the equipment device E2 which is not an object of protectively control thereof. The fact that the equipment device E2 is not protected is that the protective control device of the digital protective control apparatus 171A is not correctly operated even if a fault occurs in the equipment device E2.

Moreover, the control apparatus 171A is provided with an operation-information recording unit 173A which is capable of, when the fault detection unit 172A detects a fault of at least one of the equipment device E1 and the equipment device E2, fetching electric quantity data D1 sampled by the data acquiring unit 116 in accordance with a fault detection command transmitted from the fault detection unit 172A and of adding the absolute time t of sampling to the electric quantity data D1 so as to record those as electric quantity data D1 (t) having the absolute time.

The digital protective control apparatus 171A is further provided with a transmitting unit 174A for reading the electric quantity data D1 (t) recorded by the operation-information recording unit 173A so as to transmit the recorded data D1 (t) to the communication network 113.

In addition to the GPS receiving unit 115, the data acquiring unit 116 and the protective control calculating unit 118 and similarly to the control apparatus 171A, the control apparatus 171B is provided with a fault detection unit 172B for detecting a fault occurring in the equipment device E2 which is an object of protectively control of the apparatus 171B and the equipment device E1 which is not an object of protectively control thereof.

Moreover, the control apparatus 171B is provided with an operation-information recording unit 173B which is capable of, when the fault detection unit 172B detects a fault of at least one of the equipment device E1 and the equipment device E2, fetching electric quantity data D2 sampled by the data acquiring unit 116 in accordance with a fault detection command transmitted from the fault detection unit 172B and of adding the absolute time t of sampling to the electric quantity data D2 so as to record those as electric quantity data D2 (t) having the absolute time.

Furthermore, the control apparatus 171B is provided with a transmission unit 174B for reading electric quantity data D2 (t) so as to transmit those to the communication network 113. Note that the AC power source for the GPS receiving unit is omitted from illustration.

Similarly to the fourth embodiment, the display unit 112 time-sequentially arranges (sorts) electric quantity data D1 (t) and D2 (t) each having the absolute time transmitted from the control apparatuses 171A and 171B through the communication network 113 so as to display the sorted electric quantity data D1 (t) and D2 (t). The display unit 112 is provided with the receiving unit 120, the arranging unit 121, the reserving unit 122 and the display unit 123.

Figure 26:
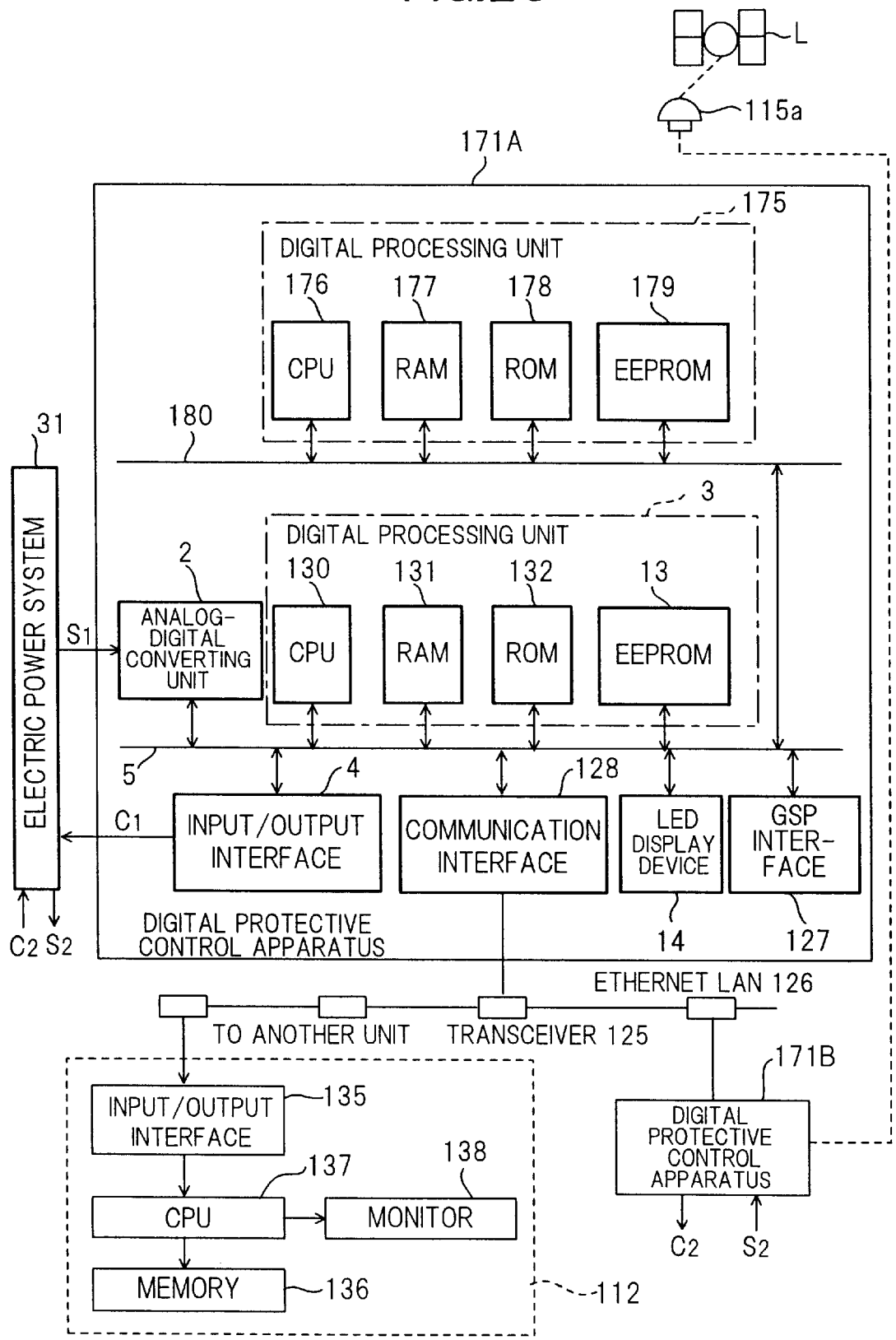
FIG. 26 is a diagram showing the hardware configurations of a digital protective control apparatus and a display unit according to the sixth embodiment.

FIG. 26 is a diagram showing the hardware configuration for realizing the processes of functional blocks of the control apparatus 171A and the display unit 112 according to this embodiment. The display unit 112 is realized by, for example, a personal computer. Similar elements of the hardware configuration of the control apparatus 171A to those of the control apparatus 111A shown in FIG. 19 are given the same reference numerals and the similar elements are omitted from description or described simply.

The control apparatus 171A shown in FIG. 26 is connected to other units (the control apparatus 171B and the display unit 112) of the control system 170 through the transceiver 125 and the Ethernet LAN 126, which constitute the communication network 113, such that data communication is permitted.

The control apparatus 171A is provided with the following units each having a similar structure according to the fourth embodiment: an analog-digital converting unit 2 for acquiring electric quantity data; a digital processing unit 3 serving as a main detection relay hardware for performing processes including the process for adding absolute time and the protective control calculating processes; the input/output interface (I/O) 4 serving as the interface with respect to the electric power system 31, the bus 5 for connecting the elements to each other, the LED display unit 14 for displaying electric quantity data and the like; a GPS interface 127 serving as the interface for the GPS system (the GPS receiving antenna 115a and the satellites L); and the communication interface 128 serving as the interface with respect to the Ethernet LAN 126.

In addition, the control apparatus 171A is provided with a digital processing unit 175 serving as an fault-detection relay (fail safe relay) hardware for realizing the fault detection unit 172A.

The digital processing unit 175 is provided with a CPU 176 for performing processes including the fault detection process; a RAM 177 for temporarily storing data processed by the CPU 176; a ROM 178 for storing procedures (programs) of the processes including the fault detection process; and an EEPROM 179 for storing the setting values. The foregoing elements are connected to each other through a bus 180 such that data communication is permitted. The bus 180 is connected to the bus 5. Thus, the CPU 176 of the digital processing unit 175 is able to communicate data to and from the analog-digital converting unit 2, the digital processing unit 3, the communication interface 128 and the like through the bus 180 and the bus 5.

The CPU 176 of the digital processing unit 175 covers a detection range wider than the fault (an accident) detection range covered by the protective control operation processes performed by the CPU 130.

That is, the CPU 176 must be operated when the CPU 130 performs the fault detection operation to detect a fault (an accident) of the equipment device E1 which is the object of protectively control of the CPU 130, and is adapted to be operated, when a fault is caused to the equipment device E2 which is not the object of protectively control of the CPU 130, so as to detect the fault of the equipment device E2.

That is, the CPU 176 is adapted to detect, when the electric quantity (the electric current) of, for example, the electric power system 31 is larger than a predetermined value or the three-phase unbalance of the voltage is larger than a predetermined value, the fault of the equipment device E2 in accordance with electric quantity data stored in the RAM 177 so as to transmit protective control operation command C1', such as a tripping command, to the input/output interface 4 through the bus 5.

The input/output interface 4 has a fail-safe function by which only when protective control operation command C1 from the CPU 130 and the protective control operation command C1' from the CPU 176 are transmitted, that is, an AND output value of the two commands is, as the protective control operation command C1, transmitted to the protective control device such as the breaker.

The hardware configuration of the digital protective control apparatus 171B is similar to that of the digital protective control apparatus 171A except for a structure that the electric quantity which is acquired is expressed by S2 and the electric quantity data which must be converted is expressed by D2. Therefore, the hardware configuration is omitted from description.

On the other hand, the display unit 112 is provided with the input/output interface 135, the memory 136, the CPU 137 and the monitor 138 similarly to the fourth embodiment.

The overall operation of the electric power system protective control system 170 having the above-mentioned structure will now be described.

Figure 27:
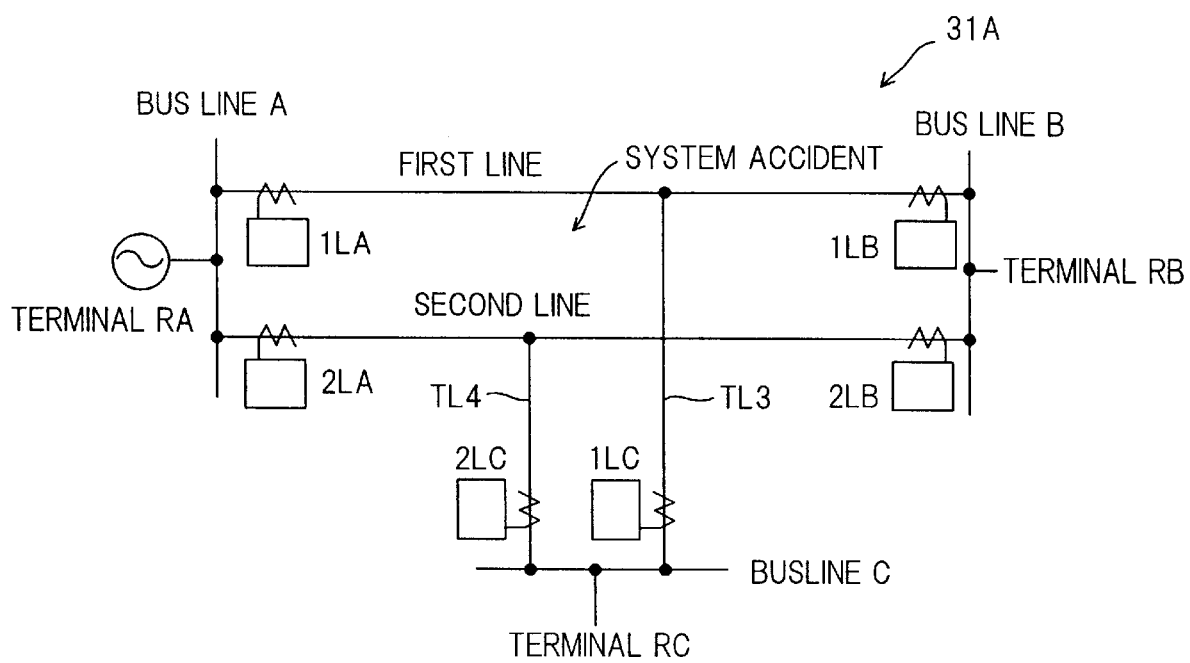
FIG. 27 is a single-line connection diagram including a portion of equipment devices of the electric power system.

FIG. 27 is a diagram showing a single-line connection including a portion of equipment devices of the electric power system.

Referring to FIG. 27, an electric power system 31A has adjacent power-transmission lines (a first line TL1 and a second line TL2) for connecting a bus line A and a bus line B to each other; a power-transmission line TL3 for connecting the first line TL1 and the bus line C to each other; and a power-transmission line TL4 for connecting the second line TL2 and the bus line C to each other and disposed adjacent to the power-transmission line TL3.

In the electric power system 31A, there are disposed digital protective control apparatuses 1LA and 1LB provided for the adjacent first line TL1 and the second line TL2 at ends adjacent to a terminal RA to which a power source is connected and adapted to perform protectively control of the first line TL1 and the second line TL2 (the bus line A and the bus line B). Moreover, digital protective control apparatuses 2LA and 2LB are provided for the adjacent first line TL1 and the second line TL2 at ends adjacent to an opened terminal RB to protectively control the first line TL1 and the second line TL2 (the bus line A and the bus line B). Furthermore, digital protective control apparatuses 1LC and 2LC are provided for the adjacent power-transmission lines TL3 and TL4 to protectively control the power-transmission lines TL3 and TL4 (the bus line C).

The first line TL1 and the second line TL2 in the electric power system 31A having the above-mentioned structure disposed adjacent to each other exert influences mutually. If a system fault as shown in FIG. 27 occurs in the first line TL1, the digital protective control apparatuses 2LA to 2LC adapted to protect the second line TL2 do not perform the protective control operation (that is, the operation is inhibited).

However, when a portion of a plurality of equipment devices, such as the first line TL1 and the second line TL2, which mutually exert influences has encountered a system fault, there arises a requirement that analysis of state quantities of the residual equipment devices except for the fault equipment device in the mutually influenced equipment devices are performed by a digital protective control apparatus adapted to protect the residual equipment devices.

The electric power system protective control system according to this embodiment meets the above-mentioned requirement.

That is, the electric power system protective control system 170 is provided with the CPU 130 and the CPU 176 of the digital protective control apparatus 171A. The CPU 130 and the CPU 176 sequentially sample the electric quantities S1 (for example, voltages Va, Vb and Vc in the corresponding phases) of the equipment device E1 through the analog-digital converting unit 2 in accordance with the sampling period set by a sampling-period setting process similar to that according to the fourth embodiment so that the electric quantities S1 are converted into digital electric quantity data Dva1 to Dvc1. Electric quantity data Dva1 to Dvc1, which is sequentially converted, are stored in the RAM 131 and the RAM 177 by the processes of the CPU 130 and the CPU 176, respectively. Similarly, the CPU 130 and the CPU 176 of the digital protective control apparatus 171B store electric quantity data Dva2 to Dvc2 obtained in accordance with the electric quantities S2 of the equipment device E2 in the RAM 131 and the RAM 177, respectively.

At this time, the CPU 130 of each of the control apparatus 171A and 171B performs the protective control operation processes in accordance with the setting values stored in the EEPROM 13 and the electric quantity data Dva1 to Dvc1 and Dva2 to Dvc2 stored in the RAM 131. Thus, the CPU 130 determines whether or not a system fault occurs in the equipment devices E1 and E2 which are the object of the protective control by the control apparatus 171A and 171B, respectively. In accordance with a result of determination (when a fault occurs in E1 or E2), the CPU 130 transmits a protective control operation command (a tripping operation command or the like) C1 to the input/output interface 4.

On the other hand, individually from and simultaneously with the protective control operation processes of the CPU 130, the CPU 176 of the digital protective control apparatus 171A performs processes based on the setting values stored in the EEPROM 179 and electric quantity data Dva1 to Dvc1 stored in the RAM 177 so that the CPU 176 determines whether or not a fault has occurred in the equipment device El, which is the object of protective control of the control apparatus 171A and another equipment device which is not the object thereof (for example, the equipment device E2) in the electric power system 31 except for the equipment device E1. Similarly, the CPU 176 of the digital protective control apparatus 171B performs processes based on the electric quantity data Dva2 to Dvc2 so that the CPU 176 determines whether or not a fault has occurred in the equipment device E2 which is the object of protective control of the control apparatus 171B and another equipment device which is not the object thereof (for example, the equipment device E1) in the electric power system 31 except for the equipment device E2.

If a system fault occurs in the equipment device E2, the CPU 176 of the control apparatus 171B adapted to protect the equipment device E2 transmits the protective control operation command C1' on the basis of the protective control operation processes performed by the CPU 130 to the input/output interface 4. As a result, the fail-safe function of the input/output interface 4 causes the protective control operation command C1 to be transmitted to the protective control apparatus (the correctly operation of the control apparatus 171B is performed).

If the CPU 176 determines that a system fault occurs in the equipment device E2 as a result of the operation processes, the CPU 176 adds the absolute time "t=t1" of sampling to electric quantity data Dva2 to Dvc2 stored in the RAM 177 in addition to the process for outputting protective control operation command C1' in the correctly operation process. Thus, the CPU 176 again stores (records), in the RAM 177, the electric quantity data Dva2 (t1) to Dvc2 (t1) having a data structure including parameters schematically shown in FIG. 20, that is, electric quantity data indicating state quantities (electric quantities, changes of state quantities) at the system fault. Next, the CPU 176 sequentially transmits recorded electric quantity data Dva2 (t1) to Dvc2 (t1) to the Ethernet LAN 126 through the bus 180, the bus 5, the communication interface 128 and the transceiver 125. Then, electric quantity data Dva2 (t2, t3, . . . ,) to Dvc2 (t2, t3, . . . ,) from occurrence of the system accident are sequentially transmitted to the Ethernet LAN 126 at each sampling period.

The CPU 176 of the digital protective control apparatus 171A which does not protect the equipment device E2 encountered the accident performs the protective control operation processes to determine that a system fault has occurred in the another equipment device E2 which is not the object of protective control of the control apparatus 171A. Thus, similar to the CPU 176 of the digital protective control apparatus 171B, the CPU 176 again records, in the RAM 177, the electric quantity data Dva1 to Dvc1 as electric quantity data dva1 (t1) to Dvc1 (t1) each having the absolute time "t=t1". Then, the CPU 176 sequentially transmits the recorded electric quantity data Dva1 (t1) to Dvc1 (t1) to the Ethernet LAN 126 through the bus 180, the bus 5, the communication interface 128 and the transceiver 125. Then, the CPU 176 sequentially transmits, to the Ethernet LAN 126, electric quantity data Dva1 (t2, t3, . . . ,) to Dvc1 (t2, t3, . . . ,) from occurrence of the system accident.

Similarly to the fourth embodiment, the CPU 137 of the display unit 112, through the input/output interface 135, receives electric quantity data Dva1 (t1, t2, . . . ,) to Dvc1 (t1, t2, . . . ,) and Dva2 (t1, t2, . . . ,) to Dvc2 (t1, t2, . . . ,) transmitted through the Ethernet LAN 126. Then, the CPU 137 sequentially stores the data Dva1 (t1, t2, . . . ,) to Dvc1 (t1, t2, . . . ,) and Dva2 (t1, t2, . . . ,) to Dvc2 (t1, t2, . . . ,) in a predetermined address range temporarily assigned to the memory 136 (as for a state before arrangement, refer to FIG. 20). In accordance with sampling time (the absolute time) "t=t1, t2, . . . ,", an arranging process similar to that according to the fourth embodiment is performed by the CPU 137. Thus, a table is formed by time-sequentially arranging the electric quantity data for each protective control apparatus (as for a state after the arrangement, refer to FIG. 21).

Then, the CPU 137 reads the table stored in the memory 136 to display the table on the monitor 138. Then, the process is completed.

As a result, the screen of the monitor 138 is able to sequentially display state quantities (changes of state quantities) of the fault equipment device E2 at which the system fault is occurred.

Moreover, the screen of the monitor 138 displays state quantities (changes of state quantities) of the equipment device E1 (non-fault) related to the equipment device E2 caused to the accident.

That is, according to this embodiment, it is able to record and display the state quantities of the equipment device E2 acquired by the control apparatus 171B adapted to be correctly operated when a system fault has occurred to the equipment device E2.

In addition, when the system fault occurs to the equipment device E2, the digital protective control apparatus 171A, which is not correctly operated when the fault has occurred to the equipment device E2, and is correctly operated when a fault has occurred to another equipment device E1, is also able to record the state quantity of the another equipment device E1 related to the fault equipment device E2 so as to display the state quantities of the non-fault equipment device E1 on the monitor 138 of the display unit 112.

Therefore, the operations which are impossible for the conventional control system can be performed. That is, the state quantities acquired by the digital protective control apparatus which is not operated when a system fault has occurred can easily be recorded, confirmed and analyzed. Therefore, if a system fault occurs, total analysis using the electric quantities (the state quantities) obtained from all of the digital protective control apparatuses can be performed regardless of the equipment devices which are the object of protective control. Therefore, it is possible to improve the reliability of the overall electric power system protective control system.

Moreover, the state quantities of all of the equipment devices can be confirmed and analyzed through the monitor of the display unit if a system fault occurs. Therefore, an effect can be obtained in addition to the effect obtainable from the fourth embodiment. That is, the necessity of making rounds the digital protective control apparatuses to confirm and analyze the state quantities of each of the equipment devices by using an analyzing tool can be eliminated. Therefore, great saving in labor can be realized.

Furthermore, in this embodiment, when a defect in operation occurs in the digital processing unit 3 including the CPU 130 of the digital protective control apparatus 171B for performing a usual protective control operation processes, the digital protective control apparatus 171B adapted to protect the equipment device E2 to which the fault happens is erroneously not operated.

However, with this embodiment, the CPU 176 of the digital processing unit 175 individually provided from the CPU 130 detects the fault of the equipment device E2 to record and transmit electric quantity data while performing the protective control operation.

Therefore, if a system fault occurs, the state quantities of each of the equipment devices in the electric power system can be confirmed and analyzed regardless of a fact whether the control apparatus related to the system fault is correctly not operated or erroneously not operated. Thus, it is able to improve the reliability and cost efficiency of the overall electric power system protective control system.

In the fourth and sixth embodiments, the display unit is individually provided from the plural digital protective control apparatuses each of which is provided for each of the equipment devices in the electric power system. The present invention is not limited to this structure. The display unit may be provided for any one of the plural digital protective control apparatuses.

(Seventh Embodiment)

An electric power system protective control system according to a seventh embodiment will now be described with reference to FIG. 28.

Figure 28:
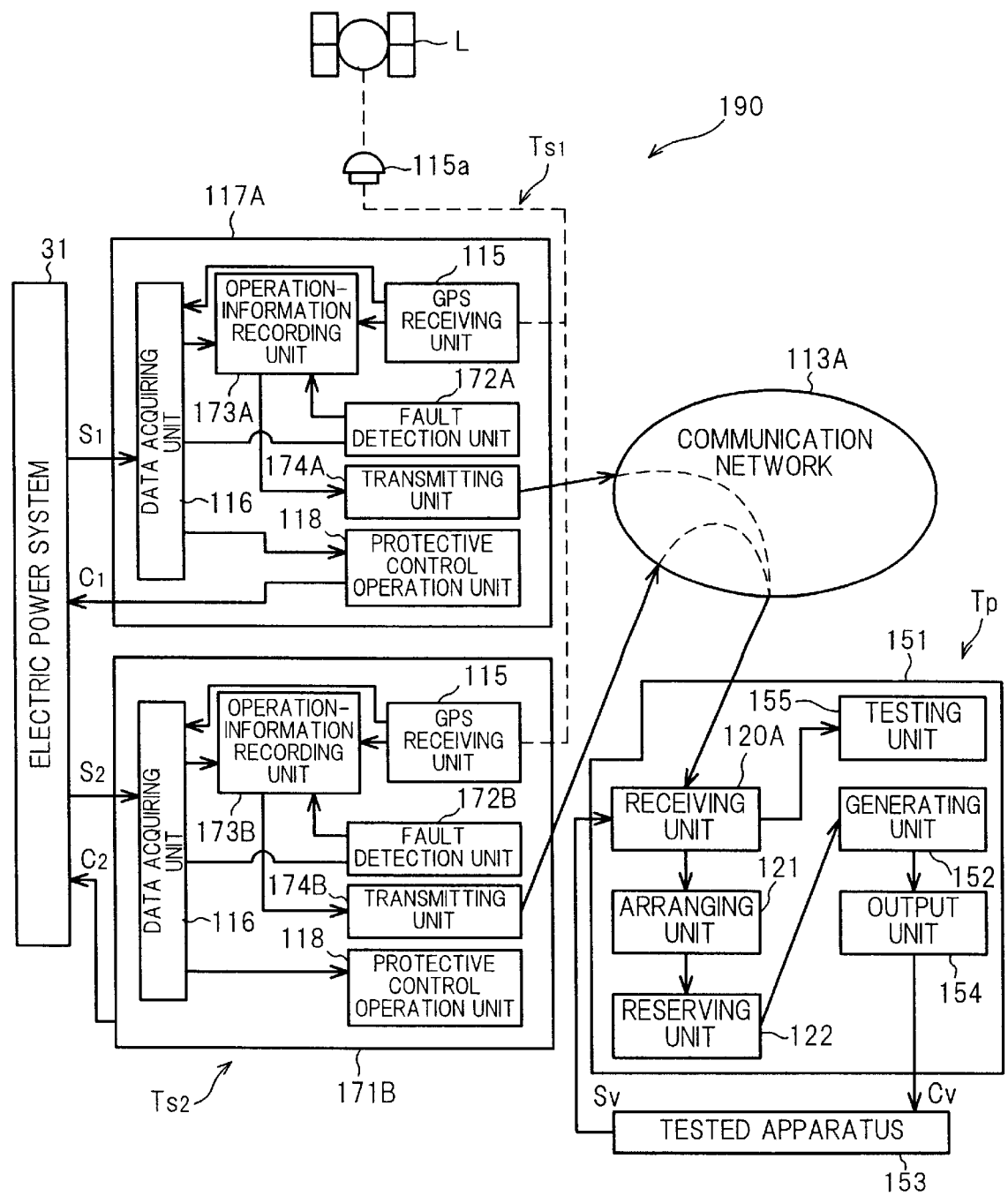
FIG. 28 is a diagram showing functional blocks of an electric power system protective control system according to a seventh embodiment of the present invention.

FIG. 28 is a diagram showing functional blocks of the electric power system protective control system according to this embodiment.

Referring to FIG. 28, an electric power system protective control system 190 according to this embodiment comprises a plurality of electric power stations Ts1 and Ts2 and a manned electric station Tp. The electric power stations Ts1 and Ts2 of the control system 190 is provided with digital protective control apparatuses 171A and 171B provided for each of two equipment devices E1 and E2 which are objects of protective control, respectively, and which are disposed adjacent to each other. The functional block configuration of each of the digital protective control apparatuses 171A and 171B is similar to that of the digital protective control apparatus according to the sixth embodiment. Therefore, similar structures are given the same reference numerals and the similar structures are omitted from description.

The electric station Tp of the control system 190 is provided with a system simulating unit 151 for generating analog data Sv applied for a test in accordance with electric quantity data on the basis of the electric quantities S1 and S2 acquired by the control apparatuses 171A and 171B. According to the generated analog data for use in the test, the system simulating unit 151 confirms the operation of a digital protective control apparatus (an apparatus to be tested) designed and manufactured by, for example, a manufacturer in the electric station Tp. The control apparatuses 171A and 171B and the system simulating unit 151 are connected to each other through the communication network 113A such that data communication is permitted. The functional block configuration of the system simulating unit 151 is similar to that of the system simulating unit according to the fifth embodiment. Therefore, the similar structures are given the same reference numerals and they are omitted from description.

The hardware configurations of the digital protective control apparatuses 171A and 171B according to this embodiment are similar to that of the digital protective control apparatus according to the sixth embodiment shown in FIG. 26. Therefore, a reference to the hardware elements shown in FIG. 26 is made to describe this embodiment. The hardware configuration of the system simulating unit 151 according to this embodiment is similar to that of the digital protective control apparatus according to the fifth embodiment shown in FIG. 23, a reference is made to the hardware elements shown in FIG. 23.

With the electric power system protective control system 190 having the above-mentioned structure, if a system fault occurs in the equipment device E2, a process similar to that according to the sixth embodiment is performed by the digital protective control apparatus 171A and the digital protective control apparatus 171B. Thus, electric quantity data Dva2 (t1, t2, . . . ,) to Dvc2 (t1, t2, . . . ,) indicating a state of the equipment device E2 at the occurrence of the system fault and states of the same after the occurrence thereof and electric quantity data Dva1 (t1, t2, . . . ,) to Dvc1 (t1, t2, . . . ,) indicating a state of the equipment device E1 adjacent to the equipment device E2 at the occurrence of the system fault and states of the same after the occurrence thereof are transmitted to the communication network 113A, respectively.

Electric quantity data Dva1 (t1, t2, . . . ,) to Dvc1 (t1, t2, . . . ,)(t1, t2, . . . ,) and electric quantity data Dva2 (t1, t2, . . . ,) to Dvc2 (t1, t2, . . . ,) transmitted to the communication network 113A are transmitted to the system simulating unit 151 so as to be received. An arranging process similar to that according to the fifth embodiment is performed thus data above is formed into a table in which data are arranged in a time-sequentially manner for each protective control apparatus.

The system simulating unit 151 performs a generating process to generate analog data Sv for use in the test in accordance with the electric quantities (the instantaneous values) read for each apparatus and each phase which are arranged into the table. Thus, analog data Sv applied for the test are transmitted to the unit 153 to be tested.

That is, according to the foregoing structure, it is possible to produce the analog data applied for the test on the basis of the state quantities of the equipment device E2 occurring the system fault and acquired by the digital protective control apparatus 171B adapted to be operated when the system fault occurs and the state quantities of the equipment device E1 (non-fault) acquired by the digital protective control apparatus 171A in accordance with the equipment device E2, whereby the tested apparatus 153 is subjected to the analog data so that the test can be performed.

Therefore, the operation confirmation test which is impossible for the conventional structure can be performed. That is, it is possible to use the analog data applied for the test corresponding to state quantities acquired by the digital protective control apparatus which is correctly not operated when a system fault occurs, thereby performing the test for confirming the operation of the tested apparatus. Thus, it is possible to improve the reliability of the test for confirming the operation of the tested apparatus and the electric power system protective control system.

Therefore, in a case where a complicated electric power system exists actually, it is possible to easily perform the test for the complicated electric power system, which is impossible by a conventional control system. As a result, it is possible to furthermore improve the reliability of the tested apparatus and the reliability for confirming the operation of the electric power system protective control system.

According to this embodiment, the electric quantity data of each of the equipment devices acquired when a system accident occurs are recorded in each of the digital protective control apparatuses. Therefore, actual electric quantity data of each of the equipment devices can be acquired when any one of a various system fault occurs without a necessity for the conventional technique of setting simulations of a variety of system faults. Therefore, it is possible to furthermore improve the cost efficient of the electric power system protective control system and the reliability of each of the tested apparatuses and the electric power system protective control system.

The fifth and seventh embodiments has the system simulating unit which is provided individually from the plural digital protective control apparatuses each of which is provided for each of the equipment devices of the electric power system. The present invention is not limited to this structure. The system simulating unit may be provided for any one of the plural digital protective control apparatuses.

In each of the sixth and seventh embodiments, the fault detection relay hardware for performing fault detection relay operation is provided individually from the digital processing unit 3. The present invention is not limited to this structure. The hardware may be realized as one of relay software modules for the digital processing unit 3. One digital processing unit 3 may perform the main detection relay operation and the fault detection relay operation.

(Eighth Embodiment)

An electric power system protective control system according to an eighth embodiment of the present invention will now be described with reference to FIGS. 29 and 30.

Figure 29:
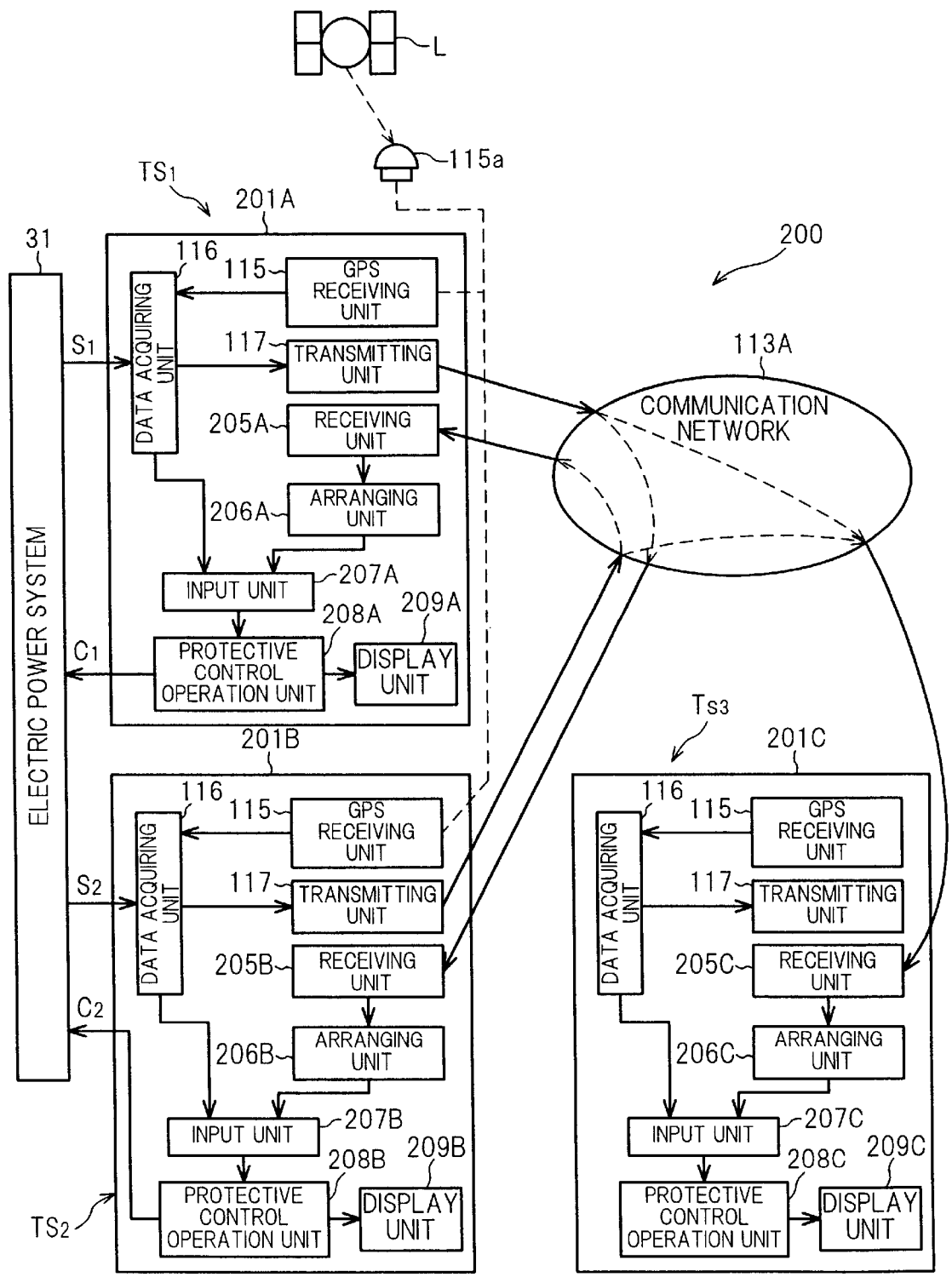
FIG. 29 is a diagram showing functional blocks of an electric power system protective control system according to an eighth embodiment of the present invention.

FIG. 29 is a diagram showing functional blocks of the electric power system protective control system according to this embodiment.

Referring to FIG. 29, an electric power system protective control system 200 is provided with a plurality of electric power stations Ts1 to Ts3. The electric power stations Ts1 and Ts2 of the electric power stations Ts1 to Ts3 of the control system 200 are provided with digital protective control apparatuses 201A and 201B provided for the equipment devices E1 and E2 of the electric power system 31 to be protected, respectively. The electric power station Ts3 is provided with a digital protective control apparatus 201C, the operation of which is tested. The electric power stations Ts1 to Ts3 are connected to each another through the communication network 113A such that data communication is permitted.

In addition to the predetermined functional blocks (the GPS receiving unit 115, the data acquiring unit 116 and the transmitting unit 117) of the digital protective control apparatus 111A according to the fifth embodiment, the digital protective control apparatus 201A is provided with a receiving unit 205A for receiving electric quantity data D2 (t) having the absolute time and transmitted from another digital protective control apparatus (the digital protective control apparatus 201B) through the communication network 113A. Moreover, the digital protective control apparatus 201A is provided with an arranging unit 206A for time-sequentially arranging (sorting) the electric quantity data D2 (t) received by the receiving unit 205A in accordance with the added absolute time.

Furthermore, the digital protective control apparatus 201A is provided with input unit 207A for determining whether or not the electric quantity data D2 (t) having the absolute time are transmitted through the communication network 113A (that is, whether or not a result of arrangement performed by the arranging unit 206A exists). If the electric quantity data D2 (t) are transmitted and the result of arrangement performed by the arranging unit 206A exists, the input unit 207A inputs the result of the arrangement to a protective control operation unit 208A to be described later. If the result of the arrangement does not exist, the input unit 207A inputs, to the protective control operation unit 208A, state quantity data (electric quantity data D1 (t)) of the equipment device E1 acquired by the data acquiring unit 116. Moreover, the control apparatus 201A is provided with the protective control operation unit 208A for performing the protective control operation processes in accordance with either of a result of the arrangement performed by the arranging unit 206A or electric quantity data acquired by the data acquiring unit 116. When the protective control operation unit 208A performs the protective control operation processes by using electric quantity data D1 (t) acquired by the data acquiring unit 116, the protective control operation unit 208A outputs, as a protective control operation command C1, a result of the protective control operation processes to the protective control device such as the breaker, for the equipment device E1 of the electric power system 31. When the protective control operation unit 208A performs the protective control operation processes by using the result of the arrangement performed by the arranging unit 206A, the protective control operation unit 208A displays the result of the protective control operation processes on a display unit 209A, such as a monitor.

The digital protective control apparatus 201B is provided with the GPS receiving unit 115, the data acquiring unit 116, the transmitting unit 117, a receiving unit 205B, an arranging unit 206B, an input unit 207B, a protective control operation unit 208B and a display unit 209B. The functional blocks of the digital protective control apparatus 201B are substantially similar to those of the digital protective control apparatus 201A except that the other digital protective control apparatus of the control apparatus 201A is regarded as the digital protective control apparatus 201A, the electric quantity data transmitted through the power-transmission line 103A is regarded as the data D1 (t) and the electric quantity data acquired by the data acquiring unit 116 is regarded as the electric quantity data D2 (t) of the equipment device E2 to be protected. Therefore, the functional blocks of the control apparatus 201B are omitted from description.

The digital protective control apparatus 201C is provided with the GPS receiving unit 115, the data acquiring unit 116, the transmitting unit 117, a receiving unit 205C, an arranging unit 206C, an input unit 207C, a protective control operation unit 208C and a display unit 209C.

Each of the functional blocks of the digital protective control apparatus 201C are basically similar to those of the digital protective control apparatus 201A and 201B. Since the digital protective control apparatus 201C is in a state before the operation confirmation test, the functional blocks are slightly different from the foregoing functional blocks of the control apparatuses 201A and 201B.

That is, the data acquiring unit 116 of the digital protective control apparatus 201C does not fetch electric quantity data from the equipment devices of the electric power system 31 to be protected. Therefore, the transmitting unit 117 does not transmit electric quantity data to the other digital protective control apparatuses 201A and 201B through the communication network 113A. The receiving unit 205C receives electric quantity data D1 (t) and D2 (t) from the other digital protective control apparatuses (201A and 201B) through the communication network 113A. The arranging unit 206C time-sequentially arranges (sorts) electric quantity data D1 (t) and D2 (t) received by the receiving unit 205C in accordance with the added absolute time.

Moreover, the input unit 207C inputs a result of arrangement performed by the arranging unit 206C to the protective control operation unit 208C. The protective control operation unit 208C performs the protective control operation processes in accordance with the result of the arrangement communicated from the input unit 207C.

Figure 30:
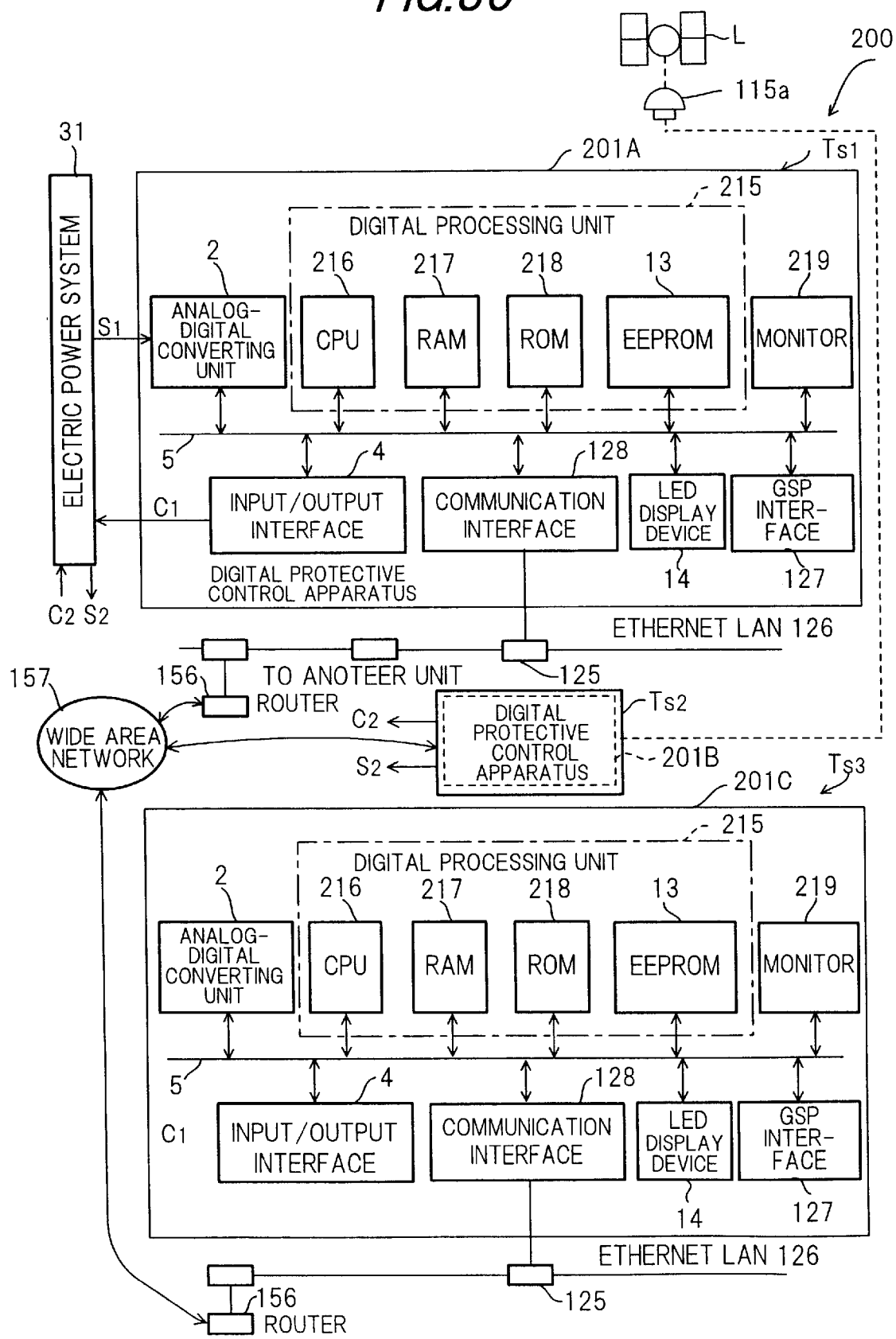
FIG. 30 is a diagram showing the hardware configuration of a digital protective control apparatus according to the eighth embodiment.

FIG. 30 is a diagram showing the hardware configuration for realizing the processes of the functional blocks of the digital protective control apparatus 201A and the digital protective control apparatus 201C according to this embodiment. Similar elements in the hardware configurations of the digital protective control apparatuses 201A and 201C to those in the hardware of the digital protective control apparatus 1 shown in FIG. 60 are given the same reference numerals and the similar elements are omitted from description or described simply.

Referring to FIG. 30, the digital protective control apparatuses 201A to 201C are, through the transceiver 125, connected to the Ethernet LAN 126 constituted in the electric power stations Ts1 and Ts3 such that data communication is permitted to the other units in the electric power stations Ts1 and Ts3 through the Ethernet LAN 126.

The Ethernet LAN 126 for connecting local areas in each of the electric power stations Ts1 and Ts3 is, through the transceiver 125 and the router 155, connected to the wide-area network 157 constituting the communication network 113A. The connection between the electric power station Ts2 (the digital protective control apparatus 201B) to the wide-area network 157 is similar to that in the electric power station Ts1 (the digital protective control apparatus 201A) and that in the electric power station Ts3 (the digital protective control apparatus 201C) shown in FIG. 30. Therefore, the connection is omitted from description.

The digital protective control apparatus 201A shown in FIG. 30 is provided with the analog-digital converting unit 2 for acquiring electric quantity data D1; a digital processing unit 215 for performing the absolute time adding process, the arranging process, the determining process and the protective control operation processes; the input/output interface (I/O) 4 serving as the interface for the electric power system 31; the bus 5 for connecting the elements to one another; the LED display unit 14 for displaying electric quantity data; the GPS interface 127 serving as the interface for the GPS system (the GPS receiving antenna 115a and the satellites L); and the communication interface 128 serving as the interface for data input/output between the Ethernet LAN 126 and the digital protective control apparatus 215.

The digital processing unit 215 is provided with a CPU 216 for performing the processes including the absolute time adding process, the arranging process, the determining process and the protective control operation processes; a RAM 217 for temporarily storing electric quantity data and data processed by the CPU 216; a ROM 218 for storing procedures (programs) for the processes including the adding process, the arranging process, the determining process and the protective control operation processes; and the EEPROM 13 for storing the setting values.

The digital protective control apparatus 201A has a monitor 219 for displaying a result of the protective control operation processes performed by the CPU 216. The hardware configuration of the digital protective control apparatus 201B is similar to that of the digital protective control apparatus 201A except for a structure that the acquired electric quantities are expressed by S2 and the electric quantity data to be converted are expressed by D2. Therefore, the hardware configuration is omitted from description.

The hardware configuration of the digital protective control apparatus 201C to be tested is similar to that of the digital protective control apparatus 201A except for the structures that the analog-digital converting unit 2 is not connected to the electric power system 31 because the state is before the operation confirmation test; the GPS interface 127 is not connected to the GPS receiving antenna 115a because the state is before the operation confirmation test; and the CPU 216 of the digital processing unit 215 does not perform the determining process. Therefore, the same structures are given the same reference numerals and they are omitted from description.

The data acquiring unit 116 shown in FIG. 29 is able to concretely be realized mainly by the processes of the analog-digital converting unit 2 and the CPU 216. The GPS receiving unit 115 is able to concretely be realized mainly by the GPS interface 127, the CPU 216, the RAM 217 and the ROM 218. The transmitting unit 117 is able to concretely be realized mainly by the CPU 216, the RAM 217, the ROM 218, the communication interface 128, the transceiver 125, the Ethernet LAN 126 and the wide-area network 157.

The receiving units 205A to 205C shown in FIG. 29 are able to concretely be realized mainly by the transceiver 125, the Ethernet LAN 126, the communication interface 128 and the CPU 216 of each of the digital protective control apparatuses 201A to 201C. The input unit 207A to 207C and the protective control operation units 208A to 208C are able to concretely be realized mainly by the CPU 216, the RAM 217 and the ROM 218 of each of the digital protective control apparatuses 201A to 201C. The display units 209A to 209C are able to concretely be realized mainly by the CPU 216 and the monitor 219 of each of the digital protective control apparatuses 201A to 201C.

In the electric power system protective control system 200 having the above-mentioned structure, the electric quantities S1 and S2 of the equipment devices E1 and E2 of the electric power system 31 are sequentially sampled through the analog-digital converting unit 2 in accordance with the sampling period set by the sampling-period setting process performed by the CPU 216 of the digital protective control apparatuses 201A and 201B and similar to that according to each of the embodiment. Thus, the electric quantities S1 and S2 are converted into digital electric quantity data D1 and D2. Electric quantity data D1 and D2 sequentially converted are subjected to the process for adding absolute time similar to that according to each embodiment so as to be sequentially transmitted to the wide-area network 157 through the communication interface 128, the transceiver 125, the Ethernet LAN 126 and the router 156, the electric quantity data D1 and D2 being transmitted as electric quantity data D1 (t1, t2, . . . ,) and D2 (ti, t2, . . . ,).

At this time, the CPU 216 of the digital protective control apparatus 201C to be tested subjects electric quantity data group D1 (t1, t2, . . . ,) and D2 (t1, t2, . . . ,) transmitted through the wide-area network 157 to the arranging process in accordance with the absolute time and similarly to each embodiment. Thus, a table which is a result of arrangement and which is formed shown in FIG. 21 or FIG. 24 is generated on the RAM 217.

Then, the CPU 216 sequentially reads arranged electric quantity data D1 (t1, t2, . . . ,) and D2 (t1, t2, . . . ,) from the table showing the result of the arrangement generated on the RAM 217. In accordance with the read electric quantity data D1 (t1, t2, ... ,) and D2 (t1, t2, ... ,), the CPU 216 performs the protective control operation processes. The CPU 216 transmits control output data obtained from the protective control operation processes to the monitor 219.

As a result, the control output data on the basis of the state quantities (the electric quantities) sampled from each of the equipment devices E1 and E2 of the electric power system 31 are displayed on the monitor 219. Therefore, it is possible to perform the operation confirmation test of the tested digital protective control apparatus 201C by confirming the displayed control output data on the monitor 219.

That is, the electric power system protective control system according to this embodiment is able to subject the digital protective control apparatus to be tested to the operation confirmation test by using the electric quantity data corresponding the state quantities of each of the equipment devices in an actual electric power system without using the system simulating unit, it being impossible for a conventional electric power system protective control system to perform the operation confirmation test by using the electric quantity data corresponding the state quantities of each of the equipment devices in the actual electric power system Therefore, it is possible to improve the reliability of the control apparatus to be tested and that of the operation confirmation test of the electric power system protective control system. Moreover, it is possible to improve the cost efficiency of the electric power system protective control system.

The electric power system protective control system 200 according to this embodiment has the structure that the operation confirmation test of the protective control operation unit (the CPU 216, the RAM 217 or the like) of the tested digital protective control apparatus which does not sample electric quantity data from the equipment device of the electric power system 31 is performed. The electric power system protective control system 200 is able to perform the operation confirmation test of the protective control operation units of the digital protective control apparatuses 201A and 201B which are actually sampling electric quantity data D1 and D2 from the equipment devices E1 and E2 of the electric power system 31.

When the operation confirmation test of the digital protective control apparatus 201A is performed by using electric quantity data D2 acquired by the digital protective control apparatus 201B, the electric quantity data D2 (t1, t2, ... ,) acquired and generated by the CPU 216 of the digital protective control apparatus 201B are sequentially transmitted to the wide-area network 157 through the communication interface 128, the transceiver 125, the Ethernet LAN 126 and the router 156.

The CPU 216 of the digital protective control apparatus 201A to be tested performs the process for arranging electric quantity data group D2 (t1, t2, ... ,) transmitted through the wide-area network 157, the process being performed in parallel with the process for sampling electric quantity data D1 (t1, t2, ... ,) from the equipment device E1 through the analog-digital converting unit 2. Thus, a table which is a result of the arrangement as shown in FIG. 21 or FIG. 24 is generated on the RAM 217.

At this time, the CPU 216 of the digital protective control apparatus 201A determines whether or not a result (the table) of the arrangement exists on the RAM 217. If a determination is made that the result (the table) of the arrangement does not exist on the RAM 217, the CPU 216 performs the usual protective control operation processes for the equipment device E1 in accordance with the electric quantity data D1 (t1, t2, ... ,).

On the other hand, in this embodiment, the result (the table) of the arrangement exists on the RAM 217 in this embodiment. Therefore, the CPU 216 does not read electric quantity data D1 (t1, t2, ... ,). The CPU 216 sequentially reads the arranged electric quantity data D2 (t1, t2, ... ,) from the table which is the result of the arrangement and generated on the RAM 217. In accordance with the read electric quantity data D2 (t1, t2, ... ,), the CPU 216 performs the protective control operation processes.

The CPU 216 of the digital protective control apparatus 201A transmits control output data obtained from the protective control operation processes to the monitor 219.

As a result, the control output data on the basis of the state quantities (the electric quantities) sampled from the equipment device E2 of the electric power system 31 are displayed on the monitor 219. Therefore, by confirming the displayed control output data, it is possible to perform the operation confirmation test of the digital protective control apparatus 201A which is being operated (which is sampling the electric quantities from the equipment device E1 of the electric power system 31) without interrupting the sampling operation of the digital protective control apparatus 201A.

That is, in the electric power system protective control system according to this embodiment, it is able to perform the operation confirmation test of the digital protective control apparatus which is being operated by using the electric quantity data corresponding to the state quantities of each of the equipment devices in the actual electric power system without using a system simulating unit. Therefore, it is capable of improving the reliability and the cost efficiency of the electric power system protective control system.

In the fourth to eighth embodiments, the electric power system protective control system has two equipment devices in the electric power system to be protected. Thus, the state quantities of the two equipment devices are fetched by the two digital protective control apparatuses so as to perform the protective control operation of the two equipment devices. The present invention is not limited to this structure. The present invention may be applied to an electric power system protective control system having a plurality of digital protective control apparatuses which fetch state quantities from a plurality of equipment devices in the electric power system to perform the protective control operation for the plural equipment devices.

The first to eighth embodiments have the structure that the electric power system is protected by the digital protective control apparatus. The present invention is not limited to this structure. A usual industrial plant or a public plant, such as a water supply/sewerage system, may be controlled by the control system of the present invention.

(Ninth Embodiment)

An electric power system protective control system according to a ninth embodiment of the present invention will now be described with reference to FIGS. 31 to 33.

The functional block configuration of an electric power system protective control system 230 according to this embodiment is shown in the drawing.

Figure 31:
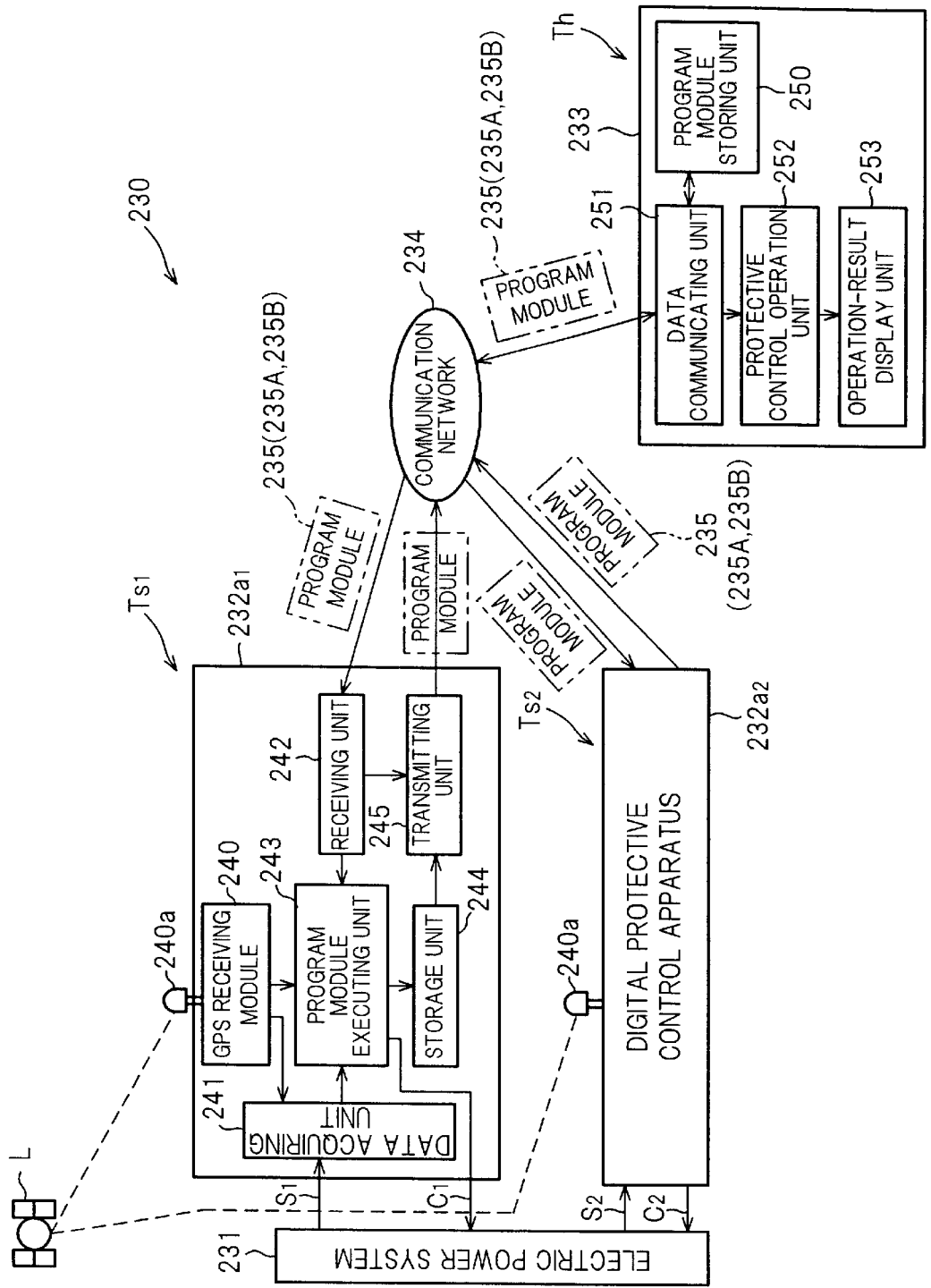
FIG. 31 is a diagram showing functional blocks of an electric power system protective control system according to a ninth embodiment of the present invention.

An electric power system protective control system 230 shown in FIG. 31 is provided with a plurality of digital protective control apparatuses (two digital protective control apparatuses 232a1 and 232a2 in this embodiment) provided in a plurality of electric stations (two electric power stations Ts1 and Ts2 in this embodiment) to protectively control the electric power system 231 having a variety of equipment devices. Moreover, the control system 230 is provided with a display/operation unit 233 disposed in a manned electric station (for example, a manned electric power station) Th disposed apart from the electric power stations Ts1 and Ts2 to remotely monitor and control states of the operations of the digital protective control apparatuses 232a1 and 232a2.

The digital protective control apparatuses 232a1 and 232a2 and the display/operation unit 233 are connected to each other through the communication network 234 such that data communication is permitted. Moreover, a movable program module (agent-type program module) 235 formed by integrating data for remote monitoring control (for example, for acquiring electric quantities or for performing protective control operation) related to the protective control function and its processing procedures is employed. The program module 235 is capable of making the rounds between the digital protective control apparatuses 232a1 and 232a2 and between each of the digital protective control apparatuses 232a1 and 232a2 and the display/operation unit 233 through the communication network 234, so that the program module movable type electric power system protective control system 230 is constituted.

The digital protective control apparatus 232a1 is provided with a GPS receiving module 240 for detecting absolute time as the precise time. The GPS receiving module 240 having a GPS antenna 240a which receives GPS signals transmitted from a four or more satellites L on each of which an atomic clock in which oscillation periods of molecules are constant is installed.

The GPS receiving unit 50 is operative to decode the GPS signals so as to obtain a three-dimensional position of the GPS antenna 50a and to, in accordance with the obtained three-dimensional position, correct a time lag so as to measure accurate absolute time t {a periodic signal indicating each timing of time having the above-mentioned accuracy of 100 ns and time data indicating time of each timing).

The digital protective control apparatus 232a1 is provided with a data acquiring unit 241 for acquiring (sampling) electric quantities (electric currents or amount of voltages in phase U, V and W) from a predetermined equipment device (for example, a power transmission line R) in the electric power system 231 in accordance with the absolute time t measured by the GPS receiving module 240 so as to convert the electric quantities into digital electric quantity data (electric quantity data Di1; i=1, 2, . . . , k). Moreover, the digital protective control apparatus 232a1 is provided with a receiving unit 242 for receiving (downloading) the program module 235 for performing remote monitoring control and data transmitted to the own digital protective control apparatus 232a1 through the communication network 234. In addition, the control apparatus 232a1 is provided with a program module executing unit 243 for executing the program module 235 received by the receiving unit 242. Thus, the program module executing unit 242 is operative to add absolute time t of sampling to electric quantity data Di1 acquired by the data acquiring unit 241 so that electric quantity data Di1 (t) having the absolute time is obtained so as to store the electric quantity data Di1 (t) in a storage unit 244 to be described later. Moreover, the program module executing unit 243 is operative to perform protective control operating processes {for example, a fault detecting operation process on the basis of a plurality of relay software modules; such as a distance relay software module, an excess current relay software module, an excess voltage relay software module and so on) and setting values to operate the respective relay software modules} in accordance with electric quantity data Di1 (t) acquired by the data acquiring unit 241 so as to output protective control operation commands including a tripping command and a reset command to an external device, such as a breaker, on the basis of a result of the protective control operation processes.

The digital protective control apparatus 232a1 is provided with a storage unit 244 for storing the electric quantity data Di1 (t) having the absolute time and obtained from the process of the program module executing unit 243 and storing a result of the protective control operation processes. The digital protective control apparatus 232a1 is provided with a transmitting unit 245 for integrating data stored in the storage unit 244 with the program module 235 so as to transmit the program module 235 in accordance with a predetermined movement route to another digital protective control apparatus (the apparatus 232a2) or the display/operation unit 233 through the communication network 234. In addition, the transmitting unit 245 is also adapted to transmit data stored in the storage unit 244 to another digital protective control apparatus (the apparatus 232a2) or the display/operation unit 233 through the communication network 234.

The digital protective control apparatus 232a2 has a similar functional block configuration as that of the digital protective control apparatus 232a1 except for the structure that acquired electric quantity data is expressed by Di2 and Di2 (t).

In this embodiment, electric quantity data indicating the state quantities of the electric power system 231 are collected at the same timing for each absolute time t by the data acquiring unit 241 of the digital protective control apparatuses 232a1 and 232a2. Then, the absolute time t of the collection is added to electric quantity data so as to be stored in the storage unit 244.

Therefore, electric quantity data Di1 (t) and Di2 (t) collected (synchronized) at the same time can be communicated between the digital protective control apparatuses 232a1 and 232a2 provided for the plurality of the remote electric power stations Ts1 and Ts2 through the communication network 234. As an alternative to this, electric quantity data Di1 (t) and Di2 (t) are transmitted to the display/operation unit 233. Thus, it is capable of detecting an abnormality and a cause of a fault in accordance with the synchronized electric quantity data Di1 (t) and Di2 (t).

An example of locating a fault (accident) point will now be described as an example of tracking of a cause of the fault.

An assumption is made that point at which the electric quantities related to the equipment device (for example, a power transmission line R) to be protected by the digital protective control apparatus 232a1 are collected is power transmission line end RA. Another assumption is made that a point at which the electric quantities related to the equipment device (for example, the power transmission line R) to be protected by the digital protective control apparatus 232a2 are collected is power transmission line end RB. Moreover, the electric quantities at the power transmission line ends RA and RB are voltages VA and VB and electric currents IA and IB. Furthermore, the impedance of the power transmission line end R is assumed to be Z and the distance between the ends RA and RB is assumed to be L. If a ground fault (accident) takes place between the ends RA and RB, assuming that the distance from the end RA to the accident point is X, a relationship of an expression mentioned below is satisfied.

$$X=(VA-VB+L \cdot Z \cdot IB)/\{Z \cdot (IA+IB)\} \qquad (7)$$

Since each of Z, IA, IB, VA and VB is a complex quantity, a phase relationship among the electric quantities is an important factor.

In this embodiment, acquired electric quantity data are added with absolute time. Therefore, the digital protective control apparatus 232a1 for protecting the power transmission line end A and the digital protective control apparatus 232a2 for protecting the power transmission line end B can use the electric quantities acquired at the same time before and after occurrence of the accident. Thus, the IA, IB, VA and VB maintaining the phase relationship can be obtained. Incidentally symbol Z is a power-transmission line constant (ranging impedance). In accordance with the Equation (7), the position X of the accident point can be obtained.

On the other hand, the display/operation unit 233 is provided with a program module storing unit 250 for storing, as the program module 235 for the remote monitoring control, a first program module 235A for acquiring and storing the electric quantities and a second program module 235B for processing protective control operation. Moreover, the display/operation unit 233 is provided with a data communicating unit 251 for transmitting the first program module 235A and the second program module 235B stored in the program module storing unit 250 to the communication network 234, receiving the first and second program modules 235A and 235B transmitted through the communication network 234 and receiving data transmitted from the digital protective control apparatuses 232a1 and 232a2. In addition, the display/operation unit 233 is provided with a protective control operation unit 252 for performing the protective control operation processes including the process for detecting the accident point expressed by the Equation (7) in accordance with the second program module 235B and data included therein received by the data communicating unit 251. Moreover, the display/operation unit 233 has an operation-result display unit 253 for displaying a result of the protective control operation processes, for example, a result of the accident detecting process performed by the protective control operation unit 252.

Figure 32:
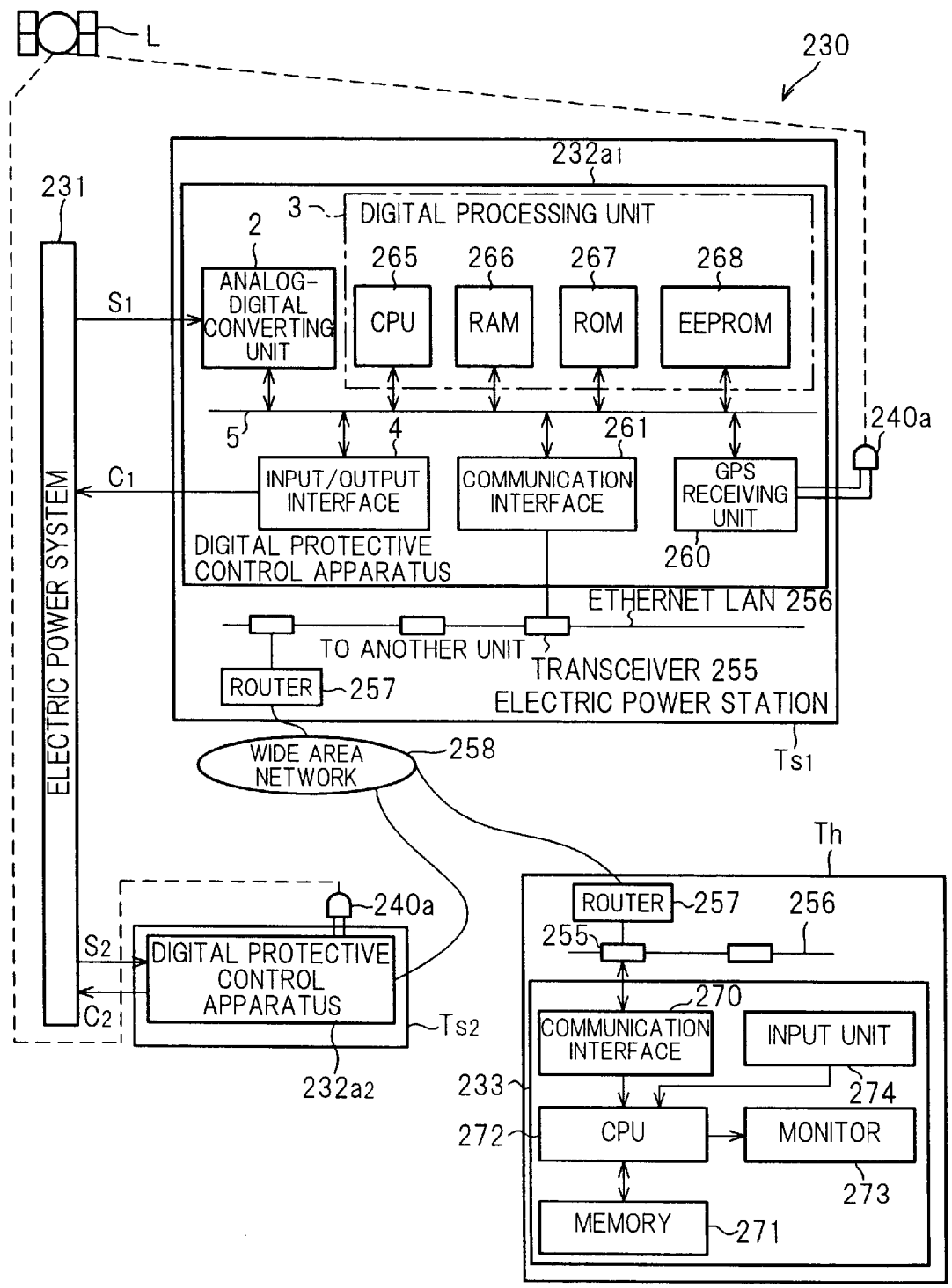
FIG. 32 is a diagram showing the hardware configuration of the electric power system protective control system shown in FIG. 31.
Figure 33:
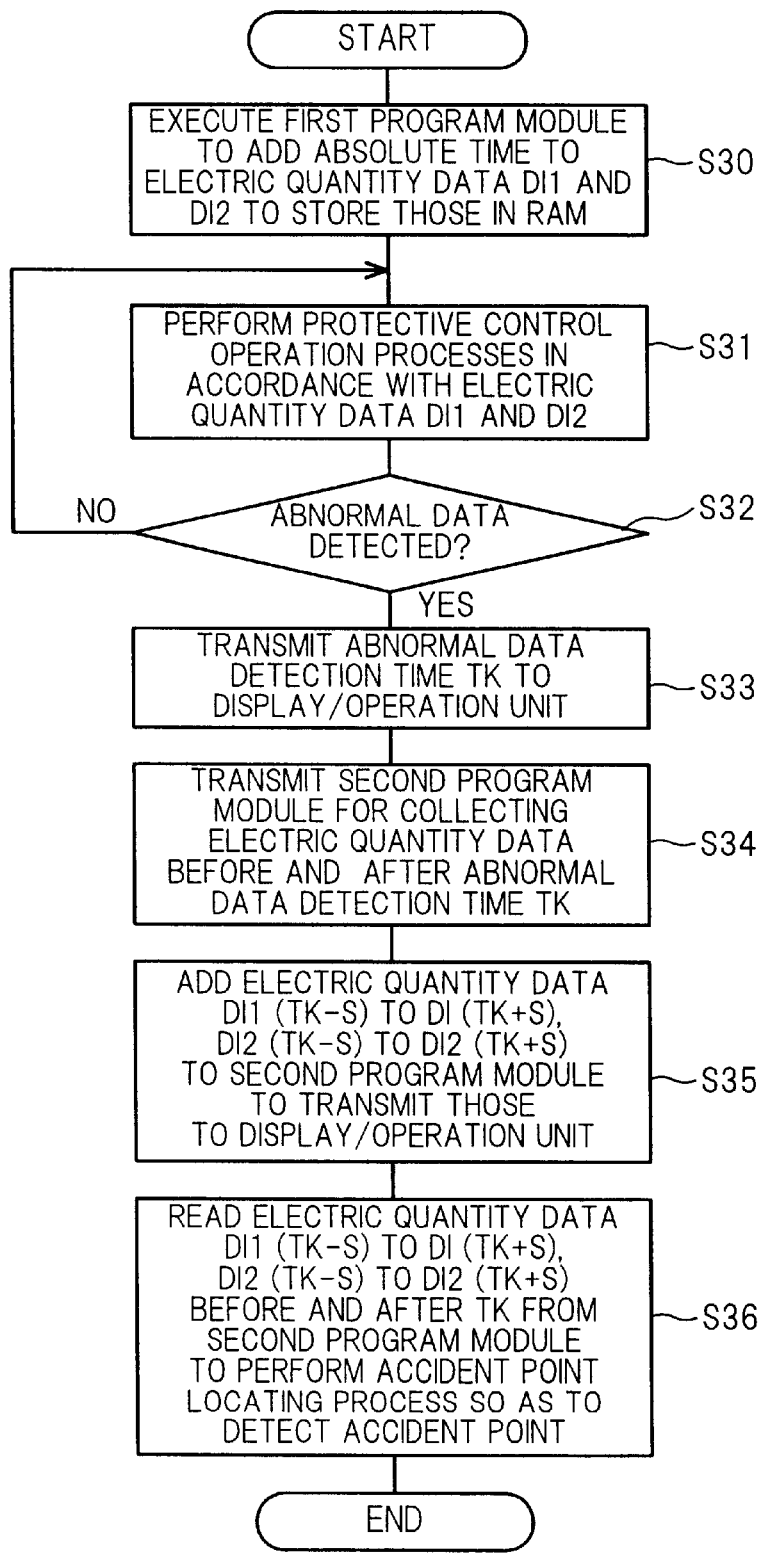
FIG. 33 is a schematic flow chart showing an example of a process of the electric power system protective control system shown in FIGS. 31 and 32.

FIG. 32 is a diagram showing the hardware configuration for realizing the processes of the functional blocks of the digital protective control apparatus 232a1 and the display/operation unit 233 which constitute the electric power system protective control system 230 according to this embodiment. The elements of the hardware configuration of the digital protective control apparatus 232a1 which are similar to those of the hardware of the digital relay 1 shown in FIG. 60 are given the same reference numerals. Thus, similar elements are omitted from description or described simply.

The digital protective control apparatus 232a1 shown in FIG. 32 is connected to the other units in the electric power station Ts1 through the transceiver 255 and the Ethernet LAN 256 such that data communication is permitted. The Ethernet LAN 256 for connecting local areas in the electric power station Ts1 is connected to the wide-area network 258, such as a telephone line, through the transceiver 255 and the router 257.

The digital protective control apparatus 232a1 is provided with an analog-digital converting unit 2 (an analog filter, a sampling hold circuit, a multiplexer and an A/D converter) for, through a sensor or the like, fetching electric quantities including the voltages and electric currents from an equipment device (for example, the power transmission line R) in the electric power system 231 to be protected by the digital protective control apparatus 232a1 so as to convert the electric quantities into digital electric quantity data Di1. Moreover, the digital protective control apparatus 232a1 is provided with a digital processing unit 3; an input/output interface (I/O) 4; a bus 5; an LED display unit 14; a GPS receiving unit 260 for measuring absolute time t in accordance with GPS signals received by the GPS receiving antenna 115a to transmit absolute time t to the digital processing unit 3; the Ethernet LAN 256; the transceiver 255 for the Ethernet LAN 256 to serve as the interface between the Ethernet LAN 256 and the digital processing unit 3 to permit data input/output; and a communication interface 261 connected to the transceiver 255 of the Ethernet LAN 256 and the bus 5.

The digital processing unit 3 is provided with a CPU 265 for performing the process for receiving the program module 235 and data transmitted from the display/operation unit 233, the process for collecting the electric quantity data by interpreting the received program module 235, the process for adding absolute time and the protective control operation processes. The CPU 265 furthermore performs a process for transmitting the protective control operation command C1 to the electric power system 231 through the input/output interface 4 in accordance with results of executions of the processes and a process for transmitting the program module 235 and data stored in the RAM 266 to the communication interface 261. Moreover, the digital processing unit 3 is provided with a RAM 266 for storing electric quantity data to which the absolute time are added and data processed by the CPU 265 such that random reading is permitted. The digital processing unit 3 has a ROM 267 for storing an OS (Operating System) for managing the overall digital processing unit, software (browser) for reading the network and procedures (programs) of the above processes including the process for adding the absolute time. In addition the digital processing unit 3 is provided with an EEPROM 268 for storing setting values related to the relay software modules for use in the relay operation. Note that the hardware configuration of the digital protective control apparatus 232a2 is similar to that of the digital protective control apparatus 232a1 except for a structure that electric quantity data which must be converted is expressed by Di2. Therefore, the hardware configuration is omitted from description.

The display/operation unit 233 is connected to the Ethernet LAN 256 for connecting local areas in the manned electric power station Th through the transceiver 255. The Ethernet LAN 256 in the manned electric power station Th is connected to the wide-area network 258 through the router 257 and the transceiver 255.

That is, the display/operation unit 233 is provided with a communication interface 270 serving as an interface for communicating the program module 235 (the first and second program modules 235A and 235B) between the wide-area network 258 and the display/operation unit 233 and a memory 271 for storing the program module 235 (235A and 235B). Moreover, the display/operation unit 233 is provided with a CPU 272 for performing a process for reading the program module 235 (235A and 235B) stored in the memory 271 to transmit the program module 235 to the wide-area network 258 through the communication interface 270 and the Ethernet LAN 256, process for receiving the program module 235 (235A and 235B) transmitted from the wide-area network 258 through the Ethernet LAN 256 and a protective control operation processes including the accident point locating process in accordance with data added to the second program module 235B by interpreting the second program module 235B.

Furthermore, the display/operation unit 233 is provided with a monitor for displaying a result of the protective control operation processes including a result of the location of the accident point. An input portion 274 is provided in the display/operation unit 233 for inputting data for the remote operational monitoring process in cooperation with the monitor 273 and the CPU 272.

The overall operation of the electric power system protective control system 230 according to this embodiment will now be described. In this case, the overall operation of the process for locating an accident point, which is performed by the display/operation unit will now be described.

In a usual state, the first program module 235A for acquiring and storing electric quantities read from the memory 271 by the CPU 272 of the display/operation unit 233 and transmitted to the wide-area network 258 through the communication interface 270 and the Ethernet LAN 256 by the transmitting process of the CPU 272 is transmitted to each of the digital protective control apparatuses 232a1 and 232a2. As a result of the receiving process of each of the digital protective control apparatuses 232a1 and 232a2, the first program module 235A is stored in the RAM 266 of the control apparatuses 232a1 and 232a2.

Absolute time t (t1 to tn) is sequentially measured by the GPS receiving antenna 240a and the GPS receiving unit 260 of the control apparatuses 232a1 and 232a2 in response to the GPS signals transmitted from the satellites L. The measured absolute time t (t1 to tn) is sequentially transmitted to the CPU 265 of the control apparatuses 232a1 and 232a2.

The CPU 265 of each of the control apparatuses 232a1 and 232a2 sets a data acquiring sampling period (for example, 1 μs) common to all of the control apparatuses 232a1 and 232a2 in accordance with the absolute time t (t1 to tn) sequentially transmitted through the GPS receiving unit 260. Thus, the data acquiring timing of the CPU 265 of the control apparatuses 232a1 and 232a2 are synchronized with each other.

Then, the CPU 265 of each of the control apparatuses 232a1 and 232a2 performs the first program module 235A to sequentially sample the electric quantities (voltages and electric currents) at the power transmission line ends RA and RB of the electric power system 231 through the analog-digital converting unit 2 in accordance with the set sampling period. Thus, the CPU 265 collects digital electric quantity data Di1 and Di2, and then adds the absolute time t of sampling to the collected electric quantity data Di1 and Di2 so as to obtain electric quantity data Di1 (t1 to tn) and Di2 (t1 to tn) which is stored in the RAM 266 (step S30 shown in FIG. 33).

Then, the CPU 265 of each of control apparatuses 232a1 and 232a2 executes the first program module 235A to perform the operation processes in accordance with collected electric quantity data Di1 and Di2 (step S31), so as to determine whether or not an abnormal value (abnormal data) is included in collected electric quantity data Di1 and Di2 (step S32).

If abnormal data is detected in the electric quantity data Di1 by the CPU 265 of the control apparatus 232a1 (an affirmative determination is made in step S32), the CPU 265 of the control apparatus 232a1 transmits abnormal-data detection information and absolute time tk, at which abnormal data is detected, to the display/operation unit 233 through the communication interface 261 and the wide-area network 258 (step S33).

At this time, the CPU 272 of the display/operation unit 233, in response to the abnormal-data detection information and the abnormal-data detection time tk transmitted through the wide-area network 258 and the communication interface 270, reads the second program module 235B for collecting electric quantity data (voltages and electric currents in the power transmission line ends RA and RB) before and after abnormal-data detection time tk from the memory 271 and the CPU 272 transmits the second program module 235B to the digital protective control apparatus 232a1 through the communication interface 270 and the wide-area network 258 along the predetermined movement route (for example, the route from the digital protective control apparatus 232a1 to the display/operation unit 233 through the digital protective control apparatus 232a2)(step S34).

The CPU 265 of the digital protective control apparatus 232a1 stores the transmitted second program module 235B in the RAM 266 through the communication interface 261 and the like. Then, the CPU 265 executes the second program module 235B to add electric quantity data Di1 (tk−s) to Di1 (tk+s) stored in the RAM 266 and having a predetermined size before and after the abnormal occurrence time tk to the second program module 235B so as to be integrated therewith. Then, the CPU 265 transmits the second program module 235B with which the data Di1 (tk−s) to Di1 (tk+s) are integrated to a next destination (the digital protective control apparatus 232a2) though the communication interface 261 and the wide-area network 258 in accordance with the movement route.

The digital protective control apparatus 232a2 also executes the second program module 235B to add electric quantity data Di2 (tk−s) to Di2 (tk+s) having a predetermined size before and after the abnormal occurrence time tk to the second program module 235B.

Then, the CPU 265 transmits the second program module 235B with which the data Di2 (tk−s) to Di2 (tk+s) are integrated to a next destination (the display/operation unit 233) through the communication interface 261 and the wide-area network 258 in accordance with the movement route(step S35).

In the display/operation unit 233, the second program module 235B transmitted through the wide-area network 258 is received by the CPU 272 through the communication interface 270 and the like.

At this time, the CPU 272 of the display/operation unit 233 reads, from the second program module 235B, electric quantity data (voltages and electric currents) Di1 (tk−s) to Di1 (tk+s) and Di2 (tk−s) to Di2 (tk+s) added and integrated with the second program module 235B, said electric quantity data being composed of data at the power transmission line ends RA and RB of the power transmission line R to be protected before and after abnormal occurrence time tk. The CPU 272 uses read electric quantity data (the voltages and electric currents) Di1 (tk−s) to Di1 (tk+s) and Di2 (tk−s) to Di2 (tk+s) and a predetermined power-transmission line constant Z so as to perform the operation process in accordance with the second program module 235B by using the above-mentioned Equation (7).

Since electric quantity data (the voltages and electric currents) Di1 (tk−s) to Di1 (tk+s) and Di2 (tk−s) to Di2 (tk+s) acquired by each of the digital protective control apparatuses 232a1 and 232a2 are composed of data collected at the same time (synchronized), the phase relationship among the data items is maintained. Therefore, it is possible to significantly and accurately perform the detection of the accident point. That is, it is possible to significantly and accurately obtain the position X of the accident point (step S36).

The position of the accident point X is displayed on the monitor 273 or stored in the memory 271 so as to permit each of the digital protective control apparatuses 232a1 and 232a2 to always use the same.

Since the CPU 272 of the display/operation unit 233 displays, on the monitor 273, electric quantity data (the voltages and electric currents) Di1 (tk−s) to Di1 (tk+s) and Di2 (tk−s) to Di2 (tk+s) read from the second program module 235B and synchronized with each other before and after the abnormal occurrence time tk, an operator for operating and monitoring the display/operation unit 233 is able to visually recognize the states of the electric power system 231 before and after the occurrence of the fault.

As described above, according to this embodiment, by using the absolute time, the digital protective control apparatuses 232a1 and 232a2 provided for each of the electric power stations Ts1 and Ts2 disposed apart from each other can synchronously collect the electric quantity data indicating the state quantities of the electric power system without connecting the digital protective control apparatuses 232a1 and 232a2 to each other by a synchronization dedicated line.

Therefore, a very simple structure can be formed as compared with the structure in which a plurality of digital protective control apparatuses are connected to each other by synchronization dedicated signal lines. As a result, all of the digital protective control apparatuses disposed apart from each other are able to synchronously collect the state quantities (electric quantity data) to perform the protective control operation processes, such as the accident point locating process, in accordance with the collected and synchronized electric quantity data. Therefore, it is possible to improve the accuracy of the protective control operation processes, making it possible to improve the reliability of the electric power system protective control system.

(Tenth Embodiment)

An electric power system protective control system according to a tenth embodiment of the present invention will now be described with reference to FIGS. 34 and 35. To cause FIG. 34 to easily be understood, the digital protective control apparatus 232a2 is omitted.

Figure 34:
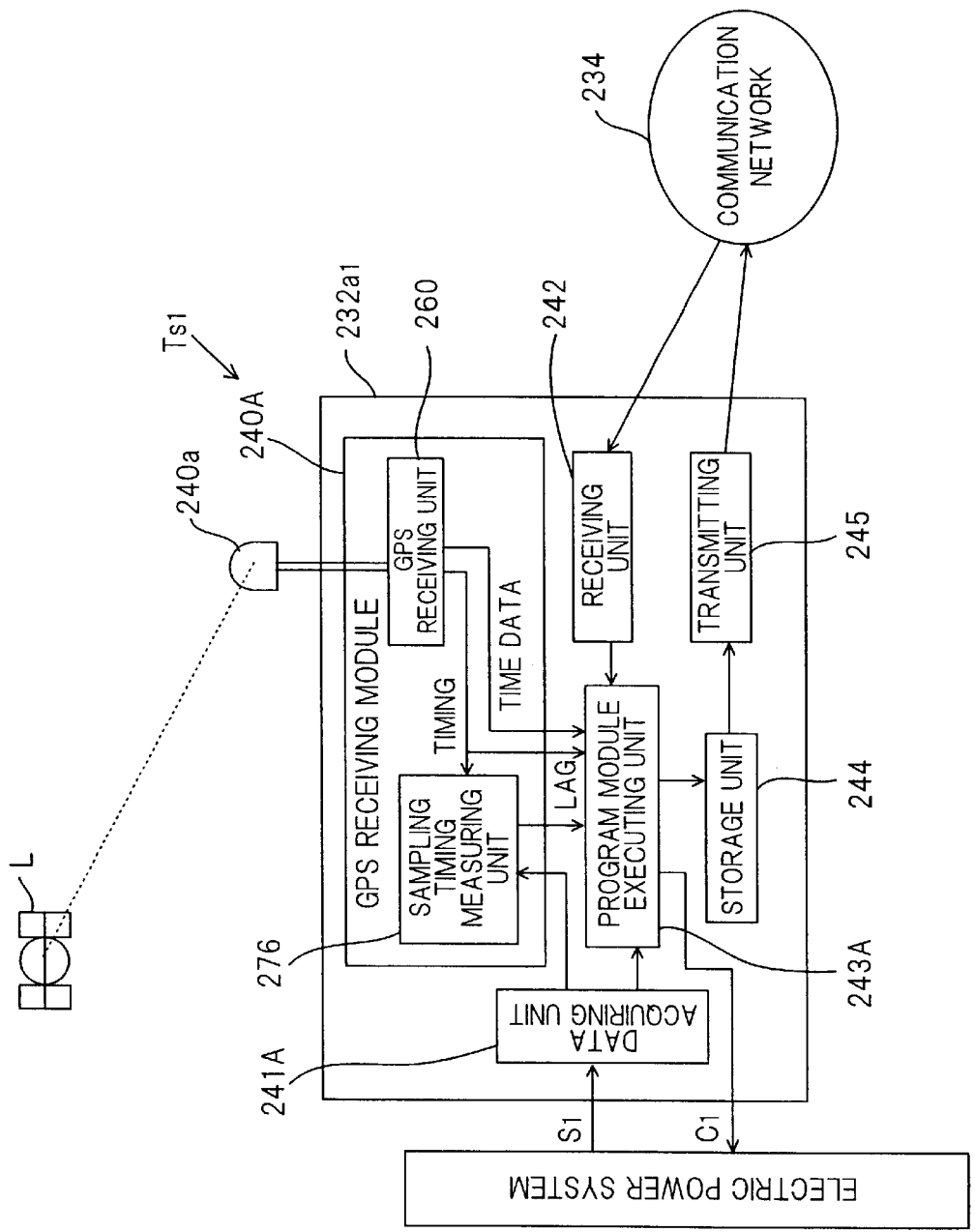
FIG. 34 is a diagram showing functional blocks of an electric power system protective control system according to a tenth embodiment of the present invention.

A data acquiring unit 241A of the digital protective control apparatus 232a1 shown in FIG. 34 is adapted to sample the electric quantities at own sampling timing regardless of the absolute time t measured by the GPS receiving module 240A so as to convert the sampled electric quantities into electric quantity data Di1. Moreover, the data acquiring unit 241A transmits the sampling timing to the GPS receiving module 240A.

The GPS receiving module 240A of the control apparatus 232a1 is provided with a GPS receiving unit 260 for measuring accurate absolute time t (a periodic signal indicating each timing of time having the above-mentioned accuracy of 100 ns and time data indicating time of each timing) in response to the GPS signal received through a GPS receiving antenna 240a; and a sampling timing measuring unit 276 for measuring an amount of lag between sampling timing transmitted from the data acquiring unit 241A and timing of the absolute time t measured by the GPS receiving unit 260. The program module executing unit 243A stores, in the storage unit 244, electric quantity data Di1 acquired by the data acquiring unit 241A, each timing (the periodic signal) and the time data constituting the absolute time t measured by the GPS receiving unit 260 and the amount of lag measured by the sampling timing measuring unit 276.

The other block function structures and the hardware configuration for realizing the functional block configuration according to this embodiment is similar to that according to the ninth embodiment shown in FIGS. 31 and 32. Therefore, the similar structures are omitted from description.

In this embodiment, in a case where, for example, a demand to transmit electric quantity data Di1 at absolute time tc (including an accuracy) is transmitted from the other digital protective control apparatus 232a2 to the digital protective control apparatus 232a1 through the communication network 234, the operation of the program module executing unit 243A of the digital protective control apparatus 232a1 will now be described.

The operation of the executing unit 243A is performed when the required accuracy in the demand for transmitting electric quantity data is lower than a reference accuracy, that is, when a relatively low sampling accuracy of the demand or the like for displaying electric quantity data collected by the control apparatus 232a1 is permitted for the control apparatus 232a2 and as well as timing lag amount tj transmitted from the sampling timing measuring unit 276 is 50% or lower (tj ≦TS/2) of the sampling interval TS when data is collected.

In this case, the program module executing unit 243A adds absolute time tc at timing (tcT) to electric quantity data Di1 (tcT−) collected at the sample timing (tcT−) immediately before the timing (tcT) of the absolute time tc. Then, the executing unit 43A transmits the data Di1 (tc) to the digital protective control apparatus 232a2 through the transmitting unit 245 and the communication network 234 (referred to FIG. 35 A). When the timing lag amount tj is larger than 50% of the sampling interval TS of data collection (tj>TS/2), the program module executing unit 243A adds the absolute time tc at the timing (tcT) to electric quantity data Di1 (tcT+) collected at sampling timing S (tcT+) immediately after the timing (tcT) of the absolute time tc so as to transmit Di1 (tc) to the other protective control apparatus 232a2 through the transmitting unit 245 and the communication network 234 (referred to FIG. 35 B).

If the demanded accuracy in the demand to transmit electric quantity data is higher than the reference accuracy, that is, if a very high sampling accuracy, such as a demand to transmit electric quantity data for detecting abnormality data is made, the executing unit 243A performs an interpolating process by using the electric quantity data Di1 (tcT−) and the electric quantity data Di1 (tcT+) collected at sampling timing S (tcT−) and sampling timing S (tcT+) immediately before and after the timing (tct) of the absolute time tc so as to generate interpolated electric quantity data Dout corresponding to the absolute time tc. Then, the executing unit 243A adds the absolute time tc to the generated interpolated electric quantity data Dout so as to transmit the data Dout (tc) to the other protective control apparatus 232a2 through the transmitting unit 245 and the communication network 234.

Figure 35A:
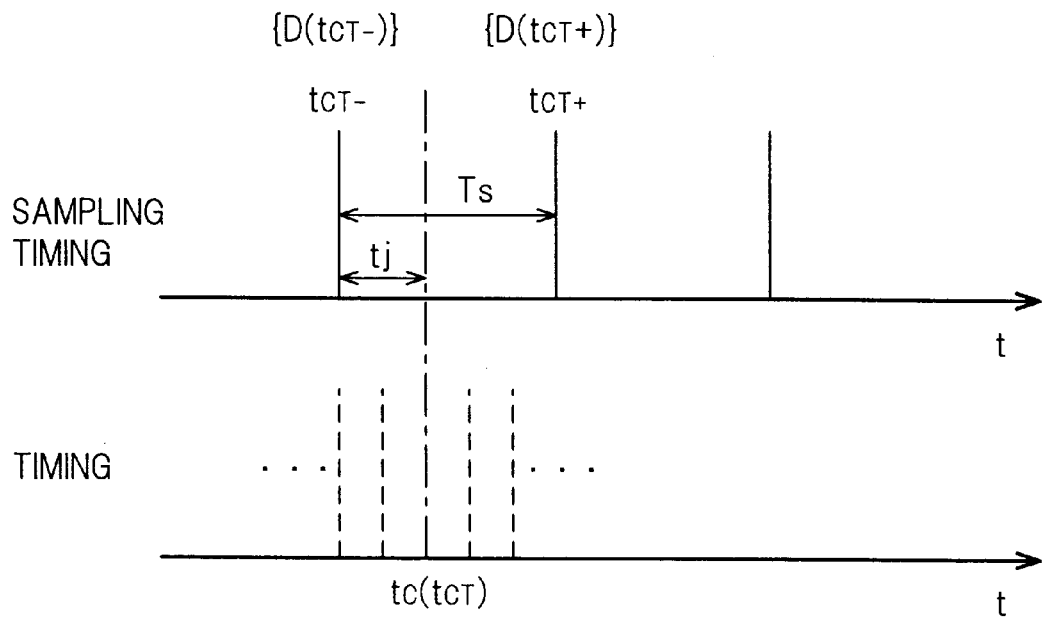
FIG. 35 is a time charts showing sampling timing and timing according to the tenth embodiment.
Figure 35B:
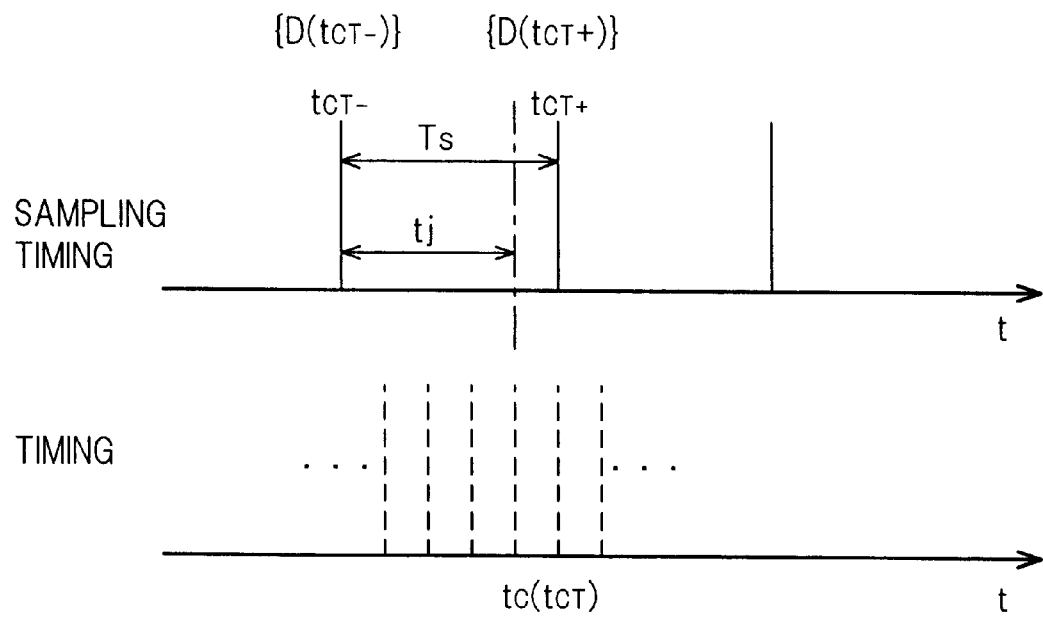

Assuming that the sampling interval is TS and the timing lag amount is tj, the electric quantity data Dout (tc) transmitted to the other protective control apparatus 232a2 is expressed as follows:

$$\text{electric quantity data } Dout(tc)=Di1(tcT-)\cdot(1-tS)/TS+Di1(tcT+)\cdot tS/TS, \quad (8)$$

referred to FIGS. 35A and 35 B.

Since ensuing processes are similar to those according to the ninth embodiment, they are omitted from description.

As described above, according to the present invention, even if electric quantity data are collected at own sampling timing by the data acquiring unit, the electric quantity data can be made to correspond to the absolute time in accordance with the amount of lag between sampling timing and timing of the absolute time.

Therefore, electric quantity data collected at original sampling timing can be transmitted to the other protective control apparatus as electric quantity data having absolute time. As a result, the protective control operation processes including the accident point locating process can be performed on the basis of the synchronized electric quantity data in accordance with the same absolute time. Thus, it is possible to improve the accuracy of the protective control calculating process and the reliability of the electric power system protective control system.

(Eleventh Embodiment)

An electric power system protective control system according to an eleventh embodiment of the present invention will now be described with reference to FIG. 32.

In this embodiment, the protective control apparatus 232a2 of the electric power station Ts2 is energized and normally operated.

While the protective control apparatus 232a2 is energized, when the protective control apparatus 232a1, which is not operated, is energized, setting of the GPS receiving unit 260 is cleared (for example, exchange of a RAM substrate or a ROM substrate).

To enable the GPS receiving unit 260 of the protective control apparatus 232a1 to output each timing, the following factors are required: (1) a GPS signal is being received from the satellites L; and (2) the three-dimensional position of the GPS receiving antenna 240a of the GPS receiving module 240 in the electric power station Ts1 is already detected. The GPS signals required in the item(1) are transmitted from the satellites L at predetermined intervals which are common to all of the protective control apparatuses on Earth. To newly obtain the GPS signal from the satellites L, about 12.5 minutes or longer are required.

The three-dimensional position of the GPS receiving antenna 240a required in the item (2) varies for each of the protective control apparatuses (for each electric power station when the GPS receiving antenna 240a is provided for each electric power station). If the GPS receiving antenna 240a of the GPS receiving unit 260 of the protective control apparatus 232a1 is disposed in a peculiar topography (for example, a valley) and thus four or more satellites cannot be trapped, long time is required to obtain the three-dimensional position of the GPS receiving antenna 240a to perform the correction process. Therefore, the timing (the absolute time) cannot easily quickly be measured.

In this embodiment, the three-dimensional position (an initial position) of the GPS receiving antenna 240a of the own protective control apparatus 232a1 previously calculated by an appropriate calculating method is previously stored in the EEPROM 268 of the protective control apparatus 232a1. The initial position of the GPS receiving antenna 240a can be calculated by using, for example, a topographic map issued by the Geographical Survey Institute of Ministry of Construction. Thus, the three-dimensional position of the GPS receiving antenna 240a can be obtained with an error of a few hundred meters. Since the three-dimensional position is previously stored in the EEPROM 268, the GPS receiving unit 232a1 of the protective control apparatus 232a1 is enabled to measure the absolute time t (the timing) having an accuracy of about $1\mu$.

That is, according to this embodiment, the CPU 265 of the protective control apparatus 232a1, which is energized, demands supply of a GPS signal to the protective control apparatus 232a2 through the wide-area network 258 and so on. To respond to the demand for the GPS signal, the CPU 265 of the protective control apparatus 232a2 transmits, as data (GPS data: about 15,000 bytes), the GPS signal received by the GPS receiving unit 260 to the CPU 265 of the protective control apparatus 232a1 through the wide-area network 258 and the like.

The CPU 265 of the protective control apparatus 232a1 receives GPS data transmitted through the wide-area network 258 and the like to transmit received GPS data to the GPS receiving unit 260. Although GPS data has a volume of about 15,000 bytes, GPS data can quickly be received in about one second by the protective control apparatus 232a1 because GPS data is received through the wide-area network.

At this time, the CPU 265 of the protective control apparatus 232a1 reads the three-dimensional position of the GPS receiving antenna 240a of own protective control apparatus 232a1 stored in the EEPROM 268 to communicate the readout three-dimensional position to the GPS receiving unit 260 together with the GPS data.

As a result, the GPS receiving unit 260 is able to obtain precise time (timing) of about 1 $\mu$s in accordance with the communicated the three-dimensional position and the GPS data so as to output the precise time (timing) to the CPU 265 within a very short time of several seconds from the demand for the GPS signal.

Therefore, if the GPS receiving unit 260 of the protective control apparatus 232a1 is cleared, accurate (about 1 $\mu$s) precise time (timing) can be outputted from the GPS receiving unit 260. Thus, it is possible to improve the reliability of the electric power system protective control system.

If the GPS receiving antenna 240a of the protective control apparatus 232a1 according to this embodiment is disposed in a place with a fine view and the GPS receiving unit 260 is able to simultaneously trap four or more satellites L, the GPS receiving unit 260 is able to significantly accurately measure the three-dimensional position of the GPS receiving antenna 240a in accordance with GPS signals simultaneously transmitted from the four or more satellites L. At this time, the CPU 265 stores the three-dimensional position of the GPS receiving antenna 240a measured by the GPS receiving unit 260 in the EEPROM 268.

Even if the GPS receiving unit 260 is cleared for some reason or other after the three-dimensional position of the GPS receiving antenna 240a is stored in the EEPROM 268, the GPS receiving unit 260 reads the accurate three-dimensional position stored in the EEPROM 268. The three-dimensional position and the GPS signals transmitted simultaneously from the four or more satellites L are used so that the accurate (about 100 ns) absolute time (timing) can be outputted. Therefore, the reliability of the electric power system protective control system can furthermore be improved.

The storage of the three-dimensional position of the GPS receiving antenna in the EEPROM may be applied to all of the other embodiments. Therefore, the reliability of the above-mentioned electric power system protective control systems (the control systems) can be improved.

(Twelfth Embodiment)

The functional block configuration of an electric power system protective control system 280 according to a twelfth embodiment of the present invention is shown in FIG. 36.

The digital protective control apparatus 232a1 (232a2) of the electric power system protective control system 280 shown in FIG. 36 is provided with a power-transmission line constant measuring unit 281 for performing a third program module 235C for measuring a power-transmission line constant, which is transmitted from the display/operation unit 233. Thus, the measuring unit 281 performs the third program module 235C by using the electric quantity data Di1 (t) (Di2 (t)) collected from the electric power system 231 by the own protective control apparatus 232a1 (232a2) and Di2 (t) (Di1 (t)) collected therefrom by another protective control apparatus 232a2 (232a1) so as to measure the power-transmission line constant of the electric power system 231 in a state where the line of the electric power system 231 is in a normal state. Moreover, the protective control apparatus 232a1 (232a2) is provided with a power-transmission line constant storage unit 282 for storing the power-transmission line constant measured by the measuring unit 281. The program module executing unit 243 of each of the digital protective control apparatuses 232a1 and 232a2 executes the first program module 235A to calculate an optimum ranging impedance when the line is in the normal state in accordance with the power-transmission line constant stored in the storage unit 282. Then, the program module executing unit 243 compares the optimum ranging impedance as a ranging impedance calculated from actual electric current values and voltage levels so as to perform an abnormal data detection process, that is, an accident detection process.

The program module storing unit 250 of the display/operation unit 233 stores the first and second program modules 235A and 235B and the third program module 235C for measuring the power-transmission line constant in the memory 271. The data communicating unit 251 transmits the first to third program modules 235A to 235C to the communication network 234 and receives the first to third program modules 235A to 235C transmitted through the communication network 234. Moreover, the data communicating unit 251 receives data transmitted from the digital protective control apparatuses 232a1 and 232a2.

The other functional block configurations of this embodiment and the hardware configuration for realizing the functional block configurations are similar to those according to the ninth embodiment shown in FIGS. 31 and 32. Therefore, similar structures are omitted from description.

According to this embodiment, the CPU 272 of the display/operation unit 233 reads the third program module 235C from the memory 271 when the line in the electric power system 231 is in a normal state. The third program module 235C is, by the transmitting process performed by the CPU 272, transmitted to the digital protective control apparatus 232a1 through the Ethernet LAN 256, the wide-area network 258 and the like.

Figure 37:
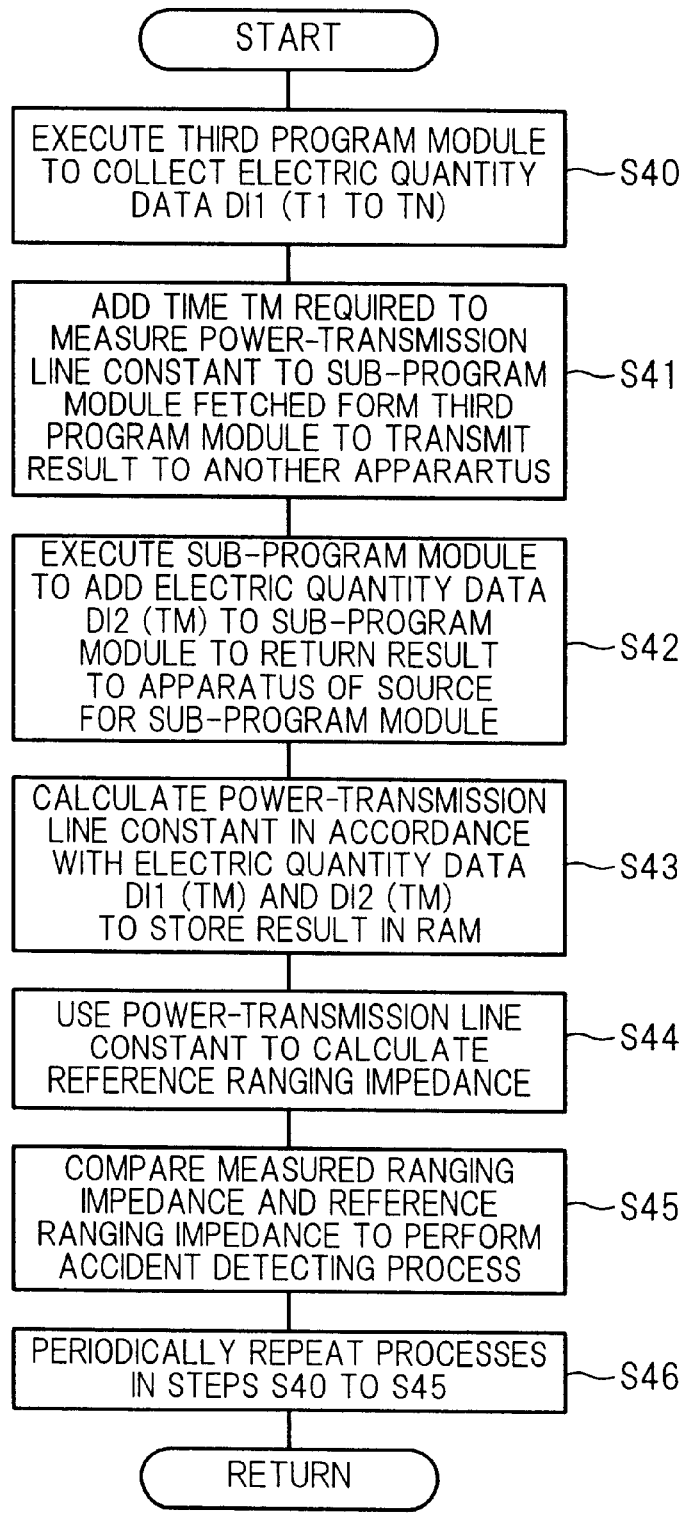
FIG. 37 is a schematic flow chart showing an example of the process of the electric power system protective control system shown in FIG. 36.

The CPU 265 of the digital protective control apparatus 232a1 receives the transmitted third program module 235C so as to store the same in the RAM 266. Then, the CPU 265 executes the third program module 235C to collect digital electric quantity data Di1 (t1 to tn) having the absolute time at the transmission line end RA to be protected by the own apparatus 232a1 so as to collect the digital electric quantity data Di1 (t1 to tn) having the absolute time temporarily stored in the buffer of the CPU 265 and as to store the data Di1 (t1 to tn) in the RAM 266 (step S40 shown in FIG. 37).

Then, the CPU 265 of the apparatus 232a1 extracts from the third program module 235C, sub-program module 235 CSUB for acquiring electric quantity data of the another apparatus 232a2 included in the third program module 235C. Next, the CPU 265 adds predetermined time tm (t1<tm<tn) at the collection time of the electric quantity data Di1 (t1 to tn) required to measure the power-transmission line constant so as to transmit a result of the addition to the another apparatus 232a2 through the wide-area network 258 and the like (step S41).

The CPU 265 of the another apparatus 232a2 receives the transmitted sub-program module 235 CSUB to execute the same. Thus, the CPU 265 collects digital electric quantity data Di2 (tm) having the absolute time at the transmission line end RB to be protected by the apparatus 232a2 and temporarily stored in the buffer of the CPU 265 so as to store the same in the RAM 266. Then, the CPU 265 adds electric quantity data Di2 (tm) to the sub-program module 235 CSUB to return the same to the digital protective control apparatus 232a1 through the wide-area network 258 and the like (source for supplying the sub-program module CSUB) (step S42).

At this time, the CPU 265 of the digital protective control apparatus 232a1 calculates the power-transmission line constant in accordance with collected electric quantity data Di1 (tm) of the own apparatus 232a1 at predetermined time tm and electric quantity data Di2 (tm) of the another apparatus 232a2 collected (synchronized) at the same time tm by using a known calculating method described hereinafter so as to store the calculated power-transmission line constant in the RAM 266 (step S43).

A method of calculating the power-transmission line constant will now be described.

The power-transmission line constant can be obtained by a calculating method disclosed in Japanese Unexamined Patent Publication No. 6-242158. An assumption is made that voltages in phases U, V and W measured at the power transmission line end RA are $V_{AU}$, $V_{AV}$ and $V_{AW}$, voltages in phases U, V and W are $V_{BU}$, $V_{BV}$ and $V_{BW}$ measured at the power transmission line end RB and electric currents in phases U, V and W which flow between the power transmission line ends RA and RB are $I_U$, $I_V$ and $I_W$. Since the foregoing values are complex quantities, the phases of the values are important factors. Since electric quantity data Di1 (tm) and electric quantity data Di2 (tm) which are communicated through the wide-area network 258 are added with time data measured significantly accurately, the phase relationship can be maintained.

An assumption is made that the self-impedances of the power transmission line in phases U, V and W are $Z_{UU}$, $Z_{VV}$ and $Z_{WW}$, the mutual impedances in phases V and W of the power transmission line in phase U are $Z_{UV}$ and $Z_{UW}$, the mutual impedances in phases U and W of the power transmission line in the phase V are $Z_{VU}$ and $Z_{VW}$ and the mutual impedances in phases U and V of the power transmission line in phase W are $Z_{WU}$ and $Z_{WV}$. In the foregoing case, Equation (9) is satisfied:

$$\begin{bmatrix} V_{AU} - V_{BU} \\ V_{AV} - V_{BV} \\ V_{AW} - V_{BW} \end{bmatrix} = \begin{bmatrix} Z_{UU} & Z_{UV} & Z_{UW} \\ Z_{VU} & Z_{VV} & Z_{VW} \\ Z_{WU} & Z_{WV} & Z_{WW} \end{bmatrix} \begin{bmatrix} I_U \\ I_V \\ I_W \end{bmatrix} \quad (9)$$

Therefore, the CPU 265 uses electric quantity data Di1 (tm) $\{V_{AU}, V_{AV}, V_{AW}, I_U, I_V, I_W\}$ and electric quantity data Di2 (tm) $\{V_{BU}, V_{BV}, V_{BW}\}$ to solve the Equation (9). Thus, the CPU 265 obtains the power-transmission line constants, that is, the self-impedance and mutual impedance ($Z_{UU}, Z_{VV}, Z_{WW}, Z_{UV}, Z_{UW}, Z_{VU}, Z_{VW}, Z_{WU}, Z_{WV}$)

The Equation (9) is a simplified equation which does not contain a leak current component of the power transmission line. When the power transmission line is modeled by a π-type equivalent circuit and electric currents in each phase at the power transmission line ends RA and RB are measured to perform measurement three or more times in different loading conditions, accurate power-transmission line constants can be obtained.

The ranging impedance of the power transmission line end RA is as follows: In a digital protective control apparatus for executing the relay software modules as, for example, a short-distance relay software module, the ranging impedance $Z_{AUV}$ for phase UV can be obtained as follows:

$$Z_{AUV} = (V_{AU} - V_{AV})/(I_{AU} - I_{AV}) \tag{10}$$

where $I_{AU}$ and $I_{AV}$ are electric currents in phases U and W at the power transmission line end RA.

If an accident of short circuit occurs between the phases U and V, the voltages and electric currents in phases U and V at the power transmission line end RA, that is, electric quantity data Di1 (t1 to tn) collected by the digital protective control apparatus 232a1 are changed in accordance with Equation (10) so that the ranging impedance $Z_{AU}$ is changed.

At this time, the CPU 265 of the apparatus 232a1 uses the power-transmission line constants stored in the RAM 266 to obtain the ranging impedance (reference ranging impedance $Z_{TH}$) in a normal state (step S44). The reference ranging impedance $Z_{TH}$ and the measured ranging impedance $Z_{AU}$ are subjected to a comparison so as to perform the accident detection process.

On the other hand, the digital protective control apparatus 232a2 also use electric quantity data Di2 (t) collected own apparatus 232a2 and electric quantity data Di1 (t) collected by the another apparatus (232a1) at the same time in accordance with the third program module 235C3. Thus, a similar accident detection process can be performed (step S45).

The digital protective control apparatuses 232a1 and 232a2 periodically performs the above-mentioned process for collecting synchronized electric quantity data of the own and the another apparatuses, the process for measuring the power-transmission line constant, the process for calculating the reference ranging impedance and a process for comparing the reference ranging impedance and the actual ranging impedance with each other (step S46) so that the optimum reference ranging impedance can always be used to perform the protective control operation processes including the accident determining process.

As described above, according to this embodiment, fixed power-transmission line constants obtained from a theory are not used. Power-transmission line constants obtained from an actual electric power system which is changed in a real-time manner can be used to perform the protective control operation processes, such as the accident detection process. Therefore, it is possible to improve the accuracy to detect an accident, thereby improving the reliability of the electric power system protective control system.

With the foregoing embodiment, an measurement apparatus, which has a processing unit and a memory and are individual from the protective control apparatus, for measuring the power-transmission line constant is not used to measure the power-transmission line constants in accordance with the actual electric power system. Therefore, it is able to reduce the cost of the control system of this embodiment as compared with the conventional control system. Moreover, since the power-transmission line constants periodically or as necessary are measured while performing the protective control operation processes without installing the measuring apparatus, it is possible to obtain power-transmission line constants corresponding to the actual electric power system.

In this embodiment, since the calculated power-transmission-line constants are transmitted to the display/operation unit 233, when the accident point locating process is performed by the display/operation unit 233, it is possible to use the power-transmission-line constants corresponding to change in the actual electric power system, making it possible to improve the accuracy of the accident point locating process.

Since this embodiment enables power-transmission line constants corresponding to change in the actual electric power system to be obtained, it is possible to perform zero phase compensation among electric currents in the phases carried out when the protective control operation is performed on the basis of the distance relay software module in one of the relay software modules.

(Thirteenth Embodiment)

The functional block configurations of an electric power system protective control system 230A according to this embodiment and the hardware configuration for realizing the processes of the functional block configurations are similar to those according to the ninth embodiment shown in FIGS. 31 and 32. Therefore, the similar structures are omitted from description.

In this embodiment, the CPU 265 of each of the digital protective control apparatuses 232a1 and 232a2 stores electric quantity data Di1 (t1 to tn) and Di2 (t1 to tn) each having the absolute time in the RAM 266 for predetermined time Tm or longer. If the stored time passes over the time Tm, the electric quantity data Di1 (tn+1 to tn+m) and Di2 (tn+1 to tn+m) having absolute time and collected newly are overwritten on the region of the RAM 266 in which the foregoing data Di1 (t1 to tn) and Di2 (t1 to tn). Thus, the data Di1 (t1 to tn) and Di2 (t1 to tn) are abolished (erased).

As described in the first embodiment, if a fault takes place in the electric power system 231, the fault is transmitted from the protective control apparatus (for example, 232a1) which has detected the fault to the display/operation unit 233 and another protective control apparatus (232a2). At this time, in order to analyze the fault, the display/operation unit 233 transmits the second program module 235B for collecting the electric quantity data before and after occurrence of the fault.

An assumption is made that time taken from occurrence of the fault to output, to the wide-area network 258, of communication of occurrence of the fault from the protective control apparatus 232a1 which has detected the fault is T1, time taken for the communication of occurrence of the fault to be transmitted from the protective control apparatus 232a1 to the display/operation unit 233 through the wide-area network 258, the Ethernet LAN 256 and the like is T2, time taken from receipt of the communication of occurrence of the fault by the display/operation unit 233 to transmission of the second program module 235B to the protective control apparatus 232a1 is T3, time taken for the program module 235B to be transmitted from the display/operation unit 233 to the protective control apparatus 232a1 through a communication unit including the wide-area network 258 and the Ethernet LAN 256 is T4 and time taken from receipt of the program module 235B by the protective control apparatus 232a1 to addition and transmission of data (electric quantity data having a predetermined size before and after the abnormal occurrence time (fault occurrence time) tk) required to analyze the fault is T5. Another assumption is made that time corresponding to electric quantity data Di1 (tk−s) stored in the RAM 266 before the detection of the fault and included in data required to analyze the fault is Ts. If the time Tm for which the digital protective control apparatus 232a1 is able to hold data is as follows, $$Tm > (T1 + T2 + T3 + T4 + T5 + Ts), \tag{11}$$

electric quantity data Di1 (tk−s) stored in the RAM 266 before the fault detected time tk and required to analyze the fault is read from the RAM 266 as a result of the process of the CPU 265 before next electric quantity data are overwritten on the region of the RAM 266 in which electric quantity data Di1 (tk−s) are stored so as to be added to the program module 235B and transmitted to the display/operation unit 233.

As a result, as described in the ninth embodiment, the display/operation unit 233 is able to display the state of the electric power system before and after occurrence of the fault to perform the fault analyzing process, such as the accident point locating process.

In this embodiment, electric quantity data having the absolute time and stored in the RAM 266 of each of the digital protective control apparatuses 232a1 and 232a2 are not erased so as to be saved, but only electric quantity data before and after the fault occurrence time, which can be received by the display/operation unit 233 are kept in the RAM 266 and electric quantity data except the electric quantity data capable of being stored in the RAM 266, that is, which are not used in the analyzing process of the display/operation unit 233 can be erased by overwriting electric quantity data having the absolute time and collected newly.

Therefore, the storage capacity (an empty capacity) assigned to the electric quantity data having the absolute time in the RAM 266 can be reduced. As a result, it is possible to improve the efficiency of using the RAM 266 and the processing speed of the CPU 265.

(Fourteenth Embodiment)

Figure 38:
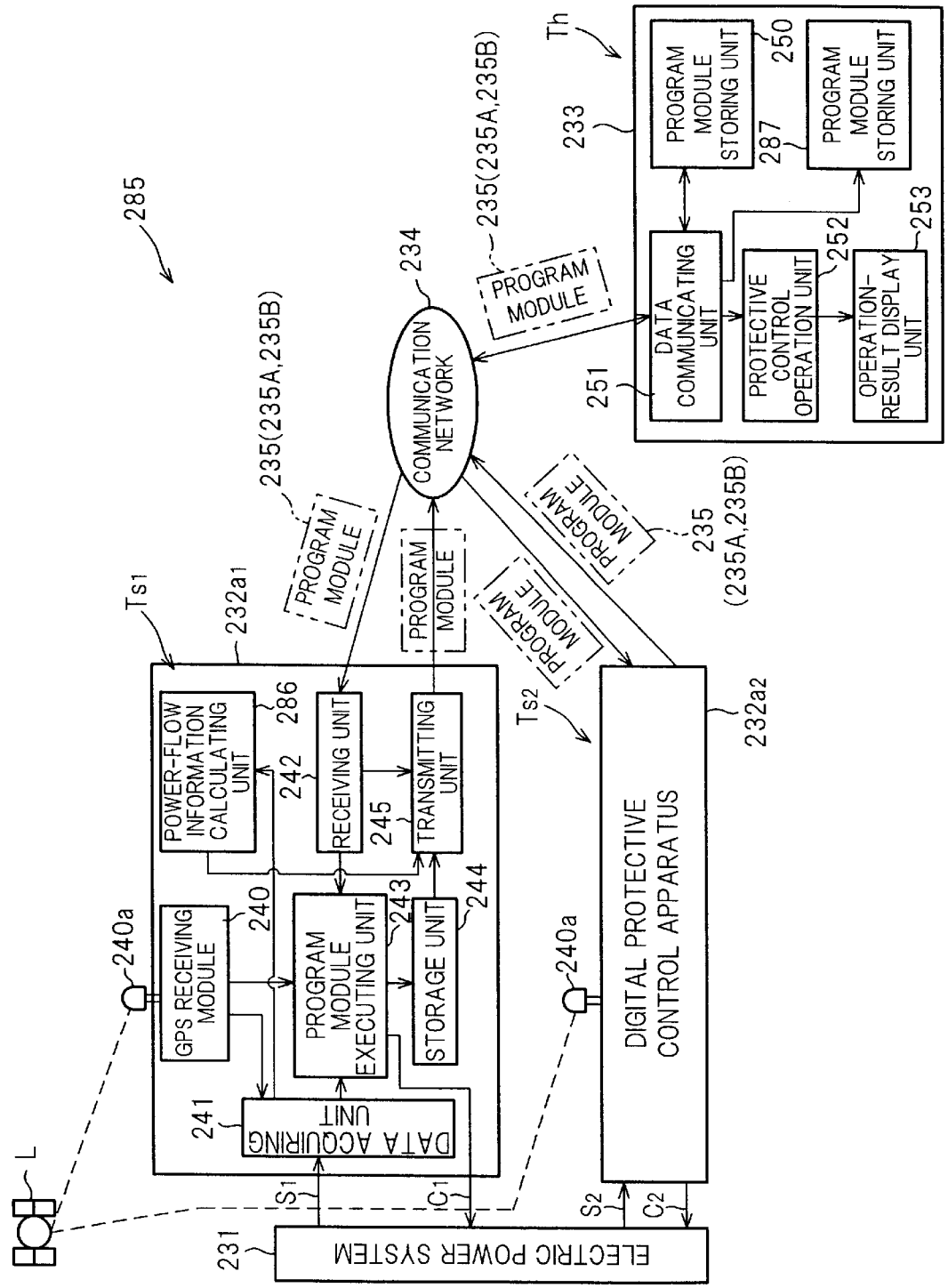
FIG. 38 is a diagram showing functional blocks of an electric power system protective control system according to a fourteenth embodiment of the present invention.

The functional block configuration of an electric power system protective control system 285 according to a fourteenth embodiment is shown in FIG. 38.

Referring to FIG. 38, digital protective control apparatuses 232a1 and 232a2 of the electric power system protective control system 285 is provided with a power-flow (load-flow) information calculating unit 286 for calculating power-flow information, for example, electric power, ineffective electric power and electric currents, at predetermined periods. The power-flow information calculating unit 286 adds time at which electric quantity data Di1 and Di2, on which the power-flow information are produced, are collected (for example, ta, ta+TF (TF is the period for calculating the power-flow information), . . . ) to the calculated power-flow information F so as to transmit, to the display/operation unit 233, the power-flow information F (ta), F (ta+TF), . . . , of the electric power system 231 having the collected time.

The data communicating unit 251 of the display/operation unit 233 receives the power-flow information F (ta), F (ta+TF), . . . transmitted from the digital protective control apparatuses 232a1 and 232a2 through the communication network 234 at the predetermined period TF.

The display/operation unit 233 is provided with a stable-state determining unit 287 for determining a stable state of the electric power system 231 in accordance with the plural power-flow information F (ta), F (ta+TF), . . . received by the data communicating unit 251.

The other functional block configurations according to this embodiment and the hardware configuration for realizing each functional block configuration are similar to hose according to the ninth embodiment shown in FIGS. 31 and 32. Therefore, similar structures are omitted from description.

That is, according to this embodiment, the CPU 272 of the display/operation unit 233 sequentially receives the power-flow information F (ta), F (ta+TF), . . . at each predetermined period TF as a result of the power-flow information calculating process and the transmitting process performed by each of the digital protective control apparatuses 232a1 and 232a2. Then, in accordance with the power-flow information F (ta), F (ta+TF), . . . of the plural apparatuses 232a1 and 232a2, the CPU 272 determines whether or not the state of the electric power system 231 is stable (normal).

For example, the CPU 272 of the display/operation unit 233 determines that the electric power system 231 is in a stable state (normal) in a case where the values (electric power, ineffective electric power, electric currents and the like) of the returned power-flow information F (ta), F (ta+TF), . . . of the plural control apparatuses 232a1 and 232a2 are within predetermined stable ranges previously set in correspondence with each value, respectively. If any one of the values is not within the stable ranges, the CPU 272 determines that the electric power system 231 is in an unstable state (an abnormal state).

That is, in this embodiment, it is possible to generate significantly accurate power-flow information by using electric quantity data which are acquired by the plural electric power system protective control apparatuses and synchronized with each other (the phase relationship is held), thereby determining the state of the electric power system according to the generated power-flow information.

Therefore, the accuracy for determining the safety state of the electric power system can be improved as compared with the conventional protective control system and thus the reliability of the electric power system protective control system can be improved.

(Fifteenth Embodiment)

The functional block configuration of an electric power system protective control system 290 according to this embodiment is similar to that according to the ninth embodiment shown in FIG. 31. Therefore, the functional block configuration is omitted from description.

Figure 39:
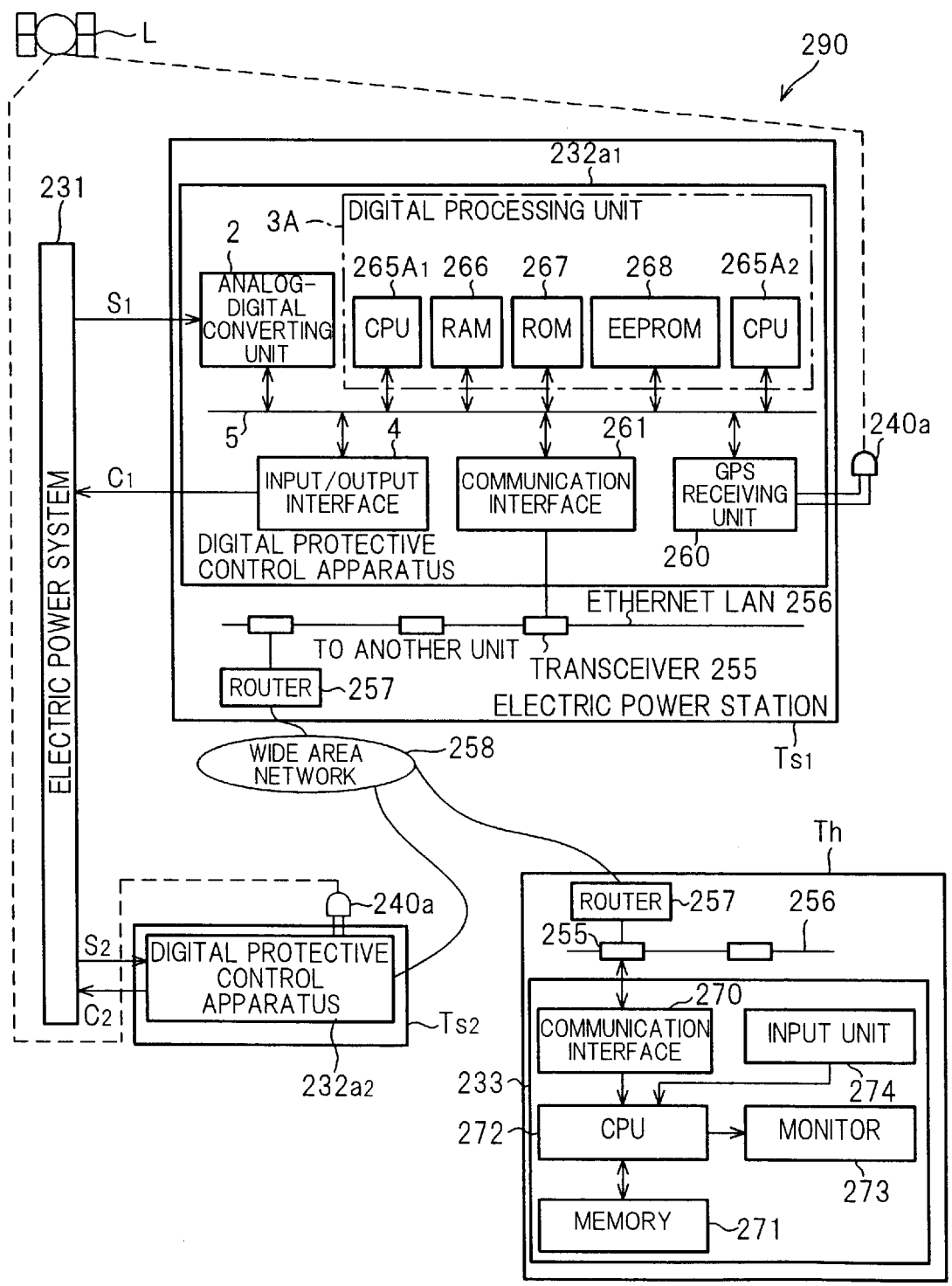
FIG. 39 is a diagram showing the hardware configuration of an electric power system protective control system according to a fifteenth embodiment of the present invention.

FIG. 39 is a diagram showing the hardware configuration for realizing the functional blocks of the electric power system protective control system 290 according to this embodiment and shown in FIG. 31.

Referring to FIG. 39, a digital processing unit 3A is provided with a first CPU 265A1 for dedicatedly performing the process for collecting electric quantity data, the process for adding absolute time, the protective control operation processes and the power flow calculating process. Moreover, a second CPU 265A2 is provided individually from the first CPU 265A1. The second CPU 265A2 dedicatedly performs the process for receiving the program module 235 and data transmitted from the display/operation unit 233 through the wide-area network 258 and the like, the process for interpreting the received program module 235 and a process for transmitting the program module 235 and data stored in the RAM 266 to the wide-area network 258 through the communication interface 261. The first and second CPU 265A1 and 265A2 commonly uses the bus 5, the RAM 266, the ROM 267 and the communication interface 261.

That is, the second CPU 265A2 mainly performs the interface process (the program module communication process or the like) with the wide-area network 258 through the communication interface 261, the process for interpreting the program module 235, an operation command output process to the first CPU 265A1 in accordance with a result of the interpretation, a process for recognizing an operation state of the display/operation unit 233, and a command output process to the display/operation unit 233 and the other units. That is, the second CPU 265A2 mainly performs processes dedicated for the program module movable system except for the processes related the electric power system protective control function. Therefore, the processes (the process for collecting electric quantity data and the protective control operation processes) related to the electric power system protective control function is dedicatedly performed by the first CPU 265A1.

The second CPU 265A2 receives and executes the first program module 235A to transmit a demand for collecting electric quantity data to the first CPU 265A1 through the common RAM 266. In response to the demand for the collection, the first CPU 265A1 collects electric quantity data Di1 (t1 to tn) and Di2 (t1 to tn) each having the absolute time to store those in the RAM 266.

If the first CPU 265A1 detects abnormal data in the electric quantity data Di1, abnormal data detection information and a detected time tk transmission demand are communicated to the second CPU 265A2 through the RAM 266 in accordance with the result of the detection. In accordance with the communication, the second CPU 265A2 transmits abnormal data detection information and the absolute time tk at which abnormal data is detected to the display/operation unit 233.

That is, the electric power system protective control system must perform collection of the state quantities (electric quantity data) of the electric power system 231 and calculation of the power flow at predetermined intervals in predetermined time. On the other hand, an amount of the processes which needs to be performed through the communication network 234 (the wide-area network 258 and the like) considerably varies depending on the amount of the communication and the contents of the communication. Moreover, the state of the operation varies considerably.

Therefore, in this embodiment, the interface process related to the communication of data and program module 235 with respect to the communication network 234, which varies considerably, the process for interpreting the program module, the recognition process of the state of the operation and the command output process with respect to the other apparatuses are separated from the processes related to the protective control function which must be performed at predetermined intervals in predetermined time so that the separated processes are performed by the second CPU 265A2. Thus, the hardware (the first CPU 265A1 and the like) except for the second CPU 265A2 of each of the digital protective control apparatuses 232a1 and 232a2 is able to perform the process for collecting electric quantity data, the process for calculating the power flow related to the electric power system 231 of the own protective control apparatus regardless of the state of the communication network 234 and the state of the operation and other processes related to the protective control operation.

As a result, simultaneous execution of the following processes which has been difficult for the conventional technique can easily be performed: the data input/output process from the display/operation unit through the communication network with which a heavy processing load must be borne: the control command analyzing process; the process for acquiring electric quantity data at predetermined periods from the electric power system; and the protective control operation processes including the power flow calculating process in accordance with acquired electric quantity data. Therefore, the process for communicating the program module, the process for interpreting the program module, the process for acquiring electric quantity data and the protective control operation processes can quickly be completed, making it possible to furthermore improve the protective control operation performance of the electric power system protective control system.

In this embodiment, the first CPU performs the processes related to the protective control operation and the second CPU performs the process for communicating the program module, the process for interpreting the program module and the interface process with the communication network. The present invention is not limited to this.

For example, three CPU having a common memory (a RAM or the like), a bus and a communication network may be employed. In this case, the first CPU performs the processes related to the protective control operation and the second CPU performs the interface process with the communication network including the process for communicating the program module and data. A third CPU performs interpretation of the program module and the operation command output process in accordance with the interpreted program module. With the above-mentioned structure, quick completion of the following processes can be realized: the interface process with the communication network including the process for inputting/outputting the program module; the processes for interpreting and executing the program module; and the protective control operation processes including the process for acquiring electric quantity data and calculating the power flow. Therefore, the efficiency of the protective control process of the electric power system protective control system can furthermore be improved.

(Sixteenth Embodiment)

An electric power system protective control system according to a sixteenth embodiment will now be described with reference to FIG. 40.

When the precise time is obtained by measuring the absolute time in response to the GPS signals transmitted from a plurality of satellites L, there is apprehension that the GPS signals from the satellites L cannot be received by the GPS receiving module 240 (the GPS receiving antenna 240a and the GPS receiving unit 260 through the GPS receiving antenna 240a depending on the states of the operations of the satellites L and the state of the ionosphere over the apparatus. In the foregoing case, the GPS receiving module 240 cannot measure the absolute time. Hitherto, it is impossible to identify the digital protective control apparatus having the GPS receiving module 240 which cannot measure the absolute time.

Therefore, each digital protective control apparatus of the electric power system protective control system according to this embodiment always determines whether or not the absolute time measured by the own module (the GPS receiving module) is correct. It is possible to identify the digital protective control apparatus (the GPS receiving unit) which cannot measure the absolute time.

Figure 40:
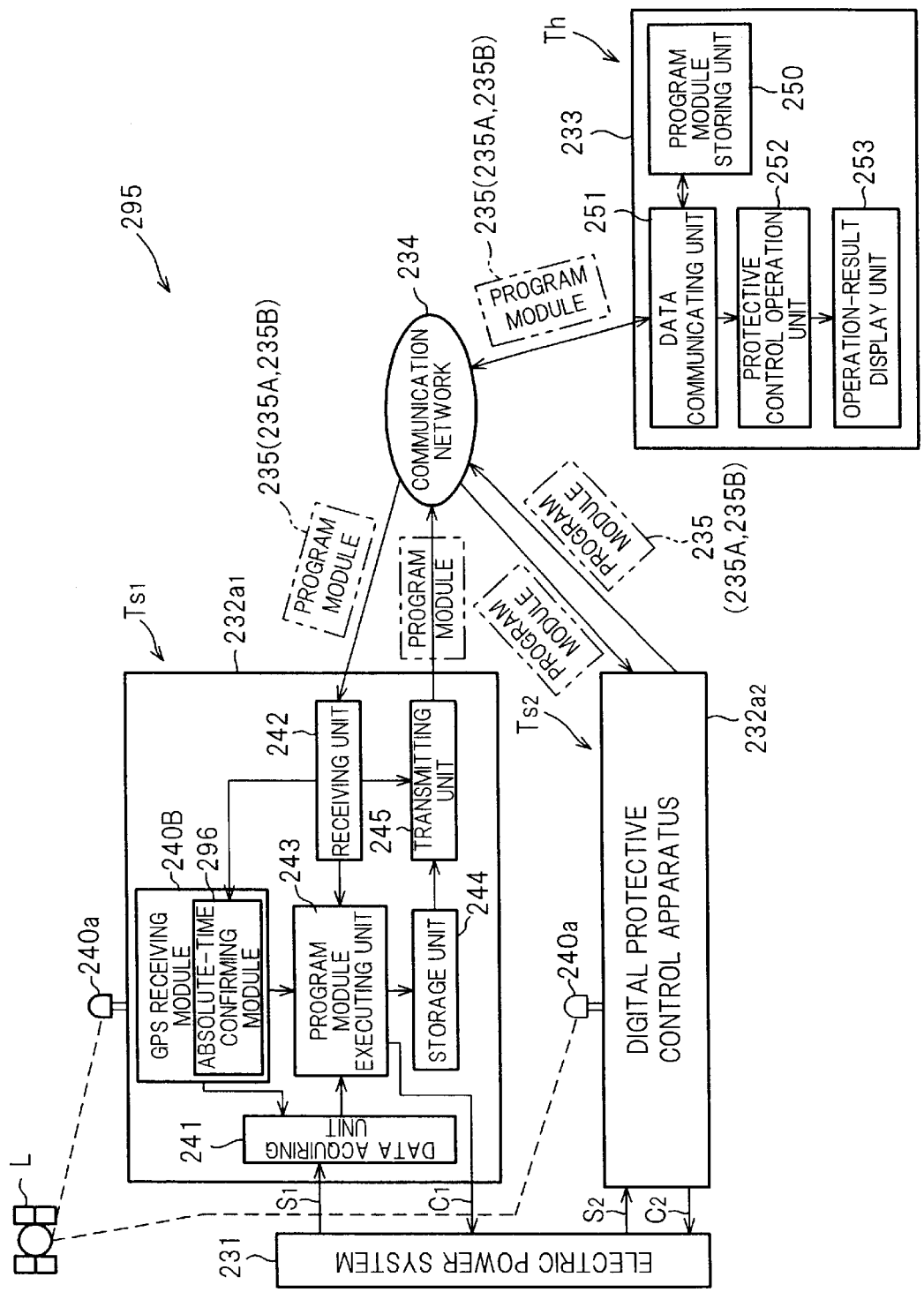
FIG. 40 is a diagram showing functional blocks of an electric power system protective control system according to a sixteenth embodiment of the present invention.

Referring to FIG. 40, in addition to the functional block configuration shown in FIG. 31, a GPS receiving module 240B of the electric power system protective control system 295 of the digital protective control apparatus 232a1 (232a2) is provided with an absolute-time confirming module 296 for fetching, through the receiving unit 242, absolute time t measured by the other apparatus 232a2 (232a1) on the basis of the GPS signals received thereby. In accordance with the fetched absolute time, the absolute-time confirming module 296 determines whether or not the absolute time t is obtained by the own apparatus 232a1 (232a2).

According to this embodiment, the CPU 265 of, for example, the digital protective control apparatus 232a1 sequentially receives the GPS signals transmitted from the plurality of the satellites L through the GPS receiving antenna 240a and the GPS receiving unit 260 to obtain absolute time t. Then, the CPU 265 receives absolute time t' measured by the CPU 265 of the other apparatus 232a2 through the wide-area network 258 and the like. Then, the CPU 265 compares the absolute time t measured by the own apparatus 232a1 and the absolute time t' measured by the other apparatus 232a2 with each other to determine whether or not the absolute time t of the own apparatus 232a1 is accurate.

An assumption is made that transmission delay of Td or smaller takes place when data transmitted from the other apparatus 232a2 are received by the own apparatus 232a1 through the wide-area network 258 and the like and that the comparison accuracy is Tc. As for the determination of the CPU 265, if the time lag between the absolute time t of the own apparatus 232a1 and the absolute time t' measured by the other apparatus 232a2 satisfies the following equation, $$|t-t'| \leq (Tc+Td), \quad (12)$$

the CPU 265 of the digital protective control apparatus 232a1 determines that the absolute time t is accurately measured by the digital protective control apparatus 232a1.

If the time lag |t–t'| between the absolute time t and the absolute time t' does not satisfy the above-mentioned Equation (12), that is, $$|t-t'| > Tc+Td, \quad (13)$$

the CPU 265 determines that the absolute time t measured by the own apparatus 232a1 is inaccurate.

The digital protective control apparatus 232a2 fetches the absolute time t from the other apparatus 232a2 to perform the above-mentioned process. Thus, whether or not the absolute time t' of the own apparatus 232a1 is accurate can be determined.

That is, according to this embodiment, each of the digital protective control apparatuses 232a1 and 232a2 is able to determine whether or not the absolute time measured by the own apparatus is accurate. Therefore, the reliability can furthermore be improved as compared with the electric power system protective control systems according to the foregoing embodiments.

(Seventeenth Embodiment)

Figure 41:
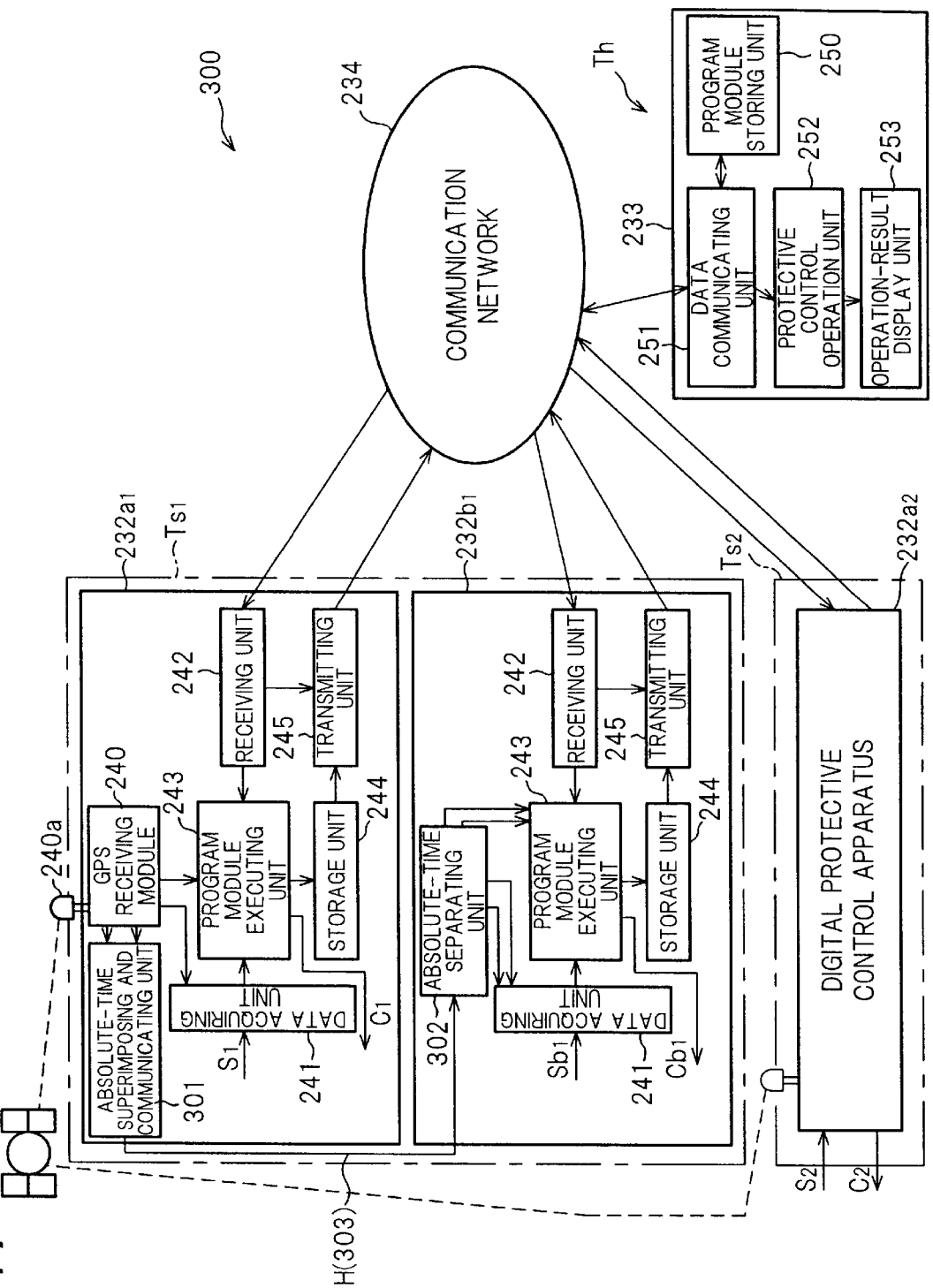
FIG. 41 is a diagram showing functional blocks of an electric power system protective control system according to a seventeenth embodiment of the present invention.

An electric power system protective control system according to a seventeenth embodiment will now be described with reference to FIG. 41. In FIG. 41, the electric power system 231 is omitted to cause the drawing to easily be understood.

In the electric power system protective control system 300 shown in FIG. 41, a plurality of (two in FIG. 41 to easily describe the structure) of digital protective control apparatuses 232a1 and 232b1 are disposed in one electric power station TS1. That is, the digital protective control apparatuses 232a1 and 232b1 are disposed adjacent to each other (as compared with the digital protective control apparatuses 232a2 disposed in the other electric power station Ts2).

The digital protective control apparatus 232a1 of one of the two adjacent digital protective control apparatuses 232a1 and 232b1 in one electric power station Ts1 has a functional block configuration shown in FIG. 31. The other digital protective control apparatus 232b1 has a functional block configuration similar to that shown in FIG. 31 except for the GPS receiving module 240 (including the GPS receiving antenna 240a, GPS receiving unit 240) which is omitted.

The digital protective control apparatus 232a1 is provided with an absolute-time superimposing and communicating unit 301 for superimposing the periodic signal (having the accuracy corresponding to the absolute time) indicting each timing of time on the time data indicating time of each timing, both of which constitute the absolute time t measured by the GPS receiving module 240, and transmit a superimposition signal H of the periodic signal and the time data to the digital protective control apparatus 232b1.

On the other hand, the digital protective control apparatus 232b1 is provided with an absolute-time separating unit 302 for separating the superimposition signal transmitted from the digital protective control apparatus 232a1 and formed by superimposing the periodic signal indicating each timing and the time data indicating time of each timing into the periodic signal indicating each timing and the time data indicating time of each timing so as to generate absolute time t. The absolute-time separating unit 302 transmits the periodic signal indicating each timing and the time data indicating time of each timing, both of which constitute the absolute time t, to the data acquiring unit 241 and the program module executing unit 243. Thus, the transmitted periodic signal and time data are used in the electric quantity data acquiring process and the absolute time adding process described in the ninth embodiment.

The hardware configuration of the digital protective control apparatus 232b1 is similar to that of the digital protective control apparatus 232a1 shown in FIG. 32 except for the GPS receiving unit 260 (including the GPS receiving antenna 240a, GPS receiving unit 240) which is omitted. The communication interface 261 of the digital protective control apparatus 232b1 is connected to the Ethernet LAN 256 through the transceiver 255. The digital protective control apparatus 232a1 and the digital protective control apparatus 232b1 are connected to each other through the Ethernet LAN 256, the communication interface 261 and the like such that data communication is permitted.

In this embodiment, the I/O 4 of the digital protective control apparatus 232a1 and the I/O 4 of the digital protective control apparatus 232b1 are connected through one communication line (for example, an optical fiber) 303 (referred to FIG. 41) for serial communication with which the superimposition signal H.

The other functional block configurations according to this embodiment and the hardware configuration for realizing the functional block configurations are similar to those according to the ninth embodiment shown in FIGS. 31 and 32. Therefore, they are omitted from description. Note that the electric quantities acquired by the digital protective control apparatus 232b1 from the electric power system are expressed to Sb1 and an operation command transmitted to external devices of the electric power system are expressed to Cb1.

That is, according to this embodiment, the CPU 265 of the digital protective control apparatus 232a1 superimposes the periodic signal indicating each timing of each time t1 to tn and the time data indicating the contents of the time t1 to tn of each timing, said periodic signal and time data constituting the absolute time t (t1 to tn) measured through the GPS receiving antenna 240a. Then, the CPU 265 transmits the superimposition signal H of the periodic signal and the time data to the digital protective control apparatus 232b1 through the I/O 4 and the communication line 303 (refer to a time chart shown in FIG. 42). Note that data transmission time Tt require to transmit one data item (absolute time timing data+time data) is larger that Tx, said Tx representing time required to transfer one byte and said relationship being expressed to Tt>Tx.

The CPU 265 of the digital protective control apparatus 232b1 receives the superimposition signal H transmitted through the I/O 4. Then, the CPU 265 use a detection pulse (having a pulse width of Td) having a pulse width shorter than Tx and longer than Tx so as to separate the received signal H into the absolute-time timing signal (periodic signal) for each time t1 to tn and the time data at each timing (refer to the time chart shown in FIG. 42).

The CPU 265 performs the process for acquiring the electric quantity data and the process for adding the absolute time in accordance with the foregoing absolute time t1 to tn.

As described above, according to this embodiment, the communication line, such as an optical fiber, which permits high-speed data transference is used to establish the connection between the digital protective control apparatus having at least one GPS receiving module (the GPS receiving antenna and the GPS receiving unit) of a plurality of digital protective control apparatuses disposed relatively adjacently to each other, for example, disposed in one electric power station and at least one digital protective control apparatus having no GPS receiving module. The absolute time (the absolute-time timing signal and the time data) received by the GPS receiving module is superimposed so as to be communicated to the at least one digital protective control apparatus having no GPS receiving module. Thus, the at least one digital protective control apparatus having no GPS receiving module separates the transmitted superimposition signal into the absolute-time timing signal and time data to obtain synchronized electric quantity data by using the absolute time (the absolute-time timing signal and time data). Moreover, the absolute time can be added to electric quantity data so as to be stored.

Therefore, the number of the GPS receiving modules (GPS receiving units and GPS receiving antenna), each of which has the relatively high cost as compared with that of the digital protective control apparatus, can be reduced. Therefore, it is possible to reduce the cost of the electric power system protective control system calculation.

Figure 42:
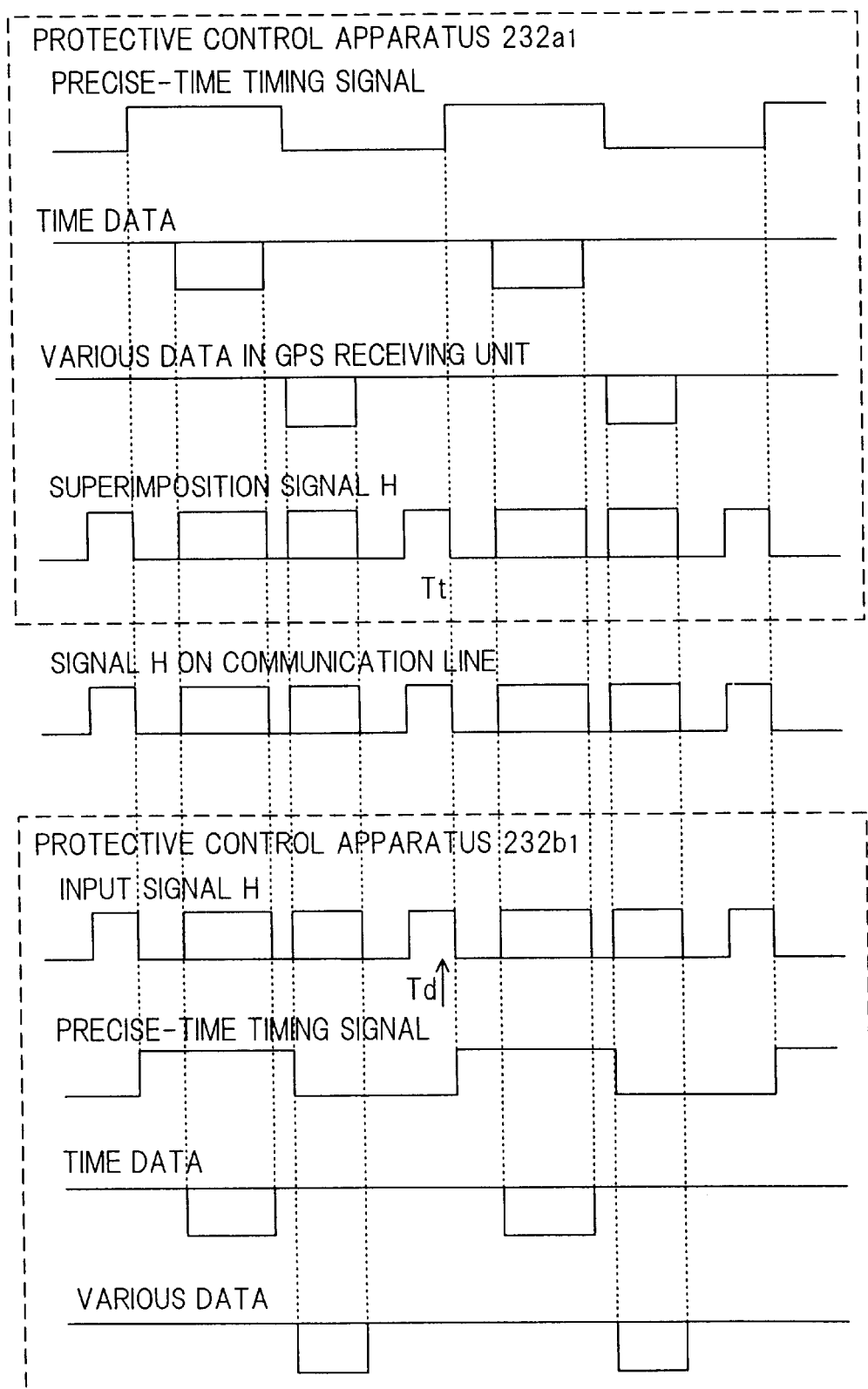
FIG. 42 is a time chart showing an absolute time timing signal, time data, a superimposition signal and various data for use in the electric power system protective control system according to the seventeenth embodiment.

In this embodiment, timing and time data are superimposed so as to be transmitted from the digital protective control apparatus 232a1 to the digital protective control apparatus 232b1. The present invention is not limited to this structure. As shown in FIG. 42, it is able to superimpose various data items (a result of self-diagnosis of the GPS receiving unit 260, the states of the satellites and receiving states) of the GPS receiving unit 26, at appropriate time intervals, on the superimposition signal H formed by superimposing the timing and time data so as to transmit the obtained superimposition signal H' to the digital protective control apparatus 232b1. When the foregoing structure is employed, the digital protective control apparatus 232b1 is able to use the timing of each absolute time in accordance with the states of use of the satellites and the wave receipt state.

Figure 43:
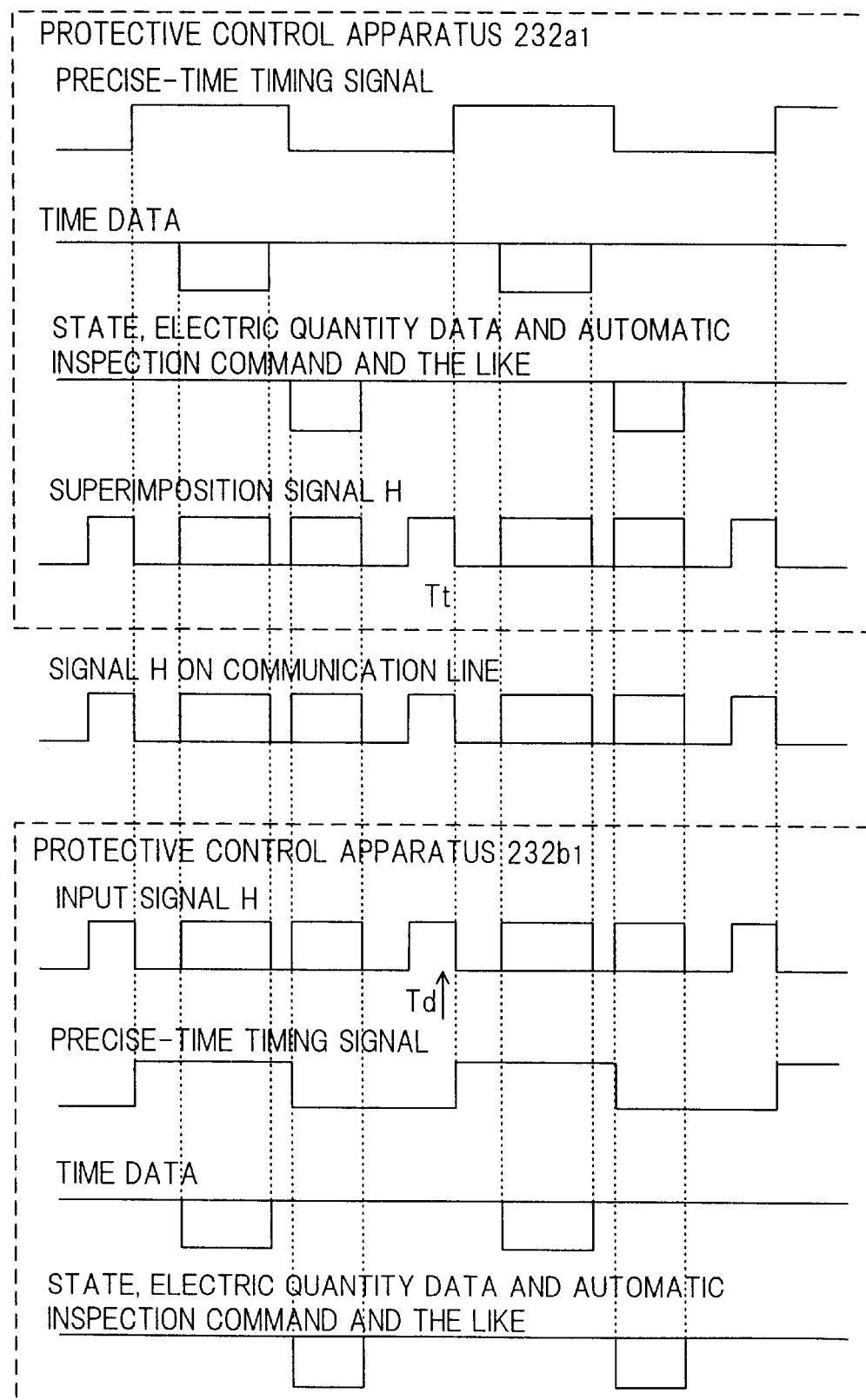
FIG. 43 is a time chart showing an absolute time timing signal, time data, a superimposition signal, status and electric quantity data and an automatic inspection command for use in an electric power system protective control system according to a modification of the seventeenth embodiment.

A structure as shown in FIG. 43 may be employed in which the state and the electric quantity data of the digital protective control apparatus 232a1, from which the transmission is performed, and an automatic inspection command for the digital protective control apparatus 232b1, to which the receive process is performed, are superimposed on the superimposition signal H in which the timing and time data are superimposed so as to transmit superimposition signal H" to the digital protective control apparatus 232b1. The foregoing enables communication between the digital protective control apparatus 232a1 and the digital protective control apparatus 232b1 disposed in one electric power station to be permitted such that enlargement of the communication load in the wide area network is prevented.

(Eighteenth Embodiment)

Figure 44:
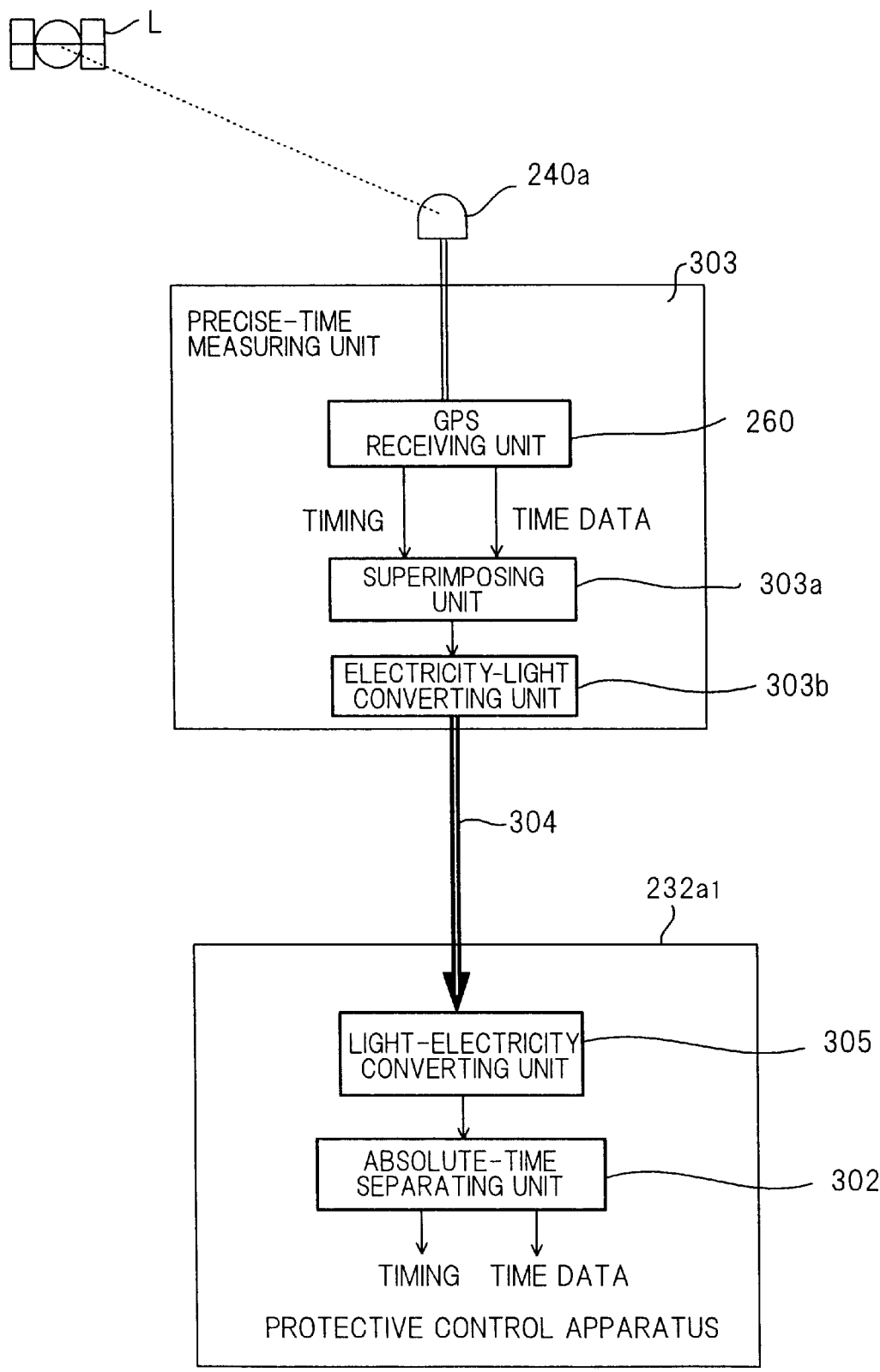
FIG. 44 is a diagram showing functional block configuration of an electric power system protective control system according to an eighteenth embodiment of the present invention.

An electric power system protective control system according to an eighteenth embodiment of the present invention is shown in FIG. 44.

The GPS receiving module 240 (the GPS receiving unit 260) of the digital protective control apparatuses 232a1 and 232a2 shown in FIG. 41 is electrically connected to the GPS receiving antenna 240a. Therefore, if the GPS receiving antenna 240a which is disposed outdoor is directly struck by lightning, there is apprehension that the electric current of the thunder flows into the GPS receiving module 240 (the GPS receiving unit 260) and the other units (the CPU and the like) through the GPS receiving antenna 240a. In this case, there is apprehension that the overall protective control apparatus may be broken.

Therefore, according to this embodiment, an electric power system protective control system which is capable of protecting the overall body of the protective control apparatus even if the GPS receiving antenna 240a is directly struck by lightening.

FIG. 44 a block configuration of a digital protective control apparatus (only digital protective control apparatus 232a1 is representatively illustrated) of the electric power system protective control system according to this embodiment.

Referring to FIG. 44, the electric power system protective control system is provided with a main protective control apparatus 232a1 having a structure similar to the hardware configuration shown in FIG. 32 except for the GPS receiving module 240 which is omitted; a precise-time measuring unit 303 having the GPS receiving unit 260 and the GPS receiving antenna 240a mounted thereon and adapted to measure precise time; and an optical communication cable 304 for connecting the protective control apparatus 232a1 and the precise-time measuring unit 303 such that communication is permitted in an electrically insulated state.

The precise-time measuring unit 303 is provided with the GPS receiving antenna 240a, the GPS receiving unit 260, a superimposing unit 303a for, as shown in FIG. 42, superimposing the timing and the time data constituting the absolute time t measured by the GPS receiving unit 260; and an electricity-light converting unit 303b for converting the superimposition signal H in which the timing and time data are superimposed into an optical signal so as to transmit the optical signal (optical data) to the main protective control apparatus 232a1 through the optical communication cable 304.

The main protective control apparatus 232a1 is provided with, the data acquiring unit 241, the receiving unit 242, the program module executing unit 243, the storage unit 244 and the transmitting unit 245. Moreover, the protective control apparatus 232a1 is provided with, the following units (not shown in FIG. 44): a light-electricity converting unit 305 connected to the optical communication cable 304 such that communication is permitted and adapted to convert the optical data based on the superimposition signal H transmitted through the optical communication cable 304 into an electric superimposition signal H; and an absolute-time separating unit 302 for separating the superimposition signal H obtained from the converting process performed by the light-electricity converting unit 305 into the timing and time data to generate a signal indicating absolute time t.

A method of using the separated absolute time t has been described in the foregoing ninth and seventeenth embodiments. Therefore, the method is omitted from description.

That is, according to this embodiment, the precise-time measuring unit 303 is connected to the main protective control apparatus 232a1 through the optical communication cable 304 which is electrically insulated. Therefore, if the GPS receiving antenna 240a of the precise-time measuring unit 303 is directly struck by lightning, the electric signal of the thunder is not transmitted to the main protective control apparatus 232a1 through the optical communication cable 304. Therefore, a fault of the main protective control apparatus 232a1 can be prevented.

Therefore, the reliability of the electric power system protective control system can furthermore be improved.

The structure of the protective control apparatus of the electric power system protective control system according to this embodiment (the hardware for measuring the precise time and the hardware for the protective control operation processes are separated from the hardware (the precise-time measuring unit) for measuring the precise time by measuring the GPS signal) so as to be connected to each other through the communication cable which is electrically insulated) may be applied to all of the protective control apparatuses according to the embodiments of the present invention which receive the GPS signals.

Figure 45:
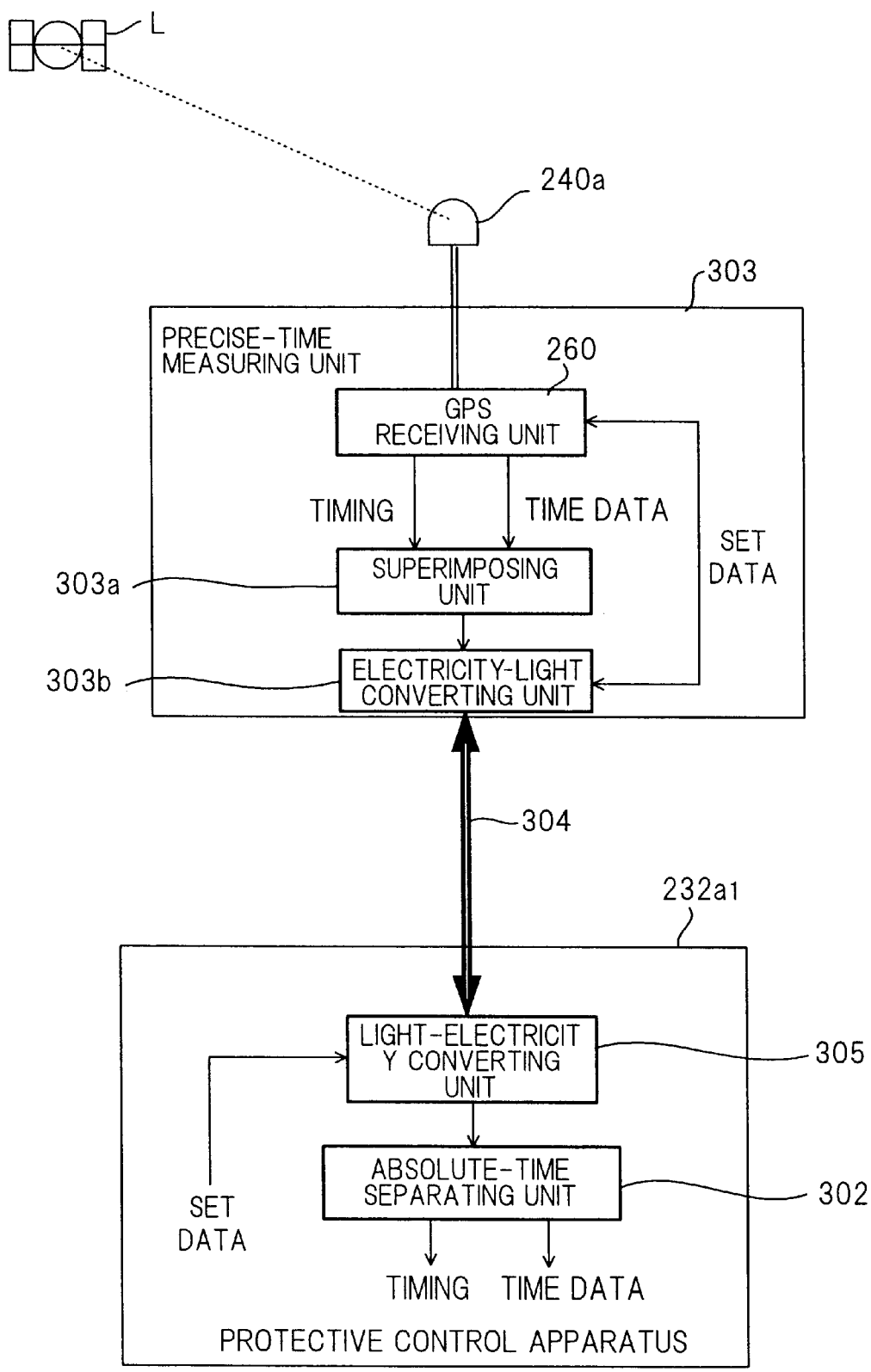
FIG. 45 is a diagram showing functional block configurations of an electric power system protective control system according to a first modification of the eighteenth embodiment.

FIG. 45 is a diagram showing a first modification of the eighteenth embodiment.

Referring to FIG. 45, the CPU 265 of the protective control apparatus 232$a$1 has a function for converting set data (the initial position of the GPS receiving antenna 240$a$ and the like) stored in the RAM 266, the EEPROM 268 and the like into optical data through the light-electricity converting unit 305 so as to transmit the optical data to the precise-time measuring unit 303 through the optical communication cable 304. The precise-time measuring unit 303 receives the set data based on the optical data and transmitted through the optical communication cable 340 and the electricity-light converting unit 303$b$ so as to transmit the set data to the GPS receiving unit 260.

The above-mentioned structure enables the precise-time measuring unit 303 (the GPS receiving unit 260) to be initialized similarly to the eleventh embodiment. Thus, the precise-time measuring unit 303 (the GPS receiving unit 260) can be energized in a short time.

When various data (a result of the self-diagnosis of the GPS receiving unit 260, the states of the satellites and states of receipt) except for data related to the absolute time t of the GPS receiving unit 260 are transmitted to the electricity-light converting portion 303$b$, the protective control apparatus 232$a$1 is able to receive the various data through the electricity-light converting portion 303$b$, the optical communication cable 304 and the light-electricity converting unit 305. As a result, it is possible to significantly improve the maintenance easiness of the precise-time measuring unit 303.

Figure 46:
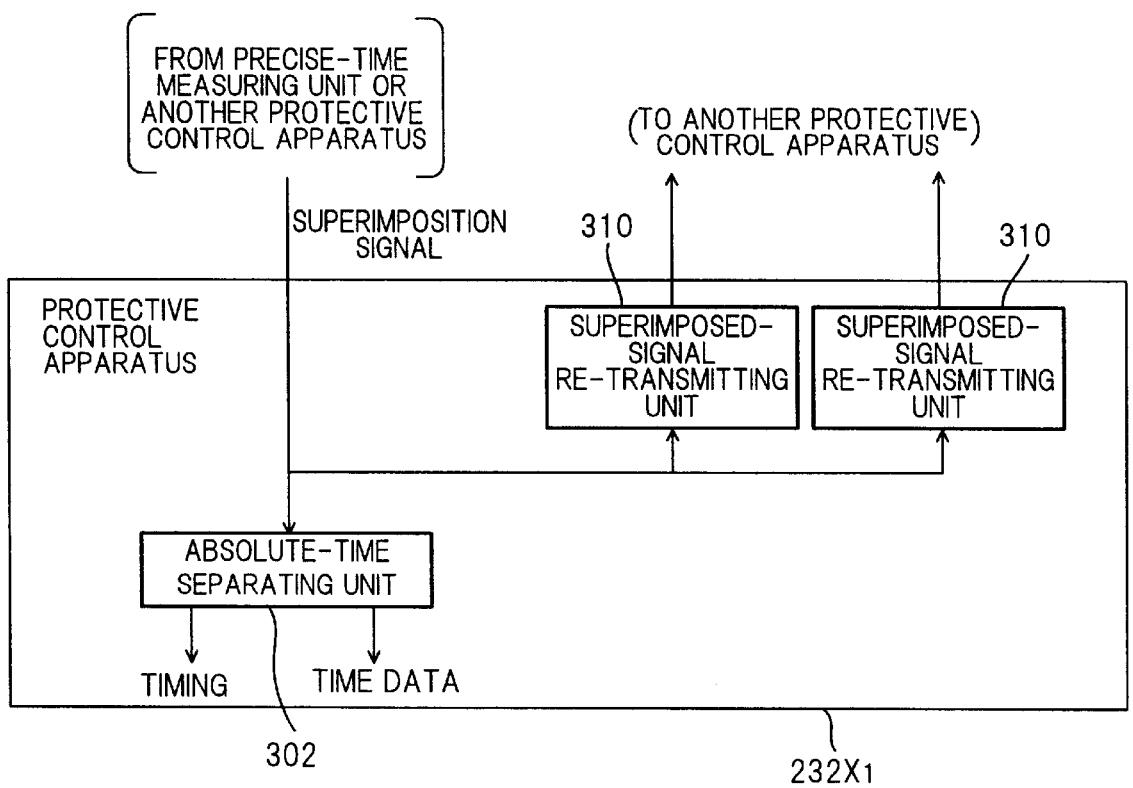
FIG. 46 is a diagram showing functional block configurations of an electric power system protective control system according to a second modification of the eighteenth embodiment.

FIG. 46 is a diagram showing a second modification of an eighteenth embodiment.

In FIGS. 41, 44 and 45, two protective control apparatuses 232$a$1 and 232$b$1 are adjacently disposed in one electric power station Ts1. The structure according to the eighteenth embodiment may be applied to an arrangement in which a plurality of protective control apparatuses 232$x$1, 232$x$2, . . . , 232$xn$ are adjacently disposed with each other in the one electric power station Ts1.

At least one (the protective control apparatus 232$a$1) of the protective control apparatuses 232$x$1, 232$x$2, . . . , 232$xn$ has the structure according to the eighteenth embodiment shown in FIG. 44. A superimposed-signal re-transmitting unit 310 is provided in the at least one protective control apparatus 232$x$1 for superimposing again the timing and time data of the absolute time separated by the absolute-time separating unit 302 of the protective control apparatus 232$x$1 has performed so as to transmit again the superimposed signal to the other protective control apparatuses 232$x$2, . . . , 232$xn$. Thus, the other protective control apparatuses 232$x$2, . . . , 232$xn$ are able to commonly obtain the absolute time t transmitted from the protective control apparatus 232$x$1. Therefore, the precise-time (absolute time measuring hardware and software can be omitted from the other protective control apparatus 232$x$2, . . . , 232$xn$.

Incidentally, a superimposed signal transmitted from, in place of the precise-time measuring unit 303, the other protective control apparatus having the hardware and software for measuring precise time to protective control apparatus 232$x$1 may be transferred to the other protective control apparatus through the superimposed-signal re-transmitting unit 310.

As shown in FIG. 46, the digital protective control apparatus 232$x$1 has two superimposed-signal re-transmitting units 310. When each of the digital protective control apparatuses 232$x$1, 232$x$2, . . . , 232$xn$ has two or more superimposed-signal re-transmitting units 310, the digital protective control, apparatuses 232$x$1, 232$x$2, . . . , 232$xn$ may be connected into a tree configuration to commonly obtain the timing and time data of the absolute time.

Figure 47:
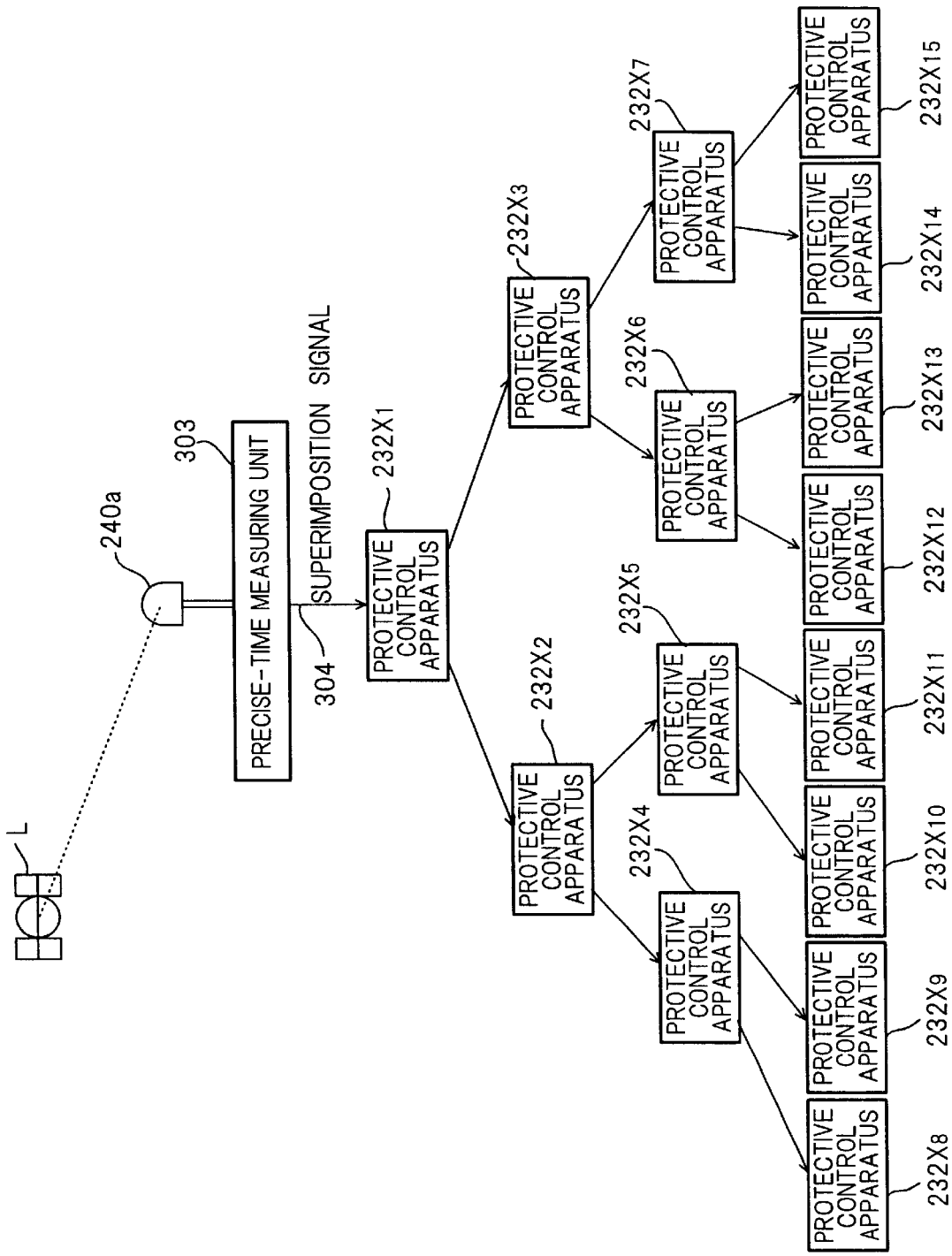
FIG. 47 is a diagram showing a second modification of the eighteenth embodiment in which a plurality of digital protective control apparatuses are connected into a tree configuration.

When the digital protective control apparatuses 232$x$1, 232$x$2, . . . , 232$xn$ connected to the communication network 234 have two superimposed-signal re-transmitting unit 310 and an assumption is made that the number of the steps of the tree is N (N=4 in the structure shown in FIG. 47), $2^N1-1$ (15 in the structure shown in FIG. 47) protective control apparatuses 232$x$1, 232$x$2, . . . , 232$x$15 can be connected into the tree configuration by using a plurality of communication cables (individual from the communication network), as shown in FIG. 47.

Assuming that the delay for each step is td and the delay for each communication cable for connecting the protective control apparatuses to each other is tc, the delay of the timing at the N-th protective control apparatus is expressed as follows:

$$\text{delay of } N\text{-}th = N \cdot td + (N-1) \cdot tc \quad (14)$$

Figure 48:
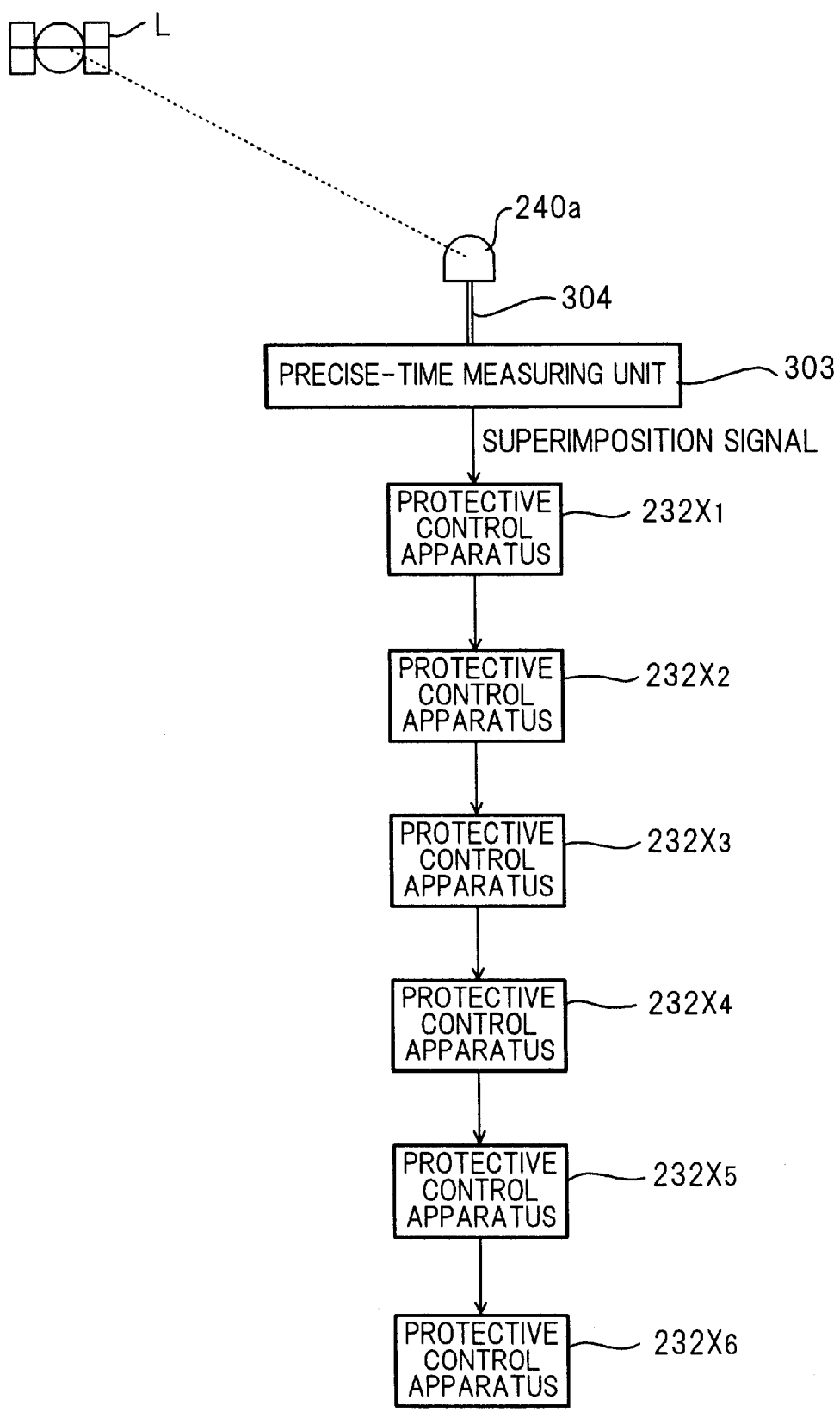
FIG. 48 is a diagram showing a second modification of the eighteenth embodiment in which a plurality of digital protective control apparatuses are connected into a cascade configuration.

When each of the digital protective control apparatuses 232$x$1, 232$x$2, . . . , 232$xn$ has one or more superimposed-signal re-transmitting unit 310, a plurality of (n=6 in FIG. 48) the digital protective control apparatuses 232$x$1, 232$x$2, . . . , 232$xn$ can be connected into a cascade configuration by using a plurality of communication cables, as shown in FIG. 48.

When the number of steps of the cascade configuration is m (=n) and the td and tc are used, the timing delay of an m-th (n-th) protective control apparatus can be expressed as follows:

$$\text{delay of } m\text{-}th = m \cdot td + (m-1) \cdot tc \quad (15)$$

As compared with the tree-type configuration shown in FIG. 47, the electric power system protective control system having the cascade configuration encounters reduction in the number of steps of the protective control apparatuses, which permits a predetermined delay. However, an advantage can be realized in that the structure for the connection can relatively be simplified.

Figure 49:
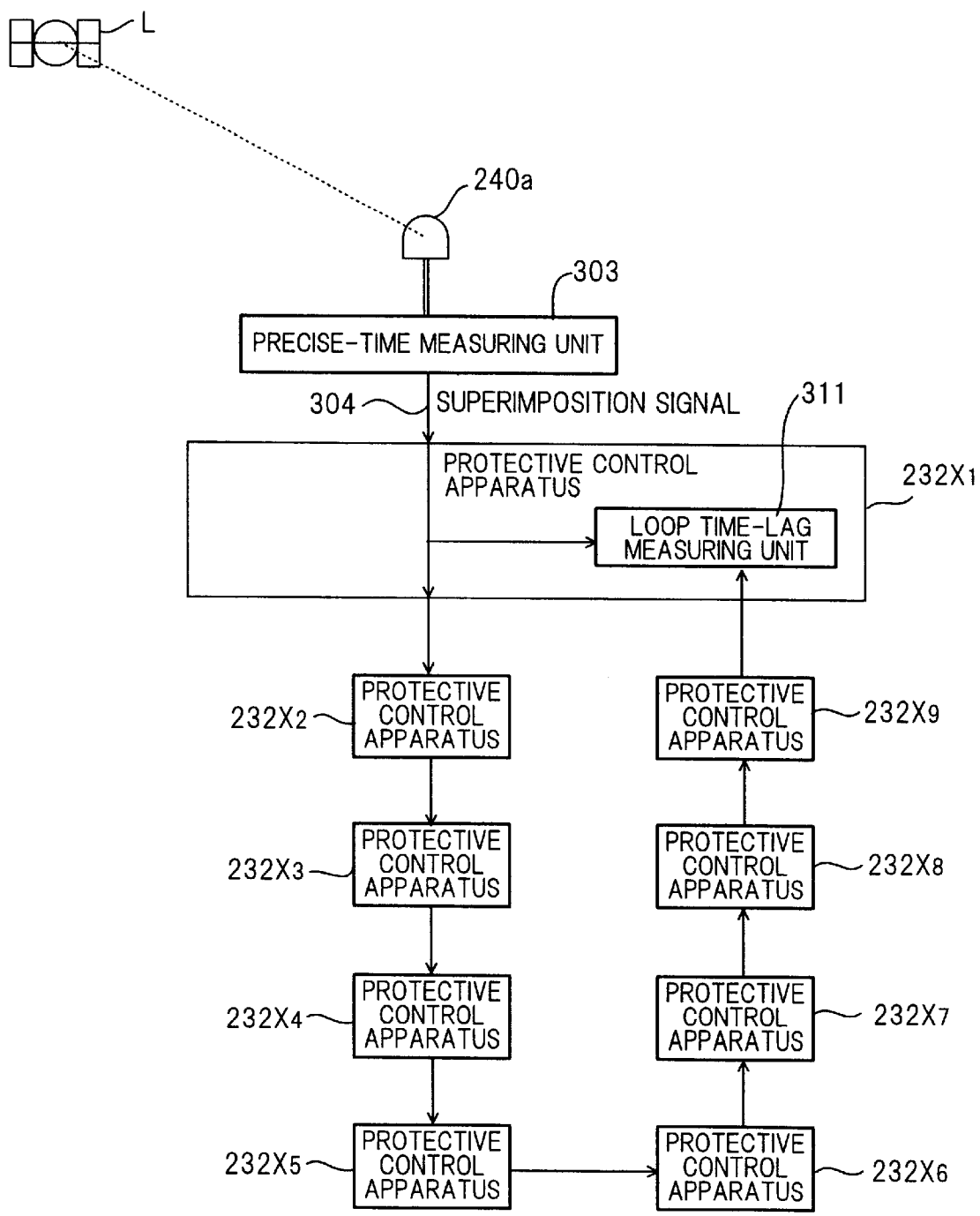
FIG. 49 is a diagram showing a second modification of the eighteenth embodiment in which a plurality of digital protective control apparatuses are connected into a loop cascade configuration.

When each of the digital protective control apparatuses 232$x$1, 232$x$2, . . . , 232$xn$ has one or more superimposed-signal re-transmitting unit 310, a plurality of the digital protective control apparatuses 232$x$1 to 232$xn$ (n=9 in FIG. 49) may be connected into a loop shape by using a plurality of communication cables, as shown in FIG. 49.

The protective control apparatus 232$x$1 connected to the precise-time measuring unit 303 through the optical communication cable 304 is provided with a loop time-lag measuring unit 311 for measuring a time lag between the superimposition signal transmitted to the next protective control apparatus 232$x$2 and the superimposition signal returned from the final protective control apparatus 232$x$9.

When the communication cables for connecting the protective control apparatuses to each other have the same lengths, the protective control apparatus 232$x$1 communicates through the communication network 234 to each of the protective control apparatuses 232x2 to 232x9 a value obtained by dividing the time lag measured by the loop time-lag measuring unit 311 with the number (which is 8 in this embodiment) of the protective control apparatuses connected to the protective control apparatus 232x1, so that each of the protective control apparatuses 232x2 to 232x9 is able to obtain an accurate absolute time (timing) in which the transmission delay of the superimposition signal is corrected by transmitting the value to each of the protective control apparatuses 232x2 to 232x9.

Figure 50:
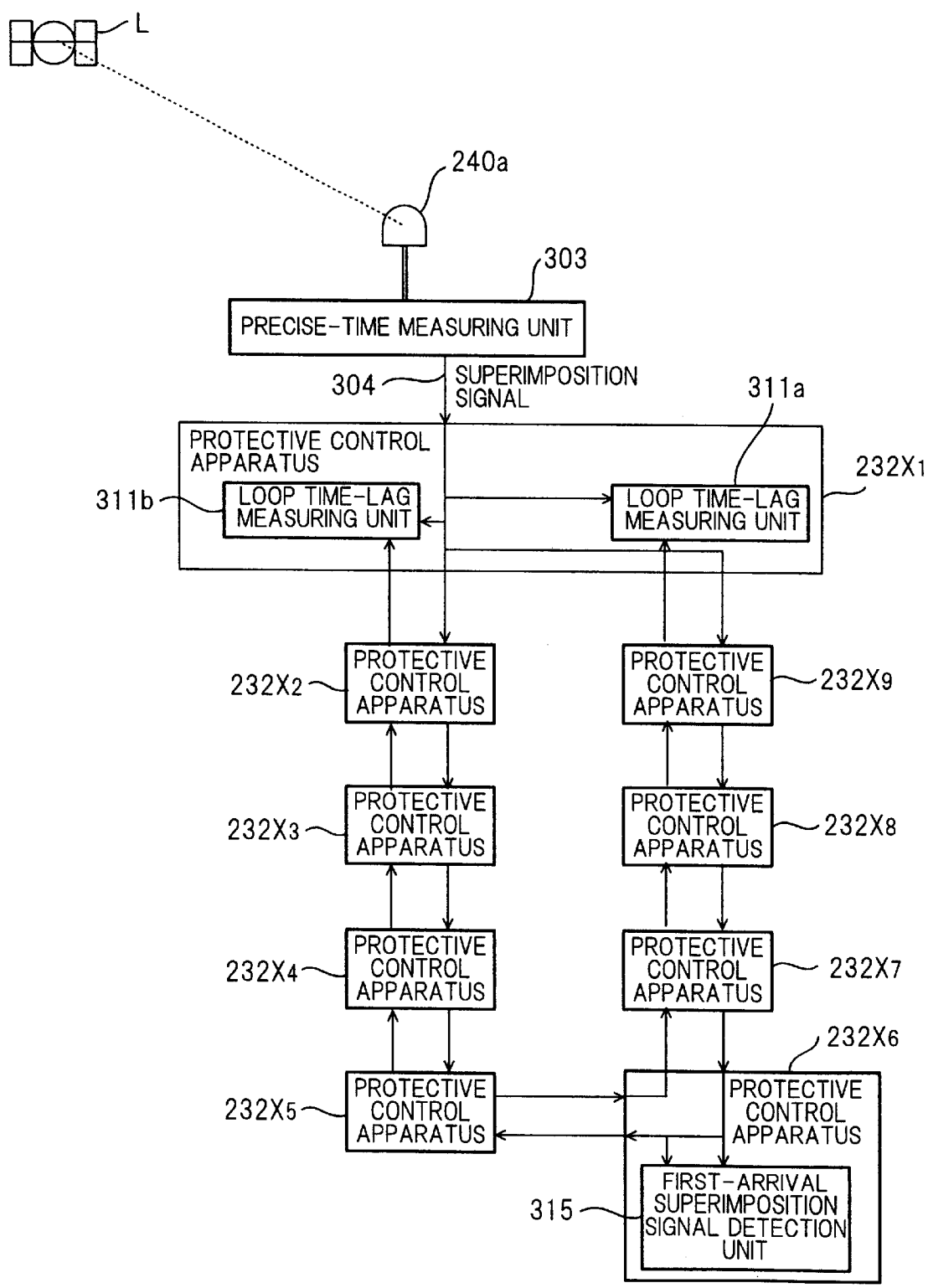
FIG. 50 is a diagram showing a second modification of the eighteenth embodiment in which a plurality of digital protective control apparatuses are connected into a double loop cascade configuration.

The plural protective control apparatuses 232x1 to 232xn (n=9 in FIG. 50) maybe connected into a double-loop configuration by two independent communication cables, as shown in FIG. 50.

The protective control apparatus 232x1 connected to the precise-time measuring unit 303 through the optical communication cable 304 is provided with a first loop time-lag measuring unit 311a and a second loop-lag measuring unit 311b. The first loop time-lag measuring unit 311a measures a loop time lag of superimposition signals sequentially transmitted through a first loop (the protective control apparatus 232x2 the protective control apparatus 232x3→ . . . → the protective control apparatus 232x8→ the protective control apparatus 232x9) and returned to the protective control apparatus 232x1. Moreover, the second loop-lag measuring unit 311b measures a lop time lag of superimposition signals sequentially transmitted through a second loop (the protective control apparatus 232x9 → the protective control apparatus 232x8→ . . . → the protective control apparatus 232x3→ the protective control apparatus 232x2) and returned to the protective control apparatus 232x1.

Each of the protective control apparatuses 232x2 to 232x9 is provided with a first-arrival superimposition signal detection unit 315 for detecting a superimposition signal transmitted through a shorter loop (a predetermined loop when the distances are the same) between the protective control apparatus 232x1 connected to the precise-time measuring unit 303 to the own protective control apparatus. That is, the previously-arrived superimposition signal detection unit 315 detects a superimposition signal, which has first arrived at the own protective control apparatus, among the superimposition signals transmitted from the protective control apparatus 232x1 through the first and second loops. Each of the protective control apparatuses 232x2 to 232x9 uses the superimposition signal detected by the first-arrival superimposition signal detection unit 315 and arrived first so as to perform the above-mentioned processes, such as the data acquiring process.

That is, the electric power system protective control system having the double-loop communication network structure has the first and second loop time-lag measuring units 311a and 311b for measuring the time lags in each of the first and second loops. Therefore, if a fault occurs in at least one portion of the communication cable for constituting either of the first loop or the second loop, each of the protective control apparatuses 232x2 to 232x9 corrects the absolute time (the timing) communicated from a normal loop different from the communication cable encountered the fault in accordance with the time lag measured by the loop time-lag measuring unit corresponding to the normal loop. Thus, it is possible to use an accurate absolute time (timing) in which the transmission delay is corrected.

With the electric power system protective control system having the double-loop connection structure, if a fault occurs in at least one portion of the communication cable for constituting either of the first loop or the second loop, a fact that the superimposition signal cannot be received through the loop encountered the fault can be detected by the first loop time-lag measuring unit 311a, the second loop time-lag measuring unit 311b or the first-arrival superimposition signal detection unit 315. Therefore, at least any one (for example, the protective control apparatus 232x1) of the protective control apparatus 232x1 to the protective control apparatus 232x9 makes an inquiry of the state of reception of the superimposition signal to the other protective control apparatuses (for example, the protective control apparatus 232x2 to the protective control apparatus 232x9) at predetermined intervals through the communication network, making it possible to determine the position of the fault in the communication cable.

The plurality of the protective control apparatuses 232x1, 232x2 to 232xn (n=9 in FIG. 50) may be connected into multi-loop configuration by two or more individual and different communication cables.

Figure 51:
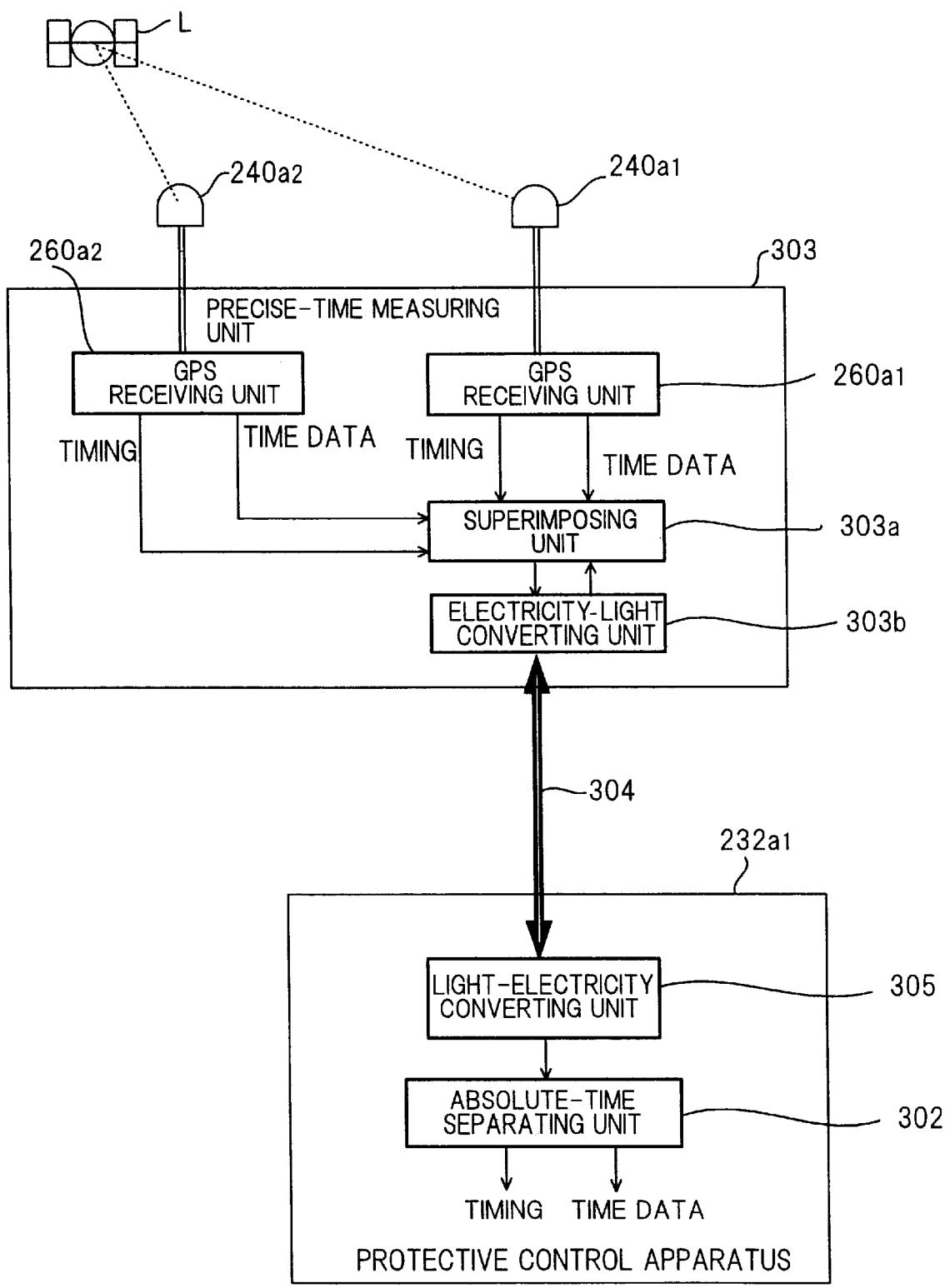
FIG. 51 is a diagram showing functional block configurations of an electric power system protective control system according to a third modification of the eighteenth embodiment.

FIG. 51 is a diagram showing a third modification of the eighteenth embodiment.

Referring to FIG. 51, the precise-time measuring unit 303 is provided with a plurality of GPS receiving antennas 240a1 to 240an and GPS receiving units 260a1 to 260an (two in FIG. 51). The superimposing unit 303a selects optimizing timing and time data of the absolute time from a plurality timing and time data thereof transmitted from the plurality of the GPS receiving units 260a1 to 260an. Then, the superimposing unit 303a superimposes the selected timing and time data of the absolute time.

When three or more GPS receiving antennas and GPS receiving units exist (the GPS receiving antennas 240a1 to 240a3 and the GPS receiving units 260a1 to 260a3), the superimposing unit 303a selects a GPS receiving unit in the GPS receiving units 240a1 to 240a3, considered to be normal in accordance with a majority theory.

For example, when the timing and time data of the absolute time measured by the GPS receiving unit 260a1 and the timing and time data of that measured by the GPS receiving unit 260a2 coincide with each other, the superimposing unit 303a is adapted to select either of the GPS receiving unit 260a1 or the GPS receiving unit 260a2.

Then, the superimposing unit 303a superimposes the timing and time data of the selected GPS receiving unit so as to generate a superimposition signal.

When two GPS receiving antennas and GPS receiving units (GPS receiving antennas 240a1 and 240a2 and GPS receiving units 260a1 and 260a2) exist, the majority theory cannot be employed. Therefore, the superimposing unit 303a selects, according to the stability of the timing signal and time data measured by each of the GPS receiving units 260a1, 260a2, more sound GPS receiving unit. Then, the timing and time data of the absolute time measured by the selected GPS receiving unit are superimposed to generate a superimposition signal.

In some cases, the protective control apparatus 232a1 may receive time data of the GPS receiving unit 260 of another protective control apparatus 232a2 through the communication network 234 (the wide-area network 258). Then, the control apparatus 232a1 transmits the received time data to the precise-time measuring unit 303 through the light-electricity converting unit 305 and the optical communication cable 304, making it possible to collate the time data measured by the precise-time measuring unit 303 with the transmitted time data.

That is, according to this modification, by providing the plural GPS receiving antennas and GPS receiving units, if a fault occurs in one GPS receiving antenna or one GPS receiving unit or if the GPS receiving unit cannot receive the GPS signal in the initial state, it is able to select timing and time data of absolute time measured by the residual GPS receiving antennas and GPS receiving units so as to use the selected timing and time data of the absolute time. Therefore, it is possible to furthermore improve the reliability of the electric power system protective control system.

Figure 52:
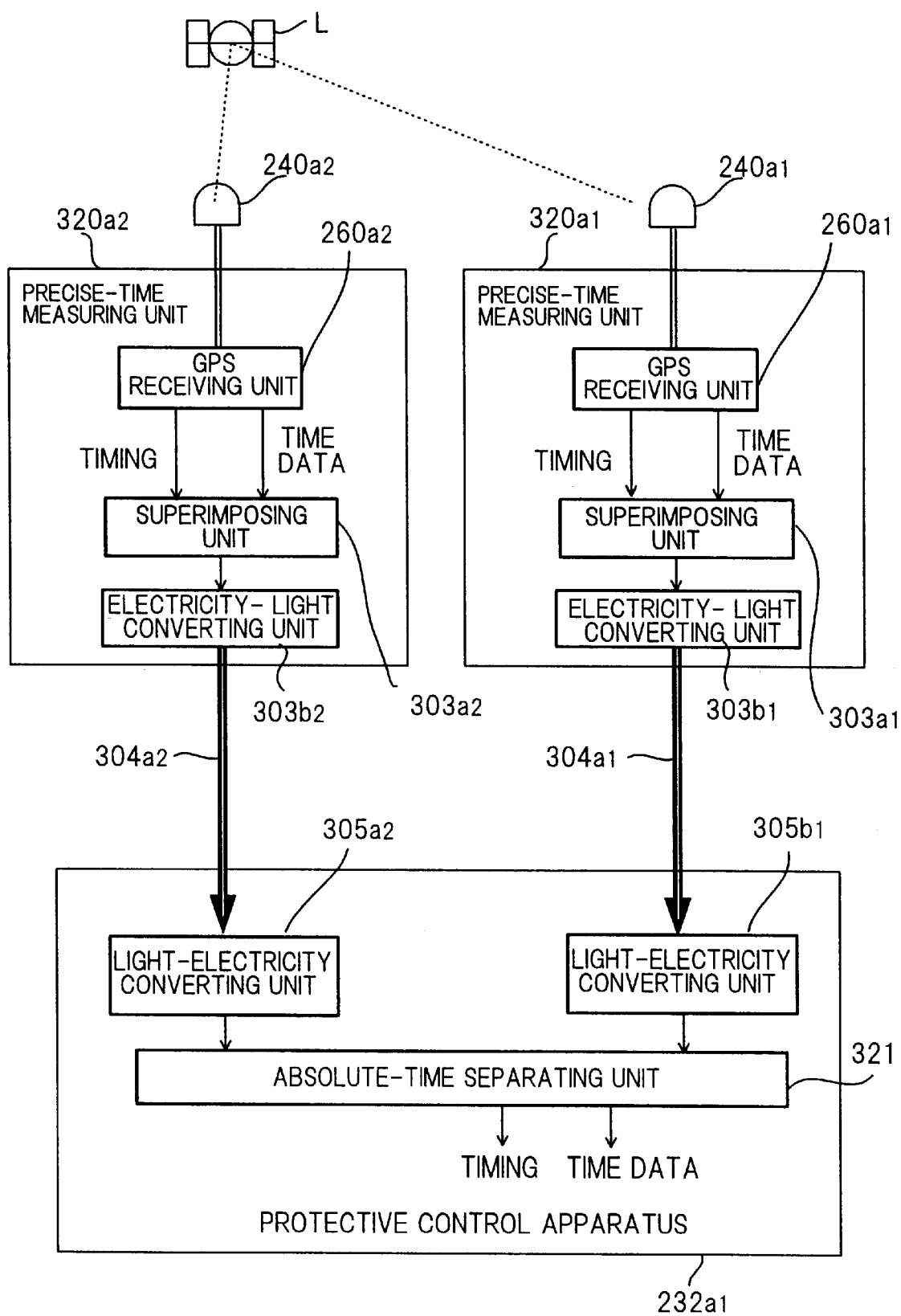
FIG. 52 is a diagram showing functional block configurations of an electric power system protective control system according to a fourth modification of the eighteenth embodiment.

FIG. 52 is a diagram showing a fourth modification of the eighteenth embodiment.

In this modification, the GPS receiving antenna and the GPS receiving unit shown in FIG. 51 are not formed into a multi-structure. The precise-time measuring unit is formed into a multi-structure (a double structure will now be described).

Referring to FIG. 52, an electric power system protective control system according to this modification is provided with a protective control apparatus 232a1 having a structure obtained by omitting the GPS receiving module 240 (GPS receiving unit 260 and the GPS receiving antenna 240a) from the hardware configuration shown in FIG. 32; a first precise-time measuring unit 320a1 having a first GPS receiving unit 260a1, a first GPS receiving antenna 240a1, a first superimposing unit 303a1 and a first electricity-light converting unit 303b1 mounted thereon; a second precise-time measuring unit 320a2 having a second GPS receiving unit 260a2, a second GPS receiving antenna 240a2, a second superimposing unit 303a2 and a second electricity-light converting unit 303b2 mounted thereon; a first optical communication cable 304a1 for connecting the protective control apparatus 232a1 and the first precise-time measuring unit 320a1 to each other such that communication is permitted in an electrically insulated state; and a second optical communication cable 304a2 for connecting the protective control apparatus 232a1 and the second precise-time measuring unit 320a2 such that communication is permitted in an electrically insulated state.

The protective control apparatus 232a1 is provided with the data acquiring unit 241, the receiving unit 242, the program module executing unit 243, the storage unit 244 and the transmitting unit 245 (omitted in FIG. 52). Moreover, the protective control apparatus 232a1 is provided with first and second light-electricity converting units 305a1 and 305a2 which are connected to the first and second optical communication cables 304a1 and 304a2, respectively such that communication is permitted and which convert optical data based on first and second superimposition signals H1 and H2 each transmitted through the first and second optical communication cables 304a1 and 304a2 into the electric first and second superimposition signals H1 and H2, respectively. Furthermore, an absolute-time separating unit 321 is provided in the protective control apparatus 232a1 for separating the first and second superimposition signals H1 and H2 obtained from the conversion processes of the first and second light-electricity converting units 305a1 and 305a2 into first data (first timing and first time data) of first absolute time t1 and second data (second timing and second time data) of second absolute time t2, respectively so as to generate first and second signals each indicating the first and second absolute time t1 and t2, respectively.

In this modification having the above-mentioned structure, the absolute-time separating unit 321 separates the first and second superimposition signals H1 and H2 measured by the first and second precise-time measuring units 320a1 and 320a2 and transmitted through the first and second optical communication cables 304a1 and 304a2 and the first and second light-electricity converting portions 305a1 and 305a2 into the first and second data, respectively, thereby generating the first and second signals each indicating the first and second absolute time t1 and t2.

The absolute-time separating unit 321 examines the validity of the first and second timing related to the generated first and second absolute time t1 and t2 and the validity of first and second time data related to the first and second absolute time t1 and t2. Thus, the absolute-time separating unit 321 selects more sound precise-time measuring unit to use the timing and time data of the selected precise-time measuring unit.

That is, in this modification, by providing a plurality of the precise-time measuring units, if a fault occurs the GPS receiving antenna or the GPS receiving unit of one precise-time measuring unit or the GPS receiving unit cannot receive the GPS signal in the initial state, timing and time data measured by the residual precise-time measuring unit are selected so as to be used. Therefore, it is possible to furthermore improve the reliability of the electric power system protective control system.

(Nineteenth Embodiment)

An electric power system protective control system 350 according to a nineteenth embodiment of the present invention will now be described with reference to FIG. 53.

Figure 53:
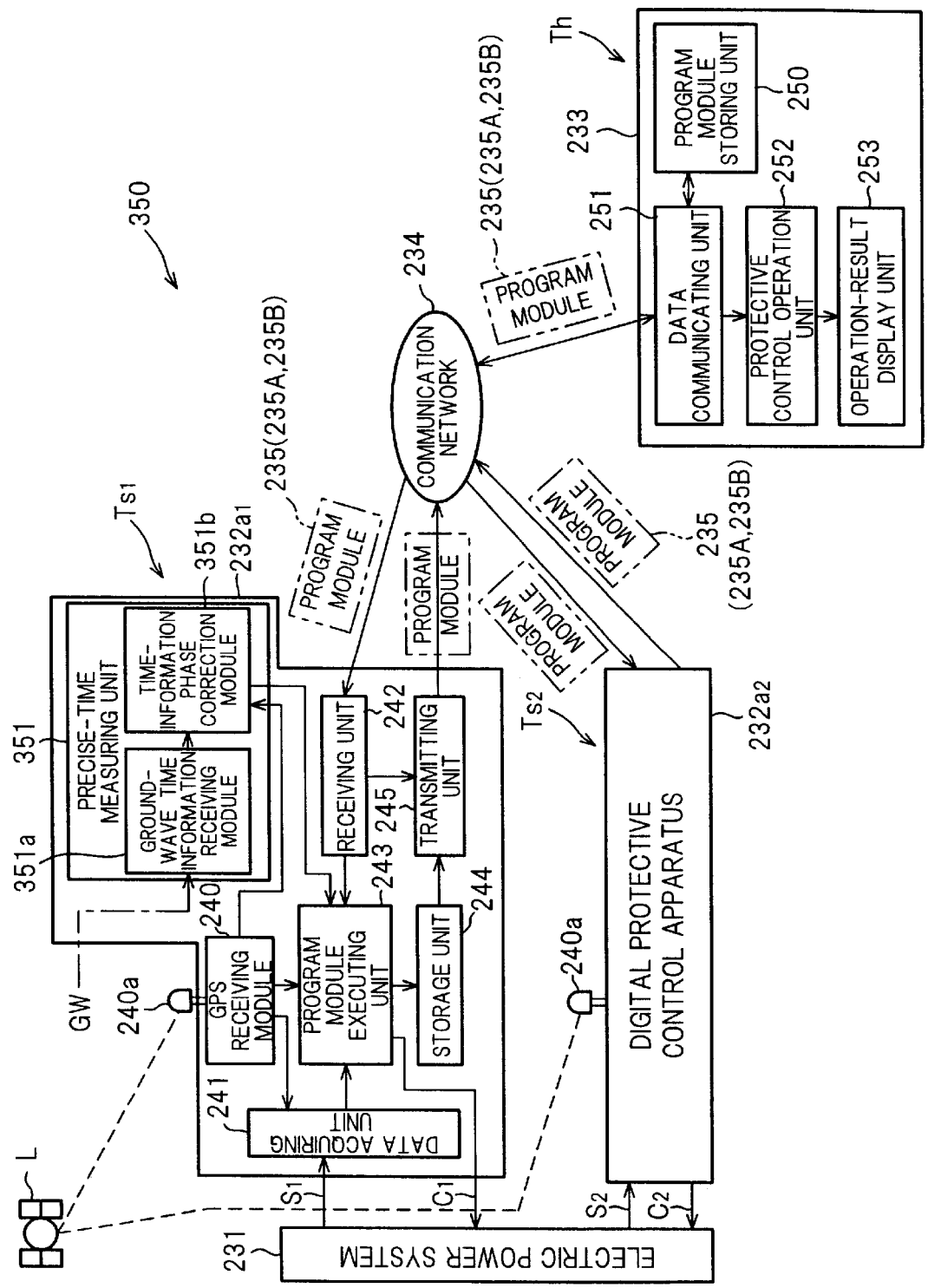
FIG. 53 is a diagram showing functional block configurations of an electric power system protective control system according to a nineteenth embodiment of the present invention.

Referring to FIG. 53, each of the digital protective control apparatuses 232a1 and 232a2 of the electric power system protective control system 350 has the functional block configuration shown in FIG. 31. Moreover, each of the protective control apparatuses 232a1 and 232a2 is provided with, in addition to the GPS receiving module 240 for receiving a GPS signal transmitted from the satellites L to measure absolute time, a precise-time measuring unit 351 for receiving ground waves (wave propagating along the ground) GW to correct the acquired precise time based on the ground wave. Thus, precise time having an accuracy substantially the same as the absolute time and no phase difference can be obtained.

The ground wave for use in the precise-time measuring unit 351 is exemplified by JG2AS which is transmitted from Tukuba City, Ibaraki, Japan. The foregoing wave is a long wave which always communicates time information. When the ground wave is transmitted from one position, time information (precise time of the ground wave) is received with a delay in accordance with the distance from the wave source to the digital protective control apparatuses 232a1 and 232a2. Therefore, a phase difference takes place as compared with the defined precise time having the accuracy of 1 $\mu$s.

The precise-time measuring unit 351 is provided with a ground-wave time information receiving module 351a for receiving time information communicated by the ground wave; and a time-information phase correction module 351b for measuring deviation of the phase (the phase difference) between the absolute time received by the GPS receiving module 240 and the precise time of the ground wave received by the ground-wave time information receiving unit 351a. In accordance with the measured phase difference, the phase of the precise time of the ground wave received by the ground-wave time information receiving unit 351a is corrected to generate precise time having an accuracy approximating the absolute time.

Figure 54:
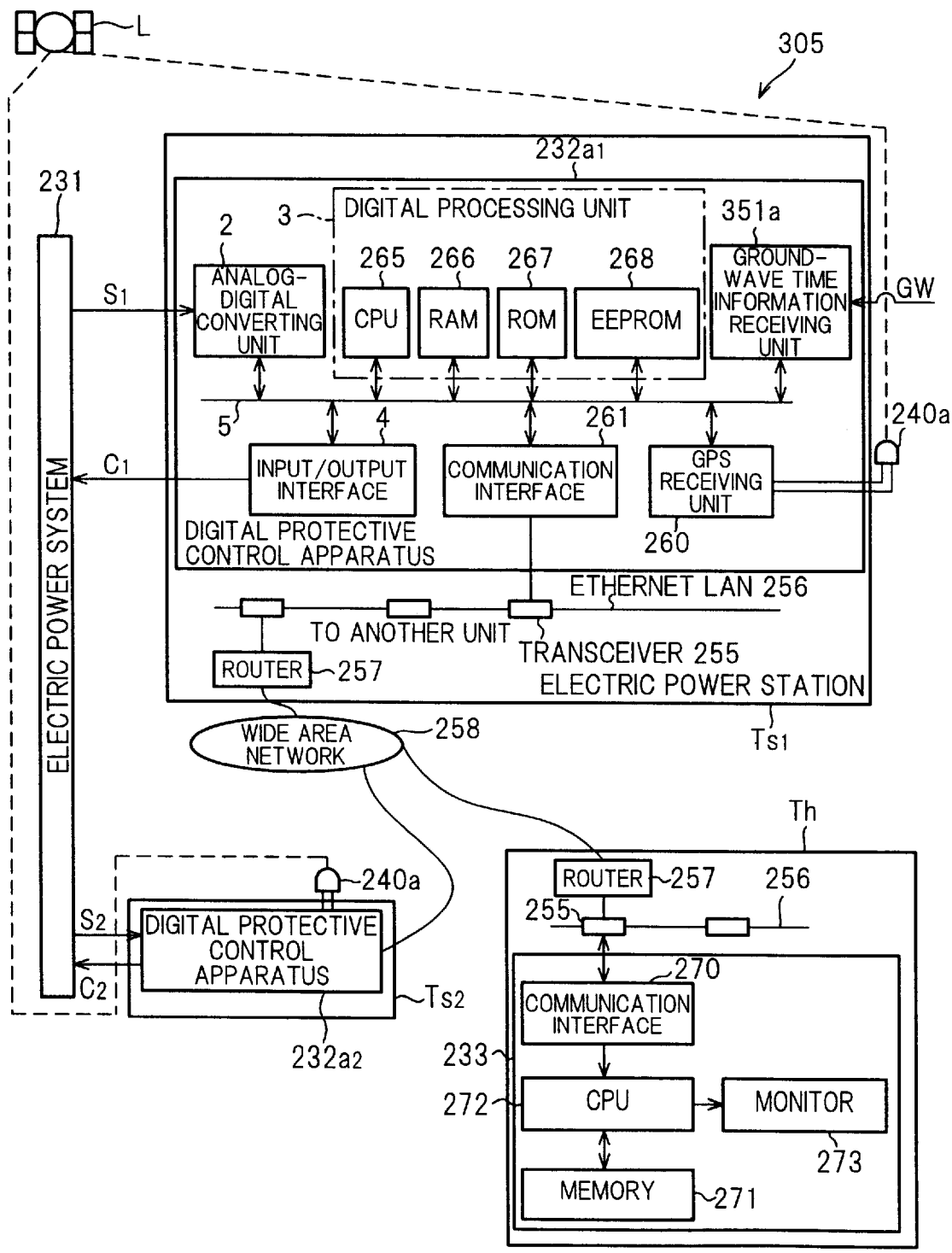
FIG. 54 is a diagram showing the hardware configuration of the electric power system protective control system shown in FIG. 53.

FIG. 54 is a diagram showing the hardware configuration for realizing the functional blocks of the electric power system protective control system 350 according to this embodiment shown in FIG. 53.

Referring to FIG. 54, each of the digital protective control apparatuses 232a1 and 232a2 are provided with a ground-wave time information receiving unit (a ground-wave receiving unit) 351a connected to the bus 5 such that data communication in the respective apparatuses are permitted with elements (the digital processing unit 3 and the like). Thus, the ground-wave time information receiving unit 351a receives information of the time of the ground wave (the precise time of the ground wave) transmitted from Tukuba City to communicate the received precise time of the ground wave to the CPU 265 of the digital processing unit 3.

The other functional block configurations of this embodiment and the hardware configuration for realizing the functional block configuration are similar to those according to the ninth embodiment shown in FIGS. 31 and 32. Therefore, the similar structures are omitted from description.

That is, in this embodiment, when the GPS receiving module 240 (the GPS receiving antenna 240a and the GPS receiving unit 260) is being operated normally, the CPU 265 of each of the digital protective control apparatuses 232a1 and 232a2 performs the process for acquiring (collecting) electric quantity data, the process for adding absolute time and the protective control operation processes similar to those of the ninth embodiment in accordance with the absolute time communicated through the GPS receiving unit 260. The phase difference between the absolute time and the precise time of the ground wave received by the ground-wave time information receiving unit 351a is always measured by the CPU 265 at each time. Then, measured data (the phase difference at each time) are stored by the storage process of the CPU 265 in the RAM 266.

If the absolute time is not communicated from the GPS receiving unit 260 owning to a fault or the like of the GPS receiving unit 260 or if the absolute time communicated from the GPS receiving unit 260 is apparently changed from the precise time of the ground wave transmitted from the ground-wave time information receiving unit 351a, the CPU 265 communicates a fact that the GPS receiving module 240 (the GPS receiving unit 260) of the own apparatus is faulty (defective receipt of GPS) to another protective control apparatus (232a1→232a2, 232a2→232a1) or the display/operation unit 233 through the wide-area network 258 and the like. Moreover, the CPU 265 reads the phase difference corresponding to the precise time of the ground wave transmitted from the ground-wave time information receiving unit 351a to correct the phase of the precise time of the ground wave by using the corresponding phase difference read from the RAM 266, thereby producing precise time having an accuracy similar to the absolute time.

The CPU 265 performs the process for collecting electric quantity data, the process for adding absolute time and the protective control operation processes similar to those according to the ninth embodiment in accordance with the produced precise time.

That is, according to this embodiment, even if the GPS receiving module (the GPS receiving unit or the like) for measuring the absolute time is faulty or the GPS signal cannot accurately be received depending on the state of the operation of the satellites or a state of the ionosphere above the ground, the digital protective control apparatuses 232a1 and 232a2 use the ground wave received by the ground-wave time information receiving unit 351a to detect the fault (the defective receipt of the GPS signal). Then, the digital protective control apparatuses 232a1, 232a2 correct, by using the phase difference between the precise time of the ground wave measured and the absolute time, the precise time based on the ground wave so as to generate the precise time having an excellent accuracy similar to the absolute time.

As a result, according to this embodiment, even if accurate absolute time cannot be obtained by the GPS receiving module (the GPS receiving unit) owning to a fault of the GPS receiving unit or the defective receipt of the GPS signal, it is possible to carry out the process for collecting electric quantity data, the process for adding absolute time and the protective control operation processes by using the corrected precise time based on the ground wave. Thus, it is able to improve the reliability of the electric power system protective control system still more.

(Twentieth Embodiment)

An electric power system protective control system according to a twentieth embodiment of the present invention will now be described with reference to FIG. 55.

Figure 55:
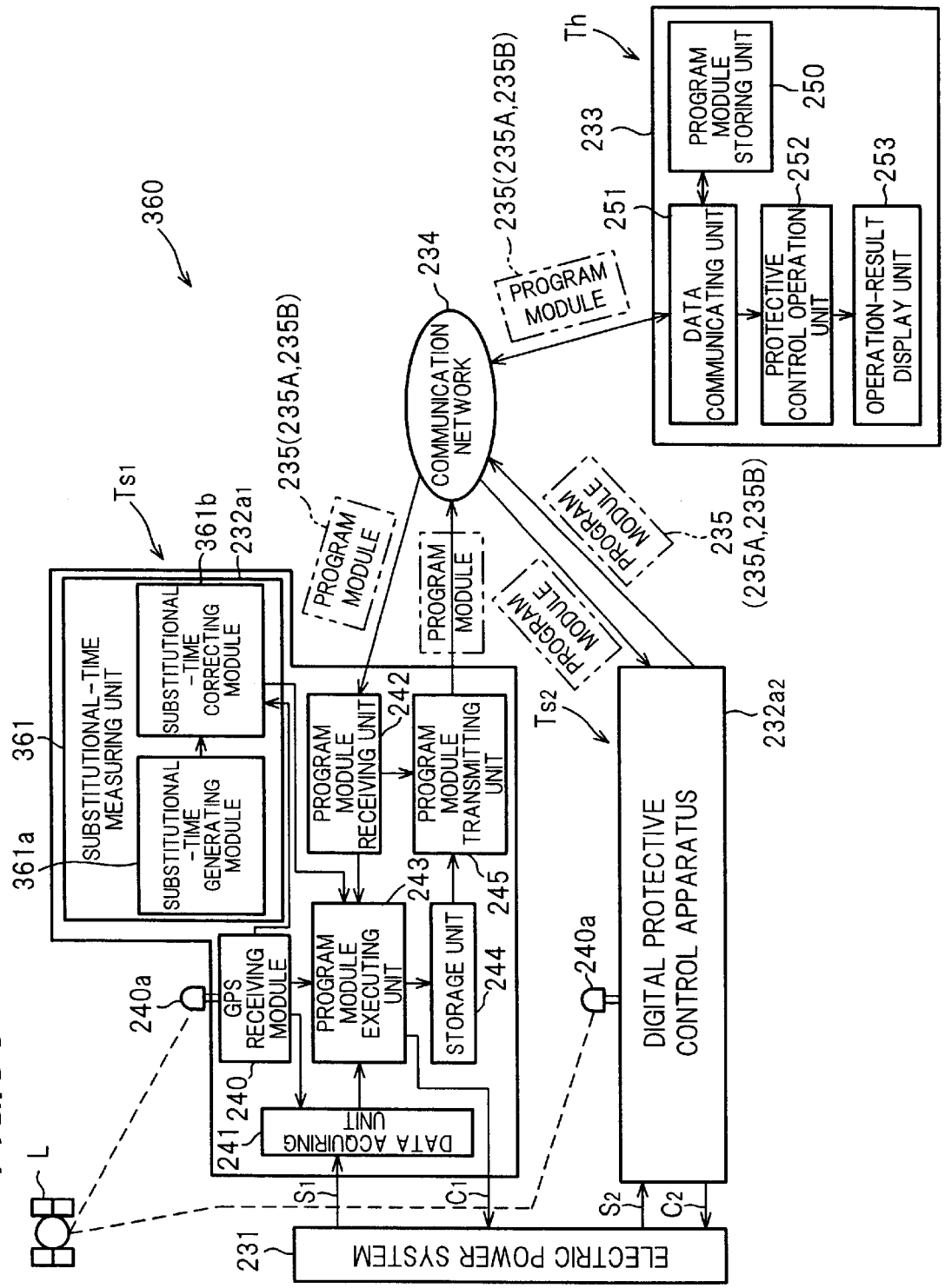
FIG. 55 is a diagram showing functional block configurations of an electric power system protective control system according to a twentieth embodiment of the present invention.

In addition to the functional block configurations shown in FIG. 31, the digital protective control apparatuses 232a1 and 232a2 of the electric power system protective control system 360 shown in FIG. 55 are provided with, in addition to the GPS receiving module 240 for receiving the GPS signal transmitted from the satellites L to measure the absolute time, a substitutional-time measuring unit 361 for correcting the real time acquired as a substitutional time for the absolute time to measure precise time.

The substitutional-time measuring unit 361 is provided with a substitutional-time generating module 361a for generating substitutional real time for the absolute time; and a substitutional-time correcting module 361b for correcting the time lag between the absolute time received by the GPS receiving module 240 and the real time generated by the substitutional-time generating module 361a to generate substitutional time.

As the hardware elements for executing the process of the substitutional-time generating module 361a, the digital protective control apparatuses 232a1 and 232a2 shown in FIG. 32 are provided with a time generating circuit (not shown) connected to the bus 5 such that data communication are permitted with the elements (the digital processing unit 3 and the like) in the respective apparatuses. The time generating circuit has an accurate clock to supply a timing signal and time data generated by the clock to the CPU 265.

That is, according to this embodiment, when the GPS receiving module 240 (the GPS receiving antenna 240a and the GPS receiving unit 260) is being operated normally, the CPU 265 of each of the digital protective control apparatuses 232a1 and 232a2 performs the process for collecting electric quantity data, the process for adding absolute time and the protective control operation processes similar to those according to the ninth embodiment in accordance with the absolute time transmitted through the GPS receiving unit 260. In accordance with the absolute time, the CPU 265 performs the process for correcting the real time generated by the substitutional-time generating module 361a.

When transmission of the absolute time is temporarily inhibited from the GPS receiving unit 260 owning to a state of the operation of the satellites, the CPU 265 communicates a fact that the own GPS receiving module 240 (the GPS receiving unit 260) is in a defective state to receive GPS to the other protective control apparatuses (232a1→232a2, 232a2→232a1) through the wide-area network 258 and the like. Moreover, in accordance with the corrected substitutional time, the CPU 265 performs the process for collecting electric quantity data, the process for adding absolute time and the protective control operation processes.

That is, according to this embodiment, if the receipt of the GPS signal is temporarily inhibited owning to a state of the operation of the satellites or the state of the ionosphere above the ground and the defective receipt of the GPS signal is a temporary defect, the digital protective control apparatuses 232a1 and 232a2 correct the real time generated by the substitutional-time generating module 361a so as to generate the substitutional time, thereby performing the process for collecting electric quantity data, the process for adding absolute time and the protective control operation processes. Therefore, it is possible to still more improve the reliability of the electric power system protective control system.

If the digital protective control apparatus 232a1 encounters a defective receipt of the GPS signal, the defective receipt of the GPS signal can be communicated to the other protective control apparatus 232a2 and the display/operation unit 233. Therefore, if the defective receipt of the GPS signal is continued for a predetermined time or longer because the defect is caused from a fault of the GPS receiving unit 260, the other protective control apparatus 232a2 determines that the established synchronization is lost so as to carry out a predetermined process (if a plurality of protective control apparatuses exist in addition to the protective control apparatuses 232a1 and 232a2, a process for synchronizing the plural protective control apparatuses except for the protective control apparatus encountered the defective receipt of the GPS signal so as to continue the process for collecting electric quantity data).

(Twenty-first Embodiment)

The functional block configuration of an electric power system protective control system 280A according to a twenty-first embodiment of the present invention is similar to that according to the twelfth embodiment shown in FIG. 36. Therefore, the structure is omitted from description. The hardware configuration for realizing the functional block configuration according to this embodiment is similar to that according to the ninth embodiment shown in FIG. 32. Therefore, the similar hardware configuration is omitted from description.

An assumption is made in this embodiment that a system accident occurs in an equipment device (a power transmission line end RB) to be protected by the digital protective control apparatus 232a2. At this time, an assumption is made that the CPU 265 of the digital protective control apparatus 232a2 performs, for example, the processes in steps S40 to S46 shown in FIG. 37 to detect the accident, followed by performing the protective control operation processes including the process for outputting a command to trip the breaker.

When the adjacent protective control apparatus 232a2 to the protective control apparatus 232a1 performs the protective control operation, a change of a state of an equipment device, such as the power transmission line end RA, of the electric power system to be protected by the apparatus 232a1 is caused. However, there are some cases that the protective control operation (the operation of the breaker) is not performed. There is one of the cases where only one single relay software module (such as, an accident detection relay software module) is operated.

Figure 56:
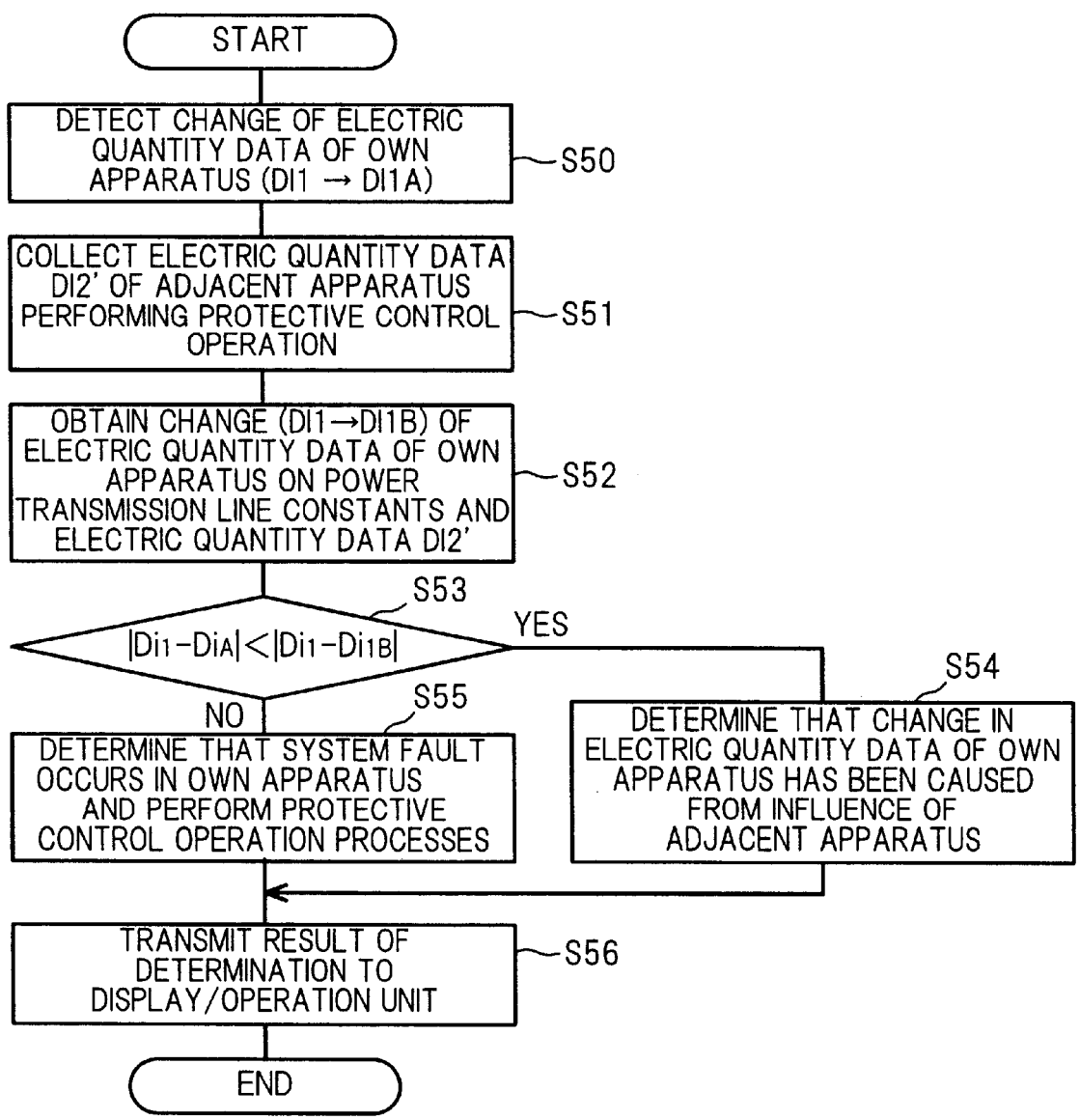
FIG. 56 is a schematic flow chart showing an example of the process of an electric power system protective control system according to a twenty-first embodiment of the present invention.

When the protective control apparatus 232a1 detects the change of the generated state quantities in accordance with the change of the electric quantity data (Di1→Di1A)(step S50 in FIG. 56), the protective control apparatus 232a1 collects electric quantity data Di2' of the adjacent protective control apparatus 232a2 through the communication network 234 (the wide-area network 258) and the like (step S51). In accordance with the power-transmission line constants (the self-impedances) of the system equipment device (the power transmission line end RA) related to the own apparatus 232a1 stored in the RAM 266, the mutual influence (power-transmission line constants; mutual impedances) of the two system equipment devices (the power transmission line ends RA and RB) and collected electric quantity data Di2', the protective control apparatus 232a1 obtains the state change (Di1→Di1B) of the own apparatus 232a1 in response to the change of the state of the adjacent apparatus 232a2 (step S52).

The CPU 265 of the apparatus 232a1 determines whether or not the detected change in the electric quantity data (Di1→Di1A) satisfies the range of the change (Di1→Di1B) in the electric quantity data on the basis of the electric quantity data Di2' of the adjacent apparatus 232a2 and the power-transmission line constants, which are obtained as a result of the process in step S52 (step S53).

Assuming that |Di1−Di1A|<|Di1−Di1B|, an affirmative determination is made in step S53. Thus, the CPU 265 determines that the change of the electric quantity data of the own apparatus 232a1 is caused from the influence of the protective control operation of the adjacent apparatus 232a2 for the system equipment device (step S54). Then, the operation is shifted to step S56.

If |Di1−Di1A|≦|Di1−Di1B|, a negative determination is made in step S53. Thus, the CPU 265 determines that the change of the electric quantity data of the own apparatus 232a1 is caused from another system accident (a multiple accident) of the system equipment device (the power transmission line end RA) to be protected by the own apparatus 232a1. Thus, the CPU 265 performs protective control operation processes including a process for outputting a trip command for the breaker)(step S55).

Then, the CPU 265 transmits a result of determination made in step S54 or S55 to the display operation unit 233 through the communication network 234 (the wide-area network 256 and the like) (step S56). Then, the process is completed.

As described above, according to this embodiment, if an accident is occurred in a near (for example, adjacent) protective control apparatus and no accident is detected in spite of generation of change of the electric quantity data occurring in the own apparatus, electric quantity data collected by the adjacent protective control apparatus and the previously measured power-transmission-line constants are used to determine whether or not the change of the electric quantity data of the own protective control apparatus is caused from the influence of the protective control operation of the adjacent protective control apparatus. Therefore, a further reliable electric power system protective control system can be provided.

(Twenty-second Embodiment)

The functional block configurations of the electric power system protective control system 230B according to the twenty-second embodiment and the hardware configuration for realizing the functional block configuration are similar to those according to the ninth embodiment shown in FIGS. 31 and 32.

Specifically, the program module storing unit 250 stores a fourth program module capable of, for example, dynamically changing the set values, such as the setting values of the respective relay software modules, which is relative to the protective control operation.

Therefore, the similar structures are omitted from description.

Referring to FIGS. 31 and 32, when change information (demand) in the electric power system (for example, a change of the system equipment device to be protected) is inputted by a remote monitoring operator by using the input unit 274 of the display/operation unit 233, or when the change information in the electric power system is detected by the protective control apparatus 232a2 or the display/operation unit 233, the protective control apparatus 232a2 or the display/operation unit 233 communicates the change information in the system to the other protective control apparatus 232a1 through the communication network 234 (the wide-area network 258 and the like).

At this time, the protective control apparatus 232a1, for example, downloads the fourth program module transmitted from the display/operation unit 233 through the communication network 234 and the like so as to execute the same, thereby dynamically changing the setting values of the own apparatus 232a1 on the basis of the fourth program module.

When the fourth program module for dynamically changing the set values to correspond to the change of the system equipment device is previously downloaded in the protective control apparatus 232a1, the fourth program module is executed by the apparatus 232a1 so as to dynamically change the set values of the own apparatus 232a1.

As a result, for example, the protective control apparatus 232a1 is able to dynamically change the set values in accordance with the change of the system equipment device detected by the other protective control apparatus 232a2 or the display/operation unit 233 even during a usual operation.

(Twenty-third Embodiment)

The functional block configuration of an electric power system protective control system 230C according to a twenty-third embodiment of the present invention and the hardware configuration for realizing the functional block configuration are similar to those according to the ninth embodiment shown in FIGS. 31 and 32. Therefore, the similar structures are omitted from description.

Incidentally, in this embodiment, an assumption is made that the number of the plurality of digital protective control apparatuses is n.

Referring to FIGS. 31 and 32, a predetermined protective control apparatus 232a1 of a plurality of the protective control apparatuses 232a1 to 232an collects, through the communication network 234, electric quantity data indicating state quantities of the electric power system 231, from the protective control apparatuses 232ak to 232an from which abnormality related to an accident are detected, wherein the respective electric quantity data of the apparatuses 232ak to 232an are added to respective absolute time at which the abnormality is detected to the respective apparatuses 232ak to 232an.

At this time, the protective control apparatus 232a1 is able to precisely obtain, according to the electric quantity data Dik (tk) to Din (tn) each having the absolute time and collected by each apparatuses 232ak to 232an at the accident, the difference (a delay state) of abnormality detecting timings among each apparatuses 232ak to 232an.

If an accident (an abnormality) is occurred in a power transmission line, the protective control apparatus near the position at which the abnormality is occurred is able to immediately observe the abnormal phenomenon.

Since propagation of the abnormality through the power transmission line has a time delay, the apparatuses which are remote from the position at which the abnormality is occurred can monitor the abnormal phenomenon, but the start timings of monitoring the abnormal phenomenon of the respective apparatuses are delayed according to the distance between the abnormality occurrence position and the respective apparatuses.

Therefore, the protective control apparatus 232a1 is able to estimate the distance of the accident point in accordance with the accident detected time tk to tn included in the electric quantity data Dik (tk) to Din (tn) each having absolute time at which the accident is detected. Moreover, the cause of the abnormality can be estimated in accordance with a state of delay of the accident detected time indicating the state of propagation of the abnormal phenomenon.

That is, according to this embodiment, if an abnormality is occurred, the distance of the accident point and a cause of the abnormality can be estimated according to the electric quantity data having absolute time of the detection of the abnormality and collected from a plurality of the digital protective control apparatuses related to the accident. Thus, in accordance with the result of the estimation, it is possible to efficiently perform an accident point locating process and an abnormality cause detecting process.

(Twenty-fourth Embodiment)

An electric power system protective control system 365 according to a twenty-fourth embodiment of the present invention will now be described with reference to FIG. 57.

Figure 57:
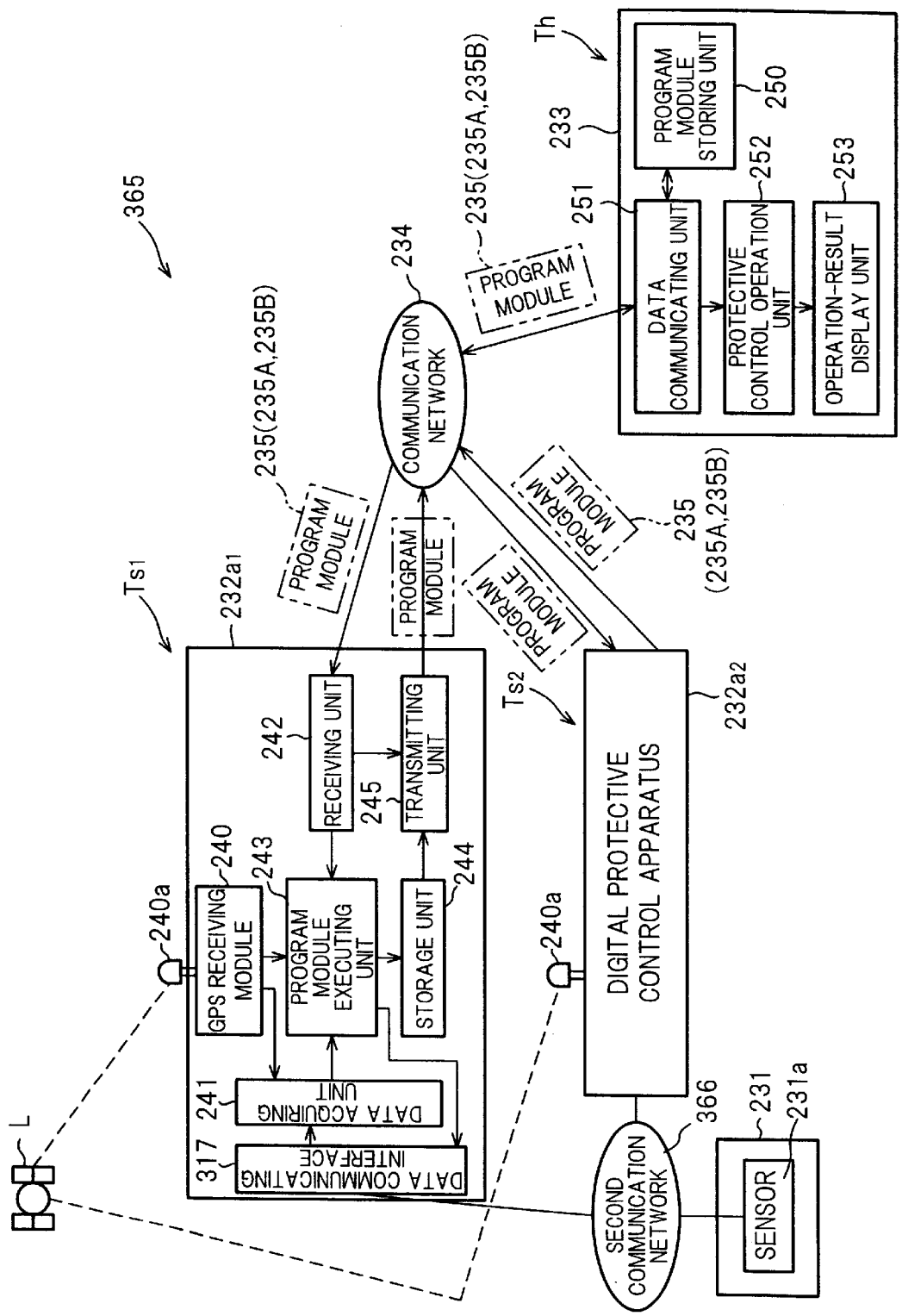
FIG. 57 is a diagram showing functional block configurations of an electric power system protective control system according to a twenty-fourth embodiment of the present invention.

Referring to FIG. 57, in addition to the functional block configuration is shown in FIG. 31, the electric power system protective control system 365 is provided with a second communication network 366 provided individually from the communication network 234 for communicating the electric quantities and the protective control command between the electric power system 231 and each of the protective control apparatuses 232a1 and 232a2.

The second communication network 366 is a high-speed communication network for collecting an analog electric quantities (raw data) of the electric power system 231 in place of conventional dedicated lines. The second communication network 366 enables a plurality of adjacent protective control apparatuses to collect data of the electric power system 231 without a necessity of using the communication network 234.

Each of the protective control apparatuses 232a1 and 232a2 is provided with a communicating unit (an interface circuit) 367 for communicating the electric quantities and operation commands between the second communication network 366 and the data acquiring unit 241 (the analog-digital converting unit 2 from a viewpoint of the hardware) and the program module executing unit 243 (the I/O interface 4 from a viewpoint of the hardware).

Hitherto, when a predetermined sensor 231a of the electric power system 231 and the protective control apparatus (for example, 232a1) are connected to each other through a dedicated line and the other protective control apparatus (for example, 232a2) use information of the sensor 231a, data of the sensor must be collected through the protective control apparatus 232a1, to which the sensor 231a is connected, and the communication network 234. Since raw data (the electric quantities) of the sensor 231a need to always and continuously be collected, the communication network 234 must bear a very heavy communication load. Moreover, the protective control apparatus 232a1 to which the sensor 231a is connected need always output data of the sensor 231a to the communication network 234. Therefore, the processing efficiency of the protective control apparatus 232a1 deteriorates.

However, this embodiment enables the electric quantities of the electric power system 231 to be collected by the second communication network 366. Therefore, the protective control apparatus 232a2 is able to directly obtain information of the sensor 231a through the communication network 234.

Therefore, the conventional process required for the protective control apparatus 232a1, to which the sensor 231a is connected, to communicate information of the sensor becomes needless. Accordingly, the processing efficiency of the protective control apparatus 232a1 can significantly be improved.

Even if the electric power system 231 includes a large number of the equipment devices, such as the sensor 231a, for acquiring the electric quantities, and the equipment devices for operating other equipment devices, the large number of equipment devices and the protective control apparatuses 232a1, 232a2 are connected to each other through one communication network 366. Therefore, the costs of the multiplicity of the dedicated lines in the protective control system can be reduced and the operations for connecting the dedicated lines can be omitted. Thus, it is possible to reduce an amount of the operation for constituting the protective control system and the cost of the protective control system.

In each of the ninth to sixteenth and eighteenth to twenty-fourth embodiments, the two digital protective control apparatuses for the electric power system protective control system are provided for the two electric power stations, respectively. In the seventeenth embodiment, the two digital protective control apparatuses are provided for one of the two electric power stations. The present invention is not limited to the foregoing structures. A plurality of the digital protective control apparatuses may be provided for a plurality of the electric power stations, respectively.

In the first to eighteenth embodiments and twentieth to twenty-fourth embodiments, the GPS receiving module (the GPS receiving unit) is provided for the digital protective control apparatus. The GPS receiving unit receives the GPS signals transmitted from a plurality of satellites on each of which the atomic clock having a constant molecule oscillation through the GPS receiving antenna to decode the GPS signals. Thus, the three-dimensional position of the GPS antenna is obtained. In accordance with the obtained three-dimensional position, time lag is corrected so that accurate absolute time t (having an accuracy of about 100 ns) is measured. The present invention is not limited to this structures. In the electric power system protective control system, any time acquiring unit (a circuit) capable of acquiring accurate precise time having an accuracy of 1 $\mu$s including a predetermined error as the absolute time may be provided in each protective control apparatuses.

For example, the system according to the nineteenth embodiment which detects the ground wave to measure the precise time may be provided in each protective control apparatuses. Another system capable of detecting the precise time (the absolute time) measured by using satellites of another nation except for the GPS may be mounted on each protective control apparatuses. Since the nineteenth embodiment has the structure that the precise-time measuring unit uses the absolute time to correct the phase difference of the precise time of the ground wave, it is preferable that a system for measuring the absolute time is employed.

In the ninth to twenty-fourth embodiments, the electric power system protective control system is provided with each digital protective control apparatus for protectively controlling the electric power system. The present invention is not limited to this structures. The present invention may be applied to a control system having each digital protective control apparatus for controlling a general industrial plant (industrial system) or a public plant (public system).

Figure 58:
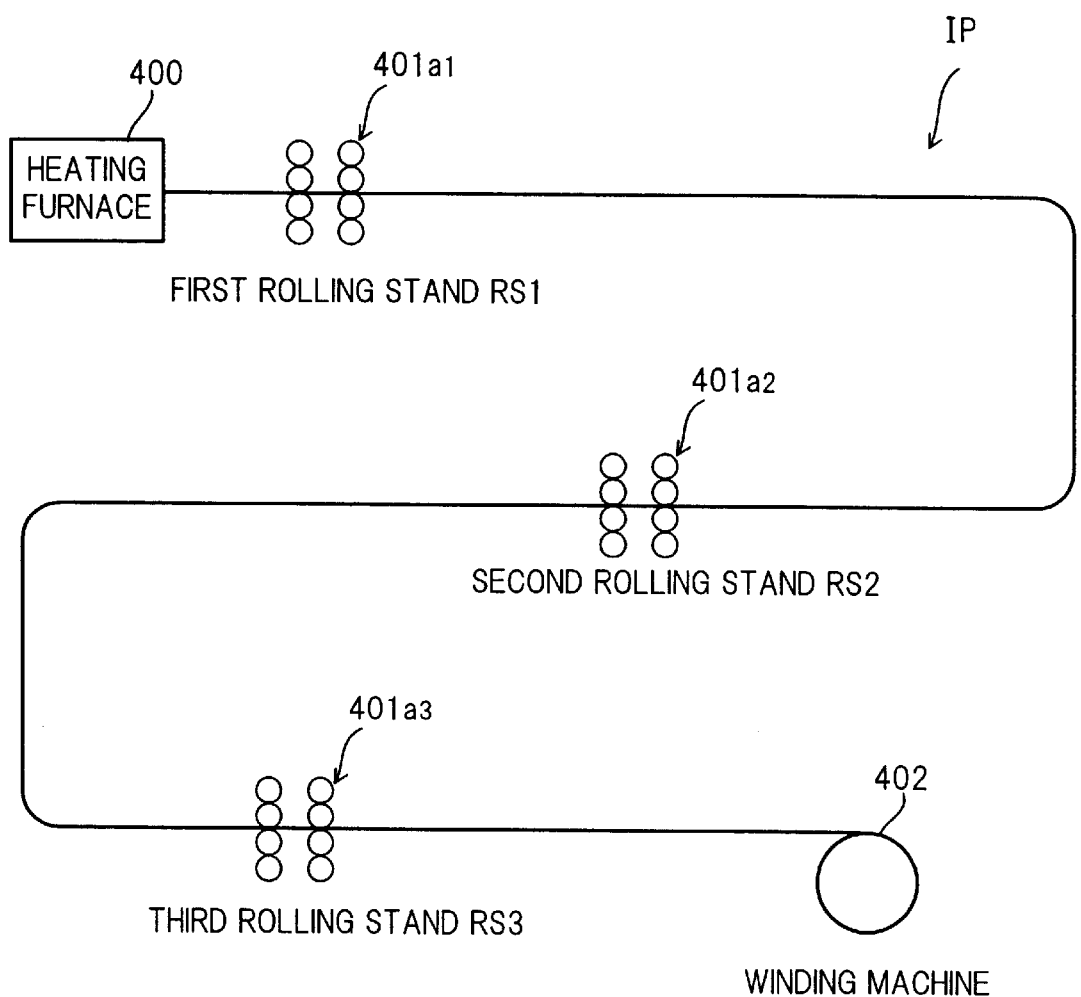
FIG. 58 is a diagram showing the schematic structure of a steel wire rolling plane which is an example of a general industrial plant to which the control system according to ninth to twenty-fourth embodiments of the present invention can be applied.

The general industrial system (the general industrial plant) is exemplified by a steel-wire rolling plant IP shown in FIG. 58. The steel-wire rolling plant shown in FIG. 58 is provided with three rolling mills (machines) 401a1 to 401a3 for successively rolling a steel member (a product) having a wire (a rail) shape heated and delivered from a heating furnace 400 in three steps. The product sequentially rolled by the rolling mills 401a1 to 401a3 is wound by a winding machine 402 disposed at the end step (position).

The steel-wire rolling plant IP is an elongated plant extending for a distance of about 1 km to several km from the heating furnace 400 or the rolling mill 401a1 at a first rolling stand RS1 to the coil winding machine 402 disposed at the end step of the plant through the second rolling mill 401a2 at a second rolling stand RS2 and a third rolling mill 401a3 at a third rolling stand RS3.

In the conventional steel-wire rolling plant IP, control apparatuses (the digital control apparatuses) for controlling the corresponding rolling mills 401a1 to 401a3 are disposed at the corresponding rolling stands RS1 to RS3, respectively. The foregoing control apparatuses are connected to each other through a very-high-speed and dedicated control network so that the control apparatuses control the rolling mills 401a1 to 401a3 in cooperation with each other.

The conventional steel-wire rolling plant IP encounters a delay of about several seconds taken for each rolling stands RS1 to RS3 to receive the product. Therefore, if data related to the rolling process can be transmitted from an own control apparatus to another control apparatus through the dedicated control network among the respective control apparatuses, the control apparatuses can be operated in cooperation with each other so as to perform a rolling process through the rolling mills 401a1 to 401a3 in cooperation with each other.

However, the conventional steel-wire rolling plant IP need adjust the timing among the rolling mills 401a1 to 401a3 to realize a time error of about 1 $\mu$s. In the conventional structure, data communicated among the control apparatuses and related to the rolling process is not added with time information having a high accuracy of substantially 1 $\mu$s. Therefore, it is difficult to accurately adjust the timing among the rolling mills 401a1 to 401a3.

Therefore, the electric power system protective control system according to each of the ninth to twenty-fourth embodiments is employed as the control system for the wire rolling plant such that the objects of the control are changed from the electric power systems to the rolling mills. That is, each digital protective control apparatus is employed as the control apparatus for each rolling mill. Thus, precise time having an accuracy of about several $\mu$s can be added to the data related to the rolling process and communicated among the control apparatuses by using the absolute time according to the ninth embodiment. As a result, the timing adjustment of the rolling mills 401a1 to 401a3 can accurately be performed with a small time error or about several $\mu$s. As a result, it is possible to improve the accuracy and reliability of the rolling process of the steel-wire rolling plant.

Figure 59:
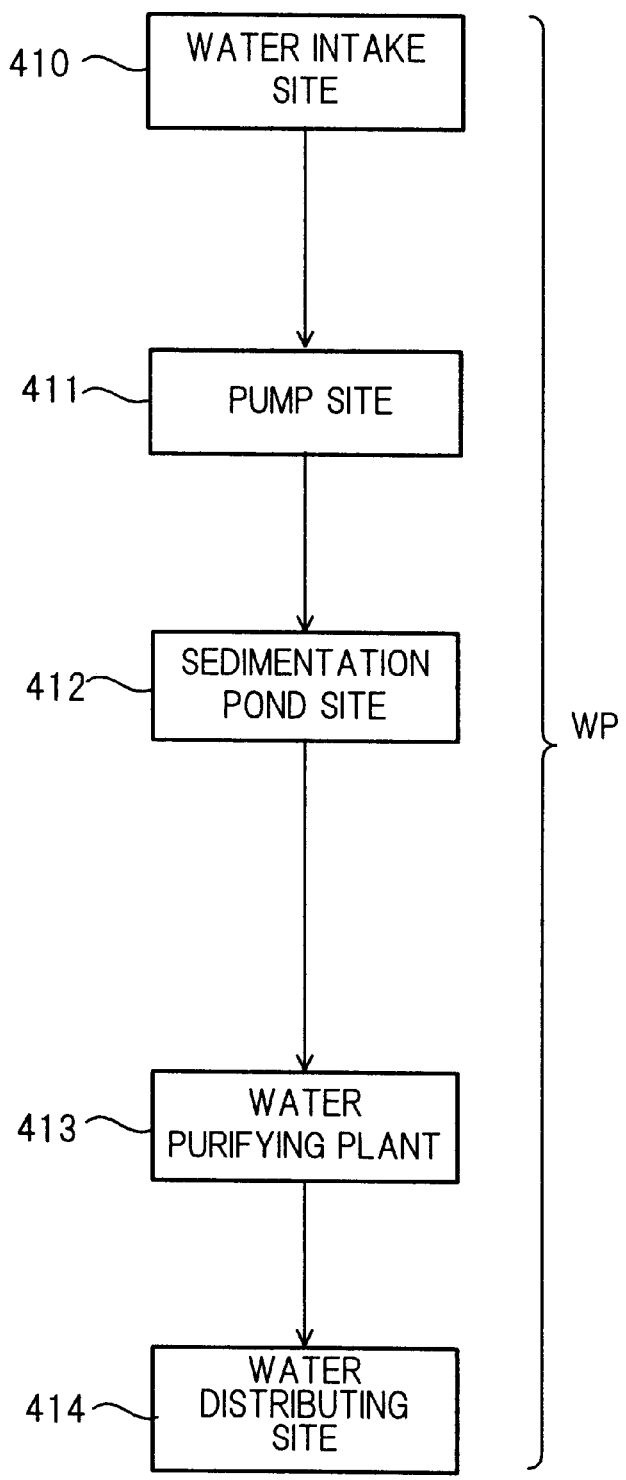
FIG. 59 is a diagram showing the schematic structure of a water supply/sewerage plant which is an example of a public plant to which the control system according to ninth to twenty-fourth embodiments of the present invention can be applied.

The public system (the public plant) is exemplified by a water supply/sewerage plant shown in FIG. 59. The water supply/sewerage plant WP shown in FIG. 59 is provided with a water intake site 410 for taking water which is delivered by a pump of a pump (site) 411 so as to be purified by a sedimentation pond site 412 and a water purifying plant (site) 413. Then, water is supplied to each user through a water distributing site 414.

In the above-mentioned water supply/sewerage plant WP, the distance among the plural processing sites (sites portions) from the water intake 410 to the water distributing site 414 through the pump site 411, the sedimentation pond 412 and the water purifying plant 413 is about several km to several tens of km, in some case, 100 km or longer.

In the conventional water supply/sewerage plant WP, control apparatuses (the digital control apparatuses) for controlling the corresponding sites are provided to the corresponding sites, respectively. The control apparatuses are connected to each other through a dedicated network so that the control apparatuses control the corresponding sites in cooperation with each other, respectively.

In the foregoing water supply/sewerage plant WP, each control apparatus need synchronously be operated with each other with an accuracy of one second at intervals of about 10 seconds. However, data communicated among the conventional control apparatuses are not added with information related to the synchronization having the above-mentioned accuracy of one second. Therefore, it is difficult to synchronize the operations of the control apparatuses with each other.

Therefore, the electric power system protective control system according to each of the ninth to twenty-fourth embodiments is employed as a system for controlling the water supply/sewerage plant such that the subject to be controlled is changed from the electric power system to the sites such as the water purifying plant. That is, the digital control apparatus is employed as the control apparatus for controlling each sites. Thus, precise time having an accuracy of about one second can be added to data communicated among the control apparatuses by using the absolute time according to, for example, the ninth embodiment. As a result, the processes of the sites 410 to 414 can be synchronized with each other at intervals of 10 seconds with an accuracy of about one second. Therefore, it is possible to improve the accuracy and the reliability of the water intake process, water purifying process and water distributing process of the water supply/sewerage plant.

As described above, the electric power system protective control system is simply required to be provided with the unit for acquiring absolute time or accurate precise time having an accuracy of about 1 $\mu$s. The control system for controlling the general industrial plant and the public plant is simply required to be provided with the unit for acquiring precise time having an accuracy required by the corresponding plant to be controlled.

While there has been described what is at present considered to be the preferred embodiment and modifications of the present invention. It will be understood that various modifications which are not described yet may be made therein, and it is intended to cover in the appended claims all such modifications as fall within the true spirit and scope of the invention.

What is claimed is:

1. A control system for controlling a plant according to a state quantity related to the plant and inputted therefrom, said system comprising:
    a communication network;
    an input device connected to the communication network so that data communication is permitted, said input device having:
        means for acquiring a precise time,
        inputting means for inputting the state quantity related to the plant therefrom,
        converting means for sampling the inputted state quantity according to the acquired precise time so as to convert the state quantity into digital data and
        first transmitting means for adding the precise time at each sampling timing to the digital data so as to transmit the digital data each having the precise time to the communication network;
    an opening/closing device connected to the communication network so that data communication is permitted and adapted to opening and closing a part of the plant,
    said opening/closing device having:
        means for receiving, through the communication network, a control command with respect to the opening/closing device and
        second transmitting means for transmitting an operating state of the opening/closing device to the communication network; and
    a control apparatus connected to the communication network so that data communication is permitted, said control apparatus having:
        means for performing a control operation process according to the digital data transmitted through the communication network and the operating state of the opening/closing device transmitted therethrough and
        third transmitting means for transmitting the control command through the communication network to the opening/closing device in response to a result of the control operation process of the performing means, wherein
            said precise time has an accuracy of substantially 1 $\mu$s to 100 ns.

2. An electric power system protective control system for controlling an electric power system according to a state quantity related to the electric power system and inputted therefrom, said protective control system comprising:
    a communication network;
    an input device connected to the communication network so that data communication is permitted, said input device having:
        means for acquiring a precise time,
        inputting means for inputting the state quantity related to the electric power system therefrom,
        converting means for sampling the inputted state quantity according to the acquired precise time so as to convert the state quantity into digital data and
        first transmitting means for adding the precise time at each sampling timing to the digital data so as to transmit the digital data each having the precise time to the communication network;
    an opening/closing device connected to the communication network so that data communication is permitted and adapted to opening and closing a part of the electric power system,
    said opening/closing device having:
        means for receiving, through the communication network, a control command with respect to the opening/closing device and
        second transmitting means for transmitting an operating state of the opening/closing device to the communication network; and
    a protective control apparatus connected to the communication network so that data communication is permitted, said control apparatus having:
        means for performing a protective control operation process according to the digital data transmitted through the communication network and the operating state of the opening/closing device transmitted therethrough and
        third transmitting means for transmitting the control command through the communication network to the opening/closing device in response to a result of the protective control operation process of the performing means, wherein
            said precise time has an accuracy of substantially 1 $\mu$s to 100 ns.

3. An electric power system protective control system according to claim 2, wherein said input device is provided with means for self-diagnosing an operating state thereof so as to transmit a result of the self-diagnosis to the communication network, and said opening/closing device is provided with means for receiving the result of the self-diagnosis through the communication network so as to control an opening/closing operation of the opening/closing device according to the received result of the self-diagnosis.

4. An electric power system protective control system according to claim 2, wherein said input device is composed of a plurality of input devices,
  said converting means of each of the input devices is adapted to sample the state quantity at predetermined periods in accordance with the precise time acquired by the acquiring means while synchronizing the state quantities of the respective input devices with each other, and to convert the sampled state quantities into digital data,
  said first transmitting means of each of the input devices is adapted to add the precise time at each sampling timing to each converted digital data and to transmit the digital data each having the precise time to the communication network, and
  wherein said control process performing means has means for receiving the digital data each having the precise time of each of the input devices and the operating state of the opening/closing device through the communication network, means for time-sequentially arranging the received digital data in accordance with the precise time of each received digital data for each of the input devices and means for performing the protective control operation process in accordance with the time-sequentially arranged digital data by the arranging means.

5. An electric power system protective control system according to claim 4, wherein said acquiring means, said converting means and said first transmitting means are constituted by a computer circuit having hardware elements including a CPU and a memory unit, said computer circuit being provided with means for self-diagnosing an operating state of the computer circuit and means for transmitting a result of the self-diagnosis performed by the self-diagnosing means to the communication network,
  and wherein said opening/closing device is provided with means for receiving the result of the self-diagnosis transmitted through the communication network and means for locking control of the operation of the opening/closing device in response to the result of the self-diagnosis received by the result receiving means.

6. An electric power system protective control system according to claim 2, wherein said input device and said opening/closing device are provided for plurality of electric stations, respectively, said electric stations being distributed, said acquiring means, said converting means and said first transmitting means are provided for the respective input devices of the respective electric stations, said control command receiving means and said second transmitting means are provided for the respective opening/closing devices of the respective electric stations, said control operation performing means and said third transmitting means are provided for at least one of the dispersively disposed electric stations, said communication network is composed of a first communication network in a local area constituted in each of the electric stations and a second communication network for widely connecting the dispersively disposed electric stations to each other,
  said converting means of each of the input devices in the electric station is adapted to sample the state quantity of its own input device at predetermined periods in accordance with the precise time acquired by the acquiring means while synchronizing the state quantities of the respective input devices with each other, and to convert the sampled state quantities into digital data,
  said first transmitting means of each of the input devices is adapted to add the precise time at each sampling time to each converted digital data and to transmit the digital data each having the precise time through the first communication network to the second communication network, and
  wherein said control operation performing means of the at least one of the electric stations has means for receiving the digital data each having the precise time of each of the input devices and the operating state of the opening/closing device transmitted through the first and second communication networks, means for time-sequentially arranging the received digital data in accordance with the precise time of each received digital data for each of the input devices and means for performing the protective control operation process in accordance with the time-sequentially arranged digital data by the arranging means.

7. An electric power system protective control system for performing an operation process in accordance with a state quantity inputted from an electric power system so as to protectively control the electric power system, said protective control system comprising:
  a communication network;
  a digital protective control apparatus connected to the communication network so that data communication is permitted, said digital protective control apparatus comprising:
    means for acquiring a precise time, converting means for sampling the state quantity inputted from the electric power system according to the acquired precise time so as to convert the state quantity into digital data and
    transmitting means for adding the precise time to the converted digital data at each sampling timing so as to transmit the digital data each having the precise time to the communication network;
    means for receiving the digital data transmitted through the communication network, each of said digital data having the precise time and
    means for time-sequentially arranging the received digital data each having the precise time in accordance with the precise time of each of the received digital data, wherein
      said precise time has an accuracy of substantially 1 $\mu$s to 100 ns.

8. An electric power system protective control system according to claim 7, wherein said electric power system has a plurality of equipment devices, said digital protective control apparatus is composed of a plurality of digital protective control apparatuses which are provided in correspondence with the equipment devices, respectively,
  each of said converting means of each of the digital protective control apparatuses is adapted to sample the state quantity of the corresponding equipment device at predetermined periods in accordance with the precise time acquired by the acquiring means while synchronizing the state quantities of the respective digital protective control apparatuses with each other, and to convert the sampled state quantities into digital data,
  each of said transmitting means of each of the digital protective control apparatuses is adapted to add the precise time at each sampling timing to each converted digital data and to transmit the digital data each having the precise time to the communication network,
  said receiving means is adapted to receive the digital data each having the precise time of each of the digital protective control apparatuses transmitted through the communication network and wherein said arranging means is adapted to time-sequentially arrange the received digital data in accordance with the precise time of each received digital data for each of the digital protective control apparatuses.

9. An electric power system protective control system according to claim 8, further comprising display means for displaying a digital data group time-sequentially arranged by the arranging means.

10. An electric power system protective control system according to claim 8, further comprising means for generating a state quantity of a test for a digital protective control apparatus to be tested in accordance with the digital data group time-sequentially arranged by the arranging means.

11. An electric power system protective control system comprising:
- a plurality of digital protective control apparatuses for protectively controlling an electric power system;
- a communication network for connecting the digital protective control apparatuses to each other so that data communication is permitted, each of said digital protective control apparatuses having:
  - means for acquiring a precise time,
  - converting means for sampling a state quantity related to a first equipment device of the electric power system at predetermined periods in accordance with the precise time acquired by the acquiring means so as to convert the sampled state quantities into digital data, said first equipment device being an object for protectively control of the corresponding digital protective control apparatus,
  - first judgement means for judging whether or not the first equipment device is faulty based on the converted digital data so as to perform a protective control operation process according to a result of the judgement of the first judgement means,
  - second judgement means for judging whether or not the first equipment device and a second equipment device of the electric power system are faulty based on the converted digital data, said second equipment device being not object for protective control of the corresponding digital protective control apparatus;
  - recording means for, when the judgement of the second judgement means is made that at least one of the first and second equipment devices is fault, adding the precise time to the converted digital data at each sampling timing so as to record the digital data each having the sampled precise time, and
  - means for transmitting the digital data recorded by the record means to the communication network, said transmitted digital data having the sampled precise time;
  - receiving means connected to the communication network for receiving the digital data transmitted through the communication network from each of the digital protective control apparatuses, each of said received digital data having the precise time; and
  - arranging means for time-sequentially arranging the received digital data according to the sampled precise time thereof for each of the digital protective control apparatuses, wherein
    said precise time has an accuracy of substantially 1 $\mu$s to 100 ns.

12. An electric power system protective control system according to claim 11, further comprising display means for displaying a digital data group time-sequentially arranged by the arranging means.

13. An electric power system protective control system according to claim 11, further comprising means for generating a state quantity of a test for a digital protective control apparatus to be tested in accordance with the digital data group time-sequentially arranged by the arranging means.

14. An electric power system protective control system comprising:
- a plurality of digital protective control apparatuses for protectively controlling an electric power system; and
- a communication network for connecting the digital protective control apparatuses to each other so that data communication is permitted, each of said digital protective control apparatuses having:
  - means for acquiring a precise time;
  - converting means for sampling a state quantity related to an equipment device of the electric power system at predetermined periods in accordance with the precise time acquired by the acquiring means so as to convert the sampled state quantities into first digital data, said equipment device being an object for protective control of the corresponding digital protective control apparatus;
  - transmitting means for adding the precise time at each sampling timing to each first converted digital data so as to transmit the first digital data each having the precise time to the communication network;
  - means for receiving second digital data having the precise time transmitted from the transmitting means of at least one of other digital protective control apparatuses through the communication network;
  - arranging means for time-sequentially arranging the received second digital data in accordance with the precise time of each second received digital data; and
  - means for performing a protective control operation process by using one of the first digital data converted by the converting means and the second digital data time-sequentially arranged by the arranging means, wherein
    said precise time has an accuracy of substantially 1 $\mu$s to 100 ns.

15. A control system comprising:
- a plurality of control apparatuses adapted to perform an operation process according to a state quantity related to a plant so as to control the plant, said control apparatuses being dispersively arranged; and
- a communication network by which the control apparatuses are connected to each other so that data communication is permitted, each of said control apparatuses comprising:
  - means for acquiring signals at substantially constant periods;
  - means for sequentially sampling a state quantity related to the plant at a same timing as a timing of other control apparatuses in accordance with the periodic signals acquired by the acquiring means so as to collect digital data; and
  - means for adding time at each sampling timing based on the periodic signals to the collected digital data so as to sequentially store the digital data each having the time, wherein
    said periodic signals have an accuracy of substantially 1 $\mu$s to 100 ns.

16. An electric power system protective control system comprising:
- a plurality of protective control apparatuses adapted to perform a protective control operation process according to a state quantity related to an electric control system for protectively controlling the electric power system, respectively, said control apparatuses being distributed; and a communication network by which the protective control apparatuses are connected to each other so that data communication is permitted, each of said protective control apparatuses comprising:

means for acquiring signals at substantially constant periods;

collecting means for sequentially sampling the state quantity related to the electric power system at a same timing as a timing of another protective control apparatus in accordance with the periodic signals acquired by the acquiring means so as to collect digital data; and storage means for adding time at each sampling timing based on the periodic signals to the collected digital data so as to sequentially store the digital data each having the time, wherein said periodic signals have an accuracy of substantially 1 µs to 100 ns.

17. An electric power system protective control system according to claim 16, wherein said acquiring means is composed of means for acquiring precise time and the time at each sampling timing is precise time at each sampling timing.

18. An electric power system protective control system according to claim 17, further comprising a monitor/control unit connected to the communication network and adapted to remotely monitor and control an operation state of the protective control apparatuses, wherein each of said protective control apparatuses is provided with means for performing a protective control operation process based on the digital data so as to determine whether or not abnormal data is detected and means for, when the abnormal data is detected as a result of the protective control operation process, transmitting an abnormal data generation information including detection time to the display/operation unit, said abnormal-data being detected at the detection time, and wherein said monitor/control unit is provided with means for transmitting, when the abnormal data generation information including the detection time is transmitted from a predetermined protective control apparatus in the protective control apparatuses, a first program module for collecting digital data before and after the detection time to the protective control apparatuses through the communication network along a predetermined route, said first program module previously being provided in the monitor/control unit;

each of said protective control apparatuses being provided with means for receiving the first program module transmitted through the communication network so as to execute the first program module and means for transmitting the digital data having the precise time before and after the detection time to the monitor/control unit in accordance with the first executed program module, said monitor/control unit being provided with means for locating a fault point related to the abnormal data according to the digital data, said digital data having the precise time before and after the detection time and being transmitted from each of the protective control apparatuses.

19. An electric power system protective control system according to claim 17, wherein each of said protective control apparatuses is provided with:

means for reading out predetermined precise time of precise time stored in the storing means of its own protective control apparatus together with the digital data in accordance with a second program module for measuring a power-transmission line constant, said second program module previously being provided in the monitor/control unit and being transmitted through the communication network therefrom, means for measuring the power-line transmission constant by using the digital data of the own protective control apparatus and digital data of at least one of other another protective control apparatuses, said digital data of the own-protective control apparatus being added to the predetermined precise time, means for storing the measured power-transmission line constant and means for calculating a ranging impedance related to an object for the protective control of the own protective control apparatus on the basis of the measured power-transmission line constant.

20. An electric power system protective control apparatus according to claim 18, wherein said storage means is adapted to store the digital data having the precise time in a period of time from the transmission of the abnormal-data generation information to the monitor/control unit till the transmission of the digital data having the precise time before and after the detection time to the monitor/control unit.

21. An electric power system protective control system according to claim 17, further comprising a monitor/control unit connected to the communication network and adapted to remotely monitor and control an operation state of the protective control apparatuses, wherein each of said protective control apparatuses is provided with means for calculating power-flow information related to the electric power system in accordance with the digital data having the precise time and stored in the storage means, said power-flow information including electric power, ineffective electric power and electric currents, said power-flow information calculating means adding time at which the digital data are collected to the calculated power-flow information so as to transmit the power-flow information to the monitor/control unit through the communication network, said power-flow information being produced on the collected digital data, and wherein said monitor/control unit is provided with means for determining a stable state of the electric power system according to the power-flow information transmitted from each of the protective control apparatuses through the communication network.

22. An electric power system protective control system according to claim 18, wherein said storage means, said control operation process performing means, said abnormal data information transmitting means, said first program module executing means and said digital data transmitting means are constituted by a computer circuit having hardware elements including a first CPU, a second CPU, a memory unit commonly provided for the first and second CPU and a communication interface commonly provided for the first and second CPU, said first CPU is adapted to use the common memory unit so as to perform the process related to the storage means and the process related to the protective control operation process performing means, respectively, and wherein said second CPU is adapted to use the common memory unit and the common communication interface so as to perform the process related to the abnormal data information transmitting means, the process related to the program module executing means and the process related to the digital data transmitting means, respectively.

23. An electric power system protective control system according to claim 18, wherein said storage means, said control operation process performing means, said abnormal data information transmitting means, said first program module executing means and said digital data transmitting means are constituted by a computer circuit having hardware elements including a first CPU, a second CPU, a third CPU, a memory unit commonly provided for the first, second and third CPU and a communication interface commonly provided for the first, second and third CPU, said first CPU is adapted to use the common memory unit so as to perform the process related to the storage means and the process related to the protective control operation process performing means, respectively, said second CPU is adapted to use the common memory unit and the common communication interface so as to perform the process related to the abnormal data information transmitting means, a receiving process for receiving the program module related to the program module executing means and the process related to the digital data transmitting means, respectively, and wherein said third CPU is adapted to use the common memory unit so as to perform an executing process for executing the program module received by the receiving process of the second CPU.

24. An electric power system protective control system according to claim 17, wherein each of said protective control apparatus is provided with means for receiving through the communication network the precise time acquired by the acquiring means of at least one of other protective control apparatuses, and means for confirming whether or not the acquired precise time of its own protective control apparatus is accurate according to the received precise time related to at least one of other protective control apparatuses.

25. An electric power system protective control system according to claim 16, wherein at least one of said protective control apparatuses is connected to at least one of other protective control apparatuses through a communication line which is different from the communication network, said acquiring means of at least one of other protective control apparatuses is composed of means for acquiring precise time, said at least one of other protective control means having means for superimposing a periodic signal indicating each timing of each acquired precise time on time data indicating time of each timing thereof so as to transmit a superimposition signal to the at least one of the protective control apparatus through the communication line, said super imposition signal being generated by the superimposition of the superimposing means and wherein said acquiring means of the at least one of the protective control apparatuses is composed of means for separating the superimposition signal transmitted from at least one of other protective control apparatuses through the communication line into the periodic signal and the time data so as to gain the precise time.

26. An electric power system protective control system according to claim 17, wherein said acquiring means of each of the protective control apparatuses is provided with a first precise time acquiring unit for receiving GPS signals transmitted from a plurality of satellites so as to acquire first precise time in response to the received GPS signals, a second precise time acquiring unit for receiving a ground wave so as to acquire second precise time in response to the received ground wave and means for measuring a phase difference between the first precise time and the second precise time so as to correct the second precise time in accordance with the measured phase difference, and said collecting means of each of the protective control apparatuses is adapted to sequentially sample the state quantities in accordance with the first precise time so as to collect the digital data, said first precise time being acquired by the first precise time acquiring unit, and when the first precise time is not acquired by the first precise time acquiring unit, said collecting means collecting the digital data by sequentially sampling the state quantities in accordance with the second precise time corrected by the correction means.

27. An electric power system protective control system according to claim 17, wherein each of said protective control apparatus is provided with means for acquiring time to be substituted for the precise time and means for correcting the substitutional time in accordance with the precise time acquired by the precise time acquiring means, and wherein said collecting means is adapted to be sequentially sample the state quantities in accordance with the time corrected by the correcting means so as to collect the digital data when the precise time acquiring means does not acquire the precise time.

28. An electric power system protective control system according to claim 19, wherein each of said protective control apparatuses is provided with means for receiving first digital data collected by the collecting means of at least one of other protective control apparatuses through the communication network when the state of the digital data collected by the collecting means of its own protective control apparatus is changed as a result of execution of a protective control operation process by the performing means of at least one of other protective control apparatuses, means for calculating a state change of the electric quantity data of its own protective control apparatus based on the power-transmission line constant and the received digital data of at least one of other protective control apparatuses, said power-transmission line constant being stored in the power-transmission line constant storage means, and means for determining whether or not the state change of the digital data collected by the collecting means satisfies a range of a state change of the digital data so as to determine whether or not the object for the protective control of the own protective control apparatus is faulty, said digital data of the state change being calculated in accordance with the digital data of at least one of other protective control apparatuses and the power-transmission line constant.

29. An electric power system protective control system according to claim 18, wherein each of said protective control apparatuses is provided with means for changing a set value related to the protective control operation of the own protective control apparatus in accordance with a change demand transmitted from at least one of other protective control apparatuses and the monitor/control unit.

30. An electric power system protective control system according to claim 18, wherein at least one of said protective control apparatuses is provided with means for collecting, through the communication network, the digital data representing a state quantity of the electric power system at which an accident occurs, said state quantity of the electric power system at the occurrence of the accident being collected by other protective control apparatuses which detect an abnormality related to the accident, respectively, and said collected quantity data of a part of other protective control apparatuses having the absolute time at the detection of the abnormality, respectively, means for obtaining a delay state of the abnormal detection time between the part of other protective control apparatuses in accordance with the collected digital data having the absolute time at the detection of abnormality and means for estimating a distance from an accident point and a cause of the abnormality in accordance with the obtained delay state between the part of other protective control apparatuses.

31. An electric power system protective control system according to claim 16, wherein said electric power system and each of said protective control apparatuses are connected to each other through a second communication network which is different from the communication network, said state quantity related to the electric power system being supplied to each of the protective control apparatuses through the second communication network.

32. A computer-readable storage medium storing a program code for use in a protectively control of a plant, in which the plant has an input device for inputting a state quantity related to the plant therefrom and an opening/closing device for opening and closing a part of the plant, said program code comprising:
   a first step of causing a computer to acquire a precise time;
   a second step of causing said computer to sample the state quantity inputted from the input device according to the acquired precise time so as to convert the state quantity into digital data;
   a third step of causing said computer to add the precise time at each sampling timing to the digital data so as to transmit the digital data to a communication network, said digital data each having the sampled precise time;
   a fourth step of causing said computer to perform a control operation according to the digital data transmitted through the communication network;
   a fifth step of causing said computer to transmit a control command with respect to the opening/closing device through the communication network in response to a result of the control operation of the fourth step;
   a sixth step of causing said computer to receive, through the communication network, the control command with respect to the opening/closing device; and
   a seventh step of causing said computer to control an operation of the opening/closing device according to the received control command, wherein
      said precise time has an accuracy of substantially 1 $\mu$s to 100 ns.

33. A computer-readable storage medium according to claim 32, wherein said storage medium is composed of first, second and third memories, and wherein said first, second and third steps of the program code are stored in the first memory, said forth and fifth steps of the program code are stored in the second memory and said sixth step of the program code is stored in the third memory.

34. A computer-readable storage medium storing a program code for use in a control of a plant, in which the plant has an input device for inputting a state quantity related to the plant therefrom and an opening/closing device for opening and closing a part of the plant, and the program code is used for generating digital data having a precise time according to the state quantity, performing a control operation according to the digital data and controlling an operation of the opening/closing device in accordance with a result of the performed control operation, said program code comprising:
   a step of causing a computer to acquire the precise time;
   a step of causing said computer to sample the state quantity inputted from the input device according to the acquired precise time so as to convert the state quantity into digital data; and
   a step of causing said computer to add the precise time at each sampling timing to the digital data so as to transmit the digital data to a communication network, said digital data each having the sampled precise time, wherein
      said precise time has an accuracy of substantially 1 $\mu$s to 100 ns.

35. A computer-readable storage medium storing a program code for use in a control of a plant, in which the plant has an input device for inputting a state quantity related to the plant therefrom and an opening/closing device for opening and closing a part of the plant, and the program code is used for generating digital data having a precise time according to the state quantity, performing a control operation according to the digital data and controlling an operation of the opening/closing device in accordance with a result of the performed control operation, said program code comprising:
   a step of causing a computer to perform a control operation according to the digital data transmitted through a communication network; and
   a step of causing said computer to transmit a control command through the communication network in response to a result of the control operation of the performing step, wherein
      said precise time has an accuracy of substantially 1 $\mu$s to 100 ns.

36. A computer-readable storage medium storing a program code for use in a control of a plant, in which the plant has an input device for inputting a state quantity related to the plant therefrom and an opening/closing device for opening and closing a part of the plant, and the program code is used for generating digital data having a precise time according to the state quantity, performing a control operation according to the digital data and controlling an operation of the opening/closing device in accordance with a result of the performed control operation, said program code comprising:
   a step of causing a computer to receive, through a communication network, a control command with respect to the opening/closing device; and
   a step of causing said computer to control an operation of the opening/closing device according to the received control command, wherein
      said precise time has an accuracy of substantially 1 $\mu$s to 100 ns.

37. A computer-readable storage medium storing a program code for use in a protectively control of an electric power system, in which the electric power system has an input device for inputting a state quantity related to the electric power system therefrom and an opening/closing device for opening and closing a part of the electric power system, said program code comprising:
   a step of causing a computer to acquire a precise time;
   a step of causing said computer to sample the state quantity inputted from the electric power system according to the acquired precise time so as to convert the state quantity into digital data;
   a step of causing said computer to add the precise time at each sampling timing to the digital data so as to transmit the digital data to a communication network, said digital data each having the sampled precise time;

a step of causing said computer to receive the digital data transmitted through the communication network, said digital data each having the sampled precise time; and a step of causing said computer to time-sequentially arrange the received digital data each having the sampled precise time in accordance with the precise time of each of the received digital data, wherein
said precise time has an accuracy of substantially 1 µs to 100 ns.

38. A computer-readable storage medium storing a program code for use in a protective control of an electric power system by a plurality of computers including protective control computers, in which the plurality of computers are connected to each other through a communication network so that data communication is permitted, and the protective control computers are disposed in correspondence with equipment devices of the electric power system, respectively, said program code comprising:

a step of causing each of the protective control computers to acquire a precise time;

a step of causing each of the protective control computers to sample a state quantity related to an equipment device of the electric power system according to the acquired precise time so as to convert the state quantity into digital data, said equipment device being an object of protective control of each of the protective control computers;

a first judgement step of causing each of the protective control computers to judge whether or not the objective equipment device is faulty based on the converted digital data so as to perform a protective control operation according to a result of the judgement of the first judgement step;

a second judgement step of causing each of the protective control computers to judge whether or not the objective equipment device and other at least one of the equipment devices are faulty based on the converted digital data, said other at least one of the equipment devices being not an object of each of the protective control computers;

a step of causing each of the protective control computers to, when the judgement of the second judgement means is made that at least one of the objective equipment device and other one of the equipment devices is fault, add the precise time to the converted digital data at each sampling timing so as to record the digital data each having the sampled precise time;

a step of causing each of the protective control computers to transmit the digital data recorded by the record step to the communication network, said transmitted digital data having the sampled precise time;

a step of causing at least one of the computers to receive the digital data transmitted through the communication network from each of the protective control computers, said received digital data having the sampled precise time; and a step of causing at least one of the computers to time-sequentially arrange the received digital data according to the sampled precise time thereof each of the protective control computers, wherein
said precise time has an accuracy of substantially 1 µs to 100 ns.

39. A computer-readable storage medium storing a plurality of program codes for use in a protective control of an electric power system, in which said plurality of program codes correspond to a plurality of computers, respectively, the plurality of computers are connected to each other through a communication network so that data communication is permitted, and the electric power system has a plurality of equipment devices which are objects of protective control of the protective control computers, respectively, said each of the program codes comprising:

a step of causing a corresponding computer to acquire a precise time;

a step of causing said corresponding computer to sample a state quantity related to the corresponding equipment device at predetermined periods in accordance with the acquired precise time so as to convert the sampled state quantity into first digital data;

a transmitting step of causing said corresponding computer to add the precise time to each first converted digital data at each sampling timing so as to transmit the first digital data each having the sampled precise time to the communication network;

a step of causing said corresponding computer to receive second digital data having the sampled precise time transmitted from another at least one of the computers through the communication network;

a step of causing said corresponding computer to time-sequentially arrange the received second digital data in accordance with the sampled precise time of each second received digital data; and a step of causing said corresponding computer to perform a protective control operation by using one of the first digital data converted by the converting step and the second digital data time-sequentially arranged by the arranging step, wherein
said precise time has an accuracy of substantially 1 µs to 100 ns.

40. A computer-readable storage medium storing a plurality of program codes for protective controlling an electric power system by a protective control system according to a state quantity inputted from the electric power system, in which the protective control system has a plurality of computers and a circuit for acquiring a precise time, the plurality of program codes correspond to the plurality of computers, respectively, and the plurality of computers are connected to each other through a communication network so that data communication is permitted, said each of the program codes comprising:

a step of causing a corresponding computer to sequentially sample the state quantity inputted from the electric power system at a same timing as a timing of other computers in accordance with the precise time so as to collect digital data; and a step of causing said corresponding computer to add the precise time at each sampling timing to the collected digital data so as to sequentially store the digital data each having the sampled precise time, wherein
said precise time has an accuracy of substantially 1 µs to 100 ns.

41. A method of protectively controlling a plant, in which the plant has an input device for inputting a state quantity related to the plant therefrom and an opening/closing device for opening and closing a part of the plant, said method comprising the steps of:

acquiring a precise time;

sampling the state quantity inputted from the input device according to the acquired precise time so as to convert the state quantity into digital data;

adding the precise time at each sampling timing to the digital data so as to transmit the digital data to a communication network, said digital data each having the sampled precise time;

performing a control operation according to the digital data transmitted through the communication network;

transmitting a control command with respect to the opening/closing device through the communication network in response to a result of the control operation of the performing step;

receiving, through the communication network, the control command with respect to the opening/closing device; and controlling an operation of the opening/closing device according to the received control command, wherein said precise time has an accuracy of substantially 1 µs to 100 ns.

42. A method of protectively controlling an electric power system having a plurality of equipment devices, the method comprising the steps of:

acquiring a precise time;

sampling state quantities inputted from the respective equipment devices at a same timing in accordance with the precise time so as to collect digital data; and adding the precise time at each sampling timing to the collected digital data of the respective equipment devices so as to sequentially store the digital data each having the sampled precise time, wherein said precise time has an accuracy of substantially 1 µs to 100 ns.

43. A control system which receives and processes an analog state quantity of a plant, said control system comprising:

a plurality of state quantity input/output units, which do not comprise a control operation function, each state quantity input/output unit of said plurality of state quantity input/output units comprising:

precise time acquiring means for acquiring a precise time by GPS, converting means for converting the state quantity of the plant which must be controlled into digital data by sampling the state quantity in accordance with the acquired precise time, and transmitting means for adding said precise time by GPS of sampling to obtained digital data to generate digital data having the precise time so as to transmit data having the precise time to a communication network;

an opening/closing device comprising:

control-command receiving means for receiving, through said communication network, a control command for opening/closing the connections among units provided for the plant which must be controlled, and operation-state communicating means for communicating a state of operation of said opening/closing device to said communication network; and a protective operation unit comprising:

calculating means for performing operations for carrying out control in accordance with digital data having the precise time and the state of the operation of said opening/closing device, and a control-command issuing means for issuing, through said communication network, a control command to said opening/closing device in accordance with results of control operations performed by said calculating means, wherein a hardware configuration and a software configuration are commonly provided for said respective state quantity input/output units.

44. The control system according to claim 43, wherein said plant is one of an industrial plant, a public plant, and a power generation plant and said state quantity of said plant controls said plant.

45. An electric power system protective control system which receives a state quantity of an electric power system to protectively control the electric power system, said electric power system protective control system comprising:

a plurality of state quantity input/output units, which do not comprise a protective control operation function, each state quantity input/output unit of said plurality of state quantity input/output units comprising:

precise time acquiring means for acquiring a precise time by GPS, converting means for converting the analog state quantity of the electric power system into digital data by sampling the state quantity in accordance with the acquired precise time, and transmitting means for adding a precise time of sampling to obtained digital data to generate digital data having the precise time so as to transmit digital data having the precise time to a communication network;

an opening/closing device comprising:

control-command receiving means for receiving, through said communication network, a command for controlling opening/closing of the connections among systems provided for the electric power system, and operation-state communicating means for communicating a state of operation of said opening/closing device to said communication network; and a protective operation unit comprising:

protective operation means for performing protective control operations in accordance with digital data having the precise time and the state of the operation of said opening/closing device, and control-command issuing means for issuing, through said communication network, a control command to said opening/closing device in accordance with results of protective control operations performed by said protective operation means, wherein a hardware configuration and a software configuration are commonly provided for said respective state quantity input/output units.

46. An electric power system protective control system according to claim 45, wherein said state quantity input/output unit comprises:

self diagnosing means for diagnosing a state of the operation thereof, and self diagnosis result transmitting means for communicating a result of self-diagnosis to said communication network, and said opening/closing device comprises:

self-diagnosis result receiving means for receiving the result of the self-diagnosis through said communication network, and opening/closing control means for controlling an opening/closing operation of said opening/closing device in accordance with an operation control command received by said control-command receiving means of said opening/closing device, and as a result of self-diagnosis received by said self-diagnosis result receiving means, it does not transmit an operation control command to a blocking operation unit of said opening/closing device so as to lock an operation control of opening/closing when it is determined that a hardware configuration of said state quantity input/output unit is faulty.

47. An electric power system protective control system according to claim 45, wherein said converting means provided for each of the plurality of state quantity input/output units performs sampling at predetermined periods while said converting means are being synchronized with one another in accordance with the precise time acquired by said precise time acquiring means to convert each of state quantities into digital data, said transmitting means provided for each of said plurality of state quantity input/output units adds precise time of sampling to a plurality of digital data converted by said converting means to transmit the plurality of digital data each having the precise time to said communication network, and said protective operation means comprises:
receiving means for receiving the plurality of digital data each having the precise time and the state of the operation transmitted through said communication network,
arranging means for time-sequentially arranging the received plurality of digital data each having the precise time for each of said state quantity input/output units in accordance with added precise time, and
protective-control calculating means for performing protective-control operation processes in accordance with digital data which has time-sequentially been arranged by said arranging means.

48. An electric power system protective control system according to claim 47, wherein
said precise time acquiring means, said converting means and transmitting means are constituted by a computer circuit having hardware elements including a CPU and memory units,
wherein said computer circuit including said CPU comprises:
self-diagnosing means for self-diagnosing a state of operation of said computer circuit including said hardware elements such as said memory units, and
communicating means for communicating a result of diagnosis performed by said diagnosing means to said communication network,
wherein said electric power system protective control system further comprises:
self diagnosis result receiving means for receiving a result of self-diagnosis performed by said diagnosing means and communicated through said communication network, and
locking means for locking control of the operation of said opening/closing device in accordance with the result of the self-diagnosis received by said self diagnosis result receiving means, and
wherein said opening/closing devices further comprises:
said self diagnosis result receiving means, and said locking means.

49. An electric power system protective control system according to claim 45, wherein
said state quantity input/output unit and said opening/closing device are provided for each electric site of a plurality of electric sites dispersedly disposed in a plurality of units,
said precise time acquiring means, said converting means and said transmitting means are provided for each of said state quantity input/output unit of said electric site of said plurality of electric sites,
said operation-state communicating means and said control-command receiving means are provided for each of said opening/closing device of said electric site of said plurality of electric sites,
said protective operation means and said control-command issuing means are provided for at least one of said electric site of said plurality of electric sites which are dispersedly disposed,
said communication network comprises a first communication network in a local area constituted in each electric site, and a second communication network for widely connecting said plurality of electric sites disposed dispersedly to one another,
said converting means provided for each of said plurality of state quantity input/output units in said plurality of electric sites samples the state quantities of a corresponding state quantity input/output unit at predetermined periods while the quantities of the states are being synchronized with one another in accordance with the precise time acquired by said precise time acquiring means to convert each of the sampled state quantities into digital data, said transmitting means provided for each of said plurality of state quantity input/output units in said plurality of electric sites adds the precise time of sampling to a plurality of digital data converted by said converting means to transmit a plurality of digital data each having the precise time to said second communication network through said first communication network, and
said protective operation means disposed in said electric site comprises:
receiving means for receiving the plurality of digital data each having the precise time and the state of the operation transmitted through said first communication network and said second communication network,
arranging means for time-sequentially arranging the plurality of the received digital data each having the precise time in accordance with the added precise time, and
protective control means for performing protective control operation processes in accordance with the digital data which have time-sequentially been arranged by said arranging means.

50. An electric power system protective control system for performing operations in accordance with a state quantity input from an electric power system to protectively control said electric power system, said electric power system protective control system comprising:
a plurality of digital protective control apparatuses, which are provided in correspondence to units of an electric power system, each digital protective control apparatus of said plurality of digital protective control apparatuses comprising:
precise time acquiring means for acquiring a precise time by GPS,
converting means for sampling an analog state quantity of said electric power system at predetermined periods in accordance with the precise time acquired by said precise time acquiring means to convert the sampled analog state quantity into digital data, and
digital-data transmitting means for adding precise time by GPS of sampling to digital data converted by said converting means to transmit digital data having the precise time to a communication network;

receiving means for receiving digital data having the precise time and sequentially transmitted through said communication network;

arranging means for time-sequentially arranging received digital data having the precise time in accordance with the added precise time; and an electric-site-side system simulation apparatus comprising generating means for generating a quantity of a test state of analog data for a digital protective control apparatus which must be tested in accordance with the digital data time-sequentially arranged by said arranging means.

51. An electric power system protective control system according to claim 50, wherein each of said converting means of each of said plurality of digital protective control apparatuses samples the state quantities of the corresponding equipment devices at predetermined periods while the quantities of the states are being synchronized with one another in accordance with the precise time acquired by said precise time acquiring means to convert each of the sampled state quantities into digital data, each of said digital-data transmitting means provided for each of said plurality of digital protective control apparatuses adds the precise time of sampling to the plural digital data converted by said converting means so as to transmit digital data each having the precise time to said communication network, said receiving means receives the plural digital data each having the precise time and transmitted through said communication network, and said arranging means time-sequentially arranges the plurality of the received digital data each having the precise time for each of said plurality of digital protective control apparatuses in accordance with the added precise time.

52. An electric power system protective control system according to claim 51, further comprising:

display means for displaying a digital data group time-sequentially arranged by said arranging means.

53. An electric power system protective control system comprising:

a plurality of digital protective control apparatuses configured to protect an electric power system;

a communication network configured to connect the plurality of digital protective control apparatuses to one another such that data communication is permitted, wherein each of said plurality of digital protective control apparatuses comprises:

precise time acquiring means for acquiring a precise time, converting means for, at predetermined periods, sampling a state quantity of a unit which must be protected in accordance with the precise time acquired by said precise time acquiring means and converting the sampled state quantity into digital data, protective control calculating means for determining whether or not an equipment device which must be protected is faulty in accordance with digital data converted by said converting means to perform protective control operation processes in accordance with a result of a determination, determining means for performing a determination individually from a faulty determining function of said protective control calculating means whether or not the equipment device which must be protected and an equipment device which is not protected are faulty in accordance with digital data converted by said converting means, recording means for adding a precise time of sampling to record digital data having the precise time when a determination is made in accordance with a result of the determination made by said determining means from at least one of the equipment device which must be protected and the equipment device which is not protected, and digital-data transmitting means for transmitting digital data having the precise time and recorded by said recording means to said communication network;

receiving means connected to said communication network and arranged to receive a plurality of digital data each having the precise time transmitted from each of said digital protective control apparatuses through said communication network; and arranging means for time-sequentially arranging the plurality of received digital data each having the precise time for each of said digital protective control apparatuses in accordance with the added precise time.

54. An electric power system protective control system according to claim 53, further comprising:

display means for displaying a digital data group time-sequentially arranged by said arranging means.

55. An electric power system protective control system according to claim 53, further comprising:

generating means for generating a quantity of a test state for a digital protective control apparatus which must be tested in accordance with a digital data group time-sequentially arranged by said arranging means.

56. An electric power system protective control system comprising:

a plurality of digital protective control apparatuses for protecting an electric power system; and a communication network for connecting the plurality of digital protective control apparatuses to one another such that data communication is permitted, wherein each of said plurality of digital protective control apparatuses comprises:

precise time acquiring means for acquiring a precise time, converting means for, at predetermined periods, sampling a state quantity of a unit which must be protected in accordance with the precise time acquired by said precise time acquiring means and converting the sampled state quantity into digital data, digital-data transmitting means for adding a precise time of sampling to digital data converted by said converting means to transmit digital data having the precise time to said communication network, receiving means for receiving digital data having the precise time sequentially transmitted from digital-data transmitting means of another digital protective control apparatus through said communication network, arranging means for time-sequentially arranging a plurality of digital data each having the precise time and received by said receiving means in accordance with the added precise time, and protective control calculating means for performing protective control operation processes in accordance with one of digital data converted by said converting means and digital data time-sequentially arranged by said arranging means.

57. An electric power system protective control system comprising:
a plurality of protective control apparatuses configured to perform operations in accordance with an analog state quantity relating to a unit which must be protected and supplied from an electric power system to protectively control said electric power system; and
a communication network through which said plurality of protective control apparatuses are connected to each other such that data communication is permitted, wherein
each of said plurality of protective control apparatuses comprises:
periodic-signal acquiring means for, which is also precise time acquiring means for acquiring a precise time by GPS, acquiring signals at substantially constant periods,
digital-data collecting means for sequentially sampling an analog state quantity relating to said electric power system at the same timing as that of another protective control apparatus in accordance with the periodic signals acquired by said periodic-signal acquiring means to collect digital data, and
storage means for adding precise time by GPS of sampling which is performed in response to the periodic signals to digital data collected by said digital-data collecting means to sequentially store digital data having the precise time.

58. An electric power system protective control system according to claim 57, further comprising a display control apparatus connected to said communication network and arranged to remotely monitor and control a state of the operations of the plurality of protective control apparatuses,
wherein each of said plurality of protective control apparatuses comprises:
protective control operation means for performing protective control operation processes in accordance with digital data to determine whether or not abnormal data is detected, and
abnormal-data-detection notice issuing means for issuing a notice of generation of abnormal data including abnormal-data detected time to said display control apparatus when abnormal data is detected as a result of the protective control operation processes performed by said protective control calculating means,
wherein said display control apparatus further comprising program module transmitting means for transmitting a program module for collecting digital data before and after abnormal-data detected time to the plurality of protective control apparatuses through said communication network by using a predetermined transmitting passage when the notice of generation of abnormal data including abnormal-data detected time has been transmitted from a predetermined protective control apparatus of the plurality of protective control apparatuses,
wherein each of said plurality of protective control apparatuses further comprising:
receiving means for receiving the program module transmitted through said communication network to execute the program module, and
transmitting means for transmitting digital data having the precise time before and after abnormal-data detected time to said display control unit in accordance with the executed program module, and
wherein said display control apparatus comprises accident-point orienting means for orienting an accident point related to detection of abnormal data in accordance with digital data having the precise time before and after the abnormal-data detected time and transmitted from each of said plurality of protective control apparatuses.

59. An electric power system protective control system according to claim 57, wherein each of said plurality of protective control apparatuses comprises:
power-transmission line constant measuring means for operating in accordance with a program module transmitted from said display control apparatus through said communication network, for measuring a power-transmission line constant, for reading a predetermined precise time of the precise time stored in storage means of an own-protective control apparatus together with digital data, and for measuring the power-transmission line constant by using digital data of said own-protective control apparatus to which the predetermined precise time has been added, and digital data of other protective control apparatuses,
power-transmission line constant storage means for storing the measured power-transmission line constant, and
calculating means for calculating a ranging impedance relating to an object which must be protected by said own-protective control apparatus in accordance with the measured power-transmission line constant.

60. An electric power system protective control system according to claim 58, wherein said storage means stores digital data having the precise time in a period of time spanning from transmission of the notice of generation of abnormal data to said display control apparatus to transmission of digital data having the precise time before and after the time at which abnormal data has been generated to said display control apparatus.

61. An electric power system protective control system according to claim 57, further comprising:
a display control apparatus connected to said communication network and arranged to remotely monitor and control a state of the operations of the plurality of protective control apparatuses, wherein
each of said plurality of protective control apparatuses comprises power-flow information calculating means for calculating power-flow information related to said electric power system based on an electric power, an ineffective electric power and electric currents in accordance with digital data stored in said storage means and having the precise time, and said power-flow information calculating means adds a time at which digital data has been collected, which is a source for power-flow information, to communicate power-flow information having the collection time to said display control apparatus through said communication network, and
said display control apparatus further comprises stable-state determining means for determining a state of stability of said electric power system in accordance with power-flow information communicated from each of said plurality of protective control apparatuses through said communication network.

62. An electric power system protective control system according to claim 58, wherein a hardware circuit including a plurality of CPU, memories commonly provided for the plurality of CPU and a communication interface commonly provided for the plurality of CPU constitutes said storage means of each of said plurality of protective control apparatuses, said protective control calculating means, said abnormal-data-detection-time communicating means, said program module executing means and said digital-data transmitting means, and wherein a first CPU of the plurality of CPU uses said common memory to perform a process associated to said storage means and a process associated to said protective control operation unit and a second CPU of the plurality of CPU uses said common memory and said common communication interface to perform a process associated to said abnormal-data-detection-time communicating means, a process associated to said program module executing means and a process associated to said digital-data transmitting means.

63. An electric power system protective control system according to claim 58, wherein a hardware circuit including a plurality of CPU, memories commonly provided for the plurality of CPU and a communication interface commonly provided for the plurality of CPU constitutes said storage means of each of said plurality of protective control apparatuses, said protective control calculating means, said abnormal-data-detection-time communicating means, said program module executing means and said digital-data transmitting means, a first CPU of the plurality of CPU uses said common memory to perform the process associated to said storage means and the process associated to said protective control calculating means, a second CPU of the plurality of CPU uses said common memory and said common communication interface to perform the process associated to said abnormal-data-detection-time communicating means, a program module receiving process of said program module executing means and the process associated to said digital-data transmitting means, and a third CPU of the plurality of CPU uses said common memory to perform a process for executing the program module received by said second CPU.

64. An electric power system protective control system according to claim 57, wherein each of said plurality of protective control apparatuses comprises:

precise time receiving means for receiving, through said communication network, the precise time acquired by said precise time acquiring means of another protective control apparatus, and precise time confirming means for confirming whether or not the precise time acquired by said own protective control apparatus is accurate in accordance with the received precise time of said another protective control apparatus.

65. An electric power system protective control system according to claim 57, wherein at least one protective control apparatus of the plurality of protective control apparatuses is connected to said another protective control apparatus through a communication line which is different from said communication network, said periodic-signal acquiring means of said another protective control apparatus is said precise time acquiring means for acquiring the precise time, said another protective control apparatus comprises superimposition transmission means for superimposing a signal representing each timing constituting the precise time acquired by said precise time acquiring means and time data representing time of each timing to communicate a result of superimposition to said at least one protective control apparatus through said communication line, and said periodic-signal acquiring means of said at least one protective control apparatus is separating means for separating the superimposition signal transmitted from said another protective control apparatus through said communication line into a signal representing each timing and time data representing time of the timing to obtain the precise time including the periodic signal.

66. An electric power system protective control system according to claim 57, wherein said precise time acquiring means of each of said plurality of protective control apparatuses comprises:

a first precise time acquiring unit configured to receive GPS signals transmitted from a plurality of satellites to acquire a first precise time in response to the received GPS signals, a second precise time acquiring unit configured to receive a ground wave to acquire a second precise time in response to the received ground wave, and correction means for measuring a phase difference between the first precise time acquired by said first precise time acquiring unit and the second precise time acquired by said second precise time acquiring unit to correct the second precise time in accordance with the measured phase difference, and wherein said digital-data collecting means sequentially samples the state quantities in accordance with the first precise time acquired by said first precise time acquiring unit to collect digital data, and when the first precise time cannot be acquired by said first precise time acquiring unit, said digital-data collecting means collects digital data by sequentially sampling the state quantities in accordance with the second precise time corrected by said correction means.

67. An electric power system protective control system according to claim 57, wherein each of said plurality of protective control apparatus comprises:

time acquiring means for acquiring time to be substituted for the precise time, and time calibrating means for calibrating the time in accordance with the precise time acquired by said precise time acquiring means, and wherein said digital-data collecting means sequentially samples the state quantities in accordance with the time calibrated by said time calibrating means to collect digital data when said precise time acquiring means cannot acquire the precise time.

68. An electric power system protective control system according to claim 59, wherein each of said plurality of protective control apparatuses comprises:

receiving means for receiving digital data collected by said digital-data collecting means through said communication network when the state of digital data collected by said digital-data collecting means of said own protective control apparatus has been changed as a result of execution of a protective control operation by other protective control calculating means, calculating means for calculating a change in the state of electric quantity data of the own protective control apparatus in accordance with the power-transmission line constant stored in said power-transmission line constant storage means and digital data of said another protective control apparatus received, and determining means for determining whether or not the change of the state of digital data collected by said digital-data collecting means satisfies a range of state change of digital data operated in accordance with digital data of said another apparatus and the power-transmission line constant to determine whether or not the object which must be protected by the own apparatus is faulty.

69. An electric power system protective control system according to claim 58, wherein each of said plurality of protective control apparatuses comprises changing means for changing a setting value related to the protective control operation of the own protective control apparatus in accordance with a system change requirement communicated from at least one of said another protective control apparatus and said display control apparatus.

70. An electric power system protective control system according to claim 58, wherein each of predetermined protective control apparatuses of the plurality of protective control apparatuses comprise:

collecting means for collecting, through said communication network, digital data representing a state quantity of said electric power system from a plurality of protective control apparatuses from which an abnormality has been detected owing to occurrence of an accident in a state in which absolute time of detection of the abnormality is added to digital data, delayed means for obtaining a delayed state of the abnormal detection time among the plurality of protective control apparatuses from which the abnormality has been detected in accordance with collected digital data having the absolute time in an event of detection of the abnormality, and estimating means for estimating a distance from an accident point and a cause of the abnormality in accordance with the obtained delayed state.

71. An electric power system protective control system according to claim 57, wherein said electric power system and each of said plurality of protective control apparatuses are connected to each other through a second communication network which is different from said communication network, and a state quantity of said electric power system is supplied to each of said plurality of protective control apparatus through said second communication network.

72. A storage medium comprising:

a control program stored therein to control a plant incorporating a plurality of units including a state quantity input/output unit and an opening/closing device, with a plurality of computers including at least a first computer provided for said state quantity input/output unit and a second computer provided for said opening/closing device, wherein said control program comprises:

causing a precise time to be acquired by said first computer, causing said first computer to sample a state quantity of said state quantity input/output unit at predetermined periods in accordance with the precise time to convert the sample state quantity into digital data, causing said first computer to add precise time of sampling to digital data having the precise time to transmit digital data having the precise time to a communication network, causing said second computer to communicate a state of the operation of the opening/closing device to said communication network, causing at least one of the plurality of computers to receive digital data having the precise time and transmitted through said communication network and the state of the operation so as to perform operations in accordance with received digital data having the precise time and the state of the operation, causing said at least one computer to transmit an operation control command to said opening/closing device to said communication network in accordance with a result of the operations, causing said second computer to receive the operation control command transmitted through said communication network, and causing said second computer to operate said opening/closing device in accordance with the received operation control command.

73. The storage medium according to claim 72, wherein said plant is an electric power system.

74. A storage medium comprising a protective control program stored therein to protect a plurality of units provided for an electric power system by using a plurality of protective control computers, said protective control program comprising:

causing each of said plurality of protective control computers to acquire a precise time;

causing each of said plurality of protective control computers to sample a state quantity of an equipment device which must be protected at predetermined periods in accordance with the precise time to convert the sampled state quantity into digital data;

causing each of said plurality of protective control computers to add the precise time of the sampling to converted digital data to transmit digital data having the precise time to a communication network;

causing each of said plurality of protective control computers to receive digital data having said precise time transmitted from other digital protective control apparatus;

causing each of said plurality of protective control computers to receive digital data having the precise time and sequentially transmitted from said other digital protective control apparatus through said communication network;

causing each of said plurality of protective control computers to time-sequentially arrange the plurality of the received digital data each having the precise time in accordance with the added precise time; and causing each of said plurality of protective control computers to execute protective control operation processes in accordance with either converted data or digital data which has time-sequentially been arranged.

* * * * *